US006018815A

United States Patent [19]

Baeg

[11] Patent Number: 6,018,815

[45] **Date of Patent: *Jan. 25, 2000**

[54] ADAPTABLE SCAN CHAINS FOR DEBUGGING AND MANUFACTURING TEST PURPOSES

[75] Inventor: Sanghyeon Baeg, Cupertino, Calif.

[73] Assignee: Samsung Electronics Co., Ltd., Seoul, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/733,132

[22] Filed: Oct. 18, 1996

[51] Int. Cl.[7] .......... G01R 31/28

[52] U.S. Cl. .......... 714/726; 365/201

[58] Field of Search .......... 371/22.31, 22.32, 371/22.34, 22.36, 22.5, 25.1, 27.1, 27.5; 395/183.06, 182.01, 182.05, 183.01, 183.12; 364/550, 489; 324/765; 714/25, 27, 30, 39, 726, 727, 729, 733, 742, 725; 365/201

[56] References Cited

U.S. PATENT DOCUMENTS

| | | | |
|---|---|---|---|
| 4,860,290 | 8/1989 | Daniels et al. | 371/25 |
| 5,280,616 | 1/1994 | Butler et al. | 395/650 |
| 5,313,470 | 5/1994 | Simpson | 371/22.3 |
| 5,329,471 | 7/1994 | Swoboda et al. | 364/578 |
| 5,341,096 | 8/1994 | Yamamura | 324/765 |
| 5,349,587 | 9/1994 | Nadeau-Dostie et al. | 371/22.3 |
| 5,434,804 | 7/1995 | Bock et al. | 364/579 |
| 5,448,576 | 9/1995 | Russell | 371/22.3 |
| 5,479,652 | 12/1995 | Dreyer et al. | 395/183.06 |
| 5,488,688 | 1/1996 | Gonzales et al. | 395/183.1 |
| 5,497,378 | 3/1996 | Amini et al. | 371/22.3 |
| 5,504,756 | 4/1996 | Kim et al. | 371/22.3 |
| 5,510,704 | 4/1996 | Parker et al. | 324/158.1 |
| 5,515,382 | 5/1996 | Lassorie | 371/22.3 |
| 5,519,715 | 5/1996 | Hao et al. | 371/22.3 |
| 5,524,114 | 6/1996 | Peng | 371/22.1 |
| 5,535,331 | 7/1996 | Swoboda et al. | 395/183.21 |
| 5,546,568 | 8/1996 | Bland et al. | 395/550 |
| 5,592,493 | 1/1997 | Crouch et al. | 371/22.3 |
| 5,608,736 | 3/1997 | Bradford et al. | 371/22.3 |
| 5,614,838 | 3/1997 | Jaber et al. | 324/765 |
| 5,623,503 | 4/1997 | Rutkowski | 371/22.3 |
| 5,636,227 | 6/1997 | Segars | 371/22.3 |
| 5,651,013 | 7/1997 | Iadanza | 371/22.3 |
| 5,668,481 | 9/1997 | Sheu et al. | 326/16 |
| 5,673,276 | 9/1997 | Jarwala et al. | 371/22.3 |
| 5,675,589 | 10/1997 | Yee | 371/22.3 |
| 5,680,543 | 10/1997 | Bhawmik | 395/183.06 |

OTHER PUBLICATIONS

Mark F. Lefebvre, Functional test and diagnosis: A proposed JTAG sample mode scan tester, 1990 International test conference, pp. 294–303, Jun. 1990.

Zacharia et al., Two dimensional test data decompressor for multiple scan designs, International test conference, Jun. 1996, pp. 186–194.

Texas Instruments, Boundary–Scan Architecture and IEEE Std 1149.1 (from Chapter 3 of TI's IEEE 1149.1 Testability Primer, SSYA002B) (Nov. 1996).

IEEE Computer Society, "IEEE Standard Test Access Port and Boundary–Scan Architecture", Published by the Institute of Electrical and Electronics Engineers, Inc. (1990), including 1149.1a (Oct. 21, 1993) and 1149.1b (Mar. 1, 1995).

Maunder and Tulloss, "The Test Access Port and Boundary–Scan Architecture", Published by the IEEE Computer Society Press, Los Alamitos, California (1990).

*Primary Examiner*—Ly V. Hua
*Assistant Examiner*—Nadeem Iqbal
*Attorney, Agent, or Firm*—Skjerven Morrill MacPherson Franklin & Friel LLP; Michael Shenker

[57] ABSTRACT

Scan chains to support debugging and manufacturing test modes for integrated circuit chips are made adaptable. Scan chains may be configured either in a multiple scan chain JTAG mode or in a multiple independent and parallel scan chain mode. The configuration transition between the scan modes is made by private instructions implemented in a JTAG controller, which supports the IEEE 1149.1 standard.

23 Claims, 6 Drawing Sheets

ADAPTABLE SCAN CHAINS FOR DEBUGGING AND MANUFACTURING TEST PURPOSES

CROSS-REFERENCE TO RELATED APPLICATIONS

This application relates to copending applications Ser. No. 08/699,303 filed Aug. 19, 1996, entitled "METHODS AND APPARATUS FOR PROCESSING VIDEO DATA", by Reader et al., Ser. No. 08/733,817, filed Oct. 18, 1996, now U.S. Pat. No. 5,793,776 issued Aug. 11, 1998, entitled "STRUCTURE AND METHOD FOR SDRAM DYNAMIC SELF REFRESH ENTRY AND EXIT USING JTAG", by Qureshi and Baeg, and Ser. No. 08/733,908, filed Oct. 18, 1996, now U.S. Pat. No. 5,805,608 issued Sep. 8, 1998, entitled "CLOCK GENERATION FOR TESTING OF INTEGRATED CIRCUITS", by Baeg and Yu, all owned by the assignee of this application and incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

A recent development in integrated circuit testing is the use of the JTAG (Joint Test Action Group) test port for in situ testing of integrated circuit chips mounted on a circuit board. The JTAG standard has been adopted by the Institute of Electrical and Electronics Engineers and is now defined as IEEE Standard 1149.1, IEEE Standard Test Access Port and Boundary-Scan Architecture, which is incorporated herein by reference. The IEEE Standard 1149.1 is explained in C. M. Maunder and R. E. Tulloss, "Test Access Port and Boundary-Scan Architecture" (IEEE Computer Society Press, 1990) which is also incorporated herein by reference.

In the JTAG scheme, a four (or optional five) signal Test Access Port (TAP) is added to each chip or grouping of chips on a board. The TAP includes four inputs: a test clock (TCK), a test mode select (TMS), a test data in (TDI), and an optional test reset (TRSTN). In addition, there is one output, a test data output (TDO). TDI and TDO are daisy-chained from chip to chip, whereas TCK and TMS are broadcast.

The TCK input is independent of the system clocks for the chip so that test operations can be synchronized between different chips. JTAG testing may be used to test suitably configured integrated circuits to verify operability. The operation of the test logic is controlled by the sequence of signals applied at the TMS input. The TDI and TDO are serial data input and output, respectively while TRSTN input is used to intitialize a chip or circuit to a known state. The features in the JTAG Standard provide for accessing any type of scan elements serially without requiring any more pins than the five JTAG pins, TCK, TMS, TDI, and TRSTN. This results in a single long scan chain for a chip.

SUMMARY OF INVENTION

For chip debugging purposes during prototype development it is advantageous to have multiple scan chains instead of one single long chain for a chip. The scan chains not selected do not change their state with multiple scan chains. Having a selectable scan chain for one or more functional blocks provides a number of advantages. The advantages include: allowing for debugging to be focused on functional blocks; preventing design errors in scan chain construction from affecting scan chains in other functional blocks; reducing scan time operation by focusing on functional blocks; and avoiding a change in the configuration of the functional blocks which are not being scanned while allowing changes in the functional block to be scanned.

However, multiple scan chains in the JTAG environment do not provide much benefit when manufacturing test time becomes important. This is because in the JTAG environment, only one scan chain may be selected at any one time for testing. Hence, the multiple scan chains connected between TDI and TDO are equivalent to a single chain insofar as scan shift time is concerned, scan values need to be shifted to every scan element in a chip.

In accordance with this invention, one can scan either a single selected scan chain for use in a JTAG environment for integrated circuit chip debugging purposes or all the scan chains simultaneously in parallel.

In the manufacturing test mode, one can combine several scan chains into a single scan chain to reduce the number of inputs that provide data to all scan chains in parallel. In accordance with this invention, some integrated circuit chip pins are reconfigured in manufacturing test mode to act as input ports for the scan chains and some of the chip pins are reconfigured to act as output ports for the scan chains.

During manufacturing test mode, nonoverlapping clock signals to scan data in and out of the parallel scan chains are provided in one embodiment by a pair of dedicated chip input ports. For multiple scan chains in a JTAG environment, nonoverlapping clocks are derived from a JTAG TCK clock.

In accordance with this invention, an integrated circuit chip may be debugged using multiple scan chains in a JTAG environment and undergo manufacturing tests after being reconfigured for multiple parallel scan chain operation. Multiple parallel scan chain operation offers reductions in manufacturing test time.

By implementing scan chains in an adaptable way, the benefits for chip debugging in both a JTAG environment and manufacturing test environment can be achieved at a low design cost.

DETAILED DESCRIPTION OF INVENTION

Figure 1:
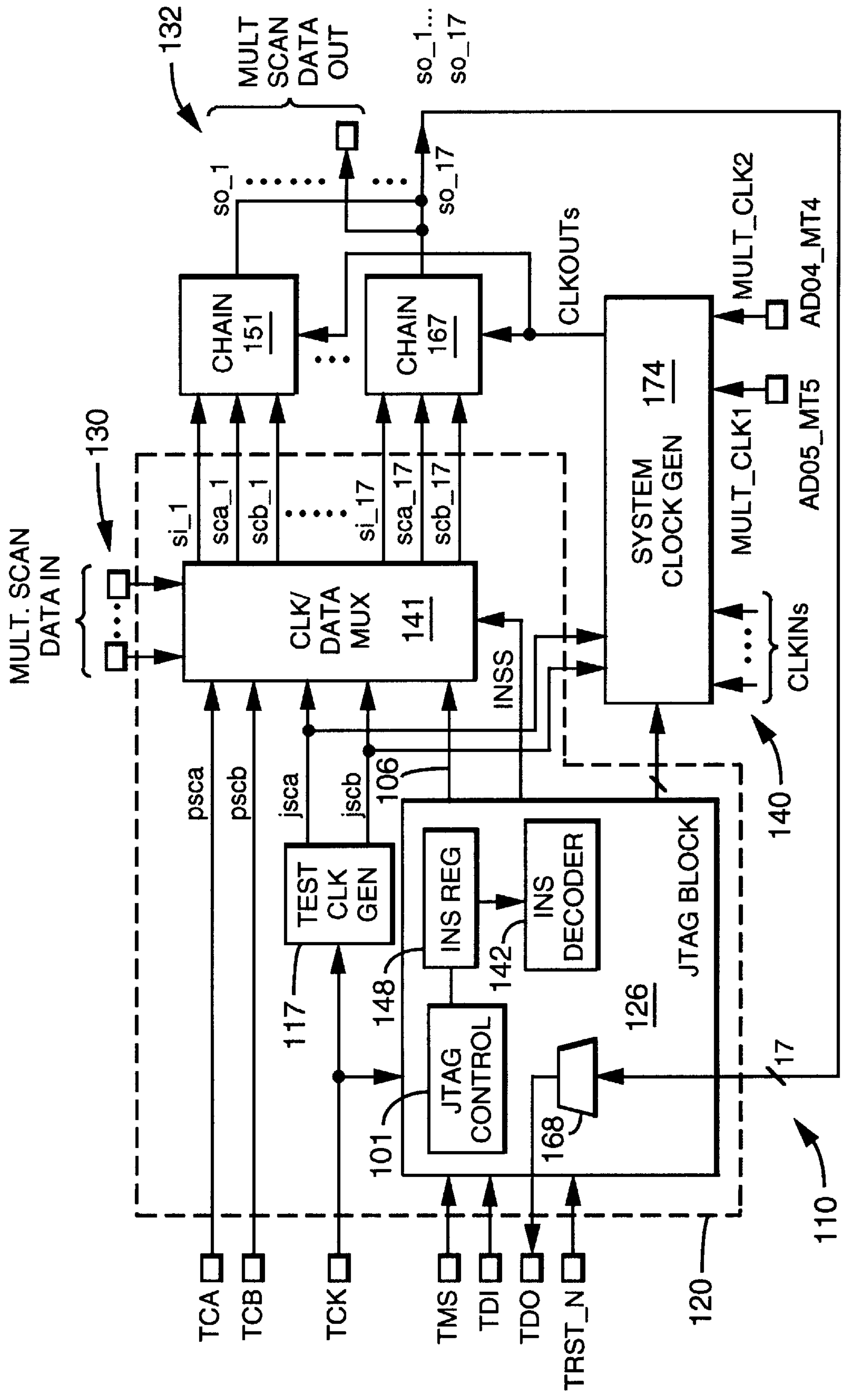
FIG. 1 is a block diagram of an integrated circuit having test circuitry in accordance with this invention.

FIG. 1 is a block diagram of an integrated circuit (IC) 110. IC 110 includes testing circuitry to facilitate the integrated circuit testing. In some embodiments, the integrated circuit chip is a Multimedia Signal Processor (MSP™) developed at Samsung Semiconductor, Inc. of San Jose Calif. That processor is described in U.S. patent application Ser. No.

08/699,303 filed Aug. 19, 1996 by C. Reader et al. and entitled "Methods and Apparatus for Processing Video Data". That patent application is incorporated herein by reference. The MSP testing circuitry is described in detail in Appendices A-B herein. In particular, Appendix B includes Verilog code for the testing circuitry.

The testing circuitry includes test control circuit 120 (FIG. 1). Circuit 120 can function as a control circuit for boundary scan testing in accordance with the JTAG standard.

In addition to boundary scan testing, test control circuit 120 is suitable for internal testing as defined below.

IC 110 includes 5 pins defined by the JTAG standard that are connected to circuit 120. Those pins are TCK (test clock input), TMS (test mode select input), TDI (test data input), TDO (test data output), and TRST_N (test reset input, active low). The clock input on pin TCK is used not only during the JTAG boundary scan testing, but also for internal testing. In particular, the pin TCK provides scan clock signals for scanning data in and out of internal scan chains 151–167. Each chain includes a shift register built of LSSD (level sensitive scan design) latches. LSSD latches are described, for example, in M. Abramovici et al., "Digital Systems Testing and Testable Design" (1990) hereby incorporated herein by reference. Some embodiments of IC 110 include more than 17 scan chains or fewer than 17 scan chains. For one MSP embodiment, the 17 scan chains, and the respective MSP function blocks incorporating these chains, are shown in Appendix A, Table 2 as chains 1–17. (Chain 18 is the MSP boundary scan chain. Chain 19 is the boundary chain of the ARM processor embedded in the MSP.) Each internal chain 151–167 in Table 2 is a JTAG test data register which can be selected by a respective JTAG private instruction listed in Table 5 of Appendix A.

Figure 2A:
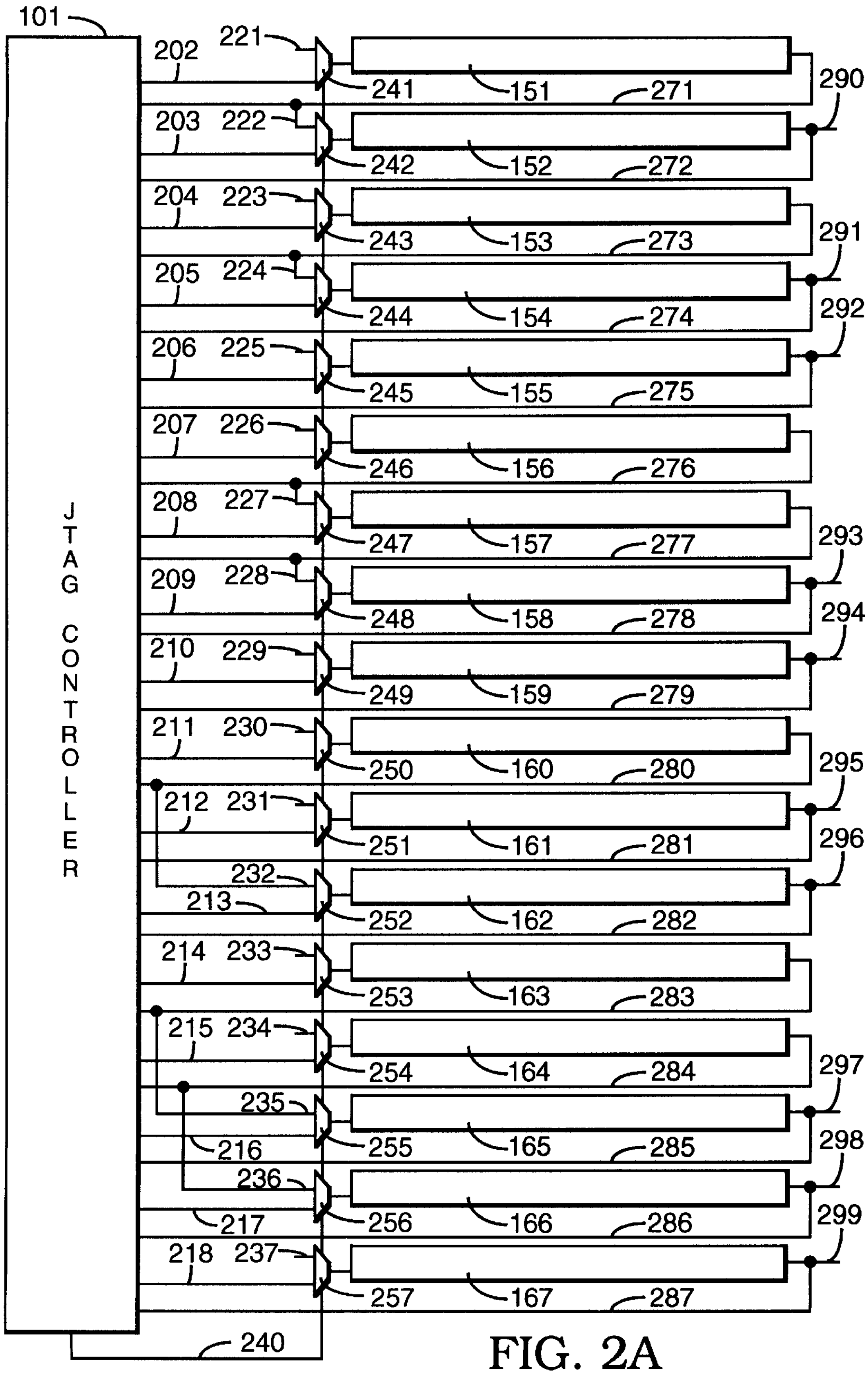
FIG. 2A shows the data paths for test circuitry single internal scan mode and multiple internal scan mode.
Figure 2B:
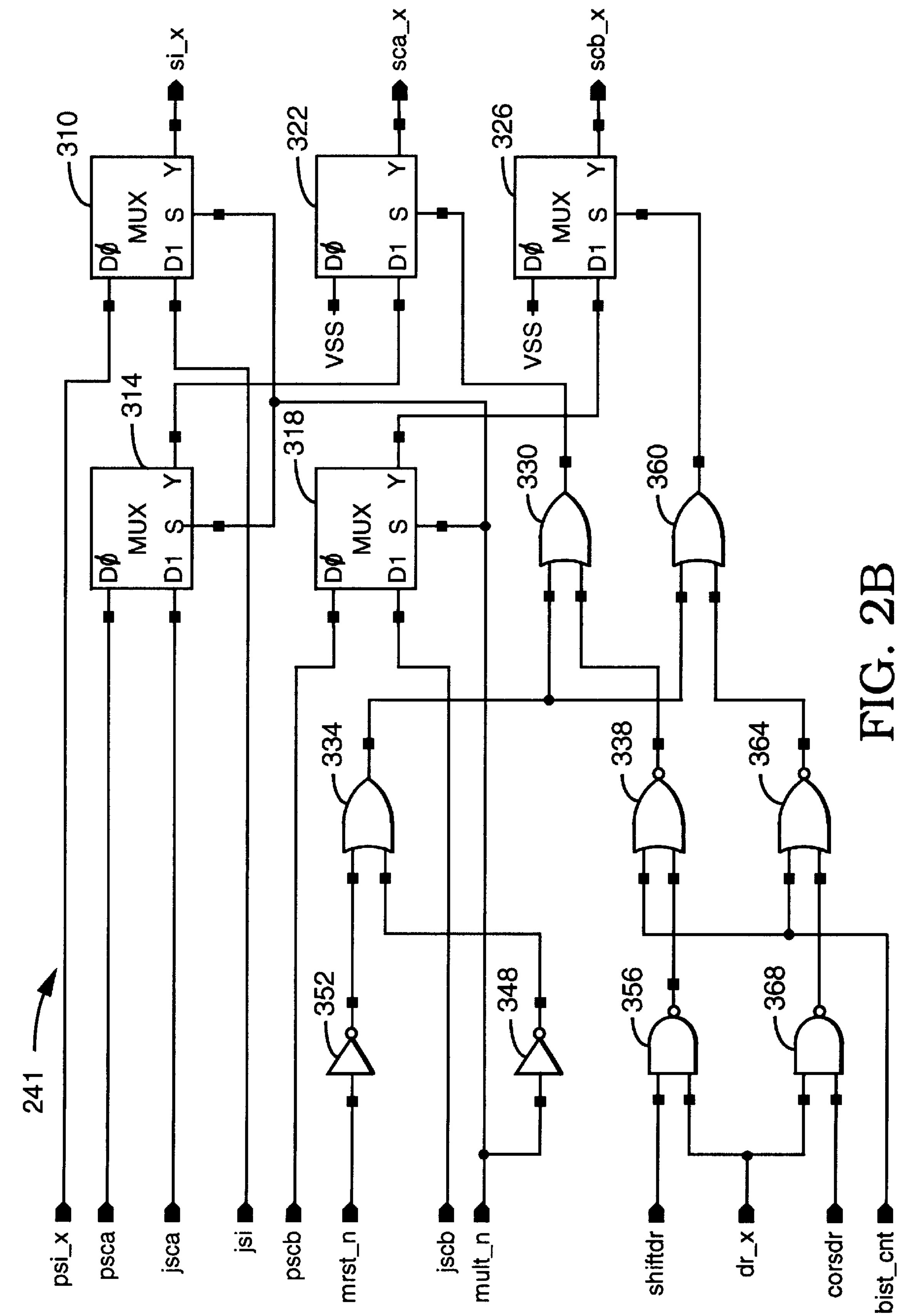
FIG. 2B is a circuit diagram illustrating a clock/data multiplexer of the circuit of FIG. 1.

FIG. 2A shows an embodiment in accordance with this invention of the data paths in single internal scan mode and in multiple internal scan mode for integrated circuit testing. FIG. 2A does not show the paths for the clock signals needed to scan data into and out of the internal scan registers. The clock signals are shown in FIG. 1 and the details of the clocking for one scan chain are shown in FIG. 2B. In single internal scan mode, one of 17 internal scan registers 151–167 is selected to take scan input from the TDI port on JTAG Controller 101. When single internal scan mode is selected, multiplexers 241–257 will be set to select leads 202–218, respectively, coming from JTAG Controller 101. Outputs of multiplexers 241–257 are coupled to scan registers 151–167, respectively. During single internal scan mode, the selected one of scan registers 151–167 is coupled to the JTAG TDO port. Hence, a selected scan register is placed between the JTAG TDI and TDO ports during single internal scan mode and a scan is performed by JTAG Controller 101.

In one embodiment in accordance with this invention, multiple internal scan mode is selected by the JTAG custom instruction code 110100(34) described in Table 6 of Appendix A. When the multiple internal scan mode instruction is decoded, JTAG Controller 101 asserts signal mult_n on lead 240 to multiplexers 241–257 to select inputs 221–237 of the multiplexers. After the multiple internal scan mode has been selected, JTAG Controller 101 is not used, remaining in state RunTest/Idle. In multiple internal scan mode, scan mode signal mult_scan_mode is connected to bidirectional pin "AD04_MT3" to toggle in and out of scan mode. This signal is used by the functional blocks to be scanned but not the scan chains. In accordance with this invention, pins on the chip will be switched to provide access to inputs 221–237 of multiplexers 241–257, allowing parallel access to the internal scan registers.

In the multiple internal scan operation, inputs 221–237 receive data from MSP pins 130. In normal (non-testing)

operation, MSP pins 130 are bidirectional pins. See Appendix A, Section 1.6.5. For example, in one embodiment, 10 bidirectional pins 130 on a chip are configured as input ports while 10 other bidirectional pins 132 are configured as output ports. The pins selected for input and output during multiple internal scan mode are pins connected to slow logic in normal (as opposed to test) mode so that the added delay caused by the introduction of a multiplexer to select normal or test mode at each of the selected bidirectional pins does not create timing problems during normal mode. Because the number of pins on the chip available for multiple internal scan mode is limited to 10 pins in one embodiment while the number of scan registers is 17 in single scan mode, scan registers 151–167 are reconfigured in multiple internal scan mode as shown in FIG. 2A and described in Table 1. Note that the numbers in Table 1 refer to the figure numbers in FIG. 2A.

TABLE 1

| Input from Pin to Reconfigured Register | Reconfigured Register | Output to Pin from Reconfigured Register |
|---|---|---|
| 221 | 151 + 152 | 290 |
| 223 | 153 + 154 | 291 |
| 225 | 155 | 292 |
| 226 | 156 + 157 + 158 | 293 |
| 229 | 159 | 294 |
| 230 | 160 + 162 | 296 |
| 231 | 161 | 295 |
| 233 | 163 + 165 | 297 |
| 234 | 164 + 166 | 298 |
| 237 | 167 | 299 |

Reconfiguration allows access to all 17 scan registers using 10 bidirectional pins 130 available for input during multiple internal scan mode. Parallel output from the reconfigured registers during multiple internal scan mode is available to 10 bidirectional output pins 132 on IC 110.

Each one of internal scan chains 151–167 receives non-overlapping scan clocks sca_x, scb_x for scanning test data. In a "single internal scan" operation, only one of chains 151–167 is scanned. The respective clocks sca, scb are derived from the TCK clock as described below. Some testing environments provide good control over the TCK and, therefore, good control is provided over the clocks sca, scb. In particular, the TCK frequency is well controlled, and TCK can be started or stopped at any time. See, for example, the testing environment described in Section 1.11 in Appendix A. Therefore, clocks sca, scb are also well controlled in the single scan operation.

IC 110 also has a multiple internal scan mode in which all the chains 151–167 are scanned simultaneously. This mode is suitable for manufacturing, when a number of standard tests need to be run quickly. In this mode, clocks sca, scb are derived from non-overlapping clocks provided on test clock input pins TCA, TCB. TCA and TCB are dedicated test clock input pins in some embodiments. Using separate test clock pins TCA, TCB provides well controlled clocks sca, scb and also simplifies interface between IC 110 and existing manufacturing test equipment such as Schlumberger ITS 9000. Separate clock pins TCA, TCB, also facilitate use of ATPG (Automatic Test Pattern Generator) software such as Sunrise™ which is ATPG software available from ViewLogic of San Jose, Calif.

During testing, function blocks that include chains 151–167 may be clocked to simulate normal operation. The function blocks are clocked by clocks CLKOUTs both when normal operation is simulated during testing and when normal operation actually takes place. During testing, the clocks CLKOUT's can be derived from the TCK clock. Alternatively, these clocks can be derived from normal system clocks CLKINs provided on inputs 140 and used for normal operation. Deriving CLKOUTs from TCK allows one to have good control over CLKOUTs. In some embodiments the clocks CLKINs are free running (and hence not well controlled).

In some tests, clocks CLKOUTs are taken from test clocks mult_clk1, mult_clk2 on respective pins AD05_MT5, AD04_MT4. In normal mode these pins are bidirectional pins used for other purposes.

The TCK clock is provided to JTAG block 126 to control the operation of the JTAG circuitry as known in the art. TCK is also connected to clock generator 117. Clock generator 117 generates from the TCK clock two non-overlapping clocks jsca, jscb having the same frequency as TCK. Clock/data multiplexer 141 receives the clocks jsca, jscb and also receives the clock signals psca, pscb from respective test clock pins TCA, TCB. In some manufacturing tests, clocks psca, pscb are non-overlapping clocks having equal frequencies.

In the single internal scan operation, multiplexer 141 provides clocks jsca, jscb on respective outputs sca_x, scb_x of one of internal scan chains 151–167 selected by JTAG block 126. The remaining clocks sca_i, scb_i are held low (at VSS). In the multiple scan operation, multiplexer 141 provides the clocks psca, pscb on respective outputs sca_x, scb_x to all internal scan chains 151–167.

Multiplexer 141 is controlled by signals INSS from JTAG block 126.

Clocks jsca, jscb are also provided to clock generator 174. Clock generator 174 also receives: 1) normal mode clocks from inputs 140; 2) clock mult_clk 1 from pin AD05_MT5; and 3) clock mult_clk2 from pin AD04_MT4. In the normal operation, clock generator 174 generates CLKOUTs from the normal clocks 140. In non-scan test operations (for example, in BIST), clock generator 174 generates the output clocks CLKOUTs from normal clocks 140, scan clocks jsca, jscb, and/or clocks mult_clk1, mult_clk2. Clock generator 174 is controlled by signals from JTAG block 126.

Clock/data multiplexer 141 includes separate multiplexer 241 (FIG. 2B), corresponding to each of multiplexers 241–257 in FIG. 2A, for each one of internal scan chains 151–167. In multiplexer 241, data output si_x is the output of multiplexer 310. The data inputs D0, D1 of multiplexer 310 received respective signals psi_x, jsi. Signal jsi is a data signal received from pin TDI via line 106 (FIG. 1) in the single internal scan mode. Input psi_x receives data in multiple internal scan operation from one of pins 130 or from a scan output of another one of chains 151–167. (As described above, in the multiple internal scan mode several chains can be combined into a single chain.) The select input S of multiplexer 310 is connected to input mult_n of multiplexer 241. In the signal names, suffix "_n" indicates that the signal is active low. Signal mult_n is asserted (driven low) by block 126 to indicate the multiple internal scan mode.

The scan operation in the multiple internal scan mode is indicated by a signal "mult_scan_mode" on the MSP pin AD03_MT3 (not shown) which is a bidirectional pin in normal operation. See appendix A, Table 14. When mult_n is asserted (low), mult_scan_mode is asserted to configure function blocks for the scan operation.

When the input S of multiplexer 310 is low, multiplexer 310 selects its input D0, that is, psi_x. When the select signal S is high, multiplexer 310 selects D1 (jsi).

Signal mult_n is connected to select inputs S of multiplexers 314, 318. When mult_n is low, multiplexer 314 selects input psca connected to pin TCA (FIG. 1), and MUX 318 selects pscb connected to TCB. When mult_n is high, MUX 314 selects input jsca from clock generator 160, and multiplexer 318 selects input jscb from clock generator 117.

The output of multiplexer 314 is connected to input D1 of multiplexer 322. The output of multiplexer 318 is connected to input D1 of multiplexer 326. Multiplexers 314, 318, 322, 326 are identical to multiplexer 310. The output of multiplexer 322 provides signal sca_x. The output of multiplexer 326 provides signal scb_x.

The inputs D0 of multiplexers 322, 326 are connected to VSS.

The select input S of multiplexer 322 is connected to the output of OR gate 330. Gate 330 ORs the outputs of OR gate 334 and NOR gate 338. One of the two inputs of gate 334 is connected to the output of inverter 348 whose input is connected to input mult_n. The other input of gate 334 is connected to the output of inverter 352 whose input is connected to a system reset signal mrst_n.

One of the two inputs of NOR gate 338 is connected to input bist_cnt of multiplexer 241. The other input of NOR gate 338 is connected to the output of NAND gate 356. One of the two inputs of gate 356 receives signal shiftdr from JTAG block 126. Signal shiftdr is a standard JTAG signal indicating that the JTAG controller is in state Shift_DR. See the aforementioned book "The Test Access Port and Boundary-Scan Architecture", page 41 (FIGS. 4–8). The other input of gate 356 is connected to input dr_x.

The select input S of multiplexer 326 is connected to the output of OR gate 360. One of the two inputs of gate 360 is connected to the output of OR gate 334. The other input of gate 360 is connected to the output of NOR gate 364. One of the two inputs of gate 364 is connected to input bist_cnt. The other input of gate 364 is connected to the output of NOR gate 368. The two inputs of gate 368 are connected to respectively inputs dr_x, corsdr.

Inputs mrst_n, mult_n, shiftdr, dr_x, corsdr, bist_cnt are the outputs of JTAG block 126. Input mrst_n receives a system reset signal. During normal operation or testing, this signal is high.

Signal mult_n is generated by JTAG instruction decoder 142. This signal is asserted when JTAG controller 101 receives a multiple scan chain instruction (a private instruction described in Appendix A, Table 6) and the controller is in the Run-Test/Idle state. When mult_n is low, multiplexers 322, 326 select their inputs D1, and the clocks on TCA, TCB are provided to outputs sca_x, scb_x.

When mult_n is high, the inputs D1 of multiplexers 322, 326 receive respective signals jsca, jscb. The select inputs S of multiplexers 322, 326 receive signals depending on signals shiftdr, dr_x, corsdr, and bist_cnt. Signal bist_cnt generated by JTAG instruction decoder 142 is high when JTAG controller 101 receives instruction BIST or GBIST shown in Appendix A, Table 9, or any of the instructions in Table 7, or the last instruction "ARM7 intest/BIST" in Table 4. These are private instructions for BIST. The high bist_cnt causes multiplexers 322, 326 to provide the clock signals jsca, jscb on respective outputs sca_x, scb_x.

Signal corsdr is driven high by JTAG block 126 in the JTAG controller states Shift-DR and Capture-DR. Signal dr_x is driven high by JTAG block 126 when the corresponding one of chains 151–167 is selected as a test data register by JTAG controller 101. When dr_x is high, it enables multiplexers 322, 326 to select respectively jsca, jscb when the respective signal shiftdr, corsdr is high. Thus when dr_x is high, the respective chain of chains 151–167 can be scanned or can capture data in the single scan mode.

The embodiments described above and in the appendices below do not limit the invention. In some embodiments, the invention is implemented using CMOS technology, but other technologies are used in other embodiments. The invention is defined by the claims below.

961008 (MS:

APPENDIX A

Test and normal modes in MSP are described in this chapter. All those modes are controlled by a JTAG controller using five JTAG pins only.

1.2 Application and Assumptions

All the test schemes, which are described in the following sections are implemented to aid MSP hardware testing during the processes of both prototype debugging and manufacturing test.

This material assumes that users know IEEE 1149.1 JTAG protocols and LSSD type scan properties. Please refer to following material for more information in LSSD, JTAG, and MSP specification.

- Test Compiler Reference Manual Ver. 3.2a (Synopsys, Inc. 1994)
- IEEE Standard 1149.1-1990:. IEEE Standard Test Access Port and Boundary Scan Architecture, 1990
- Preliminary MSP-1EX System Specification, Samsung Semiconductor Inc. 1996

1.3 Features

- LSSD type scan design
- Independent scan operation for each functional block
- Parallel scan operation for manufacturing test
- Two boundary scan chains for MSP and ARM7
- All JTAG basic instructions, intest, extest, and sample/preload
- Memory access operation
- BIST clock generation

1.4 Test methodology abstract

MSP testing is aided with various test schemes, which incorporate LSSD (Level Sensitive Scan Design) type scan design, JTAG controller, and mixing techniques of DFT (Design For Testability) and BIST (Built In Self Test) for memory test.

The control blocks in MSP are made to be fully scannable. The data path blocks are partially scanned to reduce hardware penalty. The scan chains are partitioned by functional block to aid debugging.

There are two boundary scan chains for MSP and ARM7, which are controlled using one JTAG controller. The JTAG control logic is able to scan boundary scan chains as well as the internal scan chains.

To debug and test in silicon, hybrid DFT method is used for the cache memory. It is a combined method of DFT, JTAG, and BIST. The automatic comparison scheme has been embedded for cache to reduce test time while MARCH C algorithm is executed. The memories are controlled using memory control register located inside the JTAG controller.

1.5 Conceptual JTAG Requirements

The general requirements that JTAG controller should provide are discussed. They are specified in the points of functional debugging rather than board level testing.

- Boundary scan for MSP and ARM7 core: arbitrary functional vectors should be supplied to the scan chain, which implies that a clock pulse in clock pads can be emulated through the scan chain. The tri-state and bi-directional controls should be possible in a group of related signals such as data bus. Arbitrary patterns from the off-chip and internal logic are captured and shifted to TDO pin. It should be able to drive the external chip and internal logic via the boundary scan cell for interconnection test and internal logic testing respectively. At least one of boundary scan operation guarantees that all the internal 961008 (MS:

state machines are frozen until the boundary scan cells are updated by JTAG controller.

- Scan in/out test for functional blocks: scan chains are partitioned by the functional block unit. Exceptions can be made if a block has much less scan cells compared to other blocks. Scanning in and out arbitrary values should be possible for every scan cell. During the scan operations for functional blocks, all the internal ff/latches except the selected chain, boundary scan cells, cache, and register should hold the previous values. This is critical for efficient silicon debugging process. In other words, all the data registers, boundary scan, ARM7 boundaries scan should be *independently* controllable.
- Generation of system clock in test mode: the MSP chip is executed as many system clock cycles as users want. This is performed in two ways in terms of clock pulse generation. First, the clock pulses are generated using boundary scan cell assigned to clock ports. This will be extremely slow because it requires scanning all the boundary scan cells three times to create one pulse (0-1-0). In case of the system clock this feature is not supported. The capture only boundary scan cell is used. If the TCK is 20 MHz, about 24 Khz clock can be emulated using the boundary scan chain in MSP. Note that the boundary scan length in MSP is 270 bits long. Secondly, the clock pulse can also be generated using the JTAG clock. One pulse of the JTAG clock, TCK is the same as one system clock pulse. This is very fast compared to the previous one. The second way of clock generation is implemented for the main system clock only. Other clocks are emulated using the boundary scan chain.

- Embedded memory access via JTAG: the memories, IDC and register file inside MSP are controlled through JTAG interface in test mode. Read and write operation to an arbitrary location are provided. Any read/write operations to one RAM should not affect the contents in the other RAMs.
- Multiple independent scan: the multiple scan chains are configured based on the number of scan cells rather than functional blocks. They are scanned simultaneously. JTAG controller is responsible for providing the circuitry of the scan chain reorganization.
- JTAG instructions: all the basic JTAG instructions should be implemented in addition to the instructions to provide the functionalities specified in above items in this section. During JTAG instruction change, all the boundary scan cells are not changing, all ff/latches freeze their state, and memories hold their current contents. This will help predict the current state during the prototype debugging process.

1.6 Classified JTAG Operations

This section discusses the implementation issues of the JTAG requirements discussed in the previous section. JTAG operation in MSP design can be classified into six different categories. Each category can have a little variation depending on its application. You will see the matching instructions for the categories in the section of *JTAG design details*. The six different categories are *normal operation, boundary scan operation, single internal scan operation, memory access operation, multiple internal scan operation,* and *pseudo system clock*

*operation* modes. They are discussed in the following subsections.

1.6.1 Normal operation

All the functional and memory blocks are operating as they are supposed to. All the shared input and output pins and test logic are properly redirected to provide legal signals in this mode. This mode is entered by enabling JTAG standard signal, *TRST_N (=0)*.

1.6.2 Boundary scan operation

Two boundary scan chains are implemented. They are for MSP and ARM7 core. All the I/O ports in MSP and ARM7 have their appropriate boundary scan cells except the five JTAG related pins. The specific boundary scan cells for the scan chains can be found in the sections of *MSP boundary scan* and *ARM7 boundary scan*. The two boundary scan chains will share one JTAG controller and must be independently scannable. Intest, extest, and sample/preload instructions for both scan chains are implemented.

1.6.3 Single internal scan operation

In this mode, JTAG takes over the hardware control in terms of data transfer inside MSP. All the functional blocks, which have scan chains in them can be independently scanned in or out. "Independently" means that the scan chains which are not selected do not change their states. Only the selected block takes a scan input from TDI port and updates the scan chain.

This scan mode is primarily used for chip debugging. You can set and observe the values in scan chains whenever you want. Since only one scan chain can be accessed at a time, it is as if there were only a single chain in terms of testing time. It is not a good candidate for production test even though it can be used for the purpose.

1.6.4 Memory access operation

The vd_ram and tag_ram in IDC (Instruction Data Cache) are selected and accessed at the same time. The data_ram can be independently accessed. Any address in the RAMs can be independently read and written in this mode. The memory operations are executed serially by scan chain and JTAG controller.

When one memory is accessed for read and write operations, the other memories do not change their contents. Below is how you access the memories.

1. Change to single scan mode and select the RAM block. Scan in the necessary data. At this time, you can set the address counter, and the data to be written. Since this is the scan mode, no memory write operation should be performed.

2. Go out of single scan mode and step into memory access operation. In this mode, a memory to be tested can be selected. JTAG controller provides a select signal for each memory. They are *data_ram_test_en, vt_ram_test_en, and register_file_test_en*. Only one of them can be active at a time.

3. Once one memory is selected, memory and address counter control signals can be controlled using JTAG. The control names are *mem_we, mem_hwd, mem_compare, mem_add_u/d, mem_add_cnt, mem_add_reset, and mem_add_set*. Their usages can be found in the section of *JTAG interface signals*.

1.6.5 Multiple internal scan operation

In addition to the single scan mode, there is multiple scan mode in which 10 different scan chains are accessed simultaneously from MSP I/O ports. They 961008 (MS)

are basically reorganized from the existing scan chains based on the scan ff/latch counts.

Multiple scan chain operation is implemented with production test in mind. 10 scan flip-flops can be accessed in every clock cycle. Furthermore, no JTAG instruction switching is necessary to have a specific function block scanned as in single scan mode.

The ten scan inputs are shared with normal functional bidirectional pins. The names are *ad06_si0, ad07_si1, ad08_si2, ad09_si3, ad10_si4, ad11_si5, ad12_si6, ad13_si7, ad14_si8, ad15_si9*. The ten test pins are muxed with the normal bidirectional pins, *ad16_so0, ad17_so1, ad18_so2, ad19_so3, ad20_so4, ad21_so5, ad22_so6, ad23_so7, ad24_so8, ad25_so9.*

The two input ports, *tca and tcb* are used for scan clock stimulus. Since the two ports are dedicated for testing, it does not give any limitation for test generation. Note that they are not coming from the JTAG controller but from a tester.

On the tester during manufacturing, MSP is set to multiple scan mode, in which the boundary scan cells are in transparent mode. So that all the test vectors in normal ports can be applied through boundary scan cells.

The signal which tells the JTAG is in the multiple state can be used to direct the bidirectional I/O cells. It avoids the preprocessing step to direct the bidirectional pins.

1.6.6 Pseudo system clock operation

After the scan chains have been loaded, some portion of MSP needs to be executed in single or multiple clocks during prototype debugging. JTAG controller generates two non overlapping clocks, *jsca, jscb* which will be muxed internally with the two system clocks, *clk1, clk2*. The main difference from the

961008 IMS normal mode is clock source. In this mode, the clocks are coming from the JTAG controller instead of from system clock. It is called pseudo system clock. The clocks from the output of the muxes affect the system operation. Currently, the pseudo system clock is hooked up to the IDC block only. While the clocks are applied, other system clocks are frozen.

In this mode, you can apply JTAG generated clocks for the duration of user specified number of clock cycles. However, clock counting is not implemented inside the JTAG controller. It is provided through a proTEST-PC and AVL (see the section on "hardware test environment").

1.7 Signal overview in the test modes

Figure 3:
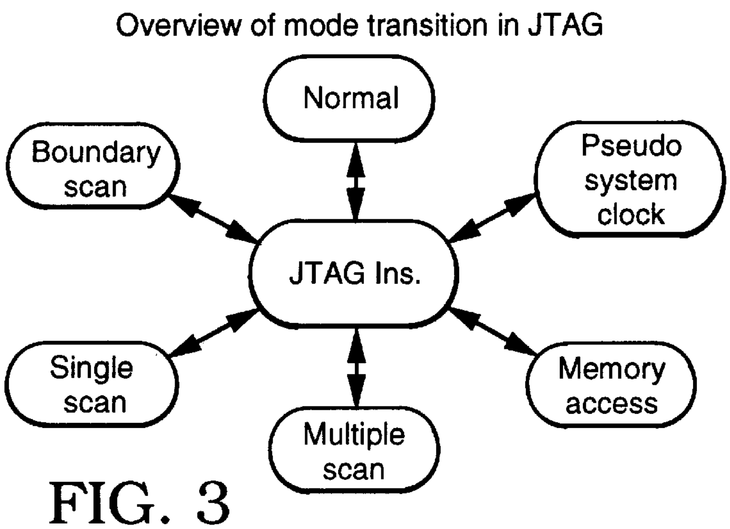
FIG. 3 illustrates modes that can be entered via JTAG instructions in the circuit of FIG. 1.

The overview diagram is shown in figure 3. All six different modes can be entered through the JTAG instructions. This means there are no dedicated I/O pins to switch back and forth between the modes. A JTAG instruction should be loaded first before you go to the desired mode.

Figure 4:
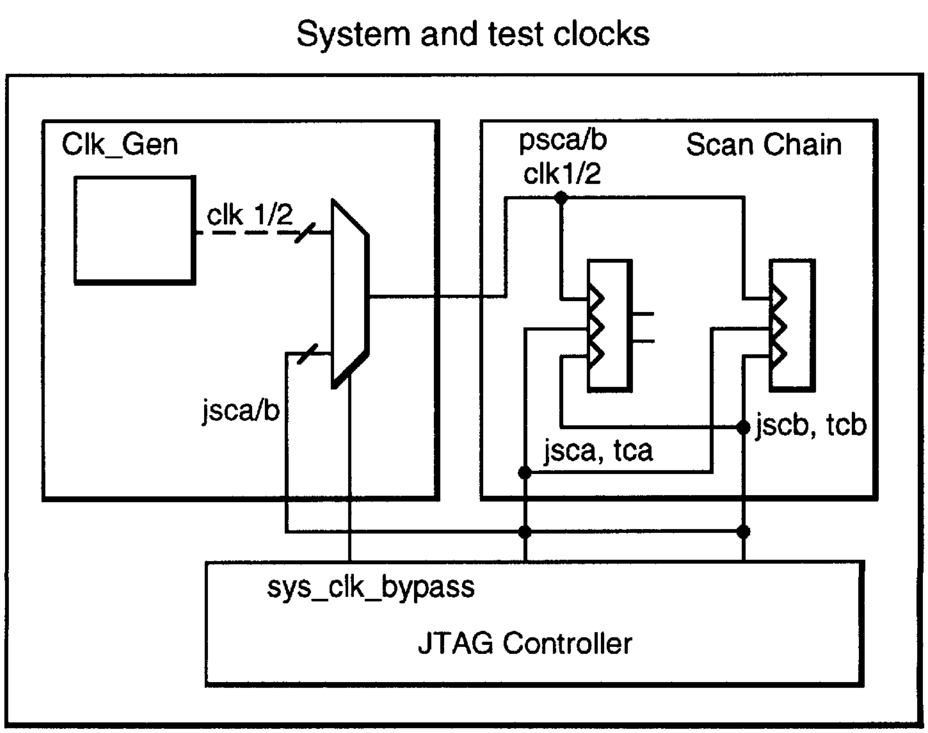
FIG. 4 is a block diagram of testing circuitry according to the present invention.

Table 1 shows the general picture of the important signals in the six different modes. Three kinds of clocks, system clock, scan clock, and pseudo system clock, are used to support the different test modes. The view of the clocks in MSP are shown in figure 4. System clock refers to the two non overlapping clocks, *clk1* and *clk2*, which are derived from system clock. One of those will be connected to the normal clock port of scan flipflops and scan latches depending on the application.

Scan clock is two non overlapping clocks for scan operation, which will be connected to scan clock ports for every scan flipflops and scan latches. The scan clocks are generated by either JTAG controller or MSP input pads, *tca* and *tcb*. They will be selected appropriately depending on the test modes. In the single scan mode, two scan clocks, *jsca*, *jscb* are pulsed to a selected functional block and two clock ports, *tca*, *tcb* stay at logic *0*. In the multiple scan mode, *jsca* and *jscb* stay at logic *0* and *tca* and *tcb* are enabled.

Pseudo system clock is also two non overlapping clocks which are generated by JTAG controller. They are the same signals as scan clocks, *jsca* and *jscb*. However they are going to a different place at this time, which is the normal clock port instead of scan clock port. Notice that the single scan and pseudo system clock modes are not supposed to happen at the same time. The clock is named as pseudo system clock because they are used for system execution rather than scan operation. The clocks will be denoted as *psca*, *pscb*.

Functional block in table 1 refers to any hardware module in MSP design. It could be multiplier, FALU etc. Memory blocks are either IDC or register file. Input pins refer to MSP input or inout pads except JTAG input pins. Output pins refer to MSP output or inout pads except TDO pin.

961008 (MS)

TABLE 1

General picture of MSP in test modes

| Classification | Modes | System clock (clk1/2) | Scan clock (jsca/b. tca/b) | Pseudo system clock (psca/b) | Functional blocks | Memory blocks | Input pins | Output pins |
|---|---|---|---|---|---|---|---|---|
| NORMAL | Normal | Active | Inactive. Inactive | Inactive | Normal | Normal | Used | Used |
| TEST MODE | Boundary scan | Inactive | Inactive. Inactive | Inactive | Frozen | Frozen | Boundary scan | Boundary scan |
| | Single scan | Inactive | Active. Inactive | Inactive | A block scanned | Frozen | Not used | Not used |
| | Memory test | Inactive | Inactive. Inactive | Active | Frozen | Normal | Not used | Not used |
| | Multiple scan | Inactive | Inactive. Active | Inactive | Multiple scanned | Frozen | Shared SI pins | Shared SO pins |
| | Pseudo sys clock | Inactive | Inactive. Inactive | Active | Frozen | Normal | Boundary scan | Boundary scan |

In the normal mode, the system clocks, *clk1, clk2* are pulsed, which basically executes the MSP as stated in the MSP specification. Scan clocks, *sca* and *scb* should not be active (sca = 0, scb = 0). If they are active, the scan flipflops and latches in the MSP go to unknown states. Pseudo system clock is inactive. So that the clocks which are carried to all sequential elements are coming from the system clock pin, *mclk*, instead of JTAG controller. All the test logic should not affect the normal functionality.

In the boundary scan mode, no clock is active. The boundary scan chains are shifting values via JTAG generated clocks. All functional blocks are freezing their states during scan operation.

In the single scan mode, only one block can be selected and scanned in or out using scan clocks. During this period, only five JTAG pins are accessed. Other I/O pins are not significant. For the same reason in normal mode, the system clock should not be active. All memory write should be disabled during this period.

In the memory test, the pseudo system clock is used for memory read and write operations. Input and outputs are not significant in this mode too since all data to be processed are in scan chain in the memory block. All the memory controls are steered by the memory control register which resides in JTAG control logic.

Multiple scan mode uses the scan clock which are coming from input pads, tca and tcb. The ten scan input ports and ten scan output ports are used to supply scan data instead of the JTAG port, TDI.

Pseudo normal mode uses the clock from JTAG to execute the MSP. In this mode the boundary scan cells at MSP I/O are not transparent but in intest mode. So that the input is steady in this mode.

1.8 Clock control scheme via JTAG controller

Clock control scheme is incorporated to help the prototype debugging. The scheme implements clock stop, clock generation on demand, and clock restart. For the control signals, refer to special control registers in 1.10.4. Please refer to the clock specification for MSP clocks.

Clock stop: when clock stop request is made from JTAG controller to clock generator, the clocks to MSP, system clock, pci clock, and codec clocks stops at the first rising edge of each clock after clock stop request is made.

Clock stop request is made in two different ways. The first simple way is to issue the request regardless of the system state. The second way is to request after MSP is ready to stop clocks. JTAG controller broadcasts the clock shutdown notice to MSP and make stop request to clock generator after it recognizes the idle status from MSP. Currently, only vector core is implemented to issue its idle status to JTAG controller.

Clock generation on demand: Any number of clock cycles up to 1024 may be requested to clock generator through control register in JTAG controller. The number of clocks are for the system clock. Other clocks are generated in ratio with the system clock. The clocks which are generated on demand are the same as the original clocks. The request is made after the clocks are stopped.

Clock restart: when clock restart is requested, all the clocks start after the first rising edge of the clocks.

1.9 Global Reset Operation

System reset can be performed using the scan chains embedded in MSP chip. In this operation, the master reset signal goes low (*active low*) and remains there for the duration of reset operation.

Since the JTAG clock, TCK is not running in the normal operation, the system clock should be used to shift data into scan chains. Because the TCK is not running at this time, this can not be considered as one of JTAG instructions.

The functionality of this scheme is that when the master reset is low, the logic "0" value is shifted to all scan ff/latches. The conditions to be satisfied in reset operation are listed below.

- The system clocks "clk1" and "clk2", and all other clocks which affect the scan ff/latches need to be disabled (clk1 = 0, clk2 = 0). This guarantees that only one kind of clock, which is scan clock, is applied to the scan ff/latches. This requires adding control logic to clock ports.

P:\DMS\... 961008 (MS)

- The system clock is used to generate the scan clocks, sca, scb. Since the scan operation need to be very slow, normal free running clock should not be used. The system clock will be divided by 2.
- The master reset should be low enough to shift the reset value to scan ff/latches. The failure of not satisfying it will cause improper operation.

This operation has been implemented inside the JTAG controller section. ~~However, it is not decided yet if MSP is going to implement this operation.~~

1.10 JTAG Design Details

This section describes MSP JTAG design issues, instructions, and their codes which are available. All the functionalities described in the previous sections can be achieved using the instructions described in this section.

The instruction decoder in JTAG controller was designed for ~~a~~ possible 38 custom instructions. Currently 1 instruction is reserved for a future application. Out of 36, 17 instructions have an associated internal data register.

Serial output of each data register and an instruction register is muxed and connected to the TDO pin. When selected, by an instruction, data from the TDI pin can be serially shifted through the selected data register, or the instruction register, and observed at the TDO pin.

In all JTAG circuits, MSB is the leftmost ~~left most~~ bit and the typical signal name looks like this "DATA[N:0]". When integrating with other circuits this standard should be followed, for correct signal interconnections.

1.10.1 Requirements

The following items must be satisfied for JTAG controller to properly operate.

- Input pins: TDI and TMS input pins must have an onchip pull-up register. If these pins are left unconnected by the user, JTAG controller inputs are still logic high. All JTAG input pins must be connected logic high or low level under all operating conditions, for proper operation of the JTAG controller.
- Clock skew: Boundary scan register being about 270 bit long clock drivers should be designed and laid out such that there is minimum skew between bit 0 clock input and bit 270 clock input. JTAG controller is designed to work up to clock frequency of 40 Mhz maximum.
- Clock condition: the clocks conditions to be observed during internal scan operation are listed below.
  1. The clocks going to the normal clock port in scan latches have to be disabled.
  2. The clocks going to the normal clock port in scan flipflops have to be disabled.

1.10.2 Internal scan chains in MSP

The internal scan chains for JTAG controller are organized by functional block unit for effective chip debugging purposes. All internal scan chains are listed in table 2. The current scan chain partition does not affect the final testing time during production because the scan chains will be reorganized for production test purposes based on the number of scan cells in a chain. However it does affect the way MSP chip is debugged.

961008 (MS)

TABLE 2
Scan chains for MSP

| Number | MSP Blocks in a chain | Number of scan cells (As of 6/21) | Comment |
|---|---|---|---|
| 1 | register file | 288 | LSSD scan ff chain |
| 2 | idc | 602 | LSSD scan ff chain |
| 3 | ifu,<br>exe, issue,<br>decode | ?<br>759<br>4 | LSSD scan ff chain |
| 4 | ehu,<br>lsu cntl,<br>lsu address dp,<br>aiu | 183<br>321<br>154<br>323 | LSSD scan ff chain |
| 5 | pci,<br>dma, asic i/f | ?<br>454 | LSSD scan ff chain |
| 6 | mcu,<br>fbus arb,<br>ccu cntl, ccu sm | 293<br>26<br>354 | LSSD scan ff chain |
| 7 | bp,<br>bp dp,<br>ad1843,<br>ks119 | 159<br>449<br>132<br>277 | LSSD scan ff chain |
| 8 | i/o peri, i/o ccu i/f | ? | LSSD scan ff chain |
| 9 | falu | 1872 | LSSD scan ff chain |
| 10 | exe dp | 864 | LSSD scan ff chain |
| 11 | multiplier | 1024 | LSSD scan ff chain |
| 12 | ifu dp,<br>dma dp | 160<br>976 | LSSD scan ff chain |
| 13 | isu_rd dp, isu_wr dp | 998 | LSSD scan ff chain |
| 14 | ccu data dp,<br>ccu addr dp | 1024<br>154 | LSSD scan ff chain |
| 15 | mcu dp | 1027 | LSSD scan ff chain |
| 16 | pci dp | 434 | LSSD scan ff chain |
| 17 | ad 1843 dp,<br>ks 119 dp,<br>ehu dp | 160<br>144<br>864 | LSSD scan ff chain |
| 18 | msp bs | 270 | boundary scan |
| 19 | arm7 bs | 124 | boundary scan |

P:\DMS\7\24\M-44-3_0-4371.63.02
961008 (MS)

1.10.3 JTAG Instructions

JTAG instructions are described in tables 4 through 10. They are classified based on the JTAG operation classes discussed in the section of classified JTAG operations. "Test name" is the name of each instruction and imposes its application. The instruction code has to be shifted into the instruction register in the JTAG controller before accessing a specific data register. Register selected shows the data register which can be accessed in each instruction.

Table 4 shows the instructions for boundary scan in MSP. Eight of them are for MSP boundary scan chain. They select either MSP boundary scan chain or bypass register depending on their application. When boundary scan chain is selected, vectors can be loaded into the scan chain. Otherwise, MSP boundary scan is not accessible.

Three instructions in table 4 are for the ARM7 boundary scan chain. They select the ARM7 boundary scan chain.

TABLE 3

Boundary scan cell and clock control

| Test Name | MSP Mode _I | MSP Mode _O | MSP Mode _C | ARM7 Mode _I | ARM7 Mode _O | MSP_bs_ disable | MCR disable | OCR disable | ARM7_bs_ disable | sys_clk_ bypass |
|---|---|---|---|---|---|---|---|---|---|---|
| normal | 0 | 0 | 0 | 0 | 0 | 0 | 0 | 0 | 0 | 1 |
| bypass | 0 | 0 | 0 | 0 | 0 | 0 | 0 | 0 | 0 | 1 |
| extest | 0 | 1 | 1 | 0 | 0 | 1 | 0 | 0 | 0 | 1 |
| sam/pre | 0 | 0 | 0 | 0 | 0 | 1 | 0 | 0 | 0 | 1 |
| intest | 1 | 1 | 1 | 0 | 1 | 1 | 0 | 0 | 0 | 0 |
| clamp | 1 | 1 | 1 | 0 | 0 | 0 | 0 | 0 | 0 | 0 |
| highz | 1 | 1 | 1 | 0 | 0 | 0 | 0 | 0 | 0 | 0 |
| vp sam/pre | 0 | 0 | 0 | 1 | 1 | 1 | 0 | 0 | 0 | 0 |
| MSP boun. | 1 | 1 | 1 | 0 | 0 | 1 | 0 | 0 | 0 | 1 |

F:\DMS\...M-44... 961008 (MS:

| Test Name | MSP Mode _I | MSP Mode _O | MSP Mode _C | ARM7 Mode _I | ARM7 Mode _O | MSP_bs_ disable | MCR disable | OCR disable | ARM7_bs_ disable | sys_clk_ bypass |
|---|---|---|---|---|---|---|---|---|---|---|
| arm7 intest | 1 | 1 | 1 | 1 | 1 | 0 | 0 | 0 | 1 | 0 |
| arm7 extest | 1 | 1 | 1 | 0 | 1 | 0 | 0 | 0 | 1 | 0 |
| arm7 sam/pr | 1 | 1 | 1 | 0 | 0 | 0 | 0 | 0 | 1 | 0 |
| bist | 1 | 1 | 1 | 0 | 1 | 0 | 0 | 0 | 0 | 0 |
| gbist | 1 | 0 | 1 | 0 | 0 | 1 | 0 | 0 | 0 | 0 |
| mult scan | 0 | 0 | 0 | 0 | 0 | 0 | 0 | 0 | 0 | 0 |
| single scans in table 5 | 1 | 1 | 1 | 0 | 0 | 0 | 0 | 0 | 0 | 0 |
| MCR/ BIST1 | 0 | 0 | 0 | 0 | 0 | 0 | 1 | 0 | 0 | 1 |
| MCR/ BIST2 | 0 | 0 | 0 | 0 | 0 | 0 | 1 | 0 | 0 | 1 |
| MCR/ BIST3 | 1 | 1 | 1 | 1 | 1 | 0 | 1 | 0 | 0 | 0 |
| MCR/ BIST4 | 1 | 1 | 1 | 1 | 1 | 0 | 1 | 0 | 0 | 0 |
| Monitor | 0 | 0 | 0 | 0 | 0 | 0 | 0 | 1 | 0 | 1 |

Table 3 shows the control signals for boundary scan cell and system clock bypass signal. There are four mode signals to control two boundary scan chains for MSP and ARM7, which are itemized below. Please refer to the table of JTAG I/O signals in the next section for the explanation of other control signals, MSP_bs_disable, ARM7_bs_disable, and sys_clk_bypass.

- MSP Mode_I: MSP boundary scan input cell mode signal
- MSP Mode_O: MSP boundary scan output cell mode signal
- MSP Mode_C: MSP boundary scan control cell mode signal
- ARM7 Mode_I: ARM7 boundary scan input cell mode signal

- ARM7 Mode_O: ARM7 boundary scan output cell mode signal

When a mode signal is low, the boundary scan cell becomes transparent to take inputs from normal input ports. When it is high, the output of boundary scan cells depends on the update latch in the boundary scan cell. (Please refer to the KGL75 data book for the details about boundary scan cells).

Table 5 shows internal scan chains for all functional blocks which can be accessed via JTAG controller. There is only one instruction for multiple scan mode in table 6.

The table 7 shows the memory access instructions. Three memories in IDC block can be controlled by JTAG controller. Data RAM and register file have their own instructions. Vd RAM and Tag RAM are accessed simultaneously. There is one more instruction available for future. It could be for ROM or another embedded RAM. MCR is memory control register which is located in JTAG controller.

Table 8 shows the default instruction when system is powered up. Table 9 shows the instruction for generating pseudo system clock which is actually coming from the JTAG pin TCK rather than the system clock. Thus you can control the number of clock cycles via the JTAG interface. Table 10 shows the available instructions for future application.

961008 (MS:

TABLE 4

Boundary scan instructions

| Number | Test Name | Instruction Code | Comment | Register Selected |
|---|---|---|---|---|
| | | M L<br>S S<br>B B | | |
| 1 | Bypass | 111111(3f) | Mandatory test/code | Bypass Reg. |
| 2 | Extest | 000000(00) | Mandatory test/code | MSP BS |
| 3 | Sample/ Preload | 000001(01) | Mandatory test/user defined code | MSP BS |
| 4 | Intest | 000010(02) | Optional, user defined code | MSP BS |
| 5 | Clamp | 000011(03) | Optional, user defined code | Bypass Reg. |
| 6 | HighZ | 000100(04) | Optional, user defined code | Bypass Reg. |
| 7 | VP sample/ preload | 111011(3B) | Custom | MSP BS |
| 8 | SDRAM | 110110(3C) | Custom | SDRAM interface portion of MSP BS |
| 9 | ARM7 sample/ preload | 111001(39) | Custom | ARM7 |
| 10 | ARM7 extest | 111000(38) | Custom | ARM7 |
| 11 | ARM7 intest/BIST | 110010(32) | Custom | ARM7 |

P:\DMS\774\M-4415_U\0191163.01
961008 (MS)

TABLE 5

Single Internal Scan Instructions

| Number | Test Name | Instruction Code | Comment | Register Selected |
|---|---|---|---|---|
| 12 | chain_idc | 100000(20) | Custom | idc |
| 13 | chain_falu | 100101(25) | Custom | falu |
| 14 | chain_mul | 100110(26) | Custom | multiplier |
| 15 | chain_ifu | 100111(27) | Custom | ifu, exe, issue, decode |
| 16 | chain_lsu | 101000(28) | Custom | ehu, lsu cntl, lsu add dp, aiu |
| 17 | chain_mcu | 101001(29) | Custom | mcu, fbus arb, ccu cntl, ccu sm |
| 18 | chain_pci | 101010(2a) | Custom | pci, dma, ad1843, ks1 19 |
| 19 | chain_ifudp | 101011(2b) | Custom | ifu dp, dma dp |
| 20 | chain_lsudp | 101100(2c) | Custom | lsu rd dp, lsu wr dp |
| 21 | chain_ccudp | 101101(2d) | Custom | ccu data dp, ccu addr dp |
| 22 | chain_mcudp | 101110(2e) | Custom | mcu dp |
| 23 | chain_pcidp | 101111(2f) | Custom | pci dp, fbus, i/o bus |
| 24 | chain_bp | 110000(30) | Custom | bp, bp dp, ad1843, ks 119 |
| 25 | chain_codp | 110001(31) | Custom | ad 1843 dp, ks 119 dp |
| 26 | chain_exedp | 110011(33) | Custom | exe dp |
| 27 | chain_io | 110101(35) | Custom | i/o peri, i/o ccu i/f |
| 28 | chain_rf | 110111(37) | Custom | register file |

961008 (MS)

TABLE 6

Multiple scan instruction

| Number | Test Name | Instruction Code | Comment | Register Selected |
|---|---|---|---|---|
| 29 | Multiple scan chain | 110100(34) | Custom | Bypass Reg. |

TABLE 7

Memory access instruction

| Number | Test Name | Instruction Code | Comment | Register Selected |
|---|---|---|---|---|
| 30 | MCR/BIST 1 | 100001(21) | Custom/Intest | MCR |
| 31 | MCR/BIST 2 | 100010(22) | Custom/Intest | MCR |
| 32 | MCR/BIST 3 | 100011(23) | Custom/Intest | MCR |
| 33 | MCR/BIST 4 | 100100(24) | Custom/Intest | MCR |

TABLE 8

Powerup instruction

| Number | Test Name | Instruction Code | Comment | Register Selected |
|---|---|---|---|---|
| 34 | Powerup | 11110(3d) | Custom | Bypass Reg. |

TABLE 9

Pseudo system clock generation instruction

| Number | Test Name | Instruction Code | Comment | Register Selected |
|---|---|---|---|---|
| 35 | BIST | 000101(05) | Optional, user defined code | Bypass Reg. |
| 36 | GBIST | 111010(3a) | Optional, user defined code | MSP BS Reg. |

961008 (MS)

TABLE 10

JTAG instruction class for monitoring system behavior

| Number | Test Name | Instruction Code | Comment | Register Selected |
|---|---|---|---|---|
| 37 | Monitor | 111100(3c) | Custom | OCR |

TABLE 11

JTAG instruction class for future application

| Number | Test Name | Instruction Code | Comment | Register Selected |
|---|---|---|---|---|
| 38 | Available for Future | 111110(3e) | Custom | Bypass Reg. |

1.10.4 Special Control Registers

There are two special registers which are controlled by JTAG controller. They are used to control the internal logic or observe the status of the MSP system. The names are MCR (Mode Control Register) and OCR (Observation Control Register). The control signals for each control register are shown below.

TABLE 12

Contents of MCR

| Number | Control Signal | Comments |
|---|---|---|
| 1 | clk_cnt_0 | clock count 0 bit |
| 2 | clk_cnt_1 | clock count 1 bit |
| 3 | clk_cnt_2 | clock count 2 bit |
| 4 | clk_cnt_3 | clock count 3 bit |
| 5 | clk_cnt_4 | clock count 4 bit |
| 6 | clk_cnt_5 | clock count 5 bit |
| 7 | clk_cnt_6 | clock count 6 bit |
| 8 | clk_cnt_7 | clock count 7 bit |
| 9 | clk_cnt_8 | clock count 8 bit |
| 10 | clk_cnt_9 | clock count 9 bit |

F:\DMS\7 14 M 44 9_0 ...

961008 (MS)

| Number | Control Signal | Comments |
|---|---|---|
| 11 | sys_clk_bypass | All clocks in MSP are bypassed |
| 12 | clk_jtag_cntl | JTAG will control clocks for test clocks |
| 13 | jtag_ack | JTAG acknowledges the signal from clock generator |
| 14 | jtag_clk_stop_re q | JTAG wants to stop clock. This is for handshaking between JTAG and core blocks. |
| 15 | cnt_start | Start to generate the system clocks. |
| 16 | start_sdram_acce ss | SDRAM accces signals are generated from JTAG controlled SDRAM access sub-module. |
| 17 | em_status | Emulation status. Hooked up to EHU block |
| 18 | jtag_rf_cs | rf cex |
| 19 | mem_data_we | Data RAM write enable, rf we1, rf we2 |
| 20 | mem_vt_we | VD and Tag RAM write enable |
| 21 | mem_add_u/d | Address counter up/down indicator |
| 22 | mem_add_cnt | Address counter count enable |
| 23 | mem_add_reset | Address counter reset signal |
| 24 | mem_add_set | Address counter set signal |
| 25 | mem_vclear | Vclear in SRAM |
| 26 | mem_data_cs | Data RAM select |
| 27 | mem_vt_cs | Vd and Tag RAM select |
| 28 | mem_compare | Compare latch enable |
| 29 | mem_hwd | Hold write data enable in the write register in SRAM |
| 30 | vt_ram_test_en | Vd and Tag RAM test enable |
| 31 | data_ram_test_en | Data RAM test enable |
| 32 | reg_file_test_en | Register file test enable |
| 33 | future slot | |
| 34 | mode_sig_control | Mode signal is controlled from MCR |
| 35 | arm_i_mode | Mode signal for ARM7 input boundary scan |

961008 (MS:

| Number | Control Signal | Comments |
|---|---|---|
| 36 | arm_o_mode | Mode signal for ARM7 output boundary scan |
| 37 | msp_i_mode | Mode signal for MSP input boundary scan |
| 38 | msp_o_mode | Mode signal for MSP for output boundary scan |
| 39 | msp_c_mode | Mode signal for MSP control boundary scan |
| 40 | jtag_sdram_norm | Notify MCU to use SDRAM |

TABLE 13

Contents of OCR

| Number | Control Signal | Comments |
|---|---|---|
| 1 | vp_idle | VP is in IDLE state |
| 2 | req_acom | the request to clock generator has been accomplished |
| 3 | md0 | sdram data bit 0 |
| 4 | md1 | sdram data bit 1 |
| 5 | md2 | sdram data bit 2 |
| 6 | md3 | sdram data bit 3 |
| 7 | md4 | sdram data bit 4 |
| 8 | md5 | sdram data bit 5 |
| 9 | md6 | sdram data bit 6 |
| 10 | md7 | sdram data bit 7 |
| 11 | md8 | sdram data bit 8 |
| 12 | md9 | sdram data bit 9 |
| 13 | md10 | sdram data bit 10 |
| 14 | md11 | sdram data bit 11 |
| 15 | md12 | sdram data bit 12 |
| 16 | md13 | sdram data bit 13 |
| 17 | md14 | sdram data bit 14 |
| 18 | md15 | sdram data bit 15 |

P:\DMS\7714\M-4415_U\0191163.01
961008 (MS:

| Number | Control Signal | Comments |
|---|---|---|
| 19 | md16 | sdram data bit 16 |
| 20 | md17 | sdram data bit 17 |
| 21 | md18 | sdram data bit 18 |
| 22 | md19 | sdram data bit 19 |
| 23 | md20 | sdram data bit 20 |
| 24 | md21 | sdram data bit 21 |
| 25 | md22 | sdram data bit 22 |
| 26 | md23 | sdram data bit 23 |
| 27 | md24 | sdram data bit 24 |
| 28 | md25 | sdram data bit 25 |
| 29 | md26 | sdram data bit 26 |
| 30 | md27 | sdram data bit 27 |
| 31 | md28 | sdram data bit 28 |
| 32 | md29 | sdram data bit 29 |
| 33 | md30 | sdram data bit 30 |
| 34 | md31 | sdram data bit 31 |
| 35 | md32 | sdram data bit 32 |
| 36 | md33 | sdram data bit 33 |
| 37 | md34 | sdram data bit 34 |
| 38 | md34 | sdram data bit 34 |
| 39 | md35 | sdram data bit 35 |
| 40 | md36 | sdram data bit 36 |
| 41 | md37 | sdram data bit 37 |
| 42 | md38 | sdram data bit 38 |
| 43 | md39 | sdram data bit 39 |
| 44 | md40 | sdram data bit 40 |
| 45 | md41 | sdram data bit 41 |
| 46 | md42 | sdram data bit 42 |
| 47 | md43 | sdram data bit 43 |
| 48 | md44 | sdram data bit 44 |

961008 (MS:

| Number | Control Signal | Comments |
|---|---|---|
| 49 | md45 | sdram data bit 45 |
| 50 | md46 | sdram data bit 46 |
| 51 | md47 | sdram data bit 47 |
| 52 | md48 | sdram data bit 48 |
| 53 | md49 | sdram data bit 49 |
| 54 | md50 | sdram data bit 50 |
| 55 | md51 | sdram data bit 51 |
| 56 | md52 | sdram data bit 52 |
| 57 | md53 | sdram data bit 53 |
| 58 | md54 | sdram data bit 54 |
| 59 | md55 | sdram data bit 55 |
| 60 | md56 | sdram data bit 56 |
| 61 | md57 | sdram data bit 57 |
| 62 | md58 | sdram data bit 58 |
| 63 | md59 | sdram data bit 59 |
| 64 | md60 | sdram data bit 60 |
| 65 | md61 | sdram data bit 61 |
| 66 | mcu_idle | MCU is in idle |
| 67 | | available for future |
| 68 | | available for future |
| 69 | | available for future |
| 70 | | available for future |

1.10.5 Test scenarios using JTAG instructions

1.10.5.1 Debugging steps

A debugging process of MSP will involve taking a couple of steps, which are predefined and will be repeated. The brief steps to follow are described below. This is how to use the JTAG instructions during the procedure.

- Step 0: Issue clock stop request: when you want to stop the clock for any reason while MSP is executing its operations, the clock stop flag needs to be issued first. It is issued through JTAG control logic. Then the flag is broadcast to every necessary functional block. JTAG instructions MCR/BIST1 or MCR/BIST2 can be used to issue the signal.
- Step 1: Observing internal state: the next step is to know when to step into the JTAG controlled modes from the normal mode. In this mode, the internal state can be observed through OCR (Observation Control Register). The clock stop will not be activated until JTAG observes all signals from all the functional blocks. While MSP is executing its operations, the states can be observed through the TDO pin. The instuction to be used is *monitor*.
- Step 2: Stopping the clocks: since the necessary states have been observed, you can stop all types of clocks when the system is idle. Clock stop is required to be able to scan the appropriate scan registers. You can selectively stop the clocks depending on how you set up the values in MCR. You should not scan the cell for the blocks for which normal clock is running. The clock stop signal is being issued while MSP is running with system clock. Any of the four instructions, MCR/BIST1, MCR/BIST2, MCR/BIST3, and MCR/BIST4 can be used to issue the clock stop signal. MCR/BIST1 and MCR/BIST2 can issue the signals while boundary scan cells are in transparent mode. The others can issue the clock stop signals while all input signals are blocked.
- Step 3: Scanning the internal states: now, every clock is bypassed, so that there are no free

P:\DMS\7714\M-4445_-\--71163.01
961008 (MS:

running clocks. You can scan the appropriate blocks. You can use instructions 9-10 to scan the boundary of ARM7 blocks. The instructions 12 through 28 can be used to scan the functional blocks. Instructions 35 and 36 can be used to generate the fast clocks, which are coming from TCK. Before the clocks are restarted, you want to take the necessary setup in MSP. For instance you need to take care of the state machine of generating the half clocks like ARM clock.

- Step 4: Restarting the clocks: now the system clock can be restarted by setting the values in MCR. The same instructions as in step 2 can be used in this step. Before starting clocks again, the clock stop flag will be reset to logic "0".

1.10.5.2 Manufacturing test operation

The manufacturing test mode can be entered using multiple scan instruction. Once decoded for this mode, the MSP is configured as follows.

- 10 bidirectional pins are configured as input ports
- 10 bidirectional pins are configured as output ports
- 1 bidirectional pin is configured as an input port of clk1
- 1 bidirectional pin is configured as an input port of clk2
- 1 bidirectional pin is configured as an input port of scan_mode
- The other bidirectional pins are controlled as in the normal mode
- The ARM7 clock, which is same as I/O clocks is applied as the clk2
- PCI clocks use the clk1, clk2

961008 :MS:

- The scan clocks are generated by the two input pins, tca, tcb
- All codec clocks are supplied from codec clock ports.

1.10.5.3 ARM7 execution

ARM7 is executed using the ARM7 intest instruction. The ARM7 boundary scan cells are not transparent. The input and output of ARM7 are applied and observed through the boundary scan chain.

The clock is generated from TCK to speed up the clock application. The three inputs, prog32, data32, and bigend are required to change its signal when mclk is high. To achieve it, the update signal is separate from the update signals of other boundary scan cells.

It should be noted that the mclk is shared with the I/O clock. Once the clock of ARM7 is trigered the state of the other blocks can be changing.

1.10.5.4 Cache and register file access

Load the MCR/BIST4 instruction, which selects the MCR as data register and blocks the input and output signals. The bist clock is generated in this mode to speed up the operations. By controlling the MCR, the read and write can be performed.

The clocks which go to cache and register file are muxed with test clock. The memory operation should not disturb the state in other logic blocks.

1.10.5.5 Vector only execution

Vector only execution requires considering the output of ARM7 block as the input of VP blocks. Use ARM7 boundary scan access instructions to do it.

1.10.5.6 Intest and Extest

Use intest and extest instructions.

961008 (MS)

1.10.6 JTAG interface signals

TABLE 14

JTAG controller I/O Signals

| Signal Name | Description |
|---|---|
| | **JTAG input signals** |
| **sdram_clk** | Same clock as the clock going to SDRAM |
| **rasb** | RAS signal coming from the boundary scan chain |
| **sdram_data[31:0]** | Data coming from SDRAM through boundary scan |
| **trst_n** | JTAG standard pin. Connected to test logic reset pin in MSP, *TRSTL*. During normal operation, this signal is always high. Should have an onchip pull-up register. Please refer to the IEEE Std. 1149.1 for more information. |
| **tdi** | JTAG standard pin. Connected to *TDI* pin in MSP. Used for supplying test data for JTAG. During normal operation, this signal is always high. Should have an onchip pull-up register. Please refer to the IEEE Std. 1149.1 for more information. |
| **tck** | JTAG standard pin. 20 MHZ operation. Connected to *TCK* pin in MSP. Used for operating JTAG controller and creating the two non-overlapping scan clocks for functional blocks in MSP. During normal operation, this is always low. Please refer to the IEEE Std. 1149.1 for more information. |
| **tms** | JTAG standard pin. Connected to TMS pin in MSP. Used for test mode selection in JTAG controller. During normal operation, this is always high. Should have an onchip pull-up register. Please refer to the IEEE Std. 1149.1 for more information. |
| **tca** | Test phase 1 clock. Connected to TCA pin in MSP. Used for supplying the phase 1 clock to every data register in MSP during multiple scan chain operation. This is always low in normal operation. Should have an onchip pull-down register. |

P:\DMS\7714\M-4415_U\0191163.01
961008 (MS:

| Signal Name | Description |
|---|---|
| **tcb** | Test phase 2 clock. Connected to TCB pin in MSP. Used for supplying the phase 2 clock to every data register in MSP during multiple scan chain operation. This is always low in normal operation. Should have an onchip pull-down register. |
| **sysclk** | System clock. Connected to system clock pin in MSP. This clock will be divided by 2 internally to create two non-overlapping clocks which go to every data register in MSP during system reset operation. **Note: The reset function is not going to be implemented for MSP-1E.** |
| **sysreset_n** | System reset signal. Connected to system reset pin in MSR, *RSTL*. Used for the reset operation using scan operation. This signal should be guaranteed to stay low during reset operation. **The period will be determined after the longest scan chain in MSP is determined. This signal will be tied to VDD in test chip** |
| **mult_in_*1*, ...** ~ **mult_in_17** | Input signals for re-routing in the multiple scan mode. Connected to either multiple scan input pins in MSP, *ad06_si0, ad07_si1, ad08_si2, ad09_si3, ad10_si4, ad11_si5, ad12_si6, ad13_si7, ad14_si8, ad15_si9*, or the scan outputs port of functional blocks. **The re-routing will be determined after all the scan lengths in functional blocks are fixed.** |
| **bn_scan_out** | Scan output signals from "*bn*", which is the input to JTAG controller. *bn* is defined at the bottom. |
| **bsr_scan_out** | Scan output signal from MSP boundary scan chain. |
| **arm7_scan_out** | Scan output signal from ARM7 boundary scan chain. |
| **dbsr_scan_out** | Scan output signal from MSP boundary scan chain for SDRAM access. |
| **mult_clk1** | Serve as normal phase 1 clock in the multiple scan mode. It is same as phase 1 system clock. The clock is hooked up to bi-di pin "AD05_MT5". |

P:\DMS\7714\M-4415_J\0191163.01
961008 (MS:

| Signal Name | Description |
|---|---|
| **mult_clk2** | Serve as normal phase 2 clock in the multiple scan mode. It is same as phase 2 system clock. The clock is hooked up to bi-di pin "AD04_MT4". |
| **mult_scan_mode** | Scan mode signal in the multiple scan mode. It is hooked up to bi-directional pin "AD03_MT3". |
| **por_n** | Power up reset signal. If there is no power up signal, tie this to VDD. Whenever MSP is powered up, the JTAG logic is also reset. |
| **JTAG input signals For OCR register** | |
| **vp_idle** | VP is in IDLE state, OCR[0] |
| **req_acom** | the request to clock generator has been accomplished, OCR[1] |
| **ocr_in[34-39]** | Signals from the core logic. The core logic signals can be monitored using JTAG controller by assigning to one of these bits. The signal assignment list can be found in the section of "special control registers". |
| **JTAG Output Signals** | |
| **sdram_bs_csn** | SDRAM chip selection. |
| **tdo** | JTAG standard pin. Connected to *TDO* pin in MSP. It is the primary port to observe test data output. Please refer to the IEEE Std. 1149.1 for more information. |
| **rti** | Run test idle state |
| ***bn*_sclka** | Phase 1 clock for scan operation. Connected to the phase 1 clock port in block "*bn*". This clock is derived from the TCK clock. *bn* is defined at the bottom of this table. |
| ***bn*_sclkb** | Phase 2 clock for scan operation. Connected to the phase 2 clock port in block "*bn*". This clock is derived from the TCK clock. *bn* is defined at the bottom of this table. |
| **sys_clk_bypass** | This is obsolete |
| **scan_test_mode** | System is in scan operation when it is high. Connected to every scan_test_mode port in every functional block. Every illegal behavior will be disabled in the scan mode using this signal. |

P:\DMS\7714\M-4415_U\0191163.01
961008 (MS:

| Signal Name | Description |
|---|---|
| *bn_scan_in* | Scan input signals for blocks *bn*. Used in JTAG scan operation and originally coming from the *TDI* pin in MSP. *bn* is defined at the bottom of this table. |
| **bist_mb1_clk1o** | BIST phase 1 clock. Connected to the *bist_clk1* port in *Clock_Gen* block. It is derived from TCK clock. This signal is different from *bn_sclka* in a sense that this is applied to the normal clock port instead of scan clock ports in the LSSD flipflops and latches. This can be generated only when the instruction MCR/BIST1 is selected and JTAG is in run-test/idle. |
| **bist_mb1_clk2o** | BIST phase 2 clock. Connected to the *bist_clk2* port in *Clock_Gen* block. It is derived from TCK clock. This signal is different from *bn_sclkb* in a sense that this is applied to the normal clock port instead of scan clock ports in the LSSD flipflops and latches. This can be generated only when the instruction MCR/BIST1 is selected and JTAG is in run-test/idle. |
| **bist_mb2_clk1o** | BIST phase 1 clock. This can be generated only when the instruction MCR/BIST2 is selected and JTAG is in run-test/idle. |
| **bist_mb2_clk2o** | BIST phase 2 clock. This can be generated only when the instruction MCR/BIST2 is selected and JTAG is in run-test/idle. |
| **bist_mb3_clk1o** | BIST phase 1 clock. This can be generated only when the instruction MCR/BIST3 is selected and JTAG is in run-test/idle. |
| **bist_mb3_clk2o** | BIST phase 2 clock. This can be generated only when the instruction MCR/BIST3 is selected and JTAG is in run-test/idle. |
| **bist_mb4_clk1o** | BIST phase 1 clock. It is connected to "**jtag_mem_clk1**" in clock generator block. This can be generated only when the instruction MCR/BIST4 is selected and JTAG is in run-test/idle. |
| **bist_mb4_clk2o** | BIST phase 2 clock. It is connected to "**jtag_mem_clk2**" in clock generator block. This can be generated only when the instruction MCR/BIST4 is selected and JTAG is in run-test/idle. |

P:\DMS\7714\M-4415_...
961008 (MS)

| Signal Name | Description |
|---|---|
| **bist_arm7_clk1o** | BIST phase 1 clock. This can be generated only when the instruction ARM7 intest is selected and JTAG is in run-test/idle. |
| **bist_arm7_clk2o** | BIST phase 2 clock. It is connected to "**jtag_arm_clk**" in clock generator block. This can be generated only when the instruction ARM7 intest is selected and JTAG is in run-test/idle. |
| **clockdr** | JTAG standard signal. Connected to the clockdr port in MSP boundary scan chain. Must have a power of driving 270 boundary scan cells. Clock skew between 1st and 270th bit should be minimal. Please refer to the IEEE Std. 1149.1 for more information. |
| **clockdra** | Connected to the clockdra port in MSP boundary scan chain, which is LSSD type cell for scan operation. |
| **clockdrb** | Connected to the clockdrb port in MSP boundary scan chain, which is LSSD type cell for scan operation. |
| **updatedr** | JTAG standard signal. Connected to the updatedr port in MSP boundary scan chain. Must have a power of driving 270 boundary scan cells. Clock skew between 1st and 270th bit should be minimal. Please refer to the IEEE Std. 1149.1 for more information. |
| **shiftdr** | JTAG standard signal. Connected to the shiftdr port in MSP boundary scan chain. Must have a power of driving 270 boundary scan cells. Clock skew between 1st and 270th bit should be minimal. Please refer to the IEEE Std. 1149.1 for more information. |
| **msp_mode_i** | JTAG standard signal. Connected to the input boundary scan mode port in MSP boundary scan chain. Must have a power of driving 270 boundary scan cells. |
| **msp_mode_o** | JTAG standard signal. Connected to the output boundary scan mode port in MSP boundary scan chain. Must have a power of driving 270 boundary scan cells. |
| **msp_mode_c** | JTAG standard signal. Connected to the control boundary scan mode port in MSP boundary scan chain. Must have a power of driving 270 boundary scan cells. |

P:\DMS\7714\M-4415_U\0191163.01
961008 (MS)

| Signal Name | Description |
|---|---|
| **arm7_mode_i** | JTAG standard signal. Connected to the input boundary scan mode port in ARM7 boundary scan chain. Must have a power of driving 124 boundary scan cells. Clock skew between 1st and 124th bit should be minimal. |
| **arm7_mode_o** | JTAG standard signal. Connected to the output boundary scan mode port in ARM7 boundary scan chain. Must have a power of driving 124 boundary scan cells. Clock skew between 1st and 124th bit should be minimal. |
| **arm7_bs_disable** | ARM7 boundary scan disable signal. Connected to the *enb* port in *arm_bs* block. Disables the updating the arm7 core boundary scan chain by blocking the TCK. Must have a power of driving 100 boundary scan cells. |
| **set_n** | TCK to boundary scan cells is disabled when it is low. The two different boundary scan chains can be independently disabled by turning on this signal (low) in ARM7 boundary scan chain when it is accessing MSP boundary scan chain. |
| **msp_bs_disable** | MSP boundary scan disable signal. Connected to the *enb* port in *msp_bs* block. Disables the updating the MSP boundary scan chain by blocking the TCK. Must have a power of driving 270 boundary scan cells. |
| **ins[31:0]** | all JTAG instruction signals. All necessary signals are generated using this signal later. |
| **JTAG Output Signals From MCR register** | |
| **mem_data_we** | Data RAM write enable signal in memory access operation. |
| **mem_vt_we** | Vd and Tag RAM write enable in memory access operation. |
| **mem_add_u/d** | Memory address up or down enable signal. Connected to the u/d port in the address counter. Operated with *mem_add_cnt* signal. Used in memory access operation. |
| **mem_add_cnt** | Memory address count enable signal. Connected to the cnt port in the address counter. Operated with *mem_add_u/d* signal. Used in memory access operation. |

P:\DMS\7714\M-4415_U\0191163.01
961008 (MS:

| Signal Name | Description |
|---|---|
| **mere_add_reset** | Memory address counter synchronous reset signal. Connect to the reset port in the address counter. |
| **mem_add_set** | Memory address counter synchronous set signal. Connect to the set port in the address counter. |
| **mem_vclear** | Vd RAM clear signal in memory access mode. |
| **mem_data_cs** | Data RAM chip select signal in memory access mode |
| **mem_vt_cs** | Vd and Tag RAM chip select signal in memory access mode |
| **mem_compare** | Compare enable signal during memory test. Connected to the compare enable signals in cache memory block. |
| **mem_hwd** | Hold the data values in write register in cache during memory access mode. |
| **future_ram_test_en** | RAM test enable signal. This is for future application. It is always low in other periods. |
| **vt_ram_test_en** | Vd and Tag RAM select signal in memory access operation. It is always low in other periods. |
| **dam_ram_test_en** | Data RAM select signal in memory access operation. It is always low in other periods. |
| **reg_file_test_en** | Register file select signal in memory access operation. It is always low in other periods. |
| **jtag_rf_cex** | Register file chip selection signal |
| **start_sdram_access** | SDRAM access signals are generated. |

961008 IMS

| Signal Name | Description |
|---|---|
| *bn* in signal names represents one of the following:<br>● rf: register file<br>● idc: IDC block<br>● ied: IFU, EXU, CCU, Decode, Issue<br>● lae: LSU, AIU, Exception Handler<br>● pda: PCI, DMA<br>● mf: MCU, FBUS, FBUS Arbiter<br>● bci: Bit stream, Codec I/F blocks<br>● iof: I/O Peripheral<br>● falu: FALU<br>● exu_dp: EXU datapath<br>● mul: Multiplier<br>● ifdm_dp: IFU datapath, DMA datapath<br>● lsu_dp: LSU r/w datapath<br>● ccu_dp: CCU datapath, CCU address datapath<br>● mcueh_dp: MCU datapath, EHU datapath<br>● pcibp_dp: PCI datapath, BP datapath<br>● codec_dp: Codec 119 datapath, Codec 1843 datapath | |

All JTAG interface signals are listed in table 11.

1.11 Hardware Test Environment

Figure 5:
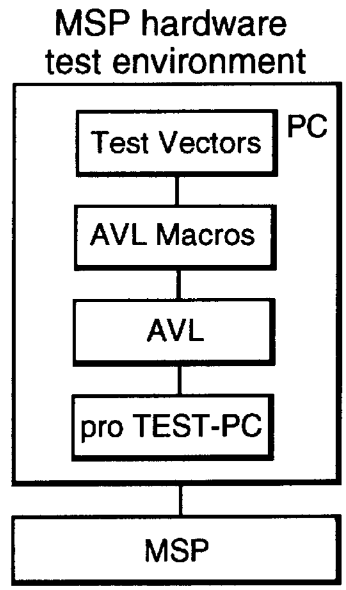
FIG. 5 is a block diagram of hardware test environment for the circuit of FIG. 1

The hardware test environment is shown in Fig 5. AVL (ASCII Vector Language) is both a test vector language, designed specifically for boundary scan testing, and a boundary scan test tool. It merges traditional parallel vector oriented Automated Test Equipment (ATE) languages with serial boundary scan testing defined by IEEE Standard 1149.1.

The proTest-PC is a PC-based test controller board capable of generating and receiving IEEE Std 1149.1 signals for testing components, boards and systems. AVL and proTest-PC are the products of AIS (Alpine Image Systems, Inc.).

During test process, all the test vectors for MSP will be formatted serially via AVL language and applied to MSP through proTest-PC board. Test vectors are the 961008 (MS:

vectors which are applied to MSP I/O or scan chains. To ease the test vector application for all functional blocks, which is performed serially, AVL macros need to be developed to access particular location in a scan chains. The communication will be made through the five JTAG ~~JTAG 5~~ pins only. Please refer to following documents for more information.

- AVL User's Guide, V1.80, Alpine Image Systems, Inc, 1995
- User's Guide for proTEST-PC, V3.01, Alpine Image Systems, Inc, 1995

1.12 Embedded RAM Test Scheme

1.12.1 IDC

Figure 6:
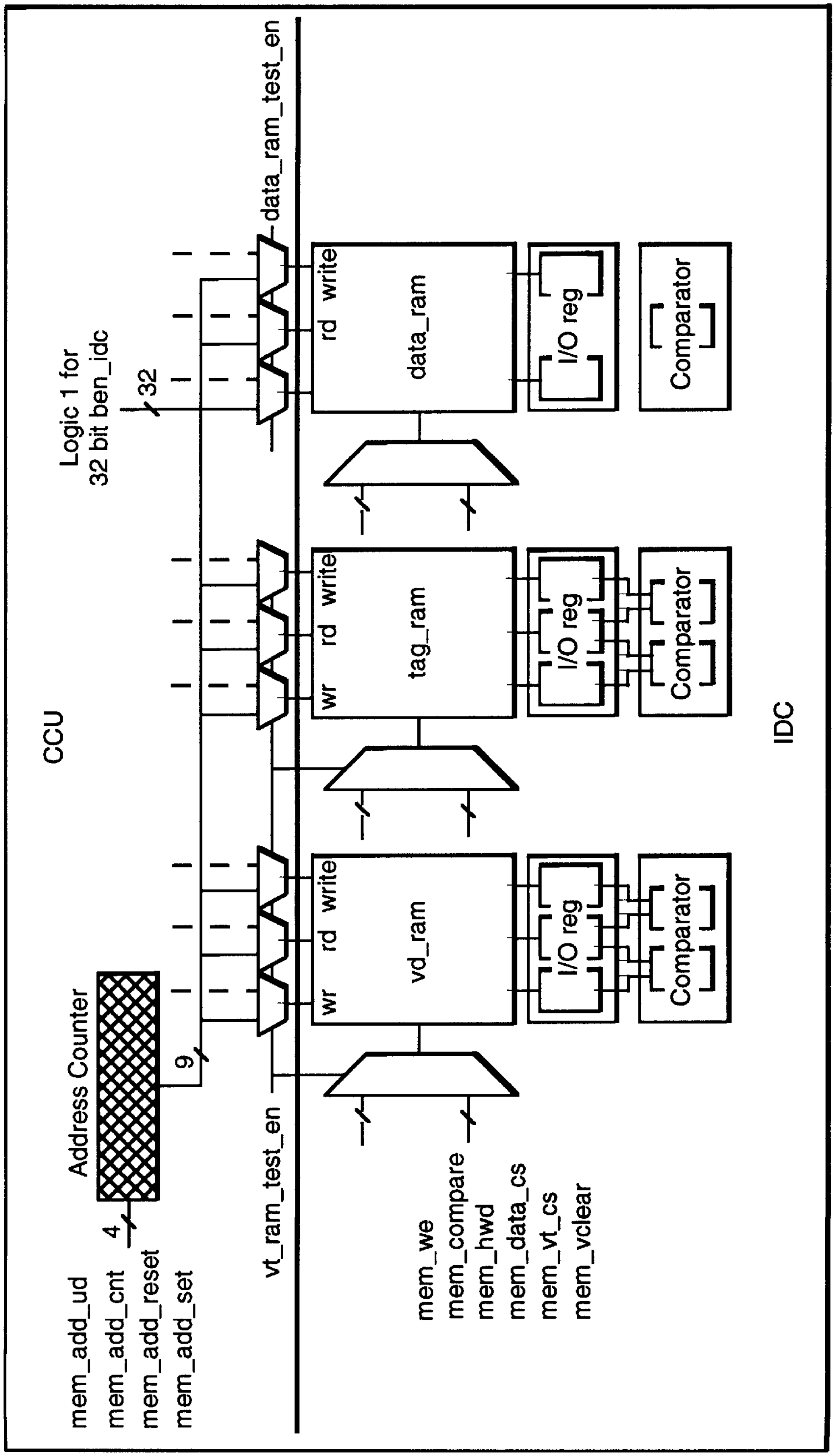
FIGS. 6 and 7 illustrate test schemes in accordance with the present invention.

Figure 6 shows the test scheme for IDC block. Test logics are inserted to blocks, CCU and IDC. All dotted lines stand for the signals in normal mode. CCU block provides the mux logics for the addresses in test and normal modes. Address is generated with 9 bit counter with set, reset, up/down, and count enable functions. All counter operation should be synchronous with the system clock, clk1. The four counter control signals, mem_add_ud, mem_add_cnt, mem_add_reset, and mem_add_set, are provided by JTAG controller. The first two bits in the MSB side need to be connected for the bank selection.

32 bit ben_idc signals are set to logic 1 during testing the memory. There are two signals which select between test and normal signals. Vt_ram_test_en is for testing vd_ram and tag_ram. Data_ram_test_en is for data_ram testing. If the signals are logic high, test data is selected.

IDC blocks have comparators embedded for automatic comparison while MARCH C algorithm is being applied. There are 6 memory control signals which are also provided by JTAG controller. Mem_compare enables the comparison between input and output registers. If there is any error occurred, the output of comparator will produce logic 0. Otherwise, it is logic 1. All the I/O registers are in scan chain, through which input and output access can be made.

Mem_hwd signal enables holding the data in the write register when it is logic 1. Please refer to MSP spec. for other memory control signals, mem_we, mem_data_cs, mem_vt_cs, and mem_vclear. The names are the same as in the normal mode signals except they starts from "mem".

1.12.2 Register file

The test scheme specified for the register file is targeted to easily access the register file in test mode. Since there is no comparator logic embedded as in IDC, it is not practical to apply MARCH type algorithm to this memory.

Figure 7:
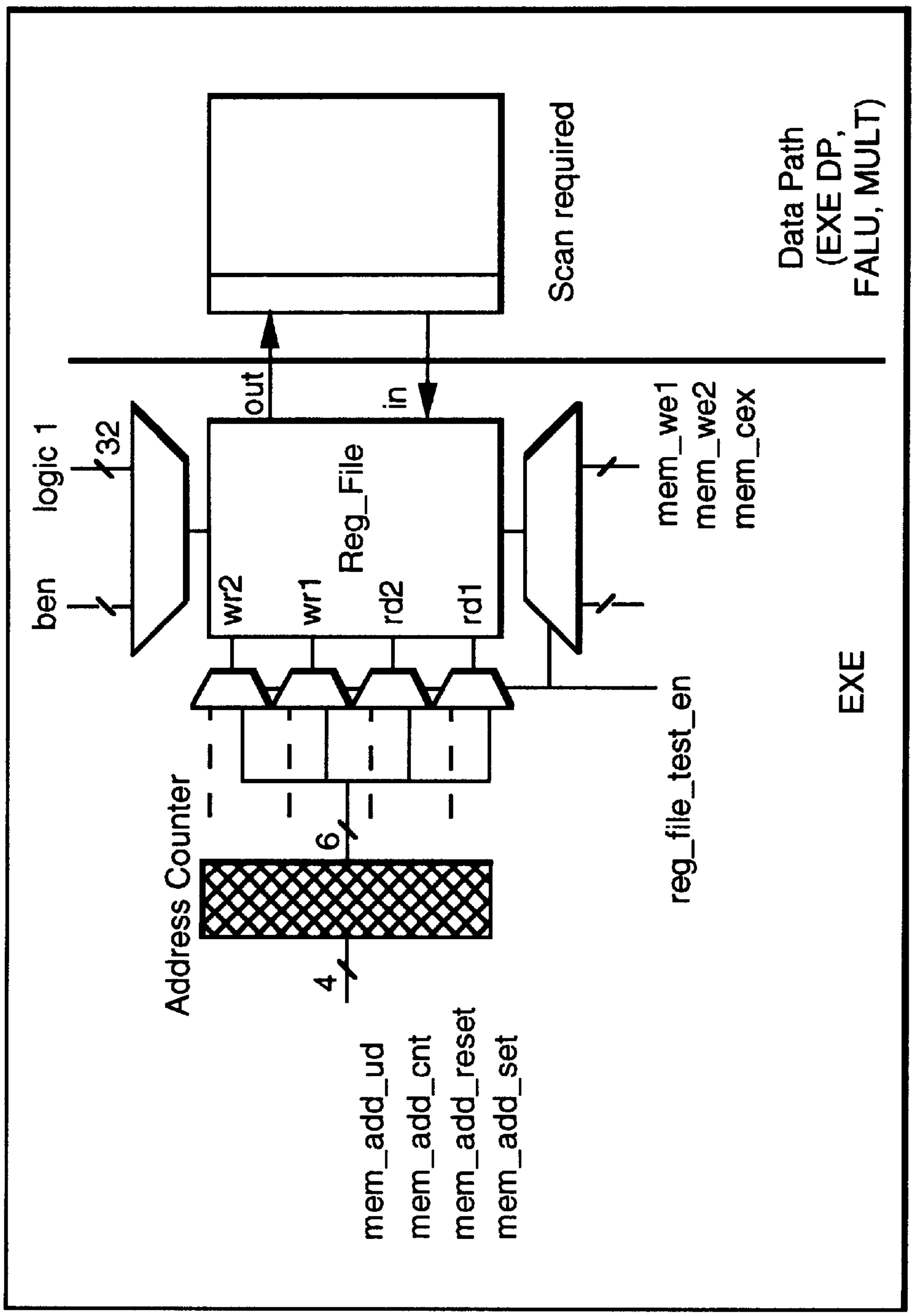

Figure 7 (register file test scheme) shows the overall scheme for test environment. The dotted lines represent the normal signals. There are three regions, data path, reg_file, and EXE block. All the logic in the left hand side of the bold line belongs to EXE block except the reg_file block. The EXE block provides the mux logic to select the address and control signals between test and normal modes. The test mode selection signal, reg_file_test_en and the three memory control signals, mem_we1, mem_we2, and mem_cex are provided by the JTAG control logic. If reg_file_test_en is high, test data is selected.

The addresses are generated by 6 bit counter with set, reset, up and down, and count enable. All count operation are synchronous with system clock, clk1. The input and output registers are located in data path blocks as specified in the figure 7. All the I/O

P:\DMS\7714\M-4415_U\0191163.01
961008 (MS)

registers need to be scanned. 32bit ben signals are tied to logic 1 in the test mode.

Free running clock is provided to register file. Capture scan register is attached to the output of it.

1.13 MSP Boundary Scan

All the I/O pads in MSP have appropriate boundary scan cells. There are 270 boundary scan cells connected in one scan chain. The sequence and cells are listed in table 13.

1.13.1 Boundary scan cell selection

The current available JTAG cells in KGL75 are listed below. Their matching JTAG standard cells are shown in table 15. The boundary scan chain for MSP uses the LSSD type scan cells. The difference from the KGL75 is using two non overlapping clocks to shift through boundary scan chain. KGL75 boundary scan cells are used for boundary scan of ARM7.

- *JTBI1*: Bi-directional I/O boundary scan cell.
- *JTCK*: Special input, such as clock input, boundary scan cell
- *JTIN1*: Input boundary scan cell
- *JTINT1*: Three-state control internal boundary-scan cell
- JTOUT1: Output boundary scan cell The rules of selecting appropriate boundary scan cells are stated below.

P:\DMS\7714\M-4415_5\0191163.01
961008 (MS:

TABLE 15
Matching table of boundary scan cell between KGL75 vs. JTAG standard

| KGL75 | STANDARD |
|---|---|
| JTB1IN | BC_2 |
| JTB1OUT | BC_1 |
| JTINT1 | BC_1 |
| JTOUT1 | BC_1 |
| JTIN1 | BC_2 |
| JTCK | BC_4 |

- For every input cell including clock inputs except *GND, VDD,* and *VCC* pins, use *JTIN1.*
- For every bidirectional cells, use *JTBI1.*
- For every output cells, use *JTOUT1.*
- For *t/s(tri-state)* pins, add a *JTINT1* cell. Use only one tri-state control cell for a group of signals such as AD[31:0].
- For the pins with *o/d(open drain)*, Use a JTINT1 cell.
- For the pins with *s/t/s(ststained tri-state)* is same as *t/s* in terms of boundary scan cell selection.

1.13.2 Boundary scan cell sequence

- The boundary scan is chained in the counter-clock direction from *TDI* input. Please refer to MSP pin layout for more information.
- Input cell comes first in case of bidirectional pins.

961008 (MS

- If there is tri-state pins, the tri-state control boundary scan cell, JTINT1, comes before the cells.
- If there are many tri-state pins in a sequence, only one tri-state control cell is inserted before the first tri-state pins in the sequence.

1.13.3 Design details

All ADxx signals have the same tri-state enable signals. So only one control boundary scan cell is enough to control 32 bit AD signals. However, to properly control the signals in the multiple scan mode, four more control boundary scan cells have been inserted. As a result, a total of five control boundary scan cells is used for AD bus. The five control boundary scan cells take one normal control signal from MSP core and produce five control signals.

TABLE 16
Boundary scan order for MSP

| PIN # | Name | Type | BS Cell | Tri-state Control same as | BS Scan Order |
|---|---|---|---|---|---|
| | | | JTINT1 | | |
| 1 | AD31 | I/O t/s | JTBI1 | pin 1 | |
| 2 | AD30 | I/O t/s | JTBI1 | pin 1 | |
| 3 | AD29 | I/O t/s | JTBI1 | pin 1 | |
| 4 | AD28 | I/O t/s | JTBI1 | pin 1 | |
| 5 | GND | IN | N/A | | |
| 6 | AD27 | I/O t/s | JTBI1 | pin 1 | |
| 7 | AD26 | I/O t/s | JTBI1 | pin 1 | |
| | | | JTINT1 | | |
| 8 | AD25_SO9 | I/O t/s | JTBI1 | pin 8 | |
| 9 | AD24_SO8 | I/O t/s | JTBI1 | pin 8 | |
| | | | JTINT1 | | |

| PIN # | Name | Type | BS Cell | Tri-state Control same as | BS Scan Order |
|---|---|---|---|---|---|
| 10 | C_BE3L | I/O t/s | JTBI1 | pin 10 | |
| 11 | VCC | IN | N/A | | |
| 12 | IDSEL | IN | JTIN1 | | |
| 13 | AD23_SO7 | I/O t/s | JTBI1 | pin 8 | |
| 14 | GND | IN | N/A | | |
| 15 | AD22_SO6 | I/O t/s | JTBI1 | pin 8 | |
| 16 | AD21_SO5 | I/O t/s | JTBI1 | pin 8 | |
| 17 | AD20_SO4 | I/O t/s | JTBI1 | pin 8 | |
| 18 | AD19_SO3 | I/O t/s | JTBI1 | pin 8 | |
| 19 | AD18_SO2 | I/O t/s | JTBI1 | pin 8 | |
| 20 | AD17_SO1 | I/O t/s | JTBI1 | pin 8 | |
| 21 | AD16_SO0 | I/O t/s | JTBI1 | pin 8 | |
| 22 | C_BE2L | I/O t/s | JTBI1 | pin 10 | |
| 23 | GND-1 | IN | N/A | | |
| | | | JTINT1 | | |
| 24 | FRAMEL | I/O s/t/s | JTBI1 | independent | |
| | | | JTINT1 | | |
| 25 | IRDYL | I/O s/t/s | JTBI1 | independent | |
| | | | JTINT1 | | |
| 26 | TRDYL | I/O s/t/s | JTBI1 | independent | |
| | | | JTINT1 | | |
| 27 | DVSELL | I/O s/t/s | JTBI1 | independent | |
| | | | JTINT1 | | |
| 28 | STOPL | I/O s/t/s | JTBI1 | independent | |
| | | | JTINT1 | | |
| 29 | LOCKL | I/O s/t/s | JTBI1 | independent | |
| | | | JTINT1 | | |
| 30 | PERRL | I/O s/t/s | JTBI1 | independent | |
| | | | JTINT1 | | |

P:\DMS\7714\M-4415_U\0191163.01
961008 (MS:

| PIN # | Name | Type | BS Cell | Tri-state Control same as | BS Scan Order |
|---|---|---|---|---|---|
| 31 | SERRL | I/O o/d | JTBI1 | independent | |
| 32 | GND | IN | N/A | | |
| 33 | VDD | IN | N/A | | |
| 34 | TCA | IN | JTIN1 | | |
| | | | JTINT1 | | |
| 35 | PAR | I/O t/s | JTBI1 | independent | |
| 36 | C_BE1L | I/O t/s | JTBI1 | pin 10 | |
| | | | JTINT1 | | |
| 37 | AD15_SI9 | I/O t/s | JTBI1 | pin 37 | |
| 38 | AD14_SI8 | I/O t/s | JTBI1 | pin 37 | |
| 39 | AD13_SI7 | I/O t/s | JTBI1 | pin 37 | |
| 40 | GND | IN | N/A | | |
| 41 | AD12_SI6 | I/O t/s | JTBI1 | pin 37 | |
| 42 | AD11_SI5 | I/O t/s | JTBI1 | pin 37 | |
| 43 | AD10_SI4 | I/O t/s | JTBI1 | pin 37 | |
| 44 | AD09_SI3 | I/O t/s | JTBI1 | pin 37 | |
| 45 | AD08_SI2 | I/O t/s | JTBI1 | pin 37 | |
| 46 | C_BE0L | I/O t/s | JTBI1 | pin 10 | |
| 47 | TCB | IN | JTIN1 | | |
| 48 | GND | IN | N/A | | |
| 49 | MCKE | OUT | JTOUT | | |
| 50 | AD07_SI1 | I/O t/s | JTBI1 | pin 37 | |
| 51 | AD06_SI0 | I/O t/s | JTBI1 | pin 37 | |
| 52 | VCC | IN | N/A | | |
| 53 | GND | IN | N/A | | |
| | | | JTINT1 | | |
| 54 | AD05_MT5 | I/O t/s | JTBI1 | pin 54 | |
| 55 | AD04_MT4 | I/O t/s | JTBI1 | pin 54 | |
| 56 | AD03_MT3 | I/O t/s | JTBI1 | pin 54 | |

P:\DMS\... M-4415_0 ...
961008 (MS)

| PIN # | Name | Type | BS Cell | Tri-state Control same as | BS Scan Order |
|---|---|---|---|---|---|
| | | | JTINT1 | | |
| 57 | AD02_MT2 | I/O t/s | JTBI1 | pin 57 | |
| 58 | AD01_MT1 | I/O t/s | JTBI1 | pin 57 | |
| 59 | AD00_MT0 | I/O t/s | JTBI1 | pin 57 | |
| 60 | GND | IN | N/A | | |
| 61 | MA11 | OUT | JTOUT1 | | |
| 62 | MA10 | OUT | JTOUT1 | | |
| 63 | MA9 | OUT | JTOUT1 | | |
| 64 | MA8 | OUT | JTOUT1 | | |
| 65 | MA7 | OUT | JTOUT1 | | |
| 66 | GND | IN | N/A | | |
| 67 | VDD | IN | N/A | | |
| 68 | MA6 | OUT | JTOUT1 | | |
| 69 | MA5 | OUT | JTOUT1 | | |
| 70 | MA4 | OUT | JTOUT1 | | |
| 71 | MA3 | OUT | JTOUT1 | | |
| 72 | MA2 | OUT | JTOUT1 | | |
| 73 | GND-1 | IN | N/A | | |
| 74 | MA1 | OUT | JTOUT1 | | |
| 75 | MA0 | OUT | JTOUT1 | | |
| 76 | RAS1L | OUT | JTOUT1 | | |
| 77 | CAS1L | OUT | JTOUT1 | | |
| 78 | VDD | IN | N/A | | |
| 79 | GND | IN | N/A | | |
| 80 | MEMCLK | OUT | JTCK | | |
| 81 | MWE1L | OUT | JTOUT1 | | |
| 82 | DQM | OUT | JTOUT1 | | |
| 83 | MCS1 | OUT | JTOUT1 | | |
| | | | JTINT1 | | |

P:\DMS\7714\M-4415_U\0191163.01
961008 (MS:

| PIN # | Name | Type | BS Cell | Tri-state Control same as | BS Scan Order |
|---|---|---|---|---|---|
| 84 | MD0 | I/O t/s | JTBI1 | pin 84 | |
| 85 | MD1 | I/O t/s | JTBI1 | pin 84 | |
| 86 | MD2 | I/O t/s | JTBI1 | pin 84 | |
| 87 | MD3 | I/O t/s | JTBI1 | pin 84 | |
| 88 | GND | IN | N/A | | |
| 89 | MD4 | I/O t/s | JTBI1 | pin 84 | |
| 90 | MD5 | I/O t/s | JTBI1 | pin 84 | |
| 91 | MD6 | I/O t/s | JTBI1 | pin 84 | |
| 92 | MD7 | I/O t/s | JTBI1 | pin 84 | |
| 93 | GND | IN | N/A | | |
| 94 | VDD | IN | N/A | | |
| 95 | MD8 | I/O t/s | JTBI1 | pin 84 | |
| 96 | MD9 | I/O t/s | JTBI1 | pin 84 | |
| 97 | MD10 | I/O t/s | JTBI1 | pin 84 | |
| 98 | MD11 | I/O t/s | JTBI1 | pin 84 | |
| 99 | GND | IN | N/A | | |
| 100 | MD12 | I/O t/s | JTBI1 | pin 84 | |
| 101 | MD13 | I/O t/s | JTBI1 | pin 84 | |
| 102 | MD14 | I/O t/s | JTBI1 | pin 84 | |
| 103 | MD15 | I/O t/s | JTBI1 | pin 84 | |
| 104 | VDD | IN | N/A | | |
| 105 | GND | IN | N/A | | |
| 106 | MD16 | I/O t/s | JTBI1 | pin 84 | |
| 107 | MD17 | I/O t/s | JTBI1 | pin 84 | |
| 108 | MD18 | I/O t/s | JTBI1 | pin 84 | |
| 109 | MD19 | I/O t/s | JTBI1 | pin 84 | |
| 110 | MD20 | I/O t/s | JTBI1 | pin 84 | |
| 111 | GND | IN | N/A | | |
| 112 | MD21 | I/O t/s | JTBI1 | pin 84 | |

P:\DMS\7714\M-4415_U\0191163.01
961008 (MS:

| PIN # | Name | Type | BS Cell | Tri-state Control same as | BS Scan Order |
|---|---|---|---|---|---|
| 113 | MD22 | I/O t/s | JTBI1 | pin 84 | |
| 114 | MD23 | I/O t/s | JTBI1 | pin 84 | |
| 115 | MD24 | I/O t/s | JTBI1 | pin 84 | |
| 116 | VDD | IN | N/A | | |
| 117 | MD25 | I/O t/s | JTBI1 | pin 84 | |
| 118 | MD26 | I/O t/s | JTBI1 | pin 84 | |
| 119 | GND | IN | N/A | | |
| 120 | MD27 | I/O t/s | JTBI1 | pin 84 | |
| 121 | VDD | IN | N/A | | |
| 122 | MD28 | I/O t/s | JTBI1 | pin 84 | |
| 123 | MD29 | I/O t/s | JTBI1 | pin 84 | |
| 124 | MD30 | I/O t/s | JTBI1 | pin 84 | |
| 125 | MD31 | I/O t/s | JTBI1 | pin 84 | |
| | | | JTINT1 | | |
| 126 | 43SDFS | I/O t/s | JTBI1 | independent | |
| | | | JTINT1 | | |
| 127 | 43SCLK | I/O t/s | JTBI1 | independent | |
| 128 | VCC | IN | N/A | | |
| 129 | GND | IN | N/A | | |
| | | | JTINT1 | | |
| 130 | 43SDI | OUT t/s | JTOUT1 | independent | |
| 131 | 43SDO | IN | JTIN1 | | |
| 132 | RI | IN | JTIN1 | | |
| 133 | LCS | IN | JTIN1 | | |
| | | | JTIN1 | | |
| 134 | CALRID | OUT t/s | JTOUT1 | independent | |
| 135 | GND | IN | N/A | | |
| | | | JTINT1 | | |
| 136 | PD15 | OUT t/s | JTOUT1 | pin 136 | |

P:\DMS\7714\M-4415_U\U191163.01
961008 (MS:

| PIN # | Name | Type | BS Cell | Tri-state Control same as | BS Scan Order |
|---|---|---|---|---|---|
| 137 | PD14_PA14 | OUT t/s | JTOUT1 | pin 136 | |
| 138 | PD13_PA13 | OUT t/s | JTOUT1 | pin 136 | |
| 139 | PD12_PA12 | OUT t/s | JTOUT1 | pin 136 | |
| 140 | PD11_PA11 | OUT t/s | JTOUT1 | pin 136 | |
| 141 | PD10_PA10 | OUT t/s | JTOUT1 | pin 136 | |
| 142 | PD9_PA9 | OUT t/s | JTOUT1 | pin 136 | |
| 143 | PD8_PA8 | OUT t/s | JTOUT1 | pin 136 | |
| 144 | BGCLK | IN | JTIN1 | | |
| 145 | VDD | IN | N/A | | |
| 146 | GND | IN | N/A | | |
| 147 | PD7_PA7 | OUT t/s | JTBI1 | pin 136 | |
| 148 | PD6_PA6 | OUT t/s | JTBI1 | pin 136 | |
| 149 | PD5_PA5 | OUT t/s | JTBI1 | pin 136 | |
| I50 | PD4_PA4 | OUT t/s | JTBI1 | pin 136 | |
| 151 | PD3_PA3 | OUT t/s | JTBI1 | pin 136 | |
| 152 | PD2_PA2 | OUT t/s | JTBI1 | pin 136 | |
| 153 | PD1_PA1 | OUT t/s | JTBI1 | pin 136 | |
| 154 | PD0_PA0 | OUT t/s | JTBI1 | pin 136 | |
| 155 | VCC | IN | N/A | | |
| 156 | PROMCSL | OUT | JTOUT1 | | |
| 157 | BGVS | IN | JTIN1 | | |
| 158 | BGHS | IN | JTIN1 | | |
| 159 | VCC | IN | N/A | | |
| 160 | GND | IN | N/A | | |
| | | | JTINT1 | | |
| 161 | SCLK | OUT t/s | JTOUT1 | independent | |
| | | | JTINT1 | | |
| 162 | SDAT | I/O t/s | JTBI1 | independent | |
| | | | JTINT1 | | |

961008 (MS

| PIN # | Name | Type | BS Cell | Tri-state Control same as | BS Scan Order |
|---|---|---|---|---|---|
| 163 | SFRS | OUT t/s | JTOUT1 | independent | |
| | | | JTINT1 | | |
| 164 | RSTOL | OUT t/s | JTOUT1 | independent | |
| | | | JTINT1 | | |
| 165 | MSSEL | OUT t/s | JTOUT1 | independent | |
| 166 | CK2 | IN | JTINT1 | | |
| 167 | VCC | IN | N/A | | |
| 168 | GND | IN | N/A | | |
| 169 | CK | IN | JTIN1 | | |
| 170 | MIDIIN | IN | JTIN1 | | |
| 171 | TM | IN | JTIN1 | | |
| 172 | GND | IN | N/A | | |
| 173 | VS | IN | JTIN1 | | |
| 174 | HS | IN | JTIN1 | | |
| 175 | HREF | IN | JTIN1 | | |
| | | | JTINT1 | | |
| 176 | MIDIO | OUT t/s | JTOUT1 | independent | |
| 177 | MSPCK | IN | JTCK | | |
| 178 | GND | IN | N/A | | |
| 179 | C7 | IN | JTIN1 | | |
| 180 | C6 | IN | JTIN1 | | |
| 181 | C5 | IN | JTIN1 | | |
| 182 | C4 | IN | JTIN1 | | |
| 183 | C3 | IN | JTIN1 | | |
| 184 | C2 | IN | JTIN1 | | |
| 185 | C1 | IN | JTIN1 | | |
| 186 | C0 | IN | JTIN1 | | |
| 187 | GND | IN | N/A | | |
| IS8 | VDD | IN | N/A | | |

| PIN # | Name | Type | BS Cell | Tri-state Control same as | BS Scan Order |
|---|---|---|---|---|---|
| 189 | Y7 | IN | JTIN1 | | |
| 190 | Y6 | IN | JTIN1 | | |
| 191 | Y5 | IN | JTIN1 | | |
| 192 | Y4 | IN | JTIN1 | | |
| 193 | Y3 | IN | JTIN1 | | |
| 194 | Y2 | IN | JTIN1 | | |
| 195 | Y1 | IN | JTIN1 | | |
| 196 | Y0 | IN | JTIN1 | | |
| 197 | TRSTL | IN | N/A | | |
| 198 | TDI | IN | N/A | | |
| 199 | TCK | IN | N/A | | |
| 200 | TDO | OUT | N/A | | |
| 201 | TMS | IN | N/A | | |
| | | | JTINT1 | | |
| 202 | INTAL | OUT o/d | JTOUT1 | independent | |
| 203 | RSTL | IN | JTIN1 | | |
| 204 | PCICLK | IN | JTIN1 | | |
| 205 | GND | IN | N/A | | |
| 206 | GNTL | IN | JTIN1 | | |
| | | | JTINT1 | | |
| 207 | REQL | OUT t/s | JTOUT1 | independent | |
| 208 | VCC | IN | N/A | | |

<u>1.14 ARM7 Boundary Scan</u>

The boundary scan cell selection has been treated as the way in the MSP boundary scan cell selection. Refer to the previous section for more information. The names and scan order are described in the table 14.

961008 (MS:

TABLE 17

Boundary scan cell order for ARM7

| Scan Order | Name | Type | Width | Description | BSC type |
|---|---|---|---|---|---|
| 1 | mclk | input | 1 | clock | JTCK |
| 2 | Nwait | input | 1 | clock | JTIN1 |
| 3 | prog32 | input | 1 | configura-tion | JTIN1 |
| 4 | data32 | input | 1 | configura-tion | JTIN1 |
| 5 | bigend | input | 1 | configura-tion | JTIN1 |
| 6 | Nexec | output | 1 | | JTOUT1 |
| 7 | Nirq | input | 1 | interrupts | JTIN1 |
| 8 | Nfiq | input | 1 | interrupts | JTIN1 |
| 9 | Nreset | input | 1 | | JTIN1 |
| 10 | ale | input | 1 | bus control | JTIN1 |
| 11 | dbe | input | 1 | bus control | JTIN1 |
| 12-16 | Nm | output | 5 | processor mode | JTOUT1 |
| 17-48 | a | output | 32 | memory interface | JTOUT1 |

B-1

```
//------------------------------------------------------------
//Copyright (c) 1996 Samsung Semiconductor Inc.
//------------------------------------------------------------
//Contact :
//       Sanghyeon Baeg,
//       Samsung Semiconductor Inc.
//       3655 N. 1st Street
//       San Jose, CA 95134
//       (415) 954-7005
//-------------------------------------------------------------

module con_log (arm7mode_i, arm7mode_o, arm7_1o, arm7_2o, bist, bist_1n26,
    bist_cnt, clk1o, clk2o, extest, ins18, ins20, ins22, ins28,
    ins31, ins27, ins26, ins25, ins24, ins4, ins3, ins2, ins1, intest, jsca
    , jscb, jtclk, mb2_1o, mb2_2o, mb3_1o, mb3_2o, mb4_1o, mb4_2o, mclk,
    mrst_n, mspmode_c, mspmode_i, mspmode_o, mult_n, muxtdo, por, reset_n,
    rti, smpl, sys_clk, tclk, tdo_data, ins29, tms, treset_i, trest_n);
  output arm7mode_i, arm7mode_o, arm7_1o, arm7_2o, bist_cnt, clk1o, clk2o,
    jtclk, mb2_1o, mb2_2o, mb3_1o, mb3_2o, mb4_1o, mb4_2o, mspmode_c,
    mspmode_i, mspmode_o, mult_n, sys_clk, tdo_data, treset_i;
  input bist, bist_1n26, extest, ins18, ins20, ins22, ins28, ins31,
    ins27, ins26, ins25, ins24, ins4, ins3, ins2, ins1, intest, jsca, jscb,
    mclk, mrst_n, muxtdo, por, reset_n, rti, smpl, tclk, ins29, tms, trest_n;
  wire x1n305, x1n360, x1n368, x1n555, x1n557, x1n579, x1n597,
    x1n659, x1n673, x1n691, x1n693, x1n719, x1n723, x1n737, x1n738, x1n758,
    x1n759, x1n771, x1n772, x1n781, x1n813, x1n818, x1n845, x1n849, x1n851,
    rti_1;
  fd1 x1i300 (.Q(tdo_data), .CK(x1n305), .D(muxtdo));
  iv x1i304 (.Y(x1n305), .A(tclk));
  nd2 x1i364 (.Y(x1n368), .A(bist_1n26), .B(rti_1));
  nr2 x1i365 (.Y(x1n360), .A(tms), .B(x1n368));
  nd2 x1i469 (.Y(mult_n), .A(rti), .B(ins20));
  mx2 x1i491 (.Y(jtclk), .D0(x1n557), .D1(tclk), .S(mrst_n));
  fd1 x1i551 (.Q(x1n557), .QN(x1n555), .CK(mclk), .D(x1n555));
  iv x1i578 (.Y(x1n579), .A(extest));
  mx2 x1i657 (.Y(clk1o), .D0(1'b0), .D1(jsca), .S(x1n360));
  fd2 x1i658 (.Q(rti_1), .CK(x1n659), .D(rti), .RN(reset_n));
  mx2 x1i660 (.Y(clk2o), .D0(1'b0), .D1(jscb), .S(x1n360));
  iv x1i665 (.Y(x1n659), .A(tclk));
  nr2 x1i690 (.Y(x1n813), .A(x1n691), .B(x1n693));
  or4 x1i703 (.Y(arm7mode_i), .A(ins27), .B(ins18), .C(ins3), .D(ins4));
  or3 x1i704 (.Y(x1n673), .A(bist), .B(intest), .C(ins24));
  or2 x1i711 (.Y(arm7mode_o), .A(arm7mode_i), .B(x1n673));
  mx2 x1i717 (.Y(mb2_1o), .D0(1'b0), .D1(jsca), .S(x1n719));
  mx2 x1i718 (.Y(mb2_2o), .D0(1'b0), .D1(jscb), .S(x1n719));
  nr2 x1i722 (.Y(x1n719), .A(tms), .B(x1n723));
  nd2 x1i724 (.Y(x1n723), .A(ins2), .B(rti_1));
  nr2 x1i740 (.Y(x1n737), .A(tms), .B(x1n738));
  nd2 x1i741 (.Y(x1n738), .A(ins3), .B(rti_1));
  mx2 x1i742 (.Y(mb3_1o), .D0(1'b0), .D1(jsca), .S(x1n737));
  mx2 x1i743 (.Y(mb3_2o), .D0(1'b0), .D1(jscb), .S(x1n737));
  mx2 x1i748 (.Y(mb4_2o), .D0(1'b0), .D1(jscb), .S(x1n759));
  mx2 x1i749 (.Y(mb4_1o), .D0(1'b0), .D1(jsca), .S(x1n759));
  nd2 x1i750 (.Y(x1n758), .A(ins4), .B(rti_1));
  nr2 x1i751 (.Y(x1n759), .A(tms), .B(x1n758));
  nr2 x1i764 (.Y(x1n771), .A(tms), .B(x1n772));
  nd2 x1i765 (.Y(x1n772), .A(ins18), .B(rti_1));
  mx2 x1i766 (.Y(arm7_1o), .D0(1'b0), .D1(jsca), .S(x1n771));
  mx2 x1i767 (.Y(arm7_2o), .D0(1'b0), .D1(jscb), .S(x1n771));
  or4 x1i779 (.Y(x1n781), .A(x1n360), .B(x1n719), .C(x1n737), .D(x1n759));
  or2 x1i780 (.Y(bist_cnt), .A(x1n781), .B(x1n771));
  or4 x1i799 (.Y(x1n691), .A(ins31), .B(smpl), .C(ins20), .D(ins1));
  or4 x1i801 (.Y(x1n693), .A(ins28), .B(ins29), .C(ins27), .D(ins2));
  ad2 x1i811 (.Y(mspmode_i), .A(x1n579), .B(x1n813));
  iv x1i815 (.Y(x1n818), .A(x1n813));
  nr2 x1i817 (.Y(mspmode_o), .A(x1n818), .B(ins26));
  or2 x1i821 (.Y(mspmode_c), .A(ins26), .B(mspmode_o));
  ad2 x1i842 (.Y(x1n597), .A(x1n845), .B(rti));
  or2 x1i846 (.Y(x1n845), .A(x1n849), .B(x1n851));
  or4 x1i847 (.Y(x1n849), .A(ins31), .B(extest), .C(smpl), .D(ins1));
  ad2d2 x1i865 (.Y(treset_i), .A(trest_n), .B(por));
  or3 x1i873 (.Y(x1n851), .A(ins2), .B(ins22), .C(ins28));
  or2 x1i874 (.Y(sys_clk), .A(x1n597), .B(ins29));

// WARNING - Component x1i658 has unconnected pins: 0 input, 1 output, 0 inout.
// WARNING - Component x1i300 has unconnected pins: 0 input, 1 output, 0 inout.
endmodule  // con_log

module bps_reg (shiftdr, tdi, clockdr, tdo);
  output tdo;
  input shiftdr, tdi, clockdr;
  wire x1n10;
  fd1 x1i3 (.Q(tdo), .CK(clockdr), .D(x1n10));
  ad2 x1i39 (.Y(x1n10), .A(shiftdr), .B(tdi));

// WARNING - Component x1i3 has unconnected pins: 0 input, 1 output, 0 inout.
endmodule  // bps_reg

module cksi_mux (psi_x, psca, pscb, mult_n, jsca, jscb, jsi, dr_x, sca_x,
    scb_x, si, shiftdr, corsdr, bist_cnt, mrst_n);
  output sca_x, scb_x, si;
  input psi_x, psca, pscb, mult_n, jsca, jscb, jsi, dr_x, shiftdr, corsdr,
    bist_cnt, mrst_n;
  wire x1n428, x1n430, x1n461, x1n473, x1n477, x1n484, x1n490, x1n492,
    x1n496, x1n500, x1n507;
  mx2 x1i413 (.Y(x1n430), .D0(psca), .D1(jsca), .S(mult_n));
  mx2 x1i414 (.Y(x1n428), .D0(pscb), .D1(jscb), .S(mult_n));
  mx2 x1i415 (.Y(scb_x), .D0(1'b0), .D1(x1n428), .S(x1n496));
  mx2 x1i416 (.Y(sca_x), .D0(1'b0), .D1(x1n430), .S(x1n461));
  mx2 x1i417 (.Y(si), .D0(psi_x), .D1(jsi), .S(mult_n));
  nd2 x1i455 (.Y(x1n473), .A(shiftdr), .B(dr_x));
  nd2 x1i462 (.Y(x1n477), .A(dr_x), .B(corsdr));
  nr2 x1i472 (.Y(x1n484), .A(bist_cnt), .B(x1n473));
  nr2 x1i476 (.Y(x1n492), .A(bist_cnt), .B(x1n477));
  or2 x1i485 (.Y(x1n461), .A(x1n490), .B(x1n484));
  iv x1i488 (.Y(x1n500), .A(mult_n));
  or2 x1i493 (.Y(x1n496), .A(x1n490), .B(x1n492));
  or2 x1i498 (.Y(x1n490), .A(x1n507), .B(x1n500));
  iv x1i504 (.Y(x1n507), .A(mrst_n));

endmodule  // cksi_mux

module idrcmx8 (psi7, psi6, psi5, psi4, psi3, psi2, psi1, psi0, psca, pscb,
    mult_n, jsca, jscb, jsi, ins7, ins6, ins5, ins4, ins3, ins2, ins1, ins0
    , sca7, sca6, sca5, sca4, sca3, sca2, sca1, sca0, scb7, scb6, scb5, scb4
    , scb3, scb2, scb1, scb0, si7, si6, si5, si4, si3, si2, si1, si0,
    shiftdr, corsdr, bist_cnt, mrst_n);
  output sca7, sca6, sca5, sca4, sca3, sca2, sca1, sca0, scb7, scb6, scb5,
    scb4, scb3, scb2, scb1, scb0, si7, si6, si5, si4, si3, si2, si1, si0;
  input psi7, psi6, psi5, psi4, psi3, psi2, psi1, psi0, psca, pscb, mult_n,
    jsca, jscb, jsi, ins7, ins6, ins5, ins4, ins3, ins2, ins1, ins0, shiftdr
```

B-2

```
  , corsdr, bist_cnt, mrst_n;
  cksi_mux x1i509 (.psi_x(psi7), .psca(psca), .pscb(pscb), .mult_n(mult_n),
    .jsca(jsca), .jscb(jscb), .jsi(jsi), .dr_x(ins7), .sca_x(sca7), .scb_x
    (scb7), .si(si7), .shiftdr(shiftdr), .corsdr(corsdr), .bist_cnt
    (bist_cnt), .mrst_n(mrst_n));
  cksi_mux x1i527 (.psi_x(psi6), .psca(psca), .pscb(pscb), .mult_n(mult_n),
    .jsca(jsca), .jscb(jscb), .jsi(jsi), .dr_x(ins6), .sca_x(sca6), .scb_x
    (scb6), .si(si6), .shiftdr(shiftdr), .corsdr(corsdr), .bist_cnt
    (bist_cnt), .mrst_n(mrst_n));
  cksi_mux x1i538 (.psi_x(psi5), .psca(psca), .pscb(pscb), .mult_n(mult_n),
    .jsca(jsca), .jscb(jscb), .jsi(jsi), .dr_x(ins5), .sca_x(sca5), .scb_x
    (scb5), .si(si5), .shiftdr(shiftdr), .corsdr(corsdr), .bist_cnt
    (bist_cnt), .mrst_n(mrst_n));
  cksi_mux x1i549 (.psi_x(psi4), .psca(psca), .pscb(pscb), .mult_n(mult_n),
    .jsca(jsca), .jscb(jscb), .jsi(jsi), .dr_x(ins4), .sca_x(sca4), .scb_x
    (scb4), .si(si4), .shiftdr(shiftdr), .corsdr(corsdr), .bist_cnt
    (bist_cnt), .mrst_n(mrst_n));
  cksi_mux x1i568 (.psi_x(psi2), .psca(psca), .pscb(pscb), .mult_n(mult_n),
    .jsca(jsca), .jscb(jscb), .jsi(jsi), .dr_x(ins2), .sca_x(sca2), .scb_x
    (scb2), .si(si2), .shiftdr(shiftdr), .corsdr(corsdr), .bist_cnt
    (bist_cnt), .mrst_n(mrst_n));
  cksi_mux x1i570 (.psi_x(psi0), .psca(psca), .pscb(pscb), .mult_n(mult_n),
    .jsca(jsca), .jscb(jscb), .jsi(jsi), .dr_x(ins0), .sca_x(sca0), .scb_x
    (scb0), .si(si0), .shiftdr(shiftdr), .corsdr(corsdr), .bist_cnt
    (bist_cnt), .mrst_n(mrst_n));
  cksi_mux x1i577 (.psi_x(psi1), .psca(psca), .pscb(pscb), .mult_n(mult_n),
    .jsca(jsca), .jscb(jscb), .jsi(jsi), .dr_x(ins1), .sca_x(sca1), .scb_x
    (scb1), .si(si1), .shiftdr(shiftdr), .corsdr(corsdr), .bist_cnt
    (bist_cnt), .mrst_n(mrst_n));
  cksi_mux x1i581 (.psi_x(psi3), .psca(psca), .pscb(pscb), .mult_n(mult_n),
    .jsca(jsca), .jscb(jscb), .jsi(jsi), .dr_x(ins3), .sca_x(sca3), .scb_x
    (scb3), .si(si3), .shiftdr(shiftdr), .corsdr(corsdr), .bist_cnt
    (bist_cnt), .mrst_n(mrst_n));

endmodule  // idrcmx8

module idrcmx7 (psi6, psi5, psi4, psi3, psi2, psi1, psi0, psca, pscb, mult_n
    , jsca, jscb, jsi, ins6, ins5, ins4, ins3, ins2, ins1, ins0, sca6, sca5
    , sca4, sca3, sca2, sca1, sca0, scb6, scb5, scb4, scb3, scb2, scb1, scb0
    , si6, si5, si4, si3, si2, si1, si0, shiftdr, corsdr, bist_cnt, mrst_n);
  output sca6, sca5, sca4, sca3, sca2, sca1, sca0, scb6, scb5, scb4, scb3,
    scb2, scb1, scb0, si6, si5, si4, si3, si2, si1, si0;
  input psi6, psi5, psi4, psi3, psi2, psi1, psi0, psca, pscb, mult_n, jsca,
    jscb, jsi, ins6, ins5, ins4, ins3, ins2, ins1, ins0, shiftdr, corsdr,
    bist_cnt, mrst_n;
  cksi_mux x1i527 (.psi_x(psi6), .psca(psca), .pscb(pscb), .mult_n(mult_n),
    .jsca(jsca), .jscb(jscb), .jsi(jsi), .dr_x(ins6), .sca_x(sca6), .scb_x
    (scb6), .si(si6), .shiftdr(shiftdr), .corsdr(corsdr), .bist_cnt
    (bist_cnt), .mrst_n(mrst_n));
  cksi_mux x1i538 (.psi_x(psi5), .psca(psca), .pscb(pscb), .mult_n(mult_n),
    .jsca(jsca), .jscb(jscb), .jsi(jsi), .dr_x(ins5), .sca_x(sca5), .scb_x
    (scb5), .si(si5), .shiftdr(shiftdr), .corsdr(corsdr), .bist_cnt
    (bist_cnt), .mrst_n(mrst_n));
  cksi_mux x1i549 (.psi_x(psi4), .psca(psca), .pscb(pscb), .mult_n(mult_n),
    .jsca(jsca), .jscb(jscb), .jsi(jsi), .dr_x(ins4), .sca_x(sca4), .scb_x
    (scb4), .si(si4), .shiftdr(shiftdr), .corsdr(corsdr), .bist_cnt
    (bist_cnt), .mrst_n(mrst_n));
  cksi_mux x1i568 (.psi_x(psi2), .psca(psca), .pscb(pscb), .mult_n(mult_n),
    .jsca(jsca), .jscb(jscb), .jsi(jsi), .dr_x(ins2), .sca_x(sca2), .scb_x
    (scb2), .si(si2), .shiftdr(shiftdr), .corsdr(corsdr), .bist_cnt
    (bist_cnt), .mrst_n(mrst_n));
  cksi_mux x1i570 (.psi_x(psi0), .psca(psca), .pscb(pscb), .mult_n(mult_n),
    .jsca(jsca), .jscb(jscb), .jsi(jsi), .dr_x(ins0), .sca_x(sca0), .scb_x
    (scb0), .si(si0), .shiftdr(shiftdr), .corsdr(corsdr), .bist_cnt
    (bist_cnt), .mrst_n(mrst_n));
  cksi_mux x1i577 (.psi_x(psi1), .psca(psca), .pscb(pscb), .mult_n(mult_n),
    .jsca(jsca), .jscb(jscb), .jsi(jsi), .dr_x(ins1), .sca_x(sca1), .scb_x
    (scb1), .si(si1), .shiftdr(shiftdr), .corsdr(corsdr), .bist_cnt
    (bist_cnt), .mrst_n(mrst_n));
  cksi_mux x1i581 (.psi_x(psi3), .psca(psca), .pscb(pscb), .mult_n(mult_n),
    .jsca(jsca), .jscb(jscb), .jsi(jsi), .dr_x(ins3), .sca_x(sca3), .scb_x
    (scb3), .si(si3), .shiftdr(shiftdr), .corsdr(corsdr), .bist_cnt
    (bist_cnt), .mrst_n(mrst_n));

endmodule  // idrcmx7

module idrcmx17 (mrst_n, bist_cnt, shiftdr, psca, pscb, mult_n, jsca, jscb,
    corsdr, dr14, dr13, dr12, dr11, dr10, dr9, dr8, dr7, dr6, dr5, dr4, dr3
    , dr2, dr1, dr0, psi16, psi15, psi14, psi13, psi12, psi11, psi10, psi9,
    psi8, psi7, psi6, psi5, psi4, psi3, psi2, psi1, psi0, si16, si15, si14,
    si13, si12, si11, si10, si9, si8, si7, si6, si5, si4, si3, si2, si1, si0
    , scb16, scb15, scb14, scb13, scb12, scb11, scb10, scb9, scb8, scb7,
    scb6, scb5, scb4, scb3, scb2, scb1, scb0, sca16, sca15, sca14, sca13,
    sca12, sca11, sca10, sca9, sca8, sca7, sca6, sca5, sca4, sca3, sca2,
    sca1, sca0, jsi, dr15, dr16, psi_cdr, cdr, sca_cdr, scb_cdr, si_cdr);
  output si16, si15, si14, si13, si12, si11, si10, si9, si8, si7, si6, si5,
    si4, si3, si2, si1, si0, scb16, scb15, scb14, scb13, scb12, scb11, scb10
    , scb9, scb8, scb7, scb6, scb5, scb4, scb3, scb2, scb1, scb0, sca16,
    sca15, sca14, sca13, sca12, sca11, sca10, sca9, sca8, sca7, sca6, sca5,
    sca4, sca3, sca2, sca1, sca0, sca_cdr, scb_cdr, si_cdr;
  input mrst_n, bist_cnt, shiftdr, psca, pscb, mult_n, jsca, jscb, corsdr,
    dr14, dr13, dr12, dr11, dr10, dr9, dr8, dr7, dr6, dr5, dr4, dr3, dr2,
    dr1, dr0, psi16, psi15, psi14, psi13, psi12, psi11, psi10, psi9, psi8,
    psi7, psi6, psi5, psi4, psi3, psi2, psi1, psi0, jsi, dr15, dr16, psi_cdr
    , cdr;
  idrcmx8 x1i509 (.psi7(psi14), .psi6(psi13), .psi5(psi12), .psi4(psi11),
    .psi3(psi10), .psi2(psi9), .psi1(psi8), .psi0(psi7), .psca(psca), .pscb
    (pscb), .mult_n(mult_n), .jsca(jsca), .jscb(jscb), .jsi(jsi), .ins7
    (dr14), .ins6(dr13), .ins5(dr12), .ins4(dr11), .ins3(dr10), .ins2(dr9),
    .ins1(dr8), .ins0(dr7), .sca7(sca14), .sca6(sca13), .sca5(sca12), .sca4
    (sca11), .sca3(sca10), .sca2(sca9), .sca1(sca8), .sca0(sca7), .scb7
    (scb14), .scb6(scb13), .scb5(scb12), .scb4(scb11), .scb3(scb10), .scb2
    (scb9), .scb1(scb8), .scb0(scb7), .si7(si14), .si6(si13), .si5(si12),
    .si4(si11), .si3(si10), .si2(si9), .si1(si8), .si0(si7), .shiftdr
    (shiftdr), .corsdr(corsdr), .bist_cnt(bist_cnt), .mrst_n(mrst_n));
  idrcmx7 x1i527 (.psi6(psi6), .psi5(psi5), .psi4(psi4), .psi3(psi3), .psi2
    (psi2), .psi1(psi1), .psi0(psi0), .psca(psca), .pscb(pscb), .mult_n
    (mult_n), .jsca(jsca), .jscb(jscb), .jsi(jsi), .ins6(dr6), .ins5(dr5),
    .ins4(dr4), .ins3(dr3), .ins2(dr2), .ins1(dr1), .ins0(dr0), .sca6(sca6)
    , .sca5(sca5), .sca4(sca4), .sca3(sca3), .sca2(sca2), .sca1(sca1), .sca0
    (sca0), .scb6(scb6), .scb5(scb5), .scb4(scb4), .scb3(scb3), .scb2(scb2)
    , .scb1(scb1), .scb0(scb0), .si6(si6), .si5(si5), .si4(si4), .si3(si3),
    .si2(si2), .si1(si1), .si0(si0), .shiftdr(shiftdr), .corsdr(corsdr),
    .bist_cnt(bist_cnt), .mrst_n(mrst_n));
  cksi_mux x1i538 (.psi_x(psi15), .psca(psca), .pscb(pscb), .mult_n(mult_n)
    , .jsca(jsca), .jscb(jscb), .jsi(jsi), .dr_x(dr15), .sca_x(sca15),
    .scb_x(scb15), .si(si15), .shiftdr(shiftdr), .corsdr(corsdr), .bist_cnt
    (bist_cnt), .mrst_n(mrst_n));
  cksi_mux x1i674 (.psi_x(psi16), .psca(psca), .pscb(pscb), .mult_n(mult_n)
    , .jsca(jsca), .jscb(jscb), .jsi(jsi), .dr_x(dr16), .sca_x(sca16),
    .scb_x(scb16), .si(si16), .shiftdr(shiftdr), .corsdr(corsdr), .bist_cnt
    (bist_cnt), .mrst_n(mrst_n));
```

B-3

```
  cksi_mux x1i702 (.psi_x(psi_cdr), .psca(psca), .pscb(pscb), .mult_n
    (mult_n), .jsca(jsca), .jscb(jscb), .jsi(jsi), .dr_x(cdr), .sca_x
    (sca_cdr), .scb_x(scb_cdr), .si(si_cdr), .shiftdr(shiftdr), .corsdr
    (corsdr), .bist_cnt(bist_cnt), .mrst_n(mrst_n));

endmodule  // idrcmx17

module tdo_mux (select, tdo55, tdo54, tdo53, tdo52, tdo51, tdo50, tdo49,
    tdo48, tdo47, tdo46, tdo45, tdo44, tdo43, tdo42, tdo41, tdo40, tdo39,
    tdo38, tdo37, ins19, ins18, ins17, ins16, ins15, ins14, ins13, ins12,
    ins11, ins10, ins9, ins8, ins7, ins6, ins5, ins25, ins24, ins23, ins22,
    ins_tdo, mux_tdo, msp, bpr, mcr, msp_tdo, bpr_tdo, mcr_tdo, cdr_tdo, ins0,
    ins21, ocr, arm7);
  output mux_tdo;
  input select, tdo55, tdo54, tdo53, tdo52, tdo51, tdo50, tdo49, tdo48,
    tdo47, tdo46, tdo45, tdo44, tdo43, tdo42, tdo41, tdo40, tdo39, tdo38,
    tdo37, ins19, ins18, ins17, ins16, ins15, ins14, ins13, ins12, ins11,
    ins10, ins9, ins8, ins7, ins6, ins5, ins25, ins24, ins23, ins22, ins_tdo,
    msp, bpr, mcr, msp_tdo, bpr_tdo, mcr_tdo, cdr_tdo, ins0, ins21, ocr, arm7;
  wire x1n351, x1n354, x1n358, x1n360, x1n364, x1n366, x1n402, x1n404,
    x1n406, x1n411, x1n421, x1n422, x1n429, x1n432, x1n457, x1n462, x1n464;
  mx8 x1i324 (.Y(x1n402), .D0(tdo37), .D1(tdo38), .D2(tdo39), .D3(tdo40),
    .D4(tdo41), .D5(tdo42), .D6(tdo43), .D7(tdo44), .S0(x1n351), .S1(x1n354), .S
2(x1n462));
  mx8 x1i325 (.Y(x1n404), .D0(tdo45), .D1(tdo46), .D2(tdo47), .D3(tdo48),
    .D4(tdo49), .D5(tdo50), .D6(tdo51), .D7(1'b0), .S0(x1n358), .S1(x1n360),
    .S2(x1n457));
  mx8 x1i326 (.Y(x1n406), .D0(tdo52), .D1(tdo53), .D2(tdo54), .D3(tdo55),
    .D4(cdr_tdo), .D5(mcr_tdo), .D6(msp_tdo), .D7(bpr_tdo), .S0(x1n364), .S1(x1n
366), .S2(x1n464));
  or4 x1i328 (.Y(x1n462), .A(ins9), .B(ins10), .C(ins11), .D(ins12));
  or4 x1i333 (.Y(x1n354), .A(ins7), .B(ins8), .C(ins11), .D(ins12));
  or4 x1i338 (.Y(x1n351), .A(ins6), .B(ins8), .C(ins10), .D(ins12));
  or4 x1i344 (.Y(x1n360), .A(ins15), .B(ins16), .C(ins19), .D(1'b0));
  or4 x1i345 (.Y(x1n457), .A(ins17), .B(ins22), .C(ins19), .D(1'b0));
  or4 x1i346 (.Y(x1n358), .A(ins14), .B(ins16), .C(ins22), .D(1'b0));
  or4 x1i348 (.Y(x1n364), .A(ins23), .B(ocr), .C(mcr), .D(bpr));
  or4 x1i349 (.Y(x1n464), .A(ins0), .B(mcr), .C(msp), .D(bpr));
  or4 x1i350 (.Y(x1n366), .A(arm7), .B(ocr), .C(msp), .D(bpr));
  mx4 x1i401 (.Y(mux_tdo), .D0(x1n402), .D1(x1n404), .D2(x1n406), .D3
    (ins_tdo), .S0(x1n429), .S1(x1n432));
  or3 x1i410 (.Y(x1n411), .A(x1n351), .B(x1n354), .C(x1n462));
  or2 x1i424 (.Y(x1n429), .A(x1n422), .B(select));
  or2 x1i425 (.Y(x1n432), .A(x1n421), .B(select));
  or4 x1i477 (.Y(x1n422), .A(ins13), .B(x1n358), .C(x1n360), .D(x1n457));
  or4 x1i480 (.Y(x1n421), .A(ins21), .B(x1n364), .C(x1n366), .D(x1n464));

endmodule  // tdo_mux

module dr_dec (bpr, smpl, extest, intest, ins20, ins22, ins31, clamp, highz
    , ins30, ins29, ins28, ins27, ins26, ins25, ins24, ins23, msp, mcr, ins4
    , ins3, ins2, ins1, ins0, bist, ir5, bist_1n26, arm7, ins18, any_bist);
  output bpr, msp, mcr, bist_1n26, arm7, any_bist;
  input smpl, extest, intest, ins20, ins22, ins31, clamp, highz, ins30,
    ins29, ins28, ins27, ins26, ins25, ins24, ins23, ins4, ins3, ins2, ins1
    , ins0, bist, ir5, ins18;
  wire x1n351, x1n358, x1n360, x1n362, x1n473, x1n482, x1n527, x1n529,
    x1n531, x1n534, x1n536;
  nr4 x1i345 (.Y(x1n358), .A(ins31), .B(clamp), .C(highz), .D(bist));
  nr4 x1i346 (.Y(x1n362), .A(1'b0), .B(1'b0), .C(1'b0), .D(ins29));
  nd2 x1i474 (.Y(msp), .A(x1n351), .B(x1n473));
  iv x1i477 (.Y(x1n482), .A(ins30));
  nd4 x1i479 (.Y(x1n534), .A(x1n358), .B(x1n360), .C(x1n362), .D(x1n482));
  nd2 x1i524 (.Y(x1n531), .A(x1n529), .B(x1n527));
  iv x1i525 (.Y(x1n529), .A(ir5));
  nd2 x1i526 (.Y(bpr), .A(x1n531), .B(x1n536));
  iv x1i533 (.Y(x1n536), .A(x1n534));
  nr3 x1i540 (.Y(x1n527), .A(smpl), .B(intest), .C(extest));
  or4 x1i551 (.Y(mcr), .A(ins3), .B(ins2), .C(ins1), .D(ins4));
  or3 x1i570 (.Y(bist_1n26), .A(ins1), .B(ins26), .C(bist));
  nr3 x1i572 (.Y(x1n360), .A(1'b0), .B(ins20), .C(1'b0));
  or3 x1i579 (.Y(arm7), .A(ins24), .B(ins25), .C(ins18));
  nr3 x1i586 (.Y(x1n473), .A(smpl), .B(ins27), .C(extest));
  or2 x1i597 (.Y(any_bist), .A(mcr), .B(bist_1n26));
  nr3 x1i600 (.Y(x1n351), .A(1'b0), .B(ins26), .C(intest));

endmodule  // dr_dec

module bsc_out (dout, mode, tck, update, shift, tdi, dinp, tdo, enb, setn,
    inst);
  output dout, tdo, inst;
  input mode, tck, update, shift, tdi, dinp, enb, setn;
  wire x1n422, x1n423, x1n436, x1n445, x1n449;
  ld6 x1i424 (.Q(x1n422), .QN(inst), .D(x1n436), .GN(update), .RN(setn));
  fd2 x1i432 (.Q(x1n436), .QN(tdo), .CK(x1n445), .D(x1n423), .RN(setn));
  mx2i x1i433 (.YN(x1n423), .D0(dinp), .D1(tdi), .S(shift));
  mx2i x1i434 (.YN(dout), .D0(x1n449), .D1(x1n422), .S(mode));
  ad2d2 x1i440 (.Y(x1n445), .A(enb), .B(tck));
  iv x1i447 (.Y(x1n449), .A(dinp));

endmodule  // bsc_out

module mc_reg (d_1st, clockdr, shiftdr, updatedr, set_n, mode, in_s14,
    in_s13, in_s12, in_s11, in_s10, tdo, out_s14, out_s13, out_s12, out_s11
    , out_s10, inst4, inst3, inst2, inst1, inst0, mcr);
  output tdo, out_s14, out_s13, out_s12, out_s11, out_s10, inst4, inst3,
    inst2, inst1, inst0;
  input d_1st, clockdr, shiftdr, updatedr, set_n, mode, in_s14, in_s13,
    in_s12, in_s11, in_s10, mcr;
  wire x1n236, x1n253, x1n269, x1n449;
  bsc_out x1i214 (.dout(out_s10), .mode(mode), .tck(clockdr), .update
    (updatedr), .shift(shiftdr), .tdi(d_1st), .dinp(in_s10), .tdo(x1n236),
    .enb(mcr), .setn(set_n), .inst(inst0));
  bsc_out x1i244 (.dout(out_s11), .mode(mode), .tck(clockdr), .update
    (updatedr), .shift(shiftdr), .tdi(x1n236), .dinp(in_s11), .tdo(x1n253),
    .enb(mcr), .setn(set_n), .inst(inst1));
  bsc_out x1i252 (.dout(out_s12), .mode(mode), .tck(clockdr), .update
    (updatedr), .shift(shiftdr), .tdi(x1n253), .dinp(in_s12), .tdo(x1n269),
    .enb(mcr), .setn(set_n), .inst(inst2));
  bsc_out x1i279 (.dout(out_s13), .mode(mode), .tck(clockdr), .update
    (updatedr), .shift(shiftdr), .tdi(x1n269), .dinp(in_s13), .tdo(x1n449),
    .enb(mcr), .setn(set_n), .inst(inst3));
  bsc_out x1i446 (.dout(out_s14), .mode(mode), .tck(clockdr), .update
    (updatedr), .shift(shiftdr), .tdi(x1n449), .dinp(in_s14), .tdo(tdo),
    .enb(mcr), .setn(set_n), .inst(inst4));

endmodule  // mc_reg


module mcregx40 (tdi, clockdr, shiftdr, updatedr, set_n, mode, in_s139,
    in_s138, in_s137, in_s136, in_s135, in_s134, in_s133, in_s132, in_s131,
    in_s130, in_s129, in_s128, in_s127, in_s126, in_s125, in_s124, in_s123,
```

jtag_core.v

B-4

```
  in_sl22, in_sl21, in_sl20, in_sl19, in_sl18, in_sl17, in_sl16, in_sl15,
  in_sl14, in_sl13, in_sl12, in_sl11, in_sl10, in_sl9, in_sl8, in_sl7,
  in_sl6, in_sl5, in_sl4, in_sl3, in_sl2, in_sl1, in_sl0, tdo, out_sl39,
  out_sl38, out_sl37, out_sl36, out_sl35, out_sl34, out_sl33, out_sl32,
  out_sl31, out_sl30, out_sl29, out_sl28, out_sl27, out_sl26, out_sl25,
  out_sl24, out_sl23, out_sl22, out_sl21, out_sl20, out_sl19, out_sl18,
  out_sl17, out_sl16, out_sl15, out_sl14, out_sl13, out_sl12, out_sl11,
  out_sl10, out_sl9, out_sl8, out_sl7, out_sl6, out_sl5, out_sl4, out_sl3
  , out_sl2, out_sl1, out_sl0, in_st39, in_st38, in_st37, in_st36, in_st35
  , in_st34, in_st33, in_st32, in_st31, in_st30, in_st29, in_st28, in_st27
  , in_st26, in_st25, in_st24, in_st23, in_st22, in_st21, in_st20, in_st19
  , in_st18, in_st17, in_st16, in_st15, in_st14, in_st13, in_st12, in_st11
  , in_st10, in_st9, in_st8, in_st7, in_st6, in_st5, in_st4, in_st3,
  in_st2, in_st1, in_st0, mcr);
output tdo, out_sl39, out_sl38, out_sl37, out_sl36, out_sl35, out_sl34,
  out_sl33, out_sl32, out_sl31, out_sl30, out_sl29, out_sl28, out_sl27,
  out_sl26, out_sl25, out_sl24, out_sl23, out_sl22, out_sl21, out_sl20,
  out_sl19, out_sl18, out_sl17, out_sl16, out_sl15, out_sl14, out_sl13,
  out_sl12, out_sl11, out_sl10, out_sl9, out_sl8, out_sl7, out_sl6,
  out_sl5, out_sl4, out_sl3, out_sl2, out_sl1, out_sl0, in_st39, in_st38,
  in_st37, in_st36, in_st35, in_st34, in_st33, in_st32, in_st31, in_st30,
  in_st29, in_st28, in_st27, in_st26, in_st25, in_st24, in_st23, in_st22,
  in_st21, in_st20, in_st19, in_st18, in_st17, in_st16, in_st15, in_st14,
  in_st13, in_st12, in_st11, in_st10, in_st9, in_st8, in_st7, in_st6,
  in_st5, in_st4, in_st3, in_st2, in_st1, in_st0;
input tdi, clockdr, shiftdr, updatedr, set_n, mode, in_sl39, in_sl38,
  in_sl37, in_sl36, in_sl35, in_sl34, in_sl33, in_sl32, in_sl31, in_sl30,
  in_sl29, in_sl28, in_sl27, in_sl26, in_sl25, in_sl24, in_sl23, in_sl22,
  in_sl21, in_sl20, in_sl19, in_sl18, in_sl17, in_sl16, in_sl15, in_sl14,
  in_sl13, in_sl12, in_sl11, in_sl10, in_sl9, in_sl8, in_sl7, in_sl6,
  in_sl5, in_sl4, in_sl3, in_sl2, in_sl1, in_sl0, mcr;
wire x1n533, x1n551, x1n578, x1n588, x1n654, x1n656, x1n657;

// @@@ Rev1.1
nid4 ins1w (.Y(clockdr_w), .A(clockdr));
nid4 ins2w (.Y(shiftdr_w), .A(shiftdr));
nid4 ins3w (.Y(updatedr_w), .A(updatedr));
nid8 ins4w (.Y(set_n_w), .A(set_n));
nid4 ins5w (.Y(mode_w), .A(mode));

mc_reg x1i503 (.d_lst(tdi), .clockdr(clockdr_w), .shiftdr(shiftdr_w),
  .updatedr(updatedr_w), .set_n(set_n_w), .mode(mode_w), .in_sl4(in_sl35),
  .in_sl3(in_sl36), .in_sl2(in_sl37), .in_sl1(in_sl38), .in_sl0(in_sl39),
  .tdo(x1n533), .out_sl4(out_sl35), .out_sl3(out_sl36), .out_sl2(out_sl37)
  , .out_sl1(out_sl38), .out_sl0(out_sl39), .inst4(in_st35), .inst3
  (in_st36), .inst2(in_st37), .inst1(in_st38), .inst0(in_st39), .mcr(mcr)
  );
mc_reg x1i523 (.d_lst(x1n533), .clockdr(clockdr_w), .shiftdr(shiftdr_w),
  .updatedr(updatedr_w), .set_n(set_n_w), .mode(mode_w), .in_sl4(in_sl30),
  .in_sl3(in_sl31), .in_sl2(in_sl32), .in_sl1(in_sl33), .in_sl0(in_sl34),
  .tdo(x1n551), .out_sl4(out_sl30), .out_sl3(out_sl31), .out_sl2(out_sl32)
  , .out_sl1(out_sl33), .out_sl0(out_sl34), .inst4(in_st30), .inst3
  (in_st31), .inst2(in_st32), .inst1(in_st33), .inst0(in_st34), .mcr(mcr)
  );
mc_reg x1i554 (.d_lst(x1n551), .clockdr(clockdr_w), .shiftdr(shiftdr_w),
  .updatedr(updatedr_w), .set_n(set_n_w), .mode(mode_w), .in_sl4(in_sl25),
  .in_sl3(in_sl26), .in_sl2(in_sl27), .in_sl1(in_sl28), .in_sl0(in_sl29),
  .tdo(x1n578), .out_sl4(out_sl25), .out_sl3(out_sl26), .out_sl2(out_sl27)
  , .out_sl1(out_sl28), .out_sl0(out_sl29), .inst4(in_st25), .inst3
  (in_st26), .inst2(in_st27), .inst1(in_st28), .inst0(in_st29), .mcr(mcr)
  );
mc_reg x1i582 (.d_lst(x1n578), .clockdr(clockdr_w), .shiftdr(shiftdr_w),
  .updatedr(updatedr_w), .set_n(set_n_w), .mode(mode_w), .in_sl4(in_sl20),
  .in_sl3(in_sl21), .in_sl2(in_sl22), .in_sl1(in_sl23), .in_sl0(in_sl24),
  .tdo(x1n588), .out_sl4(out_sl20), .out_sl3(out_sl21), .out_sl2(out_sl22)
  , .out_sl1(out_sl23), .out_sl0(out_sl24), .inst4(in_st20), .inst3
  (in_st21), .inst2(in_st22), .inst1(in_st23), .inst0(in_st24), .mcr(mcr)
  );
mc_reg x1i665 (.d_lst(x1n588), .clockdr(clockdr_w), .shiftdr(shiftdr_w),
  .updatedr(updatedr_w), .set_n(set_n_w), .mode(mode_w), .in_sl4(in_sl15),
  .in_sl3(in_sl16), .in_sl2(in_sl17), .in_sl1(in_sl18), .in_sl0(in_sl19),
  .tdo(x1n657), .out_sl4(out_sl15), .out_sl3(out_sl16), .out_sl2(out_sl17)
  , .out_sl1(out_sl18), .out_sl0(out_sl19), .inst4(in_st15), .inst3
  (in_st16), .inst2(in_st17), .inst1(in_st18), .inst0(in_st19), .mcr(mcr)
  );
mc_reg x1i662 (.d_lst(x1n657), .clockdr(clockdr_w), .shiftdr(shiftdr_w),
  .updatedr(updatedr_w), .set_n(set_n_w), .mode(mode_w), .in_sl4(in_sl10),
  .in_sl3(in_sl11), .in_sl2(in_sl12), .in_sl1(in_sl13), .in_sl0(in_sl14),
  .tdo(x1n656), .out_sl4(out_sl10), .out_sl3(out_sl11), .out_sl2(out_sl12)
  , .out_sl1(out_sl13), .out_sl0(out_sl14), .inst4(in_st10), .inst3
  (in_st11), .inst2(in_st12), .inst1(in_st13), .inst0(in_st14), .mcr(mcr)
  );
mc_reg x1i661 (.d_lst(x1n656), .clockdr(clockdr_w), .shiftdr(shiftdr_w),
  .updatedr(updatedr_w), .set_n(set_n_w), .mode(mode_w), .in_sl4(in_sl5),
  .in_sl3(in_sl6), .in_sl2(in_sl7), .in_sl1(in_sl8), .in_sl0(in_sl9), .tdo
  (x1n654), .out_sl4(out_sl5), .out_sl3(out_sl6), .out_sl2(out_sl7),
  .out_sl1(out_sl8), .out_sl0(out_sl9), .inst4(in_st5), .inst3(in_st6),
  .inst2(in_st7), .inst1(in_st8), .inst0(in_st9), .mcr(mcr));

mc_reg x1i660 (.d_lst(x1n654), .clockdr(clockdr_w), .shiftdr(shiftdr_w),
  .updatedr(updatedr_w), .set_n(set_n_w), .mode(mode_w), .in_sl4(in_sl0),
  .in_sl3(in_sl1), .in_sl2(in_sl2), .in_sl1(in_sl3), .in_sl0(in_sl4), .tdo
  (tdo), .out_sl4(out_sl0), .out_sl3(out_sl1), .out_sl2(out_sl2), .out_sl1
  (out_sl3), .out_sl0(out_sl4), .inst4(in_st0), .inst3(in_st1), .inst2
  (in_st2), .inst1(in_st3), .inst0(in_st4), .mcr(mcr));
endmodule // mcregx40

module clk_jtag (jsca, jscb, tck);
  output jsca, jscb;
  input tck;
  wire x1n429, x1n430, x1n431, x1n432, x1n433, x1n434, x1n435, x1n436,
    x1n437, x1n446, x1n448, x1n458, x1n473, x1n474, x1n475, x1n476, x1n477,
    x1n478, x1n479, x1n480, x1n481, x1n484, x1n509, x1n513, x1n515, x1n518,
    x1n521, x1n525, x1n556, x1n557, x1n558, x1n559, x1n560, x1n561, x1n562,
    x1n563, x1n564, x1n575, x1n581, x1n582, x1n583, x1n584, x1n585, x1n586,
    x1n587, x1n588, x1n589, x1n600;
  fd3 x1i413 (.Q(x1n446), .CK(tck), .D(1'b0), .SN(x1n509));
  iv x1i427 (.Y(x1n437), .A(x1n446));
  iv x1i428 (.Y(x1n448), .A(x1n429));
  iv x1i438 (.Y(x1n429), .A(x1n430));
  iv x1i439 (.Y(x1n430), .A(x1n431));
  iv x1i440 (.Y(x1n431), .A(x1n432));
  iv x1i441 (.Y(x1n432), .A(x1n433));
  iv x1i442 (.Y(x1n433), .A(x1n434));
  iv x1i443 (.Y(x1n434), .A(x1n435));
  iv x1i444 (.Y(x1n435), .A(x1n436));
  iv x1i445 (.Y(x1n436), .A(x1n437));
  nid4 x1i451 (.Y(jscb), .A(x1n515));
  nid4 x1i454 (.Y(jsca), .A(x1n521));
  fd3 x1i456 (.Q(x1n484), .CK(x1n458), .D(1'b0), .SN(x1n600));
  iv x1i465 (.Y(x1n474), .A(x1n473));
  iv x1i466 (.Y(x1n475), .A(x1n474));
```

jtag_core.v

B-5

```
iv x1i467 (.Y(x1n476), .A(x1n475));
iv x1i468 (.Y(x1n477), .A(x1n476));
iv x1i469 (.Y(x1n478), .A(x1n477));
iv x1i470 (.Y(x1n479), .A(x1n478));
iv x1i471 (.Y(x1n480), .A(x1n479));
iv x1i472 (.Y(x1n481), .A(x1n480));
iv x1i482 (.Y(x1n518), .A(x1n481));
iv x1i483 (.Y(x1n473), .A(x1n484));
iv x1i495 (.Y(x1n458), .A(tck));
iv x1i510 (.Y(x1n513), .A(tck));
nr2 x1i511 (.Y(x1n515), .A(wb14), .B(x1n513));
nr2 x1i517 (.Y(x1n521), .A(wa14), .B(x1n525));
iv Ga1 (.Y(wa1), .A(x1n518));
iv Ga2 (.Y(wa2), .A(wa1));
iv Ga3 (.Y(wa3), .A(wa2));
iv Ga4 (.Y(wa4), .A(wa3));
iv Ga5 (.Y(wa5), .A(wa4));
iv Ga6 (.Y(wa6), .A(wa5));
iv Ga7 (.Y(wa7), .A(wa6));
iv Ga8 (.Y(wa8), .A(wa7));
iv Ga9 (.Y(wa9), .A(wa8));
iv Ga10 (.Y(wa10), .A(wa9));
iv Ga11 (.Y(wa11), .A(wa10));
iv Ga12 (.Y(wa12), .A(wa11));
iv Ga13 (.Y(wa13), .A(wa12));
iv Ga14 (.Y(wa14), .A(wa13));
iv Gb1 (.Y(wb1), .A(x1n448));
iv Gb2 (.Y(wb2), .A(wb1));
iv Gb3 (.Y(wb3), .A(wb2));
iv Gb4 (.Y(wb4), .A(wb3));
iv Gb5 (.Y(wb5), .A(wb4));
iv Gb6 (.Y(wb6), .A(wb5));
iv Gb7 (.Y(wb7), .A(wb6));
iv Gb8 (.Y(wb8), .A(wb7));
iv Gb9 (.Y(wb9), .A(wb8));
iv Gb10 (.Y(wb10), .A(wb9));
iv Gb11 (.Y(wb11), .A(wb10));
iv Gb12 (.Y(wb12), .A(wb11));
iv Gb13 (.Y(wb13), .A(wb12));
iv Gb14 (.Y(wb14), .A(wb13));

iv x1i523 (.Y(x1n525), .A(x1n458));
iv x1i548 (.Y(x1n559), .A(x1n558));
iv x1i549 (.Y(x1n557), .A(x1n556));
iv x1i550 (.Y(x1n558), .A(x1n557));
iv x1i551 (.Y(x1n560), .A(x1n559));
iv x1i552 (.Y(x1n561), .A(x1n560));
iv x1i553 (.Y(x1n562), .A(x1n561));
iv x1i554 (.Y(x1n563), .A(x1n562));
iv x1i555 (.Y(x1n564), .A(x1n563));
iv x1i566 (.Y(x1n556), .A(x1n575));
nd2 x1i567 (.Y(x1n509), .A(x1n564), .B(x1n575));
iv x1i576 (.Y(x1n575), .A(tck));
iv x1i580 (.Y(x1n589), .A(tck));
iv x1i590 (.Y(x1n581), .A(x1n582));
iv x1i591 (.Y(x1n582), .A(x1n583));
iv x1i592 (.Y(x1n583), .A(x1n584));
iv x1i593 (.Y(x1n584), .A(x1n585));
iv x1i594 (.Y(x1n585), .A(x1n586));
iv x1i595 (.Y(x1n587), .A(x1n588));
iv x1i596 (.Y(x1n588), .A(x1n589));
iv x1i597 (.Y(x1n586), .A(x1n587));
nd2 x1i598 (.Y(x1n600), .A(x1n581), .B(tck));

// WARNING - Component x1i456 has unconnected pins: 0 input, 1 output, 0 inout.
// WARNING - Component x1i413 has unconnected pins: 0 input, 1 output, 0 inout.
endmodule  // clk_jtag

module pd_1x16 (ins15, ins14, ins13, ins12, ins11, ins10, ins9, ins8, ins7,
    ins6, ins5, ins4, ins3, ins2, ins1, ins0, ir3, ir2, ir1, ir0, ir_n3,
    ir_n2, ir_n1, ir_n0, is);
  output ins15, ins14, ins13, ins12, ins11, ins10, ins9, ins8, ins7, ins6,
    ins5, ins4, ins3, ins2, ins1, ins0;
  input ir3, ir2, ir1, ir0, ir_n3, ir_n2, ir_n1, ir_n0, is;
  wire x1n376, x1n423, x1n425, x1n426, x1n427, x1n428, x1n429, x1n430,
    x1n435, x1n436, x1n437, x1n438, x1n439, x1n440, x1n441, x1n442;
 nd4 x1i311 (.Y(x1n376), .A(ir_n0), .B(ir_n1), .C(ir_n2), .D(ir_n3));
 nd4 x1i356 (.Y(x1n423), .A(ir0), .B(ir_n1), .C(ir_n2), .D(ir_n3));
 nd4 x1i357 (.Y(x1n425), .A(ir_n0), .B(ir1), .C(ir_n2), .D(ir_n3));
 nd4 x1i358 (.Y(x1n426), .A(ir0), .B(ir1), .C(ir_n2), .D(ir_n3));
 nd4 x1i359 (.Y(x1n427), .A(ir_n0), .B(ir_n1), .C(ir2), .D(ir_n3));
 nd4 x1i360 (.Y(x1n428), .A(ir0), .B(ir_n1), .C(ir2), .D(ir_n3));
 nd4 x1i361 (.Y(x1n429), .A(ir_n0), .B(ir1), .C(ir2), .D(ir_n3));
 nd4 x1i362 (.Y(x1n430), .A(ir0), .B(ir1), .C(ir2), .D(ir_n3));
 nd4 x1i363 (.Y(x1n435), .A(ir_n0), .B(ir_n1), .C(ir_n2), .D(ir3));
 nd4 x1i364 (.Y(x1n436), .A(ir0), .B(ir_n1), .C(ir_n2), .D(ir3));
 nd4 x1i365 (.Y(x1n437), .A(ir_n0), .B(ir1), .C(ir_n2), .D(ir3));
 nd4 x1i366 (.Y(x1n438), .A(ir0), .B(ir1), .C(ir_n2), .D(ir3));
 nd4 x1i367 (.Y(x1n439), .A(ir_n0), .B(ir_n1), .C(ir2), .D(ir3));
 nd4 x1i368 (.Y(x1n440), .A(ir0), .B(ir_n1), .C(ir2), .D(ir3));
 nd4 x1i369 (.Y(x1n441), .A(ir_n0), .B(ir1), .C(ir2), .D(ir3));
 nd4 x1i370 (.Y(x1n442), .A(ir0), .B(ir1), .C(ir2), .D(ir3));
 nr2 x1i375 (.Y(ins0), .A(x1n376), .B(is));
 nr2 x1i408 (.Y(ins1), .A(x1n423), .B(is));
 nr2 x1i409 (.Y(ins2), .A(x1n425), .B(is));
 nr2 x1i410 (.Y(ins3), .A(x1n426), .B(is));
 nr2 x1i411 (.Y(ins4), .A(x1n427), .B(is));
 nr2 x1i412 (.Y(ins5), .A(x1n428), .B(is));
 nr2 x1i413 (.Y(ins6), .A(x1n429), .B(is));
 nr2 x1i414 (.Y(ins7), .A(x1n430), .B(is));
 nr2 x1i415 (.Y(ins8), .A(x1n435), .B(is));
 nr2 x1i416 (.Y(ins9), .A(x1n436), .B(is));
 nr2 x1i417 (.Y(ins10), .A(x1n437), .B(is));
 nr2 x1i418 (.Y(ins11), .A(x1n438), .B(is));
 nr2 x1i419 (.Y(ins12), .A(x1n439), .B(is));
 nr2 x1i420 (.Y(ins13), .A(x1n440), .B(is));
 nr2 x1i421 (.Y(ins14), .A(x1n441), .B(is));
 nr2 x1i422 (.Y(ins15), .A(x1n442), .B(is));

endmodule  // pd_1x16

module ins_dec (bist, highz, clamp, intest, smpl, ir5, ir4, ir3, ir2, ir1,
    ir0, ir_n5, ir_n4, ir_n3, ir_n2, ir_n1, ir_n0, ins31, ins30, ins29,
    ins28, ins27, ins26, ins25, ins24, ins23, ins22, ins21, ins20, ins19,
    ins18, ins17, ins16, ins15, ins14, ins13, ins12, ins11, ins10, ins9,
    ins8, ins7, ins6, ins5, ins4, ins3, ins2, ins1, ins0, extest);
  output bist, highz, clamp, intest, smpl, ins31, ins30, ins29, ins28, ins27
    , ins26, ins25, ins24, ins23, ins22, ins21, ins20, ins19, ins18, ins17,
    ins16, ins15, ins14, ins13, ins12, ins11, ins10, ins9, ins8, ins7, ins6
    , ins5, ins4, ins3, ins2, ins1, ins0, extest;
  input ir5, ir4, ir3, ir2, ir1, ir0, ir_n5, ir_n4, ir_n3, ir_n2, ir_n1,
    ir_n0;
```

B-6

```
  wire x1n111, x1n112, x1n585, x1n586, x1n592, x1n593, x1n594, x1n595,
    x1n596;
  pd_1x16 x1i66 (.ins15(ins31), .ins14(ins30), .ins13(ins29), .ins12(ins28)
    , .ins11(ins27), .ins10(ins26), .ins9(ins25), .ins8(ins24), .ins7(ins23)
    , .ins6(ins22), .ins5(ins21), .ins4(ins20), .ins3(ins19), .ins2(ins18),
    .ins1(ins17), .ins0(ins16), .ir3(ir3), .ir2(ir2), .ir1(ir1), .ir0(ir0),
    .ir_n3(ir_n3), .ir_n2(ir_n2), .ir_n1(ir_n1), .ir_n0(ir_n0), .is(x1n112)
    );
  pd_1x16 x1i67 (.ins15(ins15), .ins14(ins14), .ins13(ins13), .ins12
    (ins12), .ins11(ins11), .ins10(ins10), .ins9(ins9), .ins8(ins8), .ins7
    (ins7), .ins6(ins6), .ins5(ins5), .ins4(ins4), .ins3(ins3), .ins2(ins2)
    , .ins1(ins1), .ins0(ins0), .ir3(ir3), .ir2(ir2), .ir1(ir1), .ir0(ir0),
    .ir_n3(ir_n3), .ir_n2(ir_n2), .ir_n1(ir_n1), .ir_n0(ir_n0), .is(x1n111)
    );
  nd2 x1i68 (.Y(x1n112), .A(ir4), .B(ir5));
  nd2 x1i69 (.Y(x1n111), .A(ir_n4), .B(ir5));
  nd2 x1i70 (.Y(x1n596), .A(ir_n4), .B(ir_n5));
  nr2 x1i72 (.Y(bist), .A(x1n594), .B(x1n596));
  nd4 x1i73 (.Y(x1n594), .A(ir0), .B(ir_n1), .C(ir2), .D(ir_n3));
  nr2 x1i75 (.Y(extest), .A(x1n585), .B(x1n596));
  nd4 x1i76 (.Y(x1n585), .A(ir_n0), .B(ir_n1), .C(ir_n2), .D(ir_n3));
  nr2 x1i78 (.Y(smpl), .A(x1n586), .B(x1n596));
  nd4 x1i79 (.Y(x1n586), .A(ir0), .B(ir_n1), .C(ir_n2), .D(ir_n3));
  nd4 x1i80 (.Y(x1n595), .A(ir_n0), .B(ir_n1), .C(ir2), .D(ir_n3));
  nr2 x1i81 (.Y(highz), .A(x1n595), .B(x1n596));
  nd4 x1i83 (.Y(x1n593), .A(ir_n0), .B(ir1), .C(ir_n2), .D(ir_n3));
  nr2 x1i84 (.Y(intest), .A(x1n593), .B(x1n596));
  nd4 x1i86 (.Y(x1n592), .A(ir0), .B(ir1), .C(ir_n2), .D(ir_n3));
  nr2 x1i87 (.Y(clamp), .A(x1n592), .B(x1n596));

endmodule  // ins_dec

module ir_cell (shiftir, dat_in, dat_ir, clockir, updateir, trst_n, reset_n
    , datir, datir_n, d_nxt);
  output datir, datir_n, d_nxt;
  input shiftir, dat_in, dat_ir, clockir, updateir, trst_n, reset_n;
  wire x1n10, x1n18;
  mx2 x1i2 (.Y(x1n10), .D0(dat_in), .D1(dat_ir), .S(shiftir));
  fd1 x1i3 (.Q(d_nxt), .CK(clockir), .D(x1n10));
  fd3 x1i4 (.Q(datir), .QN(datir_n), .CK(updateir), .D(d_nxt), .SN(x1n18));
  ad2 x1i5 (.Y(x1n18), .A(trst_n), .B(reset_n));

// WARNING - Component x1i3 has unconnected pins: 0 input, 1 output, 0 inout.
endmodule  // ir_cell

module ir_cel0 (shiftir, dat_in, dat_ir, clockir, updateir, trst_n, reset_n
    , datir, datir_n, d_nxt);
  output datir, datir_n, d_nxt;
  input shiftir, dat_in, dat_ir, clockir, updateir, trst_n, reset_n;
  wire x1n10, x1n18;
  mx2 x1i2 (.Y(x1n10), .D0(dat_in), .D1(dat_ir), .S(shiftir));
  fd1 x1i3 (.Q(d_nxt), .CK(clockir), .D(x1n10));
  fd2 x1i4 (.Q(datir), .QN(datir_n), .CK(updateir), .D(d_nxt), .RN(x1n18));
  ad2 x1i5 (.Y(x1n18), .A(trst_n), .B(reset_n));

// WARNING - Component x1i3 has unconnected pins: 0 input, 1 output, 0 inout.
endmodule  // ir_cel0

module ins_reg (shiftir, tdi, clockir, updateir, trst_n, reset_n, dout, ir5
    , ir4, ir3, ir2, ir1, ir0, ir_n5, ir_n4, ir_n3, ir_n2, ir_n1, ir_n0);
  output dout, ir5, ir4, ir3, ir2, ir1, ir0, ir_n5, ir_n4, ir_n3, ir_n2,
    ir_n1, ir_n0;
  input shiftir, tdi, clockir, updateir, trst_n, reset_n;
  wire x1n11, x1n22, x1n69, x1n88, x1n92;
  ir_cell x1i2 (.shiftir(shiftir), .dat_in(1'b1), .dat_ir(x1n69), .clockir
    (clockir), .updateir(updateir), .trst_n(trst_n), .reset_n(reset_n),
    .datir(ir2), .datir_n(ir_n2), .d_nxt(x1n22));
  ir_cell x1i29 (.shiftir(shiftir), .dat_in(1'b1), .dat_ir(x1n11), .clockir
    (clockir), .updateir(updateir), .trst_n(trst_n), .reset_n(reset_n),
    .datir(ir0), .datir_n(ir_n0), .d_nxt(dout));
  ir_cel0 x1i3 (.shiftir(shiftir), .dat_in(1'b0), .dat_ir(x1n22), .clockir
    (clockir), .updateir(updateir), .trst_n(trst_n), .reset_n(reset_n),
    .datir(ir1), .datir_n(ir_n1), .d_nxt(x1n11));
  ir_cell x1i68 (.shiftir(shiftir), .dat_in(1'b1), .dat_ir(x1n88), .clockir
    (clockir), .updateir(updateir), .trst_n(trst_n), .reset_n(reset_n),
    .datir(ir3), .datir_n(ir_n3), .d_nxt(x1n69));
  ir_cell x1i85 (.shiftir(shiftir), .dat_in(1'b1), .dat_ir(x1n92), .clockir
    (clockir), .updateir(updateir), .trst_n(trst_n), .reset_n(reset_n),
    .datir(ir4), .datir_n(ir_n4), .d_nxt(x1n88));
  ir_cell x1i86 (.shiftir(shiftir), .dat_in(1'b1), .dat_ir(tdi), .clockir
    (clockir), .updateir(updateir), .trst_n(trst_n), .reset_n(reset_n),
    .datir(ir5), .datir_n(ir_n5), .d_nxt(x1n92));

endmodule  // ins_reg


module jtag_con (trst_n, tclk, jsca, jscb, tms, enable_b, shiftir, clockir,
    updateir, select, reset_n, shiftdr, clockdr, clkdr_sca, clkdr_scb,
    updatedr, tlr, rti, ud, corsdr, clampz);
  output enable_b, shiftir, clockir, clkdr_sca, clkdr_scb, updateir, select,
    reset_n, shiftdr, clockdr, updatedr, tlr, rti, ud, corsdr;
  input trst_n, tclk, jsca, jscb, tms, clampz;
  wire x1n103, x1n110, x1n152, x1n154, x1n156, x1n158, x1n168, x1n170,
    x1n178, x1n180, x1n182, x1n184, x1n190, x1n193, x1n195, x1n205, x1n207,
    x1n209, x1n213, x1n316, x1n329, x1n331, x1n341, x1n352, x1n355, x1n74,
    x1n78, a, a_n, b, b_n, c, c_n, dr, d_n, na, nb, nc, nd, tck_n, t_n;
  fd2 x1i102 (.Q(reset_n), .CK(tck_n), .D(x1n103), .RN(trst_n));
  fd2 x1i109 (.QN(enable_b), .CK(tck_n), .D(x1n110), .RN(trst_n));
  fd3 x1i119 (.QN(shiftir), .CK(tck_n), .D(x1n78), .SN(trst_n));
  fd3 x1i126 (.QN(x1n341), .CK(tck_n), .D(dr), .SN(trst_n));
  nd2 x1i144 (.Y(x1n154), .A(b_n), .B(tms));
  nd3 x1i146 (.Y(x1n152), .A(c_n), .B(a), .C(t_n));
  nd6 x1i148 (.Y(nb), .A(x1n168), .B(x1n170), .C(x1n178), .D(x1n180), .E
    (x1n182), .F(x1n184));
  nd2 x1i16 (.Y(x1n110), .A(x1n78), .B(dr));
  nd4 x1i166 (.Y(x1n184), .A(select), .B(c), .C(a), .D(tms));
  fd3 x1i2 (.Q(a), .QN(a_n), .CK(tclk), .D(na), .SN(trst_n));
  nd5 x1i24 (.Y(x1n74), .A(a), .B(b_n), .C(c), .D(select), .E(tck_n));
  ivd2 x1i274 (.Y(t_n), .A(tms));
  nd2 x1i284 (.Y(x1n156), .A(a_n), .B(tms));
  nd3 x1i285 (.Y(x1n158), .A(select), .B(c), .C(tms));
  nd3 x1i286 (.Y(x1n168), .A(b), .B(a_n), .C(t_n));
  nd2 x1i287 (.Y(x1n170), .A(c_n), .B(t_n));
  nd3 x1i288 (.Y(x1n178), .A(d_n), .B(b), .C(t_n));
  nd3 x1i289 (.Y(x1n180), .A(d_n), .B(a_n), .C(t_n));
  nd3 x1i290 (.Y(x1n182), .A(c), .B(b_n), .C(tms));
  nd3 x1i291 (.Y(nc), .A(x1n190), .B(x1n193), .C(x1n195));
  nd2 x1i292 (.Y(x1n190), .A(c), .B(b_n));
  nd2 x1i293 (.Y(x1n193), .A(c), .B(a));
  nd4 x1i296 (.Y(nd), .A(x1n205), .B(x1n207), .C(x1n209), .D(x1n213));
  nd2 x1i298 (.Y(x1n195), .A(b_n), .B(tms));
  nd2 x1i299 (.Y(x1n205), .A(select), .B(c_n));
```

B-7

```
  fd3 x1i3 (.Q(b), .QN(b_n), .CK(tclk), .D(nb), .SN(trst_n));
  nd2 x1i300 (.Y(x1n207), .A(select), .B(b));
  nd3 x1i301 (.Y(x1n209), .A(c), .B(b_n), .C(t_n));
  nd4 x1i302 (.Y(x1n213), .A(d_n), .B(c), .C(b_n), .D(a_n));
  nd4 x1i303 (.Y(na), .A(x1n152), .B(x1n154), .C(x1n156), .D(x1n158));
  nd4 x1i304 (.Y(x1n103), .A(a), .B(b), .C(c), .D(select));
  nd4 x1i305 (.Y(x1n78), .A(select), .B(c_n), .C(b), .D(a_n));
  nd4 x1i307 (.Y(clockir), .A(select), .B(b), .C(a_n), .D(tck_n));
  ad3 Gckdren (.Y(clkdr_en), .A(a_n), .B(b), .C(d_n));
  nd2 x1i309 (.Y(clockdr), .A(clkdr_en), .B(tck_n));
  ivd2 x1i310 (.Y(tlr), .A(x1n103));
  nd4 x1i314 (.Y(x1n316), .A(a_n), .B(b_n), .C(c), .D(select));
  ivd2 x1i315 (.Y(rti), .A(x1n316));
  ivd2 x1i328 (.Y(x1n331), .A(x1n329));
  nd4 x1i333 (.Y(x1n329), .A(a_n), .B(b), .C(d_n), .D(c));
  nid4 x1i340 (.Y(shiftdr), .A(x1n341));
  or2 x1i345 (.Y(corsdr), .A(delsd), .B(x1n331));
  nr2 x1i351 (.Y(x1n355), .A(x1n352), .B(clampz));
  ivd2 x1i354 (.Y(updatedr), .A(x1n355));
  fd3 x1i4 (.Q(c), .QN(c_n), .CK(tclk), .D(nc), .SN(trst_n));
  fd3 x1i5 (.Q(select), .QN(d_n), .CK(tclk), .D(nd), .SN(trst_n));
  nd4 x1i54 (.Y(dr), .A(d_n), .B(c_n), .C(b), .D(a_n));
  ivd2 x1i63 (.Y(tck_n), .A(tclk));
  ivd2 x1i73 (.Y(updateir), .A(x1n74));

  ad4 gM1 (.Y(ud), .A(d_n), .B(c), .C(b_n), .D(a));
  nd2 gM2 (.Y(x1n352), .A(ud), .B(tck_n));

  fd2 Gclksca (.Q(qclksca), .CK(tck_n), .D(clkdr_en), .RN(trst_n));
  fd2 Gclkscb (.Q(qclkscb), .CK(tclk), .D(clkdr_en), .RN(trst_n));
  ad2 Gadsca  (.Y(clkdr_sca), .A(jsca), .B(qclksca));
  ad2 Gadscb  (.Y(clkdr_scb), .A(jscb), .B(qclkscb));

  fd2 Gdelsd (.QN(delsd), .CK(tclk), .D(dr), .RN(trst_n));

// WARNING - Component x1i126 has unconnected pins: 0 input, 1 output, 0 inout.
// WARNING - Component x1i119 has unconnected pins: 0 input, 1 output, 0 inout.
// WARNING - Component x1i109 has unconnected pins: 0 input, 1 output, 0 inout.
// WARNING - Component x1i102 has unconnected pins: 0 input, 1 output, 0 inout.
endmodule  // jtag_con


module ocr_reg (tdi, clockdr, shiftdr, updatedr, set_n, mspmode_o,
    in_sl69, in_sl68, in_sl67, in_sl66, in_sl65,
    in_sl64, in_sl63, in_sl62, in_sl61, in_sl60,
    in_sl59, in_sl58, in_sl57, in_sl56, in_sl55,
    in_sl54, in_sl53, in_sl52, in_sl51, in_sl50,
    in_sl49, in_sl48, in_sl47, in_sl46, in_sl45,
    in_sl44, in_sl43, in_sl42, in_sl41, in_sl40,
    in_sl39, in_sl38, in_sl37, in_sl36, in_sl35,
    in_sl34, in_sl33, in_sl32, in_sl31, in_sl30,
    in_sl29, in_sl28, in_sl27, in_sl26, in_sl25,
    in_sl24, in_sl23, in_sl22, in_sl21, in_sl20,
    in_sl19, in_sl18, in_sl17, in_sl16, in_sl15,
    in_sl14, in_sl13, in_sl12, in_sl11, in_sl10,
    in_sl9, in_sl8, in_sl7, in_sl6, in_sl5,
    in_sl4, in_sl3, in_sl2, in_sl1, in_sl0,
    tdo,
    out_sl69, out_sl68, out_sl67, out_sl66, out_sl65,
    out_sl64, out_sl63, out_sl62, out_sl61, out_sl60,
    out_sl59, out_sl58, out_sl57, out_sl56, out_sl55,
    out_sl54, out_sl53, out_sl52, out_sl51, out_sl50,
    out_sl49, out_sl48, out_sl47, out_sl46, out_sl45,
    out_sl44, out_sl43, out_sl42, out_sl41, out_sl40,
    out_sl39, out_sl38, out_sl37, out_sl36, out_sl35,
    out_sl34, out_sl33, out_sl32, out_sl31, out_sl30,
    out_sl29, out_sl28, out_sl27, out_sl26, out_sl25,
    out_sl24, out_sl23, out_sl22, out_sl21, out_sl20,
    out_sl19, out_sl18, out_sl17, out_sl16, out_sl15,
    out_sl14, out_sl13, out_sl12, out_sl11, out_sl10,
    out_sl9, out_sl8, out_sl7, out_sl6, out_sl5,
    out_sl4, out_sl3, out_sl2, out_sl1, out_sl0,
    in_st69, in_st68, in_st67, in_st66, in_st65,
    in_st64, in_st63, in_st62, in_st61, in_st60,
    in_st59, in_st58, in_st57, in_st56, in_st55,
    in_st54, in_st53, in_st52, in_st51, in_st50,
    in_st49, in_st48, in_st47, in_st46, in_st45,
    in_st44, in_st43, in_st42, in_st41, in_st40,
    in_st39, in_st38, in_st37, in_st36, in_st35,
    in_st34, in_st33, in_st32, in_st31, in_st30,
    in_st29, in_st28, in_st27, in_st26, in_st25,
    in_st24, in_st23, in_st22, in_st21, in_st20,
    in_st19, in_st18, in_st17, in_st16, in_st15,
    in_st14, in_st13, in_st12, in_st11, in_st10,
    in_st9, in_st8, in_st7, in_st6, in_st5,
    in_st4, in_st3, in_st2, in_st1, in_st0,
    ocr);
output tdo,
    out_sl69, out_sl68, out_sl67, out_sl66, out_sl65,
    out_sl64, out_sl63, out_sl62, out_sl61, out_sl60,
    out_sl59, out_sl58, out_sl57, out_sl56, out_sl55,
    out_sl54, out_sl53, out_sl52, out_sl51, out_sl50,
    out_sl49, out_sl48, out_sl47, out_sl46, out_sl45,
    out_sl44, out_sl43, out_sl42, out_sl41, out_sl40,
    out_sl39, out_sl38, out_sl37, out_sl36, out_sl35,
    out_sl34, out_sl33, out_sl32, out_sl31, out_sl30,
    out_sl29, out_sl28, out_sl27, out_sl26, out_sl25,
    out_sl24, out_sl23, out_sl22, out_sl21, out_sl20,
    out_sl19, out_sl18, out_sl17, out_sl16, out_sl15,
    out_sl14, out_sl13, out_sl12, out_sl11, out_sl10,
    out_sl9, out_sl8, out_sl7, out_sl6, out_sl5,
    out_sl4, out_sl3, out_sl2, out_sl1, out_sl0,
    in_st69, in_st68, in_st67, in_st66, in_st65,
    in_st64, in_st63, in_st62, in_st61, in_st60,
    in_st59, in_st58, in_st57, in_st56, in_st55,
    in_st54, in_st53, in_st52, in_st51, in_st50,
    in_st49, in_st48, in_st47, in_st46, in_st45,
    in_st44, in_st43, in_st42, in_st41, in_st40,
    in_st39, in_st38, in_st37, in_st36, in_st35,
    in_st34, in_st33, in_st32, in_st31, in_st30,
    in_st29, in_st28, in_st27, in_st26, in_st25,
    in_st24, in_st23, in_st22, in_st21, in_st20,
    in_st19, in_st18, in_st17, in_st16, in_st15,
    in_st14, in_st13, in_st12, in_st11, in_st10,
    in_st9, in_st8, in_st7, in_st6, in_st5,
    in_st4, in_st3, in_st2, in_st1, in_st0;
input tdi, clockdr, shiftdr, updatedr, set_n, mspmode_o,
    in_sl69, in_sl68, in_sl67, in_sl66, in_sl65,
    in_sl64, in_sl63, in_sl62, in_sl61, in_sl60,
    in_sl59, in_sl58, in_sl57, in_sl56, in_sl55,
    in_sl54, in_sl53, in_sl52, in_sl51, in_sl50,
    in_sl49, in_sl48, in_sl47, in_sl46, in_sl45,
```

B-8

```
    in_sl44, in_sl43, in_sl42, in_sl41, in_sl40,
    in_sl39, in_sl38, in_sl37, in_sl36, in_sl35,
    in_sl34, in_sl33, in_sl32, in_sl31, in_sl30,
    in_sl29, in_sl28, in_sl27, in_sl26, in_sl25,
    in_sl24, in_sl23, in_sl22, in_sl21, in_sl20,
    in_sl19, in_sl18, in_sl17, in_sl16, in_sl15,
    in_sl14, in_sl13, in_sl12, in_sl11, in_sl10,
    in_sl9, in_sl8, in_sl7, in_sl6, in_sl5,
    in_sl4, in_sl3, in_sl2, in_sl1, in_sl0,
    ocr;
wire xln739;

// @@@ Rev1.1
nid8 ins1w (.Y(clockdr_w), .A(clockdr));
nid8 ins2w (.Y(shiftdr_w), .A(shiftdr));
nid8 ins3w (.Y(updatedr_w), .A(updatedr));
nid8 ins4w_1 (.Y(set_n_w), .A(set_n));
nid8 ins4w_2 (.Y(set_n_w), .A(set_n));
nid8 ins5w (.Y(mspmode_o_w), .A(mspmode_o));

mc_reg xli734 (.d_lst(tdi), .clockdr(clockdr_w), .shiftdr(shiftdr_w),
  .updatedr(updatedr_w), .set_n(set_n_w), .mode(mspmode_o_w), .in_sl4(in_sl65)
,
  .in_sl3(in_sl66), .in_sl2(in_sl67), .in_sl1(in_sl68), .in_sl0(in_sl69), .tdo
  (tdo0), .out_sl4(out_sl65), .out_sl3(out_sl66), .out_sl2(out_sl67), .out_sl1
  (out_sl68), .out_sl0(out_sl69), .inst4(in_st65), .inst3(in_st66), .inst2
  (in_st67), .inst1(in_st68), .inst0(in_st69), .mcr(ocr));
mc_reg xli735 (.d_lst(tdo0), .clockdr(clockdr_w), .shiftdr(shiftdr_w),
  .updatedr(updatedr_w), .set_n(set_n_w), .mode(mspmode_o_w), .in_sl4(in_sl60)
,
  .in_sl3(in_sl61), .in_sl2(in_sl62), .in_sl1(in_sl63), .in_sl0(in_sl64), .tdo
  (tdo1), .out_sl4(out_sl60), .out_sl3(out_sl61), .out_sl2(out_sl62), .out_sl1
  (out_sl63), .out_sl0(out_sl64), .inst4(in_st60), .inst3(in_st61), .inst2
  (in_st62), .inst1(in_st63), .inst0(in_st64), .mcr(ocr));
mc_reg xli736 (.d_lst(tdo1), .clockdr(clockdr_w), .shiftdr(shiftdr_w),
  .updatedr(updatedr_w), .set_n(set_n_w), .mode(mspmode_o_w), .in_sl4(in_sl55)
,
  .in_sl3(in_sl56), .in_sl2(in_sl57), .in_sl1(in_sl58), .in_sl0(in_sl59), .tdo
  (tdo2), .out_sl4(out_sl55), .out_sl3(out_sl56), .out_sl2(out_sl57), .out_sl1
  (out_sl58), .out_sl0(out_sl59), .inst4(in_st55), .inst3(in_st56), .inst2
  (in_st57), .inst1(in_st58), .inst0(in_st59), .mcr(ocr));
mc_reg xli737 (.d_lst(tdo2), .clockdr(clockdr_w), .shiftdr(shiftdr_w),
  .updatedr(updatedr_w), .set_n(set_n_w), .mode(mspmode_o_w), .in_sl4(in_sl50)
,
  .in_sl3(in_sl51), .in_sl2(in_sl52), .in_sl1(in_sl53), .in_sl0(in_sl54), .tdo
  (tdo3), .out_sl4(out_sl50), .out_sl3(out_sl51), .out_sl2(out_sl52), .out_sl1
  (out_sl53), .out_sl0(out_sl54), .inst4(in_st50), .inst3(in_st51), .inst2
  (in_st52), .inst1(in_st53), .inst0(in_st54), .mcr(ocr));
mc_reg xli738 (.d_lst(tdo3), .clockdr(clockdr_w), .shiftdr(shiftdr_w),
  .updatedr(updatedr_w), .set_n(set_n_w), .mode(mspmode_o_w), .in_sl4(in_sl45)
,
  .in_sl3(in_sl46), .in_sl2(in_sl47), .in_sl1(in_sl48), .in_sl0(in_sl49), .tdo
  (tdo4), .out_sl4(out_sl45), .out_sl3(out_sl46), .out_sl2(out_sl47), .out_sl1
  (out_sl48), .out_sl0(out_sl49), .inst4(in_st45), .inst3(in_st46), .inst2
  (in_st47), .inst1(in_st48), .inst0(in_st49), .mcr(ocr));
mc_reg xli739 (.d_lst(tdo4), .clockdr(clockdr_w), .shiftdr(shiftdr_w),
  .updatedr(updatedr_w), .set_n(set_n_w), .mode(mspmode_o_w), .in_sl4(in_sl40)
,
  .in_sl3(in_sl41), .in_sl2(in_sl42), .in_sl1(in_sl43), .in_sl0(in_sl44), .tdo
  (tdo5), .out_sl4(out_sl40), .out_sl3(out_sl41), .out_sl2(out_sl42), .out_sl1
  (out_sl43), .out_sl0(out_sl44), .inst4(in_st40), .inst3(in_st41), .inst2
  (in_st42), .inst1(in_st43), .inst0(in_st44), .mcr(ocr));
mc_reg xli740 (.d_lst(tdo5), .clockdr(clockdr_w), .shiftdr(shiftdr_w),
  .updatedr(updatedr_w), .set_n(set_n_w), .mode(mspmode_o_w), .in_sl4(in_sl35)
,
  .in_sl3(in_sl36), .in_sl2(in_sl37), .in_sl1(in_sl38), .in_sl0(in_sl39), .tdo
  (tdo6), .out_sl4(out_sl35), .out_sl3(out_sl36), .out_sl2(out_sl37), .out_sl1
  (out_sl38), .out_sl0(out_sl39), .inst4(in_st35), .inst3(in_st36), .inst2
  (in_st37), .inst1(in_st38), .inst0(in_st39), .mcr(ocr));
mc_reg xli741 (.d_lst(tdo6), .clockdr(clockdr_w), .shiftdr(shiftdr_w),
  .updatedr(updatedr_w), .set_n(set_n_w), .mode(mspmode_o_w), .in_sl4(in_sl30)
,
  .in_sl3(in_sl31), .in_sl2(in_sl32), .in_sl1(in_sl33), .in_sl0(in_sl34), .tdo
  (tdo7), .out_sl4(out_sl30), .out_sl3(out_sl31), .out_sl2(out_sl32), .out_sl1
  (out_sl33), .out_sl0(out_sl34), .inst4(in_st30), .inst3(in_st31), .inst2
  (in_st32), .inst1(in_st33), .inst0(in_st34), .mcr(ocr));
mc_reg xli742 (.d_lst(tdo7), .clockdr(clockdr_w), .shiftdr(shiftdr_w),
  .updatedr(updatedr_w), .set_n(set_n_w), .mode(mspmode_o_w), .in_sl4(in_sl25)
,
  .in_sl3(in_sl26), .in_sl2(in_sl27), .in_sl1(in_sl28), .in_sl0(in_sl29), .tdo
  (tdo8), .out_sl4(out_sl25), .out_sl3(out_sl26), .out_sl2(out_sl27), .out_sl1
  (out_sl28), .out_sl0(out_sl29), .inst4(in_st25), .inst3(in_st26), .inst2
  (in_st27), .inst1(in_st28), .inst0(in_st29), .mcr(ocr));
mc_reg xli743 (.d_lst(tdo8), .clockdr(clockdr_w), .shiftdr(shiftdr_w),
  .updatedr(updatedr_w), .set_n(set_n_w), .mode(mspmode_o_w), .in_sl4(in_sl20)
,
  .in_sl3(in_sl21), .in_sl2(in_sl22), .in_sl1(in_sl23), .in_sl0(in_sl24), .tdo
  (tdo9), .out_sl4(out_sl20), .out_sl3(out_sl21), .out_sl2(out_sl22), .out_sl1
  (out_sl23), .out_sl0(out_sl24), .inst4(in_st20), .inst3(in_st21), .inst2
  (in_st22), .inst1(in_st23), .inst0(in_st24), .mcr(ocr));
mc_reg xli744 (.d_lst(tdo9), .clockdr(clockdr_w), .shiftdr(shiftdr_w),
  .updatedr(updatedr_w), .set_n(set_n_w), .mode(mspmode_o_w), .in_sl4(in_sl15)
,
  .in_sl3(in_sl16), .in_sl2(in_sl17), .in_sl1(in_sl18), .in_sl0(in_sl19), .tdo
  (tdo10), .out_sl4(out_sl15), .out_sl3(out_sl16), .out_sl2(out_sl17), .out_sl
1
  (out_sl18), .out_sl0(out_sl19), .inst4(in_st15), .inst3(in_st16), .inst2
  (in_st17), .inst1(in_st18), .inst0(in_st19), .mcr(ocr));
mc_reg xli745 (.d_lst(tdo10), .clockdr(clockdr_w), .shiftdr(shiftdr_w),
  .updatedr(updatedr_w), .set_n(set_n_w), .mode(mspmode_o_w), .in_sl4(in_sl10)
,
  .in_sl3(in_sl11), .in_sl2(in_sl12), .in_sl1(in_sl13), .in_sl0(in_sl14), .tdo
  (tdo11), .out_sl4(out_sl10), .out_sl3(out_sl11), .out_sl2(out_sl12), .out_sl
1
  (out_sl13), .out_sl0(out_sl14), .inst4(in_st10), .inst3(in_st11), .inst2
  (in_st12), .inst1(in_st13), .inst0(in_st14), .mcr(ocr));
mc_reg xli746 (.d_lst(tdo11), .clockdr(clockdr_w), .shiftdr(shiftdr_w),
  .updatedr(updatedr_w), .set_n(set_n_w), .mode(mspmode_o_w), .in_sl4(in_sl5),

  .in_sl3(in_sl6), .in_sl2(in_sl7), .in_sl1(in_sl8), .in_sl0(in_sl9), .tdo
  (tdo12), .out_sl4(out_sl5), .out_sl3(out_sl6), .out_sl2(out_sl7),
  .out_sl1(out_sl8), .out_sl0(out_sl9), .inst4(in_st5), .inst3(in_st6),
  .inst2(in_st7), .inst1(in_st8), .inst0(in_st9), .mcr(ocr));
mc_reg xli747 (.d_lst(tdo12), .clockdr(clockdr_w), .shiftdr(shiftdr_w),
  .updatedr(updatedr_w), .set_n(set_n_w), .mode(mspmode_o_w), .in_sl4(in_sl0),

  .in_sl3(in_sl1), .in_sl2(in_sl2), .in_sl1(in_sl3), .in_sl0(in_sl4), .tdo
  (tdo), .out_sl4(out_sl0), .out_sl3(out_sl1), .out_sl2(out_sl2),
  .out_sl1(out_sl3), .out_sl0(out_sl4), .inst4(in_st0), .inst3(in_st1),
  .inst2(in_st2), .inst1(in_st3), .inst0(in_st4), .mcr(ocr));

endmodule  // ocr_reg
```

jtag_core.v

B-9

```
module mspn_top (sys_clk, msp, ins0, ins1, ins2, ins3, ins4, ins5, ins6,
    ins7, ins8, ins9, ins10, ins11, ins12, ins13, ins14, ins15, ins16, ins17
    , ins18, ins19, ins20, ins21, ins22, ins23, ins24, ins25, ins26, ins27,
    ins28, ins29, ins30, ins31, si_cdr, scb_cdr, sca_cdr, psi_cdr, mclk,
    clockdr, clkdr_sca, clkdr_scb,
    mcrp0, mcrp1, mcrp2, mcrp3, mcrp4, mcrp5, mcrp6, mcrp7, mcrp8,
    mcrp9, mcrp10, mcrp11, mcrp12, mcrp13, mcrp14, mcrp15, mcrp16, mcrp17,
    mcrp18, mcrp19, mcrp20, mcrp21, mcrp22, mcrp23, mcrp24, mcrp25, mcrp26,
    mcrp27, mcrp28, mcrp29, mcrp30, mcrp31, mcrp32, mcrp33, mcrp34, mcrp35,
    mcrp36, mcrp37, mcrp38, mcrp39, mcr_out0, mcr_out1, mcr_out2, mcr_out3,
    mcr_out4, mcr_out5, mcr_out6, mcr_out7, mcr_out8, mcr_out9, mcr_out10,
    mcr_out11, mcr_out12, mcr_out13, mcr_out14, mcr_out15, mcr_out16,
    mcr_out17, mcr_out18, mcr_out19, mcr_out20, mcr_out21, mcr_out22,
    mcr_out23, mcr_out24, mcr_out25, mcr_out26, mcr_out27, mcr_out28,
    mcr_out29, mcr_out30, mcr_out31, mcr_out32, mcr_out33, mcr_out34,
    mcr_out35, mcr_out36, mcr_out37, mcr_out38, mcr_out39, any_bist, scb0,
    scb1, scb2, scb3, scb4, scb5, scb6, scb7, scb8, scb9, scb10, scb11,
    scb12, scb13, scb14, scb15, scb16, dr_tdo0, dr_tdo1, dr_tdo2, dr_tdo3,
    dr_tdo4, dr_tdo5, dr_tdo6, dr_tdo7, dr_tdo8, dr_tdo9, dr_tdo10, dr_tdo11
    , dr_tdo12, dr_tdo13, dr_tdo14, dr_tdo15, dr_tdo16, dr_tdo17, si0, si1,
    si2, si3, si4, si5, si6, si7, si8, si9, si10, si11, si12, si13, si14,
    si15, si16, psi0, psi1, psi2, psi3, psi4, psi5, psi6, psi7, psi8, psi9,
    psi10, psi11, psi12, psi13, psi14, psi15, psi16, pscb, tms, tdi, tclk,
    trst_n, updatedr, tdo_data, tdo_enb, clk1o, mspmode_o,
    mcr_in0, mcr_in1, mcr_in2,
    mcr_in3, mcr_in4, mcr_in5, mcr_in6, mcr_in7, mcr_in8, mcr_in9, mcr_in10
    , mcr_in11, mcr_in12, mcr_in13, mcr_in14, mcr_in15, mcr_in16, mcr_in17,
    mcr_in18, mcr_in19, mcr_in20, mcr_in21, mcr_in22, mcr_in23, mcr_in24,
    mcr_in25, mcr_in26, mcr_in27, mcr_in28, mcr_in29, mcr_in30, mcr_in31,
    mcr_in32, mcr_in33, mcr_in34, mcr_in35, mcr_in36, mcr_in37, mcr_in38,
    mcr_in39, mrst_n, shiftdr, tlr, rti, ud, reset_n, psca, sca0, sca1, sca2,
    sca3, sca4, sca5, sca6, sca7, sca8, sca9, sca10, sca11, sca12, sca13,
    sca14, sca15, sca16, bsr_tdo, cdr_tdo, arm7mode_i, arm7mode_o, arm7, por,
    mspmode_c, arm7_clk1o, arm7_clk2o, clk2o, mspmode_i, mb2_clk1o,
    mb2_clk2o, mb4_clk1o, mb3_clk1o, mb3_clk2o, mb4_clk2o,
    ocr_out0, ocr_out1, ocr_out2, ocr_out3, ocr_out4, ocr_out5,
    ocr_out6, ocr_out7, ocr_out8, ocr_out9,
    ocr_out10, ocr_out11, ocr_out12, ocr_out13, ocr_out14, ocr_out15,
    ocr_out16, ocr_out17, ocr_out18, ocr_out19,
    ocr_out20, ocr_out21, ocr_out22, ocr_out23, ocr_out24, ocr_out25,
    ocr_out26, ocr_out27, ocr_out28, ocr_out29,
    ocr_out30, ocr_out31, ocr_out32, ocr_out33, ocr_out34, ocr_out35,
    ocr_out36, ocr_out37, ocr_out38, ocr_out39,
    ocr_out40, ocr_out41, ocr_out42, ocr_out43, ocr_out44, ocr_out45,
    ocr_out46, ocr_out47, ocr_out48, ocr_out49,
    ocr_out50, ocr_out51, ocr_out52, ocr_out53, ocr_out54, ocr_out55,
    ocr_out56, ocr_out57, ocr_out58, ocr_out59,
    ocr_out60, ocr_out61, ocr_out62, ocr_out63, ocr_out64, ocr_out65,
    ocr_out66, ocr_out67, ocr_out68, ocr_out69,
    ocrinst0, ocrinst1, ocrinst2, ocrinst3, ocrinst4, ocrinst5,
    ocrinst6, ocrinst7, ocrinst8, ocrinst9,
    ocrinst10, ocrinst11, ocrinst12, ocrinst13, ocrinst14, ocrinst15,
    ocrinst16, ocrinst17, ocrinst18, ocrinst19,
    ocrinst20, ocrinst21, ocrinst22, ocrinst23, ocrinst24, ocrinst25,
    ocrinst26, ocrinst27, ocrinst28, ocrinst29,
    ocrinst30, ocrinst31, ocrinst32, ocrinst33, ocrinst34, ocrinst35,
    ocrinst36, ocrinst37, ocrinst38, ocrinst39,
    ocrinst40, ocrinst41, ocrinst42, ocrinst43, ocrinst44, ocrinst45,
    ocrinst46, ocrinst47, ocrinst48, ocrinst49,
    ocrinst50, ocrinst51, ocrinst52, ocrinst53, ocrinst54, ocrinst55,
    ocrinst56, ocrinst57, ocrinst58, ocrinst59,
    ocrinst60, ocrinst61, ocrinst62, ocrinst63, ocrinst64, ocrinst65,
    ocrinst66, ocrinst67, ocrinst68, ocrinst69,
    in_sl0, in_sl1, in_sl2, in_sl3, in_sl4, in_sl5,
    in_sl6, in_sl7, in_sl8, in_sl9,
    in_sl10, in_sl11, in_sl12, in_sl13, in_sl14, in_sl15,
    in_sl16, in_sl17, in_sl18, in_sl19,
    in_sl20, in_sl21, in_sl22, in_sl23, in_sl24, in_sl25,
    in_sl26, in_sl27, in_sl28, in_sl29,
    in_sl30, in_sl31, in_sl32, in_sl33, in_sl34, in_sl35,
    in_sl36, in_sl37, in_sl38, in_sl39,
    in_sl40, in_sl41, in_sl42, in_sl43, in_sl44, in_sl45,
    in_sl46, in_sl47, in_sl48, in_sl49,
    in_sl50, in_sl51, in_sl52, in_sl53, in_sl54, in_sl55,
    in_sl56, in_sl57, in_sl58, in_sl59,
    in_sl60, in_sl61, in_sl62, in_sl63, in_sl64, in_sl65,
    in_sl66, in_sl67, in_sl68, in_sl69
);
  output sys_clk, msp, ins0, ins1, ins2, ins3, ins4, ins5, ins6, ins7, ins8
    , ins9, ins10, ins11, ins12, ins13, ins14, ins15, ins16, ins17, ins18,
    ins19, ins20, ins21, ins22, ins23, ins24, ins25, ins26, ins27, ins28,
    ins29, ins30, ins31, si_cdr, scb_cdr, sca_cdr,
    clockdr, clkdr_sca, clkdr_scb,
    mcrp0, mcrp1,
    mcrp2, mcrp3, mcrp4, mcrp5, mcrp6, mcrp7, mcrp8, mcrp9, mcrp10, mcrp11,
    mcrp12, mcrp13, mcrp14, mcrp15, mcrp16, mcrp17, mcrp18, mcrp19, mcrp20,
    mcrp21, mcrp22, mcrp23, mcrp24, mcrp25, mcrp26, mcrp27, mcrp28, mcrp29,
    mcrp30, mcrp31, mcrp32, mcrp33, mcrp34, mcrp35, mcrp36, mcrp37, mcrp38,
    mcrp39, mcr_out0, mcr_out1, mcr_out2, mcr_out3, mcr_out4, mcr_out5,
    mcr_out6, mcr_out7, mcr_out8, mcr_out9, mcr_out10, mcr_out11, mcr_out12
    , mcr_out13, mcr_out14, mcr_out15, mcr_out16, mcr_out17, mcr_out18,
    mcr_out19, mcr_out20, mcr_out21, mcr_out22, mcr_out23, mcr_out24,
    mcr_out25, mcr_out26, mcr_out27, mcr_out28, mcr_out29, mcr_out30,
    mcr_out31, mcr_out32, mcr_out33, mcr_out34, mcr_out35, mcr_out36,
    mcr_out37, mcr_out38, mcr_out39, any_bist, scb0, scb1, scb2, scb3, scb4
    , scb5, scb6, scb7, scb8, scb9, scb10, scb11, scb12, scb13, scb14, scb15
    , scb16, si0, si1, si2, si3, si4, si5, si6, si7, si8, si9, si10, si11,
    si12, si13, si14, si15, si16, updatedr, tdo_data, tdo_enb,
    clk1o, mspmode_o, shiftdr,
    tlr, rti, ud, reset_n, sca0, sca1, sca2, sca3, sca4, sca5, sca6, sca7,
    sca8, sca9, sca10, sca11, sca12, sca13, sca14, sca15, sca16, arm7mode_i,
    arm7mode_o, arm7, mspmode_c, arm7_clk1o, arm7_clk2o, clk2o, mspmode_i,
    mb2_clk1o, mb2_clk2o, mb4_clk1o, mb3_clk1o, mb3_clk2o, mb4_clk2o,
    ocr_out0, ocr_out1, ocr_out2, ocr_out3, ocr_out4, ocr_out5,
    ocr_out6, ocr_out7, ocr_out8, ocr_out9,
    ocr_out10, ocr_out11, ocr_out12, ocr_out13, ocr_out14, ocr_out15,
    ocr_out16, ocr_out17, ocr_out18, ocr_out19,
    ocr_out20, ocr_out21, ocr_out22, ocr_out23, ocr_out24, ocr_out25,
    ocr_out26, ocr_out27, ocr_out28, ocr_out29,
    ocr_out30, ocr_out31, ocr_out32, ocr_out33, ocr_out34, ocr_out35,
    ocr_out36, ocr_out37, ocr_out38, ocr_out39,
    ocr_out40, ocr_out41, ocr_out42, ocr_out43, ocr_out44, ocr_out45,
    ocr_out46, ocr_out47, ocr_out48, ocr_out49,
    ocr_out50, ocr_out51, ocr_out52, ocr_out53, ocr_out54, ocr_out55,
    ocr_out56, ocr_out57, ocr_out58, ocr_out59,
    ocr_out60, ocr_out61, ocr_out62, ocr_out63, ocr_out64, ocr_out65,
    ocr_out66, ocr_out67, ocr_out68, ocr_out69,
    ocrinst0, ocrinst1, ocrinst2, ocrinst3, ocrinst4, ocrinst5,
    ocrinst6, ocrinst7, ocrinst8, ocrinst9,
    ocrinst10, ocrinst11, ocrinst12, ocrinst13, ocrinst14, ocrinst15,
```

B-10

```
  ocrinst16, ocrinst17, ocrinst18, ocrinst19,
  ocrinst20, ocrinst21, ocrinst22, ocrinst23, ocrinst24, ocrinst25,
  ocrinst26, ocrinst27, ocrinst28, ocrinst29,
  ocrinst30, ocrinst31, ocrinst32, ocrinst33, ocrinst34, ocrinst35,
  ocrinst36, ocrinst37, ocrinst38, ocrinst39,
  ocrinst40, ocrinst41, ocrinst42, ocrinst43, ocrinst44, ocrinst45,
  ocrinst46, ocrinst47, ocrinst48, ocrinst49,
  ocrinst50, ocrinst51, ocrinst52, ocrinst53, ocrinst54, ocrinst55,
  ocrinst56, ocrinst57, ocrinst58, ocrinst59,
  ocrinst60, ocrinst61, ocrinst62, ocrinst63, ocrinst64, ocrinst65,
  ocrinst66, ocrinst67, ocrinst68, ocrinst69;
input psi_cdr, mclk, dr_tdo0, dr_tdo1, dr_tdo2, dr_tdo3, dr_tdo4, dr_tdo5
  , dr_tdo6, dr_tdo7, dr_tdo8, dr_tdo9, dr_tdo10, dr_tdo11, dr_tdo12,
  dr_tdo13, dr_tdo14, dr_tdo15, dr_tdo16, dr_tdo17, psi0, psi1, psi2, psi3
  , psi4, psi5, psi6, psi7, psi8, psi9, psi10, psi11, psi12, psi13, psi14
  , psi15, psi16, pscb, tms, tdi, tclk, trst_n, mcr_in0, mcr_in1, mcr_in2
  , mcr_in3, mcr_in4, mcr_in5, mcr_in6, mcr_in7, mcr_in8, mcr_in9,
  mcr_in10, mcr_in11, mcr_in12, mcr_in13, mcr_in14, mcr_in15, mcr_in16,
  mcr_in17, mcr_in18, mcr_in19, mcr_in20, mcr_in21, mcr_in22, mcr_in23,
  mcr_in24, mcr_in25, mcr_in26, mcr_in27, mcr_in28, mcr_in29, mcr_in30,
  mcr_in31, mcr_in32, mcr_in33, mcr_in34, mcr_in35, mcr_in36, mcr_in37,
  mcr_in38, mcr_in39, mrst_n, psca, bsr_tdo, cdr_tdo, por,
  in_sl0, in_sl1, in_sl2, in_sl3, in_sl4, in_sl5,
  in_sl6, in_sl7, in_sl8, in_sl9,
  in_sl10, in_sl11, in_sl12, in_sl13, in_sl14, in_sl15,
  in_sl16, in_sl17, in_sl18, in_sl19,
  in_sl20, in_sl21, in_sl22, in_sl23, in_sl24, in_sl25,
  in_sl26, in_sl27, in_sl28, in_sl29,
  in_sl30, in_sl31, in_sl32, in_sl33, in_sl34, in_sl35,
  in_sl36, in_sl37, in_sl38, in_sl39,
  in_sl40, in_sl41, in_sl42, in_sl43, in_sl44, in_sl45,
  in_sl46, in_sl47, in_sl48, in_sl49,
  in_sl50, in_sl51, in_sl52, in_sl53, in_sl54, in_sl55,
  in_sl56, in_sl57, in_sl58, in_sl59,
  in_sl60, in_sl61, in_sl62, in_sl63, in_sl64, in_sl65,
  in_sl66, in_sl67, in_sl68, in_sl69;
wire xln1262, bist, bist_ln26, bist_cnt, bpr, bpstdo, clamp, clockir,
  corsdr, dr_tdo18, extest, highz, ins_tdo, intest, ir0, ir1, ir2
  , ir3, ir4, ir5, ir_n0, ir_n1, ir_n2, ir_n3, ir_n4, ir_n5, jsca, jscb,
  mcr, mcr_tdo, mult_n, muxtdo, select, shiftir, smpl, treset_i,
  updateir;
con_log xli1275 (.arm7mode_i(arm7mode_i), .arm7mode_o(arm7mode_o),
  .arm7_1o(arm7_clk1o), .arm7_2o(arm7_clk2o), .bist(bist), .bist_ln26
  (bist_ln26), .bist_cnt(bist_cnt), .clk1o(clk1o), .clk2o(clk2o),
  .extest(extest), .ins18(ins18), .ins20(ins20), .ins22(ins22),
  .ins28(ins28), .ins31(ins31), .ins27(ins27), .ins26(ins26), .ins25
  (ins25), .ins24(ins24), .ins4(ins4), .ins3(ins3), .ins2(ins2), .ins1
  (ins1), .intest(intest), .jsca(jsca), .jscb(jscb), .jtclk(xln1262),
  .mb2_1o(mb2_clk1o), .mb2_2o(mb2_clk2o), .mb3_1o(mb3_clk1o), .mb3_2o
  (mb3_clk2o), .mb4_1o(mb4_clk1o), .mb4_2o(mb4_clk2o), .mclk(mclk),
  .mrst_n(mrst_n), .mspmode_c(mspmode_c), .mspmode_i(mspmode_i),
  .mspmode_o(mspmode_o), .mult_n(mult_n), .muxtdo(muxtdo), .por(por),
  .reset_n(reset_n), .rti(rti), .smpl(smpl), .sys_clk(sys_clk), .tclk
  (tclk), .tdo_data(tdo_data), .ins29(ins29), .tms(tms),
  .treset_i(treset_i), .trest_n(trst_n));
bps_reg xli1311 (.shiftdr(shiftdr), .tdi(tdi), .clockdr(clockdr), .tdo
  (bpstdo));
idrcmx17 xli1312 (.mrst_n(mrst_n), .bist_cnt(bist_cnt), .shiftdr(shiftdr)
  , .psca(psca), .pscb(pscb), .mult_n(mult_n), .jsca(jsca), .jscb(jscb),
  .corsdr(corsdr), .dr14(ins19), .dr13(ins18), .dr12(ins17), .dr11(ins16)
  , .dr10(ins15), .dr9(ins14), .dr8(ins13), .dr7(ins12), .dr6(ins11), .dr5
  (ins10), .dr4(ins9), .dr3(ins8), .dr2(ins7), .dr1(ins6), .dr0(ins5),
  .psi16(psi16), .psi15(psi15), .psi14(psi14), .psi13(psi13), .psi12
  (psi12), .psi11(psi11), .psi10(psi10), .psi9(psi9), .psi8(psi8), .psi7
  (psi7), .psi6(psi6), .psi5(psi5), .psi4(psi4), .psi3(psi3), .psi2(psi2)
  , .psi1(psi1), .psi0(psi0), .si16(si16), .si15(si15), .si14(si14), .si13
  (si13), .si12(si12), .si11(si11), .si10(si10), .si9(si9), .si8(si8),
  .si7(si7), .si6(si6), .si5(si5), .si4(si4), .si3(si3), .si2(si2), .si1
  (si1), .si0(si0), .scb16(scb16), .scb15(scb15), .scb14(scb14), .scb13
  (scb13), .scb12(scb12), .scb11(scb11), .scb10(scb10), .scb9(scb9), .scb8
  (scb8), .scb7(scb7), .scb6(scb6), .scb5(scb5), .scb4(scb4), .scb3(scb3)
  , .scb2(scb2), .scb1(scb1), .scb0(scb0), .sca16(sca16), .sca15(sca15),
  .sca14(sca14), .sca13(sca13), .sca12(sca12), .sca11(sca11), .sca10
  (sca10), .sca9(sca9), .sca8(sca8), .sca7(sca7), .sca6(sca6), .sca5(sca5)
  , .sca4(sca4), .sca3(sca3), .sca2(sca2), .sca1(sca1), .sca0(sca0), .jsi
  (tdi), .dr15(ins21), .dr16(ins23), .psi_cdr(psi_cdr), .cdr(ins0),
  .sca_cdr(sca_cdr), .scb_cdr(scb_cdr), .si_cdr(si_cdr));
tdo_mux xli1313 (.select(select), .tdo55(dr_tdo18), .tdo54(dr_tdo17),
  .tdo53(dr_tdo16), .tdo52(dr_tdo15), .tdo51(dr_tdo14), .tdo50(dr_tdo13),
  .tdo49(dr_tdo12), .tdo48(dr_tdo11), .tdo47(dr_tdo10), .tdo46(dr_tdo9),
  .tdo45(dr_tdo8), .tdo44(dr_tdo7), .tdo43(dr_tdo6), .tdo42(dr_tdo5),
  .tdo41(dr_tdo4), .tdo40(dr_tdo3), .tdo39(dr_tdo2), .tdo38(dr_tdo1),
  .tdo37(dr_tdo0), .ins19(ins19), .ins18(ins18), .ins17(ins17), .ins16
  (ins16), .ins15(ins15), .ins14(ins14), .ins13(ins13), .ins12(ins12),
  .ins11(ins11), .ins10(ins10), .ins9(ins9), .ins8(ins8), .ins7(ins7),
  .ins6(ins6), .ins5(ins5), .ins25(ins25), .ins24(ins24), .ins23(ins23),
  .ins22(ins22), .ins_tdo(ins_tdo), .mux_tdo(muxtdo), .msp(msp), .bpr(bpr),
  .mcr(mcr), .msp_tdo(bsr_tdo), .bpr_tdo(bpstdo), .mcr_tdo(mcr_tdo), .cdr_tdo
  (cdr_tdo), .ins0(ins0), .ins21(ins21), .ocr(ins28), .arm7(arm7));
dr_dec xli1318 (.bpr(bpr), .smpl(smpl), .extest(extest), .intest(intest),
  .ins20(ins20), .ins22(ins22), .ins31(ins31), .clamp(clamp), .highz
  (highz), .ins30(ins30), .ins29(ins29), .ins28(ins28), .ins27(ins27),
  .ins26(ins26), .ins25(ins25), .ins24(ins24), .ins23(ins23), .msp(msp),
  .mcr(mcr), .ins4(ins4), .ins3(ins3), .ins2(ins2), .ins1(ins1), .ins0
  (ins0), .bist(bist), .ir5(ir5), .bist_ln26(bist_ln26), .arm7(arm7),
  .ins18(ins18), .any_bist(any_bist));
mcregx40 xli1321 (.tdi(tdi), .clockdr(clockdr), .shiftdr(shiftdr),
  .updatedr(updatedr), .set_n(reset_n), .mode(mspmode_o), .in_sl39
  (mcr_in39), .in_sl38(mcr_in38), .in_sl37(mcr_in37), .in_sl36(mcr_in36),
  .in_sl35(mcr_in35), .in_sl34(mcr_in34), .in_sl33(mcr_in33), .in_sl32
  (mcr_in32), .in_sl31(mcr_in31), .in_sl30(mcr_in30), .in_sl29(mcr_in29),
  .in_sl28(mcr_in28), .in_sl27(mcr_in27), .in_sl26(mcr_in26), .in_sl25
  (mcr_in25), .in_sl24(mcr_in24), .in_sl23(mcr_in23), .in_sl22(mcr_in22),
  .in_sl21(mcr_in21), .in_sl20(mcr_in20), .in_sl19(mcr_in19), .in_sl18
  (mcr_in18), .in_sl17(mcr_in17), .in_sl16(mcr_in16), .in_sl15(mcr_in15),
  .in_sl14(mcr_in14), .in_sl13(mcr_in13), .in_sl12(mcr_in12), .in_sl11
  (mcr_in11), .in_sl10(mcr_in10), .in_sl9(mcr_in9), .in_sl8(mcr_in8),
  .in_sl7(mcr_in7), .in_sl6(mcr_in6), .in_sl5(mcr_in5), .in_sl4(mcr_in4),
  .in_sl3(mcr_in3), .in_sl2(mcr_in2), .in_sl1(mcr_in1), .in_sl0(mcr_in0),
  .tdo(mcr_tdo), .out_sl39(mcrp39), .out_sl38(mcrp38), .out_sl37(mcrp37),
  .out_sl36(mcrp36), .out_sl35(mcrp35), .out_sl34(mcrp34), .out_sl33
  (mcrp33), .out_sl32(mcrp32), .out_sl31(mcrp31), .out_sl30(mcrp30),
  .out_sl29(mcrp29), .out_sl28(mcrp28), .out_sl27(mcrp27), .out_sl26
  (mcrp26), .out_sl25(mcrp25), .out_sl24(mcrp24), .out_sl23(mcrp23),
  .out_sl22(mcrp22), .out_sl21(mcrp21), .out_sl20(mcrp20), .out_sl19
  (mcrp19), .out_sl18(mcrp18), .out_sl17(mcrp17), .out_sl16(mcrp16),
  .out_sl15(mcrp15), .out_sl14(mcrp14), .out_sl13(mcrp13), .out_sl12
  (mcrp12), .out_sl11(mcrp11), .out_sl10(mcrp10), .out_sl9(mcrp9),
  .out_sl8(mcrp8), .out_sl7(mcrp7), .out_sl6(mcrp6), .out_sl5(mcrp5),
  .out_sl4(mcrp4), .out_sl3(mcrp3), .out_sl2(mcrp2), .out_sl1(mcrp1),
  .out_sl0(mcrp0), .in_st39(mcr_out39), .in_st38(mcr_out38), .in_st37
  (mcr_out37), .in_st36(mcr_out36), .in_st35(mcr_out35), .in_st34
```

jtag_core.v

B-11

```
  (mcr_out34), .in_st33(mcr_out33), .in_st32(mcr_out32), .in_st31
  (mcr_out31), .in_st30(mcr_out30), .in_st29(mcr_out29), .in_st28
  (mcr_out28), .in_st27(mcr_out27), .in_st26(mcr_out26), .in_st25
  (mcr_out25), .in_st24(mcr_out24), .in_st23(mcr_out23), .in_st22
  (mcr_out22), .in_st21(mcr_out21), .in_st20(mcr_out20), .in_st19
  (mcr_out19), .in_st18(mcr_out18), .in_st17(mcr_out17), .in_st16
  (mcr_out16), .in_st15(mcr_out15), .in_st14(mcr_out14), .in_st13
  (mcr_out13), .in_st12(mcr_out12), .in_st11(mcr_out11), .in_st10
  (mcr_out10), .in_st9(mcr_out9), .in_st8(mcr_out8), .in_st7(mcr_out7),
  .in_st6(mcr_out6), .in_st5(mcr_out5), .in_st4(mcr_out4), .in_st3
  (mcr_out3), .in_st2(mcr_out2), .in_st1(mcr_out1), .in_st0(mcr_out0),
  .mcr(mcr));
clk_jtag x1i1327 (.jsca(jsca), .jscb(jscb), .tck(x1n1262));
ins_dec x1i1329 (.bist(bist), .highz(highz), .clamp(clamp), .intest
  (intest), .smpl(smpl), .ir5(ir5), .ir4(ir4), .ir3(ir3), .ir2(ir2), .ir1
  (ir1), .ir0(ir0), .ir_n5(ir_n5), .ir_n4(ir_n4), .ir_n3(ir_n3), .ir_n2
  (ir_n2), .ir_n1(ir_n1), .ir_n0(ir_n0), .ins31(ins31), .ins30(ins30),
  .ins29(ins29), .ins28(ins28), .ins27(ins27), .ins26(ins26), .ins25
  (ins25), .ins24(ins24), .ins23(ins23), .ins22(ins22), .ins21(ins21),
  .ins20(ins20), .ins19(ins19), .ins18(ins18), .ins17(ins17), .ins16
  (ins16), .ins15(ins15), .ins14(ins14), .ins13(ins13), .ins12(ins12),
  .ins11(ins11), .ins10(ins10), .ins9(ins9), .ins8(ins8), .ins7(ins7),
  .ins6(ins6), .ins5(ins5), .ins4(ins4), .ins3(ins3), .ins2(ins2), .ins1
  (ins1), .ins0(ins0), .extest(extest));
ins_reg x1i1348 (.shiftir(shiftir), .tdi(tdi), .clockir(clockir),
  .updateir(updateir), .trst_n(treset_i), .reset_n(reset_n), .dout
  (ins_tdo), .ir5(ir5), .ir4(ir4), .ir3(ir3), .ir2(ir2), .ir1(ir1), .ir0
  (ir0), .ir_n5(ir_n5), .ir_n4(ir_n4), .ir_n3(ir_n3), .ir_n2(ir_n2),
  .ir_n1(ir_n1), .ir_n0(ir_n0));
jtag_con x1i1349 (.trst_n(treset_i), .tclk(tclk), .jsca(jsca), .jscb(jscb),
  .tms(tms), .enable_b(tdo_enb), .shiftir(shiftir), .clockir(clockir),
  .updateir(updateir), .select(select), .reset_n(reset_n), .shiftdr(shiftdr),
  .clockdr(clockdr), .clkdr_sca(clkdr_sca), .clkdr_scb(clkdr_scb),
  .updatedr(updatedr), .tlr(tlr), .rti(rti), .ud(ud), .corsdr(corsdr),
  .clampz(clamp));
ocr_reg x1i1403 (.tdi(tdi), .clockdr(clockdr), .shiftdr(shiftdr),
  .updatedr(updatedr), .set_n(reset_n), .mspmode_o(mspmode_o),
  .in_sl69 (in_sl69), .in_sl68(in_sl68), .in_sl67(in_sl67),
  .in_sl66(in_sl66), .in_sl65 (in_sl65), .in_sl64(in_sl64),
  .in_sl63(in_sl63), .in_sl62(in_sl62), .in_sl61 (in_sl61),
  .in_sl60(in_sl60),
  .in_sl59 (in_sl59), .in_sl58(in_sl58), .in_sl57(in_sl57),
  .in_sl56(in_sl56), .in_sl55 (in_sl55), .in_sl54(in_sl54),
  .in_sl53(in_sl53), .in_sl52(in_sl52), .in_sl51 (in_sl51),
  .in_sl50(in_sl50),
  .in_sl49 (in_sl49), .in_sl48(in_sl48), .in_sl47(in_sl47),
  .in_sl46(in_sl46), .in_sl45 (in_sl45), .in_sl44(in_sl44),
  .in_sl43(in_sl43), .in_sl42(in_sl42), .in_sl41 (in_sl41),
  .in_sl40(in_sl40),
  .in_sl39 (in_sl39), .in_sl38(in_sl38), .in_sl37(in_sl37),
  .in_sl36(in_sl36), .in_sl35 (in_sl35), .in_sl34(in_sl34),
  .in_sl33(in_sl33), .in_sl32(in_sl32), .in_sl31 (in_sl31),
  .in_sl30(in_sl30),
  .in_sl29 (in_sl29), .in_sl28(in_sl28), .in_sl27(in_sl27),
  .in_sl26(in_sl26), .in_sl25 (in_sl25), .in_sl24(in_sl24),
  .in_sl23(in_sl23), .in_sl22(in_sl22), .in_sl21 (in_sl21),
  .in_sl20(in_sl20),
  .in_sl19 (in_sl19), .in_sl18(in_sl18), .in_sl17(in_sl17),
  .in_sl16(in_sl16), .in_sl15 (in_sl15), .in_sl14(in_sl14),
  .in_sl13(in_sl13), .in_sl12(in_sl12), .in_sl11 (in_sl11),
  .in_sl10(in_sl10),
  .in_sl9 (in_sl9), .in_sl8(in_sl8), .in_sl7(in_sl7), .in_sl6(in_sl6),
  .in_sl5 (in_sl5), .in_sl4(in_sl4), .in_sl3(in_sl3), .in_sl2(in_sl2),
  .in_sl1 (in_sl1), .in_sl0(in_sl0),
  .tdo(dr_tdo18),
  .out_sl69 (ocr_out69), .out_sl68(ocr_out68), .out_sl67(ocr_out67),
  .out_sl66(ocr_out66), .out_sl65 (ocr_out65), .out_sl64(ocr_out64),
  .out_sl63(ocr_out63), .out_sl62(ocr_out62), .out_sl61 (ocr_out61),
  .out_sl60(ocr_out60),
  .out_sl59 (ocr_out59), .out_sl58(ocr_out58), .out_sl57(ocr_out57),
  .out_sl56(ocr_out56), .out_sl55 (ocr_out55), .out_sl54(ocr_out54),
  .out_sl53(ocr_out53), .out_sl52(ocr_out52), .out_sl51 (ocr_out51),
  .out_sl50(ocr_out50),
  .out_sl49 (ocr_out49), .out_sl48(ocr_out48), .out_sl47(ocr_out47),
  .out_sl46(ocr_out46), .out_sl45 (ocr_out45), .out_sl44(ocr_out44),
  .out_sl43(ocr_out43), .out_sl42(ocr_out42), .out_sl41 (ocr_out41),
  .out_sl40(ocr_out40),
  .out_sl39 (ocr_out39), .out_sl38(ocr_out38), .out_sl37(ocr_out37),
  .out_sl36(ocr_out36), .out_sl35 (ocr_out35), .out_sl34(ocr_out34),
  .out_sl33(ocr_out33), .out_sl32(ocr_out32), .out_sl31 (ocr_out31),
  .out_sl30(ocr_out30),
  .out_sl29 (ocr_out29), .out_sl28(ocr_out28), .out_sl27(ocr_out27),
  .out_sl26(ocr_out26), .out_sl25 (ocr_out25), .out_sl24(ocr_out24),
  .out_sl23(ocr_out23), .out_sl22(ocr_out22), .out_sl21 (ocr_out21),
  .out_sl20(ocr_out20),
  .out_sl19 (ocr_out19), .out_sl18(ocr_out18), .out_sl17(ocr_out17),
  .out_sl16(ocr_out16), .out_sl15 (ocr_out15), .out_sl14(ocr_out14),
  .out_sl13(ocr_out13), .out_sl12(ocr_out12), .out_sl11 (ocr_out11),
  .out_sl10(ocr_out10),
  .out_sl9 (ocr_out9), .out_sl8(ocr_out8), .out_sl7(ocr_out7),
  .out_sl6(ocr_out6), .out_sl5 (ocr_out5), .out_sl4(ocr_out4),
  .out_sl3(ocr_out3), .out_sl2(ocr_out2), .out_sl1 (ocr_out1),
  .out_sl0(ocr_out0),
  .in_st69 (ocrinst69), .in_st68(ocrinst68), .in_st67(ocrinst67),
  .in_st66(ocrinst66), .in_st65 (ocrinst65), .in_st64(ocrinst64),
  .in_st63(ocrinst63), .in_st62(ocrinst62), .in_st61 (ocrinst61),
  .in_st60(ocrinst60),
  .in_st59 (ocrinst59), .in_st58(ocrinst58), .in_st57(ocrinst57),
  .in_st56(ocrinst56), .in_st55 (ocrinst55), .in_st54(ocrinst54),
  .in_st53(ocrinst53), .in_st52(ocrinst52), .in_st51 (ocrinst51),
  .in_st50(ocrinst50),
  .in_st49 (ocrinst49), .in_st48(ocrinst48), .in_st47(ocrinst47),
  .in_st46(ocrinst46), .in_st45 (ocrinst45), .in_st44(ocrinst44),
  .in_st43(ocrinst43), .in_st42(ocrinst42), .in_st41 (ocrinst41),
  .in_st40(ocrinst40),
  .in_st39 (ocrinst39), .in_st38(ocrinst38), .in_st37(ocrinst37),
  .in_st36(ocrinst36), .in_st35 (ocrinst35), .in_st34(ocrinst34),
  .in_st33(ocrinst33), .in_st32(ocrinst32), .in_st31 (ocrinst31),
  .in_st30(ocrinst30),
  .in_st29 (ocrinst29), .in_st28(ocrinst28), .in_st27(ocrinst27),
  .in_st26(ocrinst26), .in_st25 (ocrinst25), .in_st24(ocrinst24),
  .in_st23(ocrinst23), .in_st22(ocrinst22), .in_st21 (ocrinst21),
  .in_st20(ocrinst20),
  .in_st19 (ocrinst19), .in_st18(ocrinst18), .in_st17(ocrinst17),
  .in_st16(ocrinst16), .in_st15 (ocrinst15), .in_st14(ocrinst14),
  .in_st13(ocrinst13), .in_st12(ocrinst12), .in_st11 (ocrinst11),
  .in_st10(ocrinst10),
  .in_st9 (ocrinst9), .in_st8(ocrinst8), .in_st7(ocrinst7),
  .in_st6(ocrinst6), .in_st5 (ocrinst5), .in_st4(ocrinst4),
  .in_st3(ocrinst3), .in_st2(ocrinst2), .in_st1 (ocrinst1),
  .in_st0(ocrinst0),
  .ocr(ins28));
```

jtag_core.v

B-12

```
endmodule  // mspn_top
```

jtag_core.v

B-13

```
//-----------------------------------------------------------------
//Copyright (c) 1996 Samsung Semiconductor Inc.
//-----------------------------------------------------------------
//Contact :
//        Sanghyeon Baeg,
//        Samsung Semiconductor Inc.
//        3655 N. 1st Street
//        San Jose, CA 95134
//        (415) 954-7005
//-----------------------------------------------------------------

module mcr_add_log(mcr, msp_mode_i, msp_mode_o, msp_mode_c, arm7_mode_i,
  arm7_mode_o, mcr_mspmode_i, mcr_mspmode_o, mcr_mspmode_c,
  mcr_arm7mode_i, mcr_arm7mode_o);

input [39:0] mcr;
input msp_mode_i, msp_mode_o, msp_mode_c, arm7_mode_i, arm7_mode_o;
output mcr_mspmode_i, mcr_mspmode_o, mcr_mspmode_c;
output mcr_arm7mode_i, mcr_arm7mode_o;

mx2 g1 (.D0(msp_mode_i), .D1(mcr[36]), .S(mcr[33]), .Y(mcr_mspmode_i));
mx2 g2 (.D0(msp_mode_o), .D1(mcr[37]), .S(mcr[33]), .Y(mcr_mspmode_o));
mx2 g3 (.D0(msp_mode_c), .D1(mcr[38]), .S(mcr[33]), .Y(mcr_mspmode_c));
mx2 g4 (.D0(arm7_mode_i), .D1(mcr[34]), .S(mcr[33]), .Y(mcr_arm7mode_i));
mx2 g5 (.D0(arm7_mode_o), .D1(mcr[35]), .S(mcr[33]), .Y(mcr_arm7mode_o));

endmodule
```

mcr_add_log.v

B-14

```
//--------------------------------------------------------------
//Copyright (c) 1996 Samsung Semiconductor Inc.
//--------------------------------------------------------------
//Contact :
//      Sanghyeon Baeg,
//      Samsung Semiconductor Inc.
//      3655 N. 1st Street
//      San Jose, CA 95134
//      (415) 954-7005
//--------------------------------------------------------------

module jtout1_lssd (    DINP,
                        TDI,
                        SHIFT,
                        TCKA,
                        TCKB,
                        ENB,
                        UPDATE,
                        SETN,
                        MODE,
                        TDO,
                        DOUT);

input   DINP;
input   TDI;
input   SHIFT;
input   TCKA;
input   TCKB;
input   ENB;
input   UPDATE;
input   SETN;
input   MODE;
output  TDO;
output  DOUT;

mx2i INS6     ( .D0(DINP), .D1(TDI), .S(SHIFT), .YN(w4));
ld1  INS7     ( .D(w4), .G(TCKA), .Q(w5), .QN());
ld1  INS8     ( .D(w5), .G(w9), .Q(w6), .QN(TDO));
ld6  INS9     ( .D(w6), .GN(UPDATE), .Q(w7), .QN(), .RN(SETN));
mx2i INS10    ( .D0(w8), .D1(w7), .S(MODE), .YN(DOUT));
iv   INS11    ( .A(DINP), .Y(w8));
ad2d2 INS12   ( .A(ENB), .B(TCKB), .Y(w9));

endmodule
```

jtout1_lssd.v

B-15

```
//-------------------------------------------------------------
//Copyright (c) 1996 Samsung Semiconductor Inc.
//-------------------------------------------------------------
//Contact :
//       Sanghyeon Baeg,
//       Samsung Semiconductor Inc.
//       3655 N. 1st Street
//       San Jose, CA 95134
//       (415) 954-7005
//---------------------------------------------------------------


module jtint1_lssd (    DINP,
                        TDI,
                        SHIFT,
                        TCKA,
                        TCKB,
                        ENB,
                        UPDATE,
                        SETN,
                        MODE,
                        TDO,
                        DOUT);

input    DINP;
input    TDI;
input    SHIFT;
input    TCKA;
input    TCKB;
input    ENB;
input    UPDATE;
input    SETN;
input    MODE;
output   TDO;
output   DOUT;

mx2i INS6    ( .D0(DINP), .D1(TDI), .S(SHIFT), .YN(w4));
ld1  INS7    ( .D(w4), .G(TCKA), .Q(w5), .QN());
ld1  INS8    ( .D(w5), .G(w9), .Q(w6), .QN(TDO));
ld6  INS9    ( .D(w6), .GN(UPDATE), .Q(w7), .QN(), .RN(SETN));
mx2i INS10   ( .D0(w8), .D1(w7), .S(MODE), .YN(DOUT));
iv   INS11   ( .A(DINP), .Y(w8));
ad2d2 INS12  ( .A(ENB), .B(TCKB), .Y(w9));

endmodule
```

jtint1_lssd.v

B-16

```
//--------------------------------------------------------------
//Copyright (c) 1996 Samsung Semiconductor Inc.
//--------------------------------------------------------------
//Contact :
//      Sanghyeon Baeg,
//      Samsung Semiconductor Inc.
//      3655 N. 1st Street
//      San Jose, CA 95134
//      (415) 954-7005
//----------------------------------------------------------------

module jtin1_lssd (      DOUT,
                         MODE,
                         TCKA,
                         TCKB,
                         UPDATE,
                         SHIFT,
                         TDI,
                         DINP,
                         TDO,
                         ENB,
                         SETN);

output   DOUT;
input    MODE;
input    TCKA;
input    TCKB;
input    UPDATE;
input    SHIFT;
input    TDI;
input    DINP;
output   TDO;
input    ENB;
input    SETN;

iv    INS13   ( .A(DINP), .Y(w10));
mx2i  INS1    ( .D0(w10), .D1(w21), .S(MODE), .YN(DOUT));
mx2i  INS2    ( .D0(DOUT), .D1(TDI), .S(SHIFT), .YN(w2));
ld1   INS3    ( .D(w2), .G(TCKA), .Q(w3), .QN());
ld1   INS4    ( .D(w3), .G(w9), .Q(w20), .QN(TDO));
ld6   INS5    ( .D(w20), .GN(UPDATE), .Q(w21), .QN(), .RN(SETN) );
ad2d2 INS12   ( .A(ENB), .B(TCKB), .Y(w9));

endmodule
```

jtin1_lssd.v

B-17

```
//--------------------------------------------------------------
//Copyright (c) 1996 Samsung Semiconductor Inc.
//--------------------------------------------------------------
//Contact :
//        Sanghyeon Baeg,
//        Samsung Semiconductor Inc.
//        3655 N. 1st Street
//        San Jose, CA 95134
//        (415) 954-7005
//----------------------------------------------------------------

module jtck_lssd (       DINP,
                         TDI,
                         SHIFT,
                         ENB,
                         TCKA,
                         TCKB,
                         TDO);

input  DINP;
input  TDI;
input  SHIFT;
input  ENB;
input  TCKA;
input  TCKB;
output TDO;

mx2i  INS1    ( .D0(DINP), .D1(TDI), .S(SHIFT), .YN(w1));
ld1   INS2    ( .D(w1), .G(TCKA), .Q(w2), .QN());
ld1   INS3    ( .D(w2), .G(w3), .Q(), .QN(TDO));
ad2d2 INS4    ( .A(ENB), .B(TCKB), .Y(w3));

endmodule
```

jtck_lssd.v

B-18

```
//---------------------------------------------------------------
//Copyright (c) 1996 Samsung Semiconductor Inc.
//---------------------------------------------------------------
//Contact :
//       Sanghyeon Baeg,
//       Samsung Semiconductor Inc.
//       3655 N. 1st Street
//       San Jose, CA 95134
//       (415) 954-7005
//---------------------------------------------------------------

module jtbi1_lssd (      DOUT0,
                         MODE0,
                         TCKA,
                         TCKB,
                         UPDATE,
                         SHIFT,
                         TDI0,
                         DINP0,
                         TDO0,
                         DINP1,
                         TDI1,
                         TDO1,
                         ENB,
                         MODE1,
                         DOUT1);

output                   DOUT0;
input                    MODE0;
input                    TCKA;
input                    TCKB;
input                    UPDATE;
input                    SHIFT;
input                    TDI0;
input                    DINP0;
output                   TDO0;
input                    DINP1;
input                    TDI1;
output                   TDO1;
input                    ENB;
input                    MODE1;
output                   DOUT1;

mx2i INS1    ( .D0(w10), .D1(w1), .S(MODE0), .YN(DOUT0));
mx2i INS2    ( .D0(DOUT0), .D1(TDI0), .S(SHIFT), .YN(w2));
ld1  INS3    ( .D(w2), .G(TCKA), .Q(w3), .QN());
ld1  INS4    ( .D(w3), .G(w9), .Q(), .QN(TDO0));
ld5  INS5    ( .D(TDO0), .GN(UPDATE), .Q(), .QN(w1));

mx2i INS6    ( .D0(DINP1), .D1(TDI1), .S(SHIFT), .YN(w4));
ld1  INS7    ( .D(w4), .G(TCKA), .Q(w5), .QN());
ld1  INS8    ( .D(w5), .G(w9), .Q(w6), .QN(TDO1));
ld5  INS9    ( .D(w6), .GN(UPDATE), .Q(w7), .QN());
mx2i INS10   ( .D0(w8), .D1(w7), .S(MODE1), .YN(DOUT1));

iv   INS11   ( .A(DINP1), .Y(w8));
ad2d2 INS12  ( .A(ENB), .B(TCKB), .Y(w9));
iv   INS13   ( .A(DINP0), .Y(w10));

endmodule
```

jtbi1_lssd.v

B-19

```
//---------------------------------------------------------------
//Samsung Boundary Scan Chain for MSP-2M
//---------------------------------------------------------------
//Copyright (c) 1996 Samsung Semiconductor Inc.
//---------------------------------------------------------------
//Created by :
//       Sanghyeon Baeg,
//       Samsung Semiconductor Inc.
//       3655 N. 1st Street
//       San Jose, CA 95134
//       (415) 954-7005
//-----------------------------------------------------------------
//Send Comments to :
//       sbaeg@sam.com
//-----------------------------------------------------------------
//Boundary scan implementation notes :
//
//       Input  Cell                        : jtin1
//       Inout  Cell                        : jtbi1
//       Output Cell                        : jtout1
//       Tri-state/opend drain control Cell : jtint1
//-----------------------------------------------------------------
//General Hook-up information
//       All the names in boundary scan  module are composed of based
//       on following convention.

//              1) PinName_FPAD
//              2) PinName_TPAD
//              3) PinName_FCORE
//              4) PinName_TCORE
//              5) PinName_ENB_FCORE
//              6) PinName_ENB_TCORE
//       PinName is the names of pins in MSP_1E. These names are based
//       on the Rev1.0 Final for MSP Quiktrun target board which was
//       released on Dec-19_95. You may get more information from Francisc.
//       FPAD : Signal is comming From pad
//       TPAD : Signal is going To pad
//       ENB  : Enable signal. The bidirectional, open drain, and
//       tri-state output pins have this signal.
//Specific Hook-up information :
//       MSPCK is using jtck cell. MSPCK is
//       have different name convention, which is MSPCK_FPAD_TCORE. This
//       is comming from from MSPCK pin and also go to MSP core.
//       There are five control BS cells for AD pins. So there are five of
//       AD##_ENB_TPAD and five of AD##_ENB_FCORE. The control line from
//       MSP core logic will be hooked up to every AD##_ENB_FCORE signals. Every

//       AD##_ENB_TPAD should be ANDed together to produce one signal which
//       goes to I/O cells of AD type.
//-----------------------------------------------------------------
//       Example :
//       AD31 with pin number 1 is a bidirectional pin with tristate.
//       The I/O cell for the pin shoud have following signals.
//       one input from pad, which need to be hooked up to AD31_FPAD0,
//       one output to pad, which need to be hooked up to  AD31_TPAD1,
//       one input from core, which need to be hooked up to AD31_FCORE1,
//       one output to core, which need to be hooked up to AD31_TCORE0,
//       one enable signal from core, which need to be hooked up to
//       AD31_ENB_FCORE,
//       one enable signal to pad, which need to be hooked up to
//       AD31_ENB_TPAD
//-----------------------------------------------------------------
//       Note :
//       Currently, only one control boundary scan is assigned to every group
//       of pins with tri-state, open drain control. For instance, AD[31:0] have

//       only one tri-state control boundary scan cell for all of them. Please
//       contact Sanghyeon Baeg for more formation.


module msp_bs_1ex (
//       TRSTL,          // pin 1
//       TMS,    // pin 1
         INTAL_ENB_TPAD, // pin 1
         INTAL_ENB_FCORE, // pin 1
         RSTL_TCORE, // pin 1
         RSTL_FPAD, // pin 1
         PCICLK_TCORE, // pin 1
         PCICLK_FPAD, // pin 1
         GNTL_TCORE, // pin 1
         GNTL_FPAD, // pin 1
         REQL_ENB_TPAD, // pin 1
         REQL_ENB_FCORE, // pin 1
         REQL_TPAD, // pin 1
         REQL_FCORE, // pin 1
         AD31_ENB_TPAD, // pin 1
         AD31_ENB_FCORE, // pin 1
         AD31_TCORE0, // pin 1
         AD31_FPAD0, // pin 1
         AD31_FCORE1, // pin 1
         AD31_TPAD1, // pin 1
         AD30_TCORE0, // pin 1
         AD30_FPAD0, // pin 1
         AD30_FCORE1, // pin 1
         AD30_TPAD1, // pin 1
         AD29_TCORE0, // pin 1
         AD29_FPAD0, // pin 1
         AD29_FCORE1, // pin 1
         AD29_TPAD1, // pin 1
         AD28_TCORE0, // pin 1
         AD28_FPAD0, // pin 1
         AD28_FCORE1, // pin 1
         AD28_TPAD1, // pin 1
         AD27_TCORE0, // pin 1
         AD27_FPAD0, // pin 1
         AD27_FCORE1, // pin 1
         AD27_TPAD1, // pin 1
         AD26_TCORE0, // pin 1
         AD26_FPAD0, // pin 1
         AD26_FCORE1, // pin 1
         AD26_TPAD1, // pin 1
         AD25_S09_ENB_TPAD, // pin 1
         AD25_S09_ENB_FCORE, // pin 1
         AD25_S09_TCORE0, // pin 1
         AD25_S09_FPAD0, // pin 1
         AD25_S09_FCORE1, // pin 1
         AD25_S09_TPAD1, // pin 1
         AD24_S08_TCORE0, // pin 1
```

B-20

```
AD24_SO8_FPAD0, // pin 1
AD24_SO8_FCORE1, // pin 1
AD24_SO8_TPAD1, // pin 1
C_BE3L_ENB_TPAD, // pin 1
C_BE3L_ENB_FCORE, // pin 1
C_BE3L_TCORE0, // pin 1
C_BE3L_FPAD0, // pin 1
C_BE3L_FCORE1, // pin 1
C_BE3L_TPAD1, // pin 1
IDSEL_TCORE, // pin 1
IDSEL_FPAD, // pin 1
AD23_SO7_TCORE0, // pin 1
AD23_SO7_FPAD0, // pin 1
AD23_SO7_FCORE1, // pin 1
AD23_SO7_TPAD1, // pin 1
AD22_SO6_TCORE0, // pin 1
AD22_SO6_FPAD0, // pin 1
AD22_SO6_FCORE1, // pin 1
AD22_SO6_TPAD1, // pin 1
AD21_SO5_TCORE0, // pin 1
AD21_SO5_FPAD0, // pin 1
AD21_SO5_FCORE1, // pin 1
AD21_SO5_TPAD1, // pin 1
AD20_SO4_TCORE0, // pin 1
AD20_SO4_FPAD0, // pin 1
AD20_SO4_FCORE1, // pin 1
AD20_SO4_TPAD1, // pin 1
AD19_SO3_TCORE0, // pin 1
AD19_SO3_FPAD0, // pin 1
AD19_SO3_FCORE1, // pin 1
AD19_SO3_TPAD1, // pin 1
AD18_SO2_TCORE0, // pin 1
AD18_SO2_FPAD0, // pin 1
AD18_SO2_FCORE1, // pin 1
AD18_SO2_TPAD1, // pin 1
AD17_SO1_TCORE0, // pin 1
AD17_SO1_FPAD0, // pin 1
AD17_SO1_FCORE1, // pin 1
AD17_SO1_TPAD1, // pin 1
AD16_SO0_TCORE0, // pin 1
AD16_SO0_FPAD0, // pin 1
AD16_SO0_FCORE1, // pin 1
AD16_SO0_TPAD1, // pin 1
C_BE2L_TCORE0, // pin 1
C_BE2L_FPAD0, // pin 1
C_BE2L_FCORE1, // pin 1
C_BE2L_TPAD1, // pin 1
FRAMEL_ENB_TPAD, // pin 1
FRAMEL_ENB_FCORE, // pin 1
FRAMEL_TCORE0, // pin 1
FRAMEL_FPAD0, // pin 1
FRAMEL_FCORE1, // pin 1
FRAMEL_TPAD1, // pin 1
IRDYL_ENB_TPAD, // pin 1
IRDYL_ENB_FCORE, // pin 1
IRDYL_TCORE0, // pin 1
IRDYL_FPAD0, // pin 1
IRDYL_FCORE1, // pin 1
IRDYL_TPAD1, // pin 1
TRDYL_ENB_TPAD, // pin 1
TRDYL_ENB_FCORE, // pin 1
TRDYL_TCORE0, // pin 1
TRDYL_FPAD0, // pin 1
TRDYL_FCORE1, // pin 1
TRDYL_TPAD1, // pin 1
DVSELL_ENB_TPAD, // pin 1
DVSELL_ENB_FCORE, // pin 1
DVSELL_TCORE0, // pin 1
DVSELL_FPAD0, // pin 1
DVSELL_FCORE1, // pin 1
DVSELL_TPAD1, // pin 1
STOPL_ENB_TPAD, // pin 1
STOPL_ENB_FCORE, // pin 1
STOPL_TCORE0, // pin 1
STOPL_FPAD0, // pin 1
STOPL_FCORE1, // pin 1
STOPL_TPAD1, // pin 1
LOCKL_ENB_TPAD, // pin 1
LOCKL_ENB_FCORE, // pin 1
LOCKL_TCORE0, // pin 1
LOCKL_FPAD0, // pin 1
LOCKL_FCORE1, // pin 1
LOCKL_TPAD1, // pin 1
PERRL_ENB_TPAD, // pin 1
PERRL_ENB_FCORE, // pin 1
PERRL_TCORE0, // pin 1
PERRL_FPAD0, // pin 1
PERRL_FCORE1, // pin 1
PERRL_TPAD1, // pin 1
SERRL_ENB_TPAD, // pin 1
SERRL_ENB_FCORE, // pin 1
// @@@ SERRL_TCORE0, // pin 1
// @@@ SERRL_FPAD0, // pin 1
SERRL_TCORE, // pin 1
SERRL_FPAD, // pin 1
// @@@ SERRL_FCORE1, // pin 1
// @@@ SERRL_TPAD1, // pin 1
TCA_TCORE, // pin 1
TCA_FPAD, // pin 1
PAR_ENB_TPAD, // pin 1
PAR_ENB_FCORE, // pin 1
PAR_TCORE0, // pin 1
PAR_FPAD0, // pin 1
PAR_FCORE1, // pin 1
PAR_TPAD1, // pin 1
C_BE1L_TCORE0, // pin 1
C_BE1L_FPAD0, // pin 1
C_BE1L_FCORE1, // pin 1
C_BE1L_TPAD1, // pin 1
AD15_SI9_ENB_TPAD, // pin 1
AD15_SI9_ENB_FCORE, // pin 1
AD15_SI9_TCORE0, // pin 1
AD15_SI9_FPAD0, // pin 1
AD15_SI9_FCORE1, // pin 1
AD15_SI9_TPAD1, // pin 1
AD14_SI8_TCORE0, // pin 1
AD14_SI8_FPAD0, // pin 1
AD14_SI8_FCORE1, // pin 1
AD14_SI8_TPAD1, // pin 1
AD13_SI7_TCORE0, // pin 1
AD13_SI7_FPAD0, // pin 1
AD13_SI7_FCORE1, // pin 1
```

msp_1ex_bs.v

B-21

```
AD13_SI7_TPAD1, // pin 1
AD12_SI6_TCORE0, // pin 1
AD12_SI6_FPAD0, // pin 1
AD12_SI6_FCORE1, // pin 1
AD12_SI6_TPAD1, // pin 1
AD11_SI5_TCORE0, // pin 1
AD11_SI5_FPAD0, // pin 1
AD11_SI5_FCORE1, // pin 1
AD11_SI5_TPAD1, // pin 1
AD10_SI4_TCORE0, // pin 1
AD10_SI4_FPAD0, // pin 1
AD10_SI4_FCORE1, // pin 1
AD10_SI4_TPAD1, // pin 1
AD09_SI3_TCORE0, // pin 1
AD09_SI3_FPAD0, // pin 1
AD09_SI3_FCORE1, // pin 1
AD09_SI3_TPAD1, // pin 1
AD08_SI2_TCORE0, // pin 1
AD08_SI2_FPAD0, // pin 1
AD08_SI2_FCORE1, // pin 1
AD08_SI2_TPAD1, // pin 1
C_BEOL_TCORE0, // pin 1
C_BEOL_FPAD0, // pin 1
C_BEOL_FCORE1, // pin 1
C_BEOL_TPAD1, // pin 1
TCB_TCORE, // pin 1
TCB_FPAD, // pin 1
TM_TCORE, // pin 1
TM_FPAD, // pin 1
AD07_SI1_TCORE0, // pin 1
AD07_SI1_FPAD0, // pin 1
AD07_SI1_FCORE1, // pin 1
AD07_SI1_TPAD1, // pin 1
AD06_SI0_TCORE0, // pin 1
AD06_SI0_FPAD0, // pin 1
AD06_SI0_FCORE1, // pin 1
AD06_SI0_TPAD1, // pin 1
AD05_MT5_ENB_TPAD, // pin 1
AD05_MT5_ENB_FCORE, // pin 1
AD05_MT5_TCORE0, // pin 1
AD05_MT5_FPAD0, // pin 1
AD05_MT5_FCORE1, // pin 1
AD05_MT5_TPAD1, // pin 1
AD04_MT4_TCORE0, // pin 1
AD04_MT4_FPAD0, // pin 1
AD04_MT4_FCORE1, // pin 1
AD04_MT4_TPAD1, // pin 1
AD03_MT3_TCORE0, // pin 1
AD03_MT3_FPAD0, // pin 1
AD03_MT3_FCORE1, // pin 1
AD03_MT3_TPAD1, // pin 1
AD02_MT2_ENB_TPAD, // pin 1
AD02_MT2_ENB_FCORE, // pin 1
AD02_MT2_TCORE0, // pin 1
AD02_MT2_FPAD0, // pin 1
AD02_MT2_FCORE1, // pin 1
AD02_MT2_TPAD1, // pin 1
AD01_MT1_TCORE0, // pin 1
AD01_MT1_FPAD0, // pin 1
AD01_MT1_FCORE1, // pin 1
AD01_MT1_TPAD1, // pin 1
AD00_MT0_TCORE0, // pin 1
AD00_MT0_FPAD0, // pin 1
AD00_MT0_FCORE1, // pin 1
AD00_MT0_TPAD1, // pin 1
MA11_TPAD, // pin 1
MA11_FCORE, // pin 1
MA10_TPAD, // pin 1
MA10_FCORE, // pin 1
MA9_TPAD, // pin 1
MA9_FCORE, // pin 1
MA8_TPAD, // pin 1
MA8_FCORE, // pin 1
MA7_TPAD, // pin 1
MA7_FCORE, // pin 1
MA6_TPAD, // pin 1
MA6_FCORE, // pin 1
MA5_TPAD, // pin 1
MA5_FCORE, // pin 1
MA4_TPAD, // pin 1
MA4_FCORE, // pin 1
MA3_TPAD, // pin 1
MA3_FCORE, // pin 1
MA2_TPAD, // pin 1
MA2_FCORE, // pin 1
MA1_TPAD, // pin 1
MA1_FCORE, // pin 1
MA0_TPAD, // pin 1
MA0_FCORE, // pin 1
RAS1L_TPAD, // pin 1
RAS1L_FCORE, // pin 1
CAS1L_TPAD, // pin 1
CAS1L_FCORE, // pin 1
MWEL_TPAD, // pin 1
MWEL_FCORE, // pin 1
DQM_TPAD, // pin 1
DQM_FCORE, // pin 1
MCS0L_TPAD, // pin 1
MCS0L_FCORE, // pin 1
MCS1L_TPAD, // pin 1
MCS1L_FCORE, // pin 1
MCKE_TPAD, // pin 1
MCKE_FCORE, // pin 1
MRDYH_TCORE, // pin 1
MRDYH_FPAD, // pin 1
MD0_ENB_TPAD, // pin 1
MD0_ENB_FCORE, // pin 1
MD0_TCORE0, // pin 1
MD0_FPAD0, // pin 1
MD0_FCORE1, // pin 1
MD0_TPAD1, // pin 1
MD1_TCORE0, // pin 1
MD1_FPAD0, // pin 1
MD1_FCORE1, // pin 1
MD1_TPAD1, // pin 1
MD2_TCORE0, // pin 1
MD2_FPAD0, // pin 1
MD2_FCORE1, // pin 1
MD2_TPAD1, // pin 1
MD3_TCORE0, // pin 1
MD3_FPAD0, // pin 1
MD3_FCORE1, // pin 1
```

msp_1ex_bs.v

B-22

```
MD3_TPAD1, // pin 1
MD4_TCORE0, // pin 1
MD4_FPAD0, // pin 1
MD4_FCORE1, // pin 1
MD4_TPAD1, // pin 1
MD5_TCORE0, // pin 1
MD5_FPAD0, // pin 1
MD5_FCORE1, // pin 1
MD5_TPAD1, // pin 1
MD6_TCORE0, // pin 1
MD6_FPAD0, // pin 1
MD6_FCORE1, // pin 1
MD6_TPAD1, // pin 1
MD7_TCORE0, // pin 1
MD7_FPAD0, // pin 1
MD7_FCORE1, // pin 1
MD7_TPAD1, // pin 1
MD8_TCORE0, // pin 1
MD8_FPAD0, // pin 1
MD8_FCORE1, // pin 1
MD8_TPAD1, // pin 1
MD9_TCORE0, // pin 1
MD9_FPAD0, // pin 1
MD9_FCORE1, // pin 1
MD9_TPAD1, // pin 1
MD10_TCORE0, // pin 1
MD10_FPAD0, // pin 1
MD10_FCORE1, // pin 1
MD10_TPAD1, // pin 1
MD11_TCORE0, // pin 1
MD11_FPAD0, // pin 1
MD11_FCORE1, // pin 1
MD11_TPAD1, // pin 1
MD12_TCORE0, // pin 1
MD12_FPAD0, // pin 1
MD12_FCORE1, // pin 1
MD12_TPAD1, // pin 1
MD13_TCORE0, // pin 1
MD13_FPAD0, // pin 1
MD13_FCORE1, // pin 1
MD13_TPAD1, // pin 1
MD14_TCORE0, // pin 1
MD14_FPAD0, // pin 1
MD14_FCORE1, // pin 1
MD14_TPAD1, // pin 1
MD15_TCORE0, // pin 1
MD15_FPAD0, // pin 1
MD15_FCORE1, // pin 1
MD15_TPAD1, // pin 1
MD16_TCORE0, // pin 1
MD16_FPAD0, // pin 1
MD16_FCORE1, // pin 1
MD16_TPAD1, // pin 1
MD17_TCORE0, // pin 1
MD17_FPAD0, // pin 1
MD17_FCORE1, // pin 1
MD17_TPAD1, // pin 1
MD18_TCORE0, // pin 1
MD18_FPAD0, // pin 1
MD18_FCORE1, // pin 1
MD18_TPAD1, // pin 1
MD19_TCORE0, // pin 1
MD19_FPAD0, // pin 1
MD19_FCORE1, // pin 1
MD19_TPAD1, // pin 1
MD20_TCORE0, // pin 1
MD20_FPAD0, // pin 1
MD20_FCORE1, // pin 1
MD20_TPAD1, // pin 1
MD21_TCORE0, // pin 1
MD21_FPAD0, // pin 1
MD21_FCORE1, // pin 1
MD21_TPAD1, // pin 1
MD22_TCORE0, // pin 1
MD22_FPAD0, // pin 1
MD22_FCORE1, // pin 1
MD22_TPAD1, // pin 1
MD23_TCORE0, // pin 1
MD23_FPAD0, // pin 1
MD23_FCORE1, // pin 1
MD23_TPAD1, // pin 1
MD24_TCORE0, // pin 1
MD24_FPAD0, // pin 1
MD24_FCORE1, // pin 1
MD24_TPAD1, // pin 1
MD25_TCORE0, // pin 1
MD25_FPAD0, // pin 1
MD25_FCORE1, // pin 1
MD25_TPAD1, // pin 1
MD26_TCORE0, // pin 1
MD26_FPAD0, // pin 1
MD26_FCORE1, // pin 1
MD26_TPAD1, // pin 1
MD27_TCORE0, // pin 1
MD27_FPAD0, // pin 1
MD27_FCORE1, // pin 1
MD27_TPAD1, // pin 1
MD28_TCORE0, // pin 1
MD28_FPAD0, // pin 1
MD28_FCORE1, // pin 1
MD28_TPAD1, // pin 1
MD29_TCORE0, // pin 1
MD29_FPAD0, // pin 1
MD29_FCORE1, // pin 1
MD29_TPAD1, // pin 1
MD30_TCORE0, // pin 1
MD30_FPAD0, // pin 1
MD30_FCORE1, // pin 1
MD30_TPAD1, // pin 1
MD31_TCORE0, // pin 1
MD31_FPAD0, // pin 1
MD31_FCORE1, // pin 1
MD31_TPAD1, // pin 1
MD32_TCORE0, // pin 1
MD32_FPAD0, // pin 1
MD32_FCORE1, // pin 1
MD32_TPAD1, // pin 1
MD33_TCORE0, // pin 1
MD33_FPAD0, // pin 1
MD33_FCORE1, // pin 1
MD33_TPAD1, // pin 1
MD34_TCORE0, // pin 1
```

msp_1ex_bs.v

B-23

```
MD34_FPAD0, // pin 1
MD34_FCORE1, // pin 1
MD34_TPAD1, // pin 1
MD35_TCORE0, // pin 1
MD35_FPAD0, // pin 1
MD35_FCORE1, // pin 1
MD35_TPAD1, // pin 1
MD36_TCORE0, // pin 1
MD36_FPAD0, // pin 1
MD36_FCORE1, // pin 1
MD36_TPAD1, // pin 1
MD37_TCORE0, // pin 1
MD37_FPAD0, // pin 1
MD37_FCORE1, // pin 1
MD37_TPAD1, // pin 1
MD38_TCORE0, // pin 1
MD38_FPAD0, // pin 1
MD38_FCORE1, // pin 1
MD38_TPAD1, // pin 1
MD39_TCORE0, // pin 1
MD39_FPAD0, // pin 1
MD39_FCORE1, // pin 1
MD39_TPAD1, // pin 1
MD40_TCORE0, // pin 1
MD40_FPAD0, // pin 1
MD40_FCORE1, // pin 1
MD40_TPAD1, // pin 1
MD41_TCORE0, // pin 1
MD41_FPAD0, // pin 1
MD41_FCORE1, // pin 1
MD41_TPAD1, // pin 1
MD42_TCORE0, // pin 1
MD42_FPAD0, // pin 1
MD42_FCORE1, // pin 1
MD42_TPAD1, // pin 1
MSPCK_FPAD_TCORE, // pin 1
MD43_TCORE0, // pin 1
MD43_FPAD0, // pin 1
MD43_FCORE1, // pin 1
MD43_TPAD1, // pin 1
MD44_TCORE0, // pin 1
MD44_FPAD0, // pin 1
MD44_FCORE1, // pin 1
MD44_TPAD1, // pin 1
MD45_TCORE0, // pin 1
MD45_FPAD0, // pin 1
MD45_FCORE1, // pin 1
MD45_TPAD1, // pin 1
MD46_TCORE0, // pin 1
MD46_FPAD0, // pin 1
MD46_FCORE1, // pin 1
MD46_TPAD1, // pin 1
MD47_TCORE0, // pin 1
MD47_FPAD0, // pin 1
MD47_FCORE1, // pin 1
MD47_TPAD1, // pin 1
MD48_TCORE0, // pin 1
MD48_FPAD0, // pin 1
MD48_FCORE1, // pin 1
MD48_TPAD1, // pin 1
MD49_TCORE0, // pin 1
MD49_FPAD0, // pin 1
MD49_FCORE1, // pin 1
MD49_TPAD1, // pin 1
MD50_TCORE0, // pin 1
MD50_FPAD0, // pin 1
MD50_FCORE1, // pin 1
MD50_TPAD1, // pin 1
MD51_TCORE0, // pin 1
MD51_FPAD0, // pin 1
MD51_FCORE1, // pin 1
MD51_TPAD1, // pin 1
MD52_TCORE0, // pin 1
MD52_FPAD0, // pin 1
MD52_FCORE1, // pin 1
MD52_TPAD1, // pin 1
MD53_TCORE0, // pin 1
MD53_FPAD0, // pin 1
MD53_FCORE1, // pin 1
MD53_TPAD1, // pin 1
MD54_TCORE0, // pin 1
MD54_FPAD0, // pin 1
MD54_FCORE1, // pin 1
MD54_TPAD1, // pin 1
MD55_TCORE0, // pin 1
MD55_FPAD0, // pin 1
MD55_FCORE1, // pin 1
MD55_TPAD1, // pin 1
MD56_TCORE0, // pin 1
MD56_FPAD0, // pin 1
MD56_FCORE1, // pin 1
MD56_TPAD1, // pin 1
MD57_TCORE0, // pin 1
MD57_FPAD0, // pin 1
MD57_FCORE1, // pin 1
MD57_TPAD1, // pin 1
MD58_TCORE0, // pin 1
MD58_FPAD0, // pin 1
MD58_FCORE1, // pin 1
MD58_TPAD1, // pin 1
MD59_TCORE0, // pin 1
MD59_FPAD0, // pin 1
MD59_FCORE1, // pin 1
MD59_TPAD1, // pin 1
MD60_TCORE0, // pin 1
MD60_FPAD0, // pin 1
MD60_FCORE1, // pin 1
MD60_TPAD1, // pin 1
MD61_TCORE0, // pin 1
MD61_FPAD0, // pin 1
MD61_FCORE1, // pin 1
MD61_TPAD1, // pin 1
MD62_TCORE0, // pin 1
MD62_FPAD0, // pin 1
MD62_FCORE1, // pin 1
MD62_TPAD1, // pin 1
MD63_TCORE0, // pin 1
MD63_FPAD0, // pin 1
MD63_FCORE1, // pin 1
MD63_TPAD1, // pin 1
MA23_TPAD, // pin 1
MA23_FCORE, // pin 1
```

msp_1ex_bs.v

B-24

```
MA24_TPAD, // pin 1
MA24_FCORE, // pin 1
RESET0_TPAD, // pin 1
RESET0_FCORE, // pin 1
TCS0L_TPAD, // pin 1
TCS0L_FCORE, // pin 1
TCS1L_TPAD, // pin 1
TCS1L_FCORE, // pin 1
PD15_PA15_TPAD, // pin 1
PD15_PA15_FCORE, // pin 1
PD14_PA14_TPAD, // pin 1
PD14_PA14_FCORE, // pin 1
PD13_PA13_TPAD, // pin 1
PD13_PA13_FCORE, // pin 1
PD12_PA12_TPAD, // pin 1
PD12_PA12_FCORE, // pin 1
PD11_PA11_TPAD, // pin 1
PD11_PA11_FCORE, // pin 1
PD10_PA10_TPAD, // pin 1
PD10_PA10_FCORE, // pin 1
PD9_PA9_TPAD, // pin 1
PD9_PA9_FCORE, // pin 1
PD8_PA8_TPAD, // pin 1
PD8_PA8_FCORE, // pin 1
PD7_PA7_TPAD, // pin 1
PD7_PA7_FCORE, // pin 1
PD6_PA6_TPAD, // pin 1
PD6_PA6_FCORE, // pin 1
PD5_PA5_TPAD, // pin 1
PD5_PA5_FCORE, // pin 1
PD4_PA4_TPAD, // pin 1
PD4_PA4_FCORE, // pin 1
PD3_PA3_TPAD, // pin 1
PD3_PA3_FCORE, // pin 1
PD2_PA2_TPAD, // pin 1
PD2_PA2_FCORE, // pin 1
PD1_PA1_TPAD, // pin 1
PD1_PA1_FCORE, // pin 1
PD0_PA0_TPAD, // pin 1
PD0_PA0_FCORE, // pin 1
C7_TCORE, // pin 1
C7_FPAD, // pin 1
C6_TCORE, // pin 1
C6_FPAD, // pin 1
C5_TCORE, // pin 1
C5_FPAD, // pin 1
C4_TCORE, // pin 1
C4_FPAD, // pin 1
C3_TCORE, // pin 1
C3_FPAD, // pin 1
C2_TCORE, // pin 1
C2_FPAD, // pin 1
C1_TCORE, // pin 1
C1_FPAD, // pin 1
C0_TCORE, // pin 1
C0_FPAD, // pin 1
PROMCSL_TPAD, // pin 1
PROMCSL_FCORE, // pin 1
BGVS_TCORE, // pin 1
BGVS_FPAD, // pin 1
BGHS_TCORE, // pin 1
BGHS_FPAD, // pin 1
MSSEL_TPAD, // pin 1
MSSEL_FCORE, // pin 1
BGCLK_TCORE, // pin 1
BGCLK_FPAD, // pin 1
SCLK_TPAD, // pin 1
SCLK_FCORE, // pin 1
SDAT_ENB_TPAD, // pin 1
SDAT_ENB_FCORE, // pin 1
SDAT_TCORE0, // pin 1
SDAT_FPAD0, // pin 1
SDAT_FCORE1, // pin 1
SDAT_TPAD1, // pin 1
SFRS_TPAD, // pin 1
SFRS_FCORE, // pin 1
SERIAL_IN_TCORE, // pin 1
SERIAL_IN_FPAD, // pin 1
SERIAL_OUT_TPAD, // pin 1
SERIAL_OUT_FCORE, // pin 1
A43SDFS_TCORE, // pin 1
A43SDFS_FPAD, // pin 1
A43SCLK_TCORE, // pin 1
A43SCLK_FPAD, // pin 1
A43SDI_TPAD, // pin 1
A43SDI_FCORE, // pin 1
A43SDO_TCORE, // pin 1
A43SDO_FPAD, // pin 1
//      TDI,    // pin 1
//      TCK,    // pin 1
//      TDO,    // pin 1
        tdi,
        tdo,
        enb,
        setn,
        clockdra,
        clockdrb,
        updatedr,
        shiftdr,
        mode_c,
        mode_i,
        mode_o,
        dbsr_select,
        dbsr_scan_out,
        dbsr_en
);

//      input TRSTL ;    // pin 1
//      input TMS ;      // pin 1
        output INTAL_ENB_TPAD; // pin 1
        input  INTAL_ENB_FCORE; // pin 1
        output RSTL_TCORE; // pin 1
        input  RSTL_FPAD; // pin 1
        output PCICLK_TCORE; // pin 1
        input  PCICLK_FPAD; // pin 1
        output GNTL_TCORE; // pin 1
        input  GNTL_FPAD; // pin 1
        output REQL_ENB_TPAD; // pin 1
        input  REQL_ENB_FCORE; // pin 1
        output REQL_TPAD; // pin 1
        input  REQL_FCORE; // pin 1
```

B-25

```
output AD31_ENB_TPAD; // pin 1
input  AD31_ENB_FCORE; // pin 1
output AD31_TCORE0; // pin 1
input  AD31_FPAD0; // pin 1
input  AD31_FCORE1; // pin 1
output AD31_TPAD1; // pin 1
output AD30_TCORE0; // pin 1
input  AD30_FPAD0; // pin 1
input  AD30_FCORE1; // pin 1
output AD30_TPAD1; // pin 1
output AD29_TCORE0; // pin 1
input  AD29_FPAD0; // pin 1
input  AD29_FCORE1; // pin 1
output AD29_TPAD1; // pin 1
output AD28_TCORE0; // pin 1
input  AD28_FPAD0; // pin 1
input  AD28_FCORE1; // pin 1
output AD28_TPAD1; // pin 1
output AD27_TCORE0; // pin 1
input  AD27_FPAD0; // pin 1
input  AD27_FCORE1; // pin 1
output AD27_TPAD1; // pin 1
output AD26_TCORE0; // pin 1
input  AD26_FPAD0; // pin 1
input  AD26_FCORE1; // pin 1
output AD26_TPAD1; // pin 1
output AD25_SO9_ENB_TPAD; // pin 1
input  AD25_SO9_ENB_FCORE; // pin 1
output AD25_SO9_TCORE0; // pin 1
input  AD25_SO9_FPAD0; // pin 1
input  AD25_SO9_FCORE1; // pin 1
output AD25_SO9_TPAD1; // pin 1
output AD24_SO8_TCORE0; // pin 1
input  AD24_SO8_FPAD0; // pin 1
input  AD24_SO8_FCORE1; // pin 1
output AD24_SO8_TPAD1; // pin 1
output C_BE3L_ENB_TPAD; // pin 1
input  C_BE3L_ENB_FCORE; // pin 1
output C_BE3L_TCORE0; // pin 1
input  C_BE3L_FPAD0; // pin 1
input  C_BE3L_FCORE1; // pin 1
output C_BE3L_TPAD1; // pin 1
output IDSEL_TCORE; // pin 1
input  IDSEL_FPAD; // pin 1
output AD23_SO7_TCORE0; // pin 1
input  AD23_SO7_FPAD0; // pin 1
input  AD23_SO7_FCORE1; // pin 1
output AD23_SO7_TPAD1; // pin 1
output AD22_SO6_TCORE0; // pin 1
input  AD22_SO6_FPAD0; // pin 1
input  AD22_SO6_FCORE1; // pin 1
output AD22_SO6_TPAD1; // pin 1
output AD21_SO5_TCORE0; // pin 1
input  AD21_SO5_FPAD0; // pin 1
input  AD21_SO5_FCORE1; // pin 1
output AD21_SO5_TPAD1; // pin 1
output AD20_SO4_TCORE0; // pin 1
input  AD20_SO4_FPAD0; // pin 1
input  AD20_SO4_FCORE1; // pin 1
output AD20_SO4_TPAD1; // pin 1
output AD19_SO3_TCORE0; // pin 1
input  AD19_SO3_FPAD0; // pin 1
input  AD19_SO3_FCORE1; // pin 1
output AD19_SO3_TPAD1; // pin 1
output AD18_SO2_TCORE0; // pin 1
input  AD18_SO2_FPAD0; // pin 1
input  AD18_SO2_FCORE1; // pin 1
output AD18_SO2_TPAD1; // pin 1
output AD17_SO1_TCORE0; // pin 1
input  AD17_SO1_FPAD0; // pin 1
input  AD17_SO1_FCORE1; // pin 1
output AD17_SO1_TPAD1; // pin 1
output AD16_SO0_TCORE0; // pin 1
input  AD16_SO0_FPAD0; // pin 1
input  AD16_SO0_FCORE1; // pin 1
output AD16_SO0_TPAD1; // pin 1
output C_BE2L_TCORE0; // pin 1
input  C_BE2L_FPAD0; // pin 1
input  C_BE2L_FCORE1; // pin 1
output C_BE2L_TPAD1; // pin 1
output FRAMEL_ENB_TPAD; // pin 1
input  FRAMEL_ENB_FCORE; // pin 1
output FRAMEL_TCORE0; // pin 1
input  FRAMEL_FPAD0; // pin 1
input  FRAMEL_FCORE1; // pin 1
output FRAMEL_TPAD1; // pin 1
output IRDYL_ENB_TPAD; // pin 1
input  IRDYL_ENB_FCORE; // pin 1
output IRDYL_TCORE0; // pin 1
input  IRDYL_FPAD0; // pin 1
input  IRDYL_FCORE1; // pin 1
output IRDYL_TPAD1; // pin 1
output TRDYL_ENB_TPAD; // pin 1
input  TRDYL_ENB_FCORE; // pin 1
output TRDYL_TCORE0; // pin 1
input  TRDYL_FPAD0; // pin 1
input  TRDYL_FCORE1; // pin 1
output TRDYL_TPAD1; // pin 1
output DVSELL_ENB_TPAD; // pin 1
input  DVSELL_ENB_FCORE; // pin 1
output DVSELL_TCORE0; // pin 1
input  DVSELL_FPAD0; // pin 1
input  DVSELL_FCORE1; // pin 1
output DVSELL_TPAD1; // pin 1
output STOPL_ENB_TPAD; // pin 1
input  STOPL_ENB_FCORE; // pin 1
output STOPL_TCORE0; // pin 1
input  STOPL_FPAD0; // pin 1
input  STOPL_FCORE1; // pin 1
output STOPL_TPAD1; // pin 1
output LOCKL_ENB_TPAD; // pin 1
input  LOCKL_ENB_FCORE; // pin 1
output LOCKL_TCORE0; // pin 1
input  LOCKL_FPAD0; // pin 1
input  LOCKL_FCORE1; // pin 1
output LOCKL_TPAD1; // pin 1
output PERRL_ENB_TPAD; // pin 1
input  PERRL_ENB_FCORE; // pin 1
output PERRL_TCORE0; // pin 1
input  PERRL_FPAD0; // pin 1
input  PERRL_FCORE1; // pin 1
output PERRL_TPAD1; // pin 1
```

B-26

```
output SERRL_ENB_TPAD; // pin 1
input  SERRL_ENB_FCORE; // pin 1
// @@@ output SERRL_TCORE0; // pin 1
// @@@ input  SERRL_FPAD0; // pin 1
output SERRL_TCORE; // pin 1
input  SERRL_FPAD; // pin 1
// @@@ input  SERRL_FCORE1; // pin 1
// @@@ output SERRL_TPAD1; // pin 1
output TCA_TCORE; // pin 1
input  TCA_FPAD; // pin 1
output PAR_ENB_TPAD; // pin 1
input  PAR_ENB_FCORE; // pin 1
output PAR_TCORE0; // pin 1
input  PAR_FPAD0; // pin 1
input  PAR_FCORE1; // pin 1
output PAR_TPAD1; // pin 1
output C_BE1L_TCORE0; // pin 1
input  C_BE1L_FPAD0; // pin 1
input  C_BE1L_FCORE1; // pin 1
output C_BE1L_TPAD1; // pin 1
output AD15_SI9_ENB_TPAD; // pin 1
input  AD15_SI9_ENB_FCORE; // pin 1
output AD15_SI9_TCORE0; // pin 1
input  AD15_SI9_FPAD0; // pin 1
input  AD15_SI9_FCORE1; // pin 1
output AD15_SI9_TPAD1; // pin 1
output AD14_SI8_TCORE0; // pin 1
input  AD14_SI8_FPAD0; // pin 1
input  AD14_SI8_FCORE1; // pin 1
output AD14_SI8_TPAD1; // pin 1
output AD13_SI7_TCORE0; // pin 1
input  AD13_SI7_FPAD0; // pin 1
input  AD13_SI7_FCORE1; // pin 1
output AD13_SI7_TPAD1; // pin 1
output AD12_SI6_TCORE0; // pin 1
input  AD12_SI6_FPAD0; // pin 1
input  AD12_SI6_FCORE1; // pin 1
output AD12_SI6_TPAD1; // pin 1
output AD11_SI5_TCORE0; // pin 1
input  AD11_SI5_FPAD0; // pin 1
input  AD11_SI5_FCORE1; // pin 1
output AD11_SI5_TPAD1; // pin 1
output AD10_SI4_TCORE0; // pin 1
input  AD10_SI4_FPAD0; // pin 1
input  AD10_SI4_FCORE1; // pin 1
output AD10_SI4_TPAD1; // pin 1
output AD09_SI3_TCORE0; // pin 1
input  AD09_SI3_FPAD0; // pin 1
input  AD09_SI3_FCORE1; // pin 1
output AD09_SI3_TPAD1; // pin 1
output AD08_SI2_TCORE0; // pin 1
input  AD08_SI2_FPAD0; // pin 1
input  AD08_SI2_FCORE1; // pin 1
output AD08_SI2_TPAD1; // pin 1
output C_BE0L_TCORE0; // pin 1
input  C_BE0L_FPAD0; // pin 1
input  C_BE0L_FCORE1; // pin 1
output C_BE0L_TPAD1; // pin 1
output TCB_TCORE; // pin 1
input  TCB_FPAD; // pin 1
output TM_TCORE; // pin 1
input  TM_FPAD; // pin 1
output AD07_SI1_TCORE0; // pin 1
input  AD07_SI1_FPAD0; // pin 1
input  AD07_SI1_FCORE1; // pin 1
output AD07_SI1_TPAD1; // pin 1
output AD06_SI0_TCORE0; // pin 1
input  AD06_SI0_FPAD0; // pin 1
input  AD06_SI0_FCORE1; // pin 1
output AD06_SI0_TPAD1; // pin 1
output AD05_MT5_ENB_TPAD; // pin 1
input  AD05_MT5_ENB_FCORE; // pin 1
output AD05_MT5_TCORE0; // pin 1
input  AD05_MT5_FPAD0; // pin 1
input  AD05_MT5_FCORE1; // pin 1
output AD05_MT5_TPAD1; // pin 1
output AD04_MT4_TCORE0; // pin 1
input  AD04_MT4_FPAD0; // pin 1
input  AD04_MT4_FCORE1; // pin 1
output AD04_MT4_TPAD1; // pin 1
output AD03_MT3_TCORE0; // pin 1
input  AD03_MT3_FPAD0; // pin 1
input  AD03_MT3_FCORE1; // pin 1
output AD03_MT3_TPAD1; // pin 1
output AD02_MT2_ENB_TPAD; // pin 1
input  AD02_MT2_ENB_FCORE; // pin 1
output AD02_MT2_TCORE0; // pin 1
input  AD02_MT2_FPAD0; // pin 1
input  AD02_MT2_FCORE1; // pin 1
output AD02_MT2_TPAD1; // pin 1
output AD01_MT1_TCORE0; // pin 1
input  AD01_MT1_FPAD0; // pin 1
input  AD01_MT1_FCORE1; // pin 1
output AD01_MT1_TPAD1; // pin 1
output AD00_MT0_TCORE0; // pin 1
input  AD00_MT0_FPAD0; // pin 1
input  AD00_MT0_FCORE1; // pin 1
output AD00_MT0_TPAD1; // pin 1
output MA11_TPAD; // pin 1
input  MA11_FCORE; // pin 1
output MA10_TPAD; // pin 1
input  MA10_FCORE; // pin 1
output MA9_TPAD; // pin 1
input  MA9_FCORE; // pin 1
output MA8_TPAD; // pin 1
input  MA8_FCORE; // pin 1
output MA7_TPAD; // pin 1
input  MA7_FCORE; // pin 1
output MA6_TPAD; // pin 1
input  MA6_FCORE; // pin 1
output MA5_TPAD; // pin 1
input  MA5_FCORE; // pin 1
output MA4_TPAD; // pin 1
input  MA4_FCORE; // pin 1
output MA3_TPAD; // pin 1
input  MA3_FCORE; // pin 1
output MA2_TPAD; // pin 1
input  MA2_FCORE; // pin 1
output MA1_TPAD; // pin 1
input  MA1_FCORE; // pin 1
output MA0_TPAD; // pin 1
input  MA0_FCORE; // pin 1
```

B-27

```
output RAS1L_TPAD; // pin 1
input  RAS1L_FCORE; // pin 1
output CAS1L_TPAD; // pin 1
input  CAS1L_FCORE; // pin 1
output MWEL_TPAD; // pin 1
input  MWEL_FCORE; // pin 1
output DQM_TPAD; // pin 1
input  DQM_FCORE; // pin 1
output MCS0L_TPAD; // pin 1
input  MCS0L_FCORE; // pin 1
output MCS1L_TPAD; // pin 1
input  MCS1L_FCORE; // pin 1
output MCKE_TPAD; // pin 1
input  MCKE_FCORE; // pin 1
output MRDYH_TCORE; // pin 1
input  MRDYH_FPAD; // pin 1
output MD0_ENB_TPAD; // pin 1
input  MD0_ENB_FCORE; // pin 1
output MD0_TCORE0; // pin 1
input  MD0_FPAD0; // pin 1
input  MD0_FCORE1; // pin 1
output MD0_TPAD1; // pin 1
output MD1_TCORE0; // pin 1
input  MD1_FPAD0; // pin 1
input  MD1_FCORE1; // pin 1
output MD1_TPAD1; // pin 1
output MD2_TCORE0; // pin 1
input  MD2_FPAD0; // pin 1
input  MD2_FCORE1; // pin 1
output MD2_TPAD1; // pin 1
output MD3_TCORE0; // pin 1
input  MD3_FPAD0; // pin 1
input  MD3_FCORE1; // pin 1
output MD3_TPAD1; // pin 1
output MD4_TCORE0; // pin 1
input  MD4_FPAD0; // pin 1
input  MD4_FCORE1; // pin 1
output MD4_TPAD1; // pin 1
output MD5_TCORE0; // pin 1
input  MD5_FPAD0; // pin 1
input  MD5_FCORE1; // pin 1
output MD5_TPAD1; // pin 1
output MD6_TCORE0; // pin 1
input  MD6_FPAD0; // pin 1
input  MD6_FCORE1; // pin 1
output MD6_TPAD1; // pin 1
output MD7_TCORE0; // pin 1
input  MD7_FPAD0; // pin 1
input  MD7_FCORE1; // pin 1
output MD7_TPAD1; // pin 1
output MD8_TCORE0; // pin 1
input  MD8_FPAD0; // pin 1
input  MD8_FCORE1; // pin 1
output MD8_TPAD1; // pin 1
output MD9_TCORE0; // pin 1
input  MD9_FPAD0; // pin 1
input  MD9_FCORE1; // pin 1
output MD9_TPAD1; // pin 1
output MD10_TCORE0; // pin 1
input  MD10_FPAD0; // pin 1
input  MD10_FCORE1; // pin 1
output MD10_TPAD1; // pin 1
output MD11_TCORE0; // pin 1
input  MD11_FPAD0; // pin 1
input  MD11_FCORE1; // pin 1
output MD11_TPAD1; // pin 1
output MD12_TCORE0; // pin 1
input  MD12_FPAD0; // pin 1
input  MD12_FCORE1; // pin 1
output MD12_TPAD1; // pin 1
output MD13_TCORE0; // pin 1
input  MD13_FPAD0; // pin 1
input  MD13_FCORE1; // pin 1
output MD13_TPAD1; // pin 1
output MD14_TCORE0; // pin 1
input  MD14_FPAD0; // pin 1
input  MD14_FCORE1; // pin 1
output MD14_TPAD1; // pin 1
output MD15_TCORE0; // pin 1
input  MD15_FPAD0; // pin 1
input  MD15_FCORE1; // pin 1
output MD15_TPAD1; // pin 1
output MD16_TCORE0; // pin 1
input  MD16_FPAD0; // pin 1
input  MD16_FCORE1; // pin 1
output MD16_TPAD1; // pin 1
output MD17_TCORE0; // pin 1
input  MD17_FPAD0; // pin 1
input  MD17_FCORE1; // pin 1
output MD17_TPAD1; // pin 1
output MD18_TCORE0; // pin 1
input  MD18_FPAD0; // pin 1
input  MD18_FCORE1; // pin 1
output MD18_TPAD1; // pin 1
output MD19_TCORE0; // pin 1
input  MD19_FPAD0; // pin 1
input  MD19_FCORE1; // pin 1
output MD19_TPAD1; // pin 1
output MD20_TCORE0; // pin 1
input  MD20_FPAD0; // pin 1
input  MD20_FCORE1; // pin 1
output MD20_TPAD1; // pin 1
output MD21_TCORE0; // pin 1
input  MD21_FPAD0; // pin 1
input  MD21_FCORE1; // pin 1
output MD21_TPAD1; // pin 1
output MD22_TCORE0; // pin 1
input  MD22_FPAD0; // pin 1
input  MD22_FCORE1; // pin 1
output MD22_TPAD1; // pin 1
output MD23_TCORE0; // pin 1
input  MD23_FPAD0; // pin 1
input  MD23_FCORE1; // pin 1
output MD23_TPAD1; // pin 1
output MD24_TCORE0; // pin 1
input  MD24_FPAD0; // pin 1
input  MD24_FCORE1; // pin 1
output MD24_TPAD1; // pin 1
output MD25_TCORE0; // pin 1
input  MD25_FPAD0; // pin 1
input  MD25_FCORE1; // pin 1
output MD25_TPAD1; // pin 1
```

B-28

```
output MD26_TCORE0; // pin 1
input  MD26_FPAD0; // pin 1
input  MD26_FCORE1; // pin 1
output MD26_TPAD1; // pin 1
output MD27_TCORE0; // pin 1
input  MD27_FPAD0; // pin 1
input  MD27_FCORE1; // pin 1
output MD27_TPAD1; // pin 1
output MD28_TCORE0; // pin 1
input  MD28_FPAD0; // pin 1
input  MD28_FCORE1; // pin 1
output MD28_TPAD1; // pin 1
output MD29_TCORE0; // pin 1
input  MD29_FPAD0; // pin 1
input  MD29_FCORE1; // pin 1
output MD29_TPAD1; // pin 1
output MD30_TCORE0; // pin 1
input  MD30_FPAD0; // pin 1
input  MD30_FCORE1; // pin 1
output MD30_TPAD1; // pin 1
output MD31_TCORE0; // pin 1
input  MD31_FPAD0; // pin 1
input  MD31_FCORE1; // pin 1
output MD31_TPAD1; // pin 1
output MD32_TCORE0; // pin 1
input  MD32_FPAD0; // pin 1
input  MD32_FCORE1; // pin 1
output MD32_TPAD1; // pin 1
output MD33_TCORE0; // pin 1
input  MD33_FPAD0; // pin 1
input  MD33_FCORE1; // pin 1
output MD33_TPAD1; // pin 1
output MD34_TCORE0; // pin 1
input  MD34_FPAD0; // pin 1
input  MD34_FCORE1; // pin 1
output MD34_TPAD1; // pin 1
output MD35_TCORE0; // pin 1
input  MD35_FPAD0; // pin 1
input  MD35_FCORE1; // pin 1
output MD35_TPAD1; // pin 1
output MD36_TCORE0; // pin 1
input  MD36_FPAD0; // pin 1
input  MD36_FCORE1; // pin 1
output MD36_TPAD1; // pin 1
output MD37_TCORE0; // pin 1
input  MD37_FPAD0; // pin 1
input  MD37_FCORE1; // pin 1
output MD37_TPAD1; // pin 1
output MD38_TCORE0; // pin 1
input  MD38_FPAD0; // pin 1
input  MD38_FCORE1; // pin 1
output MD38_TPAD1; // pin 1
output MD39_TCORE0; // pin 1
input  MD39_FPAD0; // pin 1
input  MD39_FCORE1; // pin 1
output MD39_TPAD1; // pin 1
output MD40_TCORE0; // pin 1
input  MD40_FPAD0; // pin 1
input  MD40_FCORE1; // pin 1
output MD40_TPAD1; // pin 1
output MD41_TCORE0; // pin 1
input  MD41_FPAD0; // pin 1
input  MD41_FCORE1; // pin 1
output MD41_TPAD1; // pin 1
output MD42_TCORE0; // pin 1
input  MD42_FPAD0; // pin 1
input  MD42_FCORE1; // pin 1
output MD42_TPAD1; // pin 1
input  MSPCK_FPAD_TCORE; // pin 1
output MD43_TCORE0; // pin 1
input  MD43_FPAD0; // pin 1
input  MD43_FCORE1; // pin 1
output MD43_TPAD1; // pin 1
output MD44_TCORE0; // pin 1
input  MD44_FPAD0; // pin 1
input  MD44_FCORE1; // pin 1
output MD44_TPAD1; // pin 1
output MD45_TCORE0; // pin 1
input  MD45_FPAD0; // pin 1
input  MD45_FCORE1; // pin 1
output MD45_TPAD1; // pin 1
output MD46_TCORE0; // pin 1
input  MD46_FPAD0; // pin 1
input  MD46_FCORE1; // pin 1
output MD46_TPAD1; // pin 1
output MD47_TCORE0; // pin 1
input  MD47_FPAD0; // pin 1
input  MD47_FCORE1; // pin 1
output MD47_TPAD1; // pin 1
output MD48_TCORE0; // pin 1
input  MD48_FPAD0; // pin 1
input  MD48_FCORE1; // pin 1
output MD48_TPAD1; // pin 1
output MD49_TCORE0; // pin 1
input  MD49_FPAD0; // pin 1
input  MD49_FCORE1; // pin 1
output MD49_TPAD1; // pin 1
output MD50_TCORE0; // pin 1
input  MD50_FPAD0; // pin 1
input  MD50_FCORE1; // pin 1
output MD50_TPAD1; // pin 1
output MD51_TCORE0; // pin 1
input  MD51_FPAD0; // pin 1
input  MD51_FCORE1; // pin 1
output MD51_TPAD1; // pin 1
output MD52_TCORE0; // pin 1
input  MD52_FPAD0; // pin 1
input  MD52_FCORE1; // pin 1
output MD52_TPAD1; // pin 1
output MD53_TCORE0; // pin 1
input  MD53_FPAD0; // pin 1
input  MD53_FCORE1; // pin 1
output MD53_TPAD1; // pin 1
output MD54_TCORE0; // pin 1
input  MD54_FPAD0; // pin 1
input  MD54_FCORE1; // pin 1
output MD54_TPAD1; // pin 1
output MD55_TCORE0; // pin 1
input  MD55_FPAD0; // pin 1
input  MD55_FCORE1; // pin 1
output MD55_TPAD1; // pin 1
output MD56_TCORE0; // pin 1
```

msp_1ex_bs.v

B-29

```
input  MD56_FPAD0; // pin 1
input  MD56_FCORE1; // pin 1
output MD56_TPAD1; // pin 1
output MD57_TCORE0; // pin 1
input  MD57_FPAD0; // pin 1
input  MD57_FCORE1; // pin 1
output MD57_TPAD1; // pin 1
output MD58_TCORE0; // pin 1
input  MD58_FPAD0; // pin 1
input  MD58_FCORE1; // pin 1
output MD58_TPAD1; // pin 1
output MD59_TCORE0; // pin 1
input  MD59_FPAD0; // pin 1
input  MD59_FCORE1; // pin 1
output MD59_TPAD1; // pin 1
output MD60_TCORE0; // pin 1
input  MD60_FPAD0; // pin 1
input  MD60_FCORE1; // pin 1
output MD60_TPAD1; // pin 1
output MD61_TCORE0; // pin 1
input  MD61_FPAD0; // pin 1
input  MD61_FCORE1; // pin 1
output MD61_TPAD1; // pin 1
output MD62_TCORE0; // pin 1
input  MD62_FPAD0; // pin 1
input  MD62_FCORE1; // pin 1
output MD62_TPAD1; // pin 1
output MD63_TCORE0; // pin 1
input  MD63_FPAD0; // pin 1
input  MD63_FCORE1; // pin 1
output MD63_TPAD1; // pin 1
output MA23_TPAD; // pin 1
input  MA23_FCORE; // pin 1
output MA24_TPAD; // pin 1
input  MA24_FCORE; // pin 1
output RESET0_TPAD; // pin 1
input  RESET0_FCORE; // pin 1
output TCS0L_TPAD; // pin 1
input  TCS0L_FCORE; // pin 1
output TCS1L_TPAD; // pin 1
input  TCS1L_FCORE; // pin 1
output PD15_PA15_TPAD; // pin 1
input  PD15_PA15_FCORE; // pin 1
output PD14_PA14_TPAD; // pin 1
input  PD14_PA14_FCORE; // pin 1
output PD13_PA13_TPAD; // pin 1
input  PD13_PA13_FCORE; // pin 1
output PD12_PA12_TPAD; // pin 1
input  PD12_PA12_FCORE; // pin 1
output PD11_PA11_TPAD; // pin 1
input  PD11_PA11_FCORE; // pin 1
output PD10_PA10_TPAD; // pin 1
input  PD10_PA10_FCORE; // pin 1
output PD9_PA9_TPAD; // pin 1
input  PD9_PA9_FCORE; // pin 1
output PD8_PA8_TPAD; // pin 1
input  PD8_PA8_FCORE; // pin 1
output PD7_PA7_TPAD; // pin 1
input  PD7_PA7_FCORE; // pin 1
output PD6_PA6_TPAD; // pin 1
input  PD6_PA6_FCORE; // pin 1
output PD5_PA5_TPAD; // pin 1
input  PD5_PA5_FCORE; // pin 1
output PD4_PA4_TPAD; // pin 1
input  PD4_PA4_FCORE; // pin 1
output PD3_PA3_TPAD; // pin 1
input  PD3_PA3_FCORE; // pin 1
output PD2_PA2_TPAD; // pin 1
input  PD2_PA2_FCORE; // pin 1
output PD1_PA1_TPAD; // pin 1
input  PD1_PA1_FCORE; // pin 1
output PD0_PA0_TPAD; // pin 1
input  PD0_PA0_FCORE; // pin 1
output C7_TCORE; // pin 1
input  C7_FPAD; // pin 1
output C6_TCORE; // pin 1
input  C6_FPAD; // pin 1
output C5_TCORE; // pin 1
input  C5_FPAD; // pin 1
output C4_TCORE; // pin 1
input  C4_FPAD; // pin 1
output C3_TCORE; // pin 1
input  C3_FPAD; // pin 1
output C2_TCORE; // pin 1
input  C2_FPAD; // pin 1
output C1_TCORE; // pin 1
input  C1_FPAD; // pin 1
output C0_TCORE; // pin 1
input  C0_FPAD; // pin 1
output PROMCSL_TPAD; // pin 1
input  PROMCSL_FCORE; // pin 1
output BGVS_TCORE; // pin 1
input  BGVS_FPAD; // pin 1
output BGHS_TCORE; // pin 1
input  BGHS_FPAD; // pin 1
output MSSEL_TPAD; // pin 1
input  MSSEL_FCORE; // pin 1
output BGCLK_TCORE; // pin 1
input  BGCLK_FPAD; // pin 1
output SCLK_TPAD; // pin 1
input  SCLK_FCORE; // pin 1
output SDAT_ENB_TPAD; // pin 1
input  SDAT_ENB_FCORE; // pin 1
output SDAT_TCORE0; // pin 1
input  SDAT_FPAD0; // pin 1
input  SDAT_FCORE1; // pin 1
output SDAT_TPAD1; // pin 1
output SFRS_TPAD; // pin 1
input  SFRS_FCORE; // pin 1
output SERIAL_IN_TCORE; // pin 1
input  SERIAL_IN_FPAD; // pin 1
output SERIAL_OUT_TPAD; // pin 1
input  SERIAL_OUT_FCORE; // pin 1
output A43SDFS_TCORE; // pin 1
input  A43SDFS_FPAD; // pin 1
output A43SCLK_TCORE; // pin 1
input  A43SCLK_FPAD; // pin 1
output A43SDI_TPAD; // pin 1
input  A43SDI_FCORE; // pin 1
output A43SDO_TCORE; // pin 1
input  A43SDO_FPAD; // pin 1
//     input TDI ;     // pin 1
```

msp_1ex_bs.v

B-30

```
//      input TCK ;     // pin 1
//      output TDO ;    // pin 1
        input  tdi;
        output tdo;
        input  enb;
        input  setn;
        input  clockdra;
        input  clockdrb;
        input  updatedr;
        input  shiftdr;
        input  mode_c;
        input  mode_i;
        input  mode_o;
        input  dbsr_select;
        output dbsr_scan_out;
        input  dbsr_en;


        // reg  scan1 ;
        wire scan2 ;
        wire scan3 ;
        wire scan4 ;
        wire scan5 ;
        wire scan6 ;
        wire scan7 ;
        wire scan8 ;
        wire scan9 ;
        wire scan10 ;
        wire scan11 ;
        wire scan12 ;
        wire scan13 ;
        wire scan14 ;
        wire scan15 ;
        wire scan16 ;
        wire scan17 ;
        wire scan18 ;
        wire scan19 ;
        wire scan20 ;
        wire scan21 ;
        wire scan22 ;
        wire scan23 ;
        wire scan24 ;
        wire scan25 ;
        wire scan26 ;
        wire scan27 ;
        wire scan28 ;
        wire scan29 ;
        wire scan30 ;
        wire scan31 ;
        wire scan32 ;
        wire scan33 ;
        wire scan34 ;
        wire scan35 ;
        wire scan36 ;
        wire scan37 ;
        wire scan38 ;
        wire scan39 ;
        wire scan40 ;
        wire scan41 ;
        wire scan42 ;
        wire scan43 ;
        wire scan44 ;
        wire scan45 ;
        wire scan46 ;
        wire scan47 ;
        wire scan48 ;
        wire scan49 ;
        wire scan50 ;
        wire scan51 ;
        wire scan52 ;
        wire scan53 ;
        wire scan54 ;
        wire scan55 ;
        wire scan56 ;
        wire scan57 ;
        wire scan58 ;
        wire scan59 ;
        wire scan60 ;
        wire scan61 ;
        wire scan62 ;
        wire scan63 ;
        wire scan64 ;
        wire scan65 ;
        wire scan66 ;
        wire scan67 ;
        wire scan68 ;
        wire scan69 ;
        wire scan70 ;
        wire scan71 ;
        wire scan72 ;
        wire scan73 ;
        wire scan74 ;
        wire scan75 ;
        wire scan76 ;
        wire scan77 ;
        wire scan78 ;
        wire scan79 ;
        wire scan80 ;
        wire scan81 ;
        wire scan82 ;
        wire scan83 ;
        wire scan84 ;
        wire scan85 ;
        wire scan86 ;
        wire scan87 ;
        wire scan88 ;
        wire scan89 ;
        wire scan90 ;
        wire scan91 ;
        wire scan92 ;
        wire scan93 ;
        wire scan94 ;
        wire scan95 ;
        wire scan96 ;
        wire scan97 ;
        wire scan98 ;
        wire scan99 ;
        wire scan100 ;
        wire scan101 ;
        wire scan102 ;
        wire scan103 ;
        wire scan104 ;
```

B-31

```
wire scan105 ;
wire scan106 ;
wire scan107 ;
wire scan108 ;
wire scan109 ;
wire scan110 ;
wire scan111 ;
wire scan112 ;
wire scan113 ;
wire scan114 ;
wire scan115 ;
wire scan116 ;
wire scan117 ;
wire scan118 ;
wire scan119 ;
wire scan120 ;
wire scan121 ;
wire scan122 ;
wire scan123 ;
wire scan124 ;
wire scan125 ;
wire scan126 ;
wire scan127 ;
wire scan128 ;
wire scan129 ;
wire scan130 ;
wire scan131 ;
wire scan132 ;
wire scan133 ;
wire scan134 ;
wire scan135 ;
wire scan136 ;
wire scan137 ;
wire scan138 ;
wire scan139 ;
wire scan140 ;
wire scan141 ;
wire scan142 ;
wire scan143 ;
wire scan144 ;
wire scan145 ;
wire scan146 ;
wire scan147 ;
wire scan148 ;
wire scan149 ;
wire scan150 ;
wire scan151 ;
wire scan152 ;
wire scan153 ;
wire scan154 ;
wire scan155 ;
wire scan156 ;
wire scan157 ;
wire scan158 ;
wire scan159 ;
wire scan160 ;
wire scan161 ;
wire scan162 ;
wire scan163 ;
wire scan164 ;
wire scan165 ;
wire scan166 ;
wire scan167 ;
wire scan168 ;
wire scan169 ;
wire scan170 ;
wire scan171 ;
wire scan172 ;
wire scan173 ;
wire scan174 ;
wire scan175 ;
wire scan176 ;
wire scan177 ;
wire scan178 ;
wire scan179 ;
wire scan180 ;
wire scan181 ;
wire scan182 ;
wire scan183 ;
wire scan184 ;
wire scan185 ;
wire scan186 ;
wire scan187 ;
wire scan188 ;
wire scan189 ;
wire scan190 ;
wire scan191 ;
wire scan192 ;
wire scan193 ;
wire scan194 ;
wire scan195 ;
wire scan196 ;
wire scan197 ;
wire scan198 ;
wire scan199 ;
wire scan200 ;
wire scan201 ;
wire scan202 ;
wire scan203 ;
wire scan204 ;
wire scan205 ;
wire scan206 ;
wire scan207 ;
wire scan208 ;
wire scan209 ;
wire scan210 ;
wire scan211 ;
wire scan212 ;
wire scan213 ;
wire scan214 ;
wire scan215 ;
wire scan216 ;
wire scan217 ;
wire scan218 ;
wire scan219 ;
wire scan220 ;
wire scan221 ;
wire scan222 ;
wire scan223 ;
wire scan224 ;
wire scan225 ;
wire scan226 ;
```

msp_1ex_bs.v

B-32

```
wire scan227 ;
wire scan228 ;
wire scan229 ;
wire scan230 ;
wire scan231 ;
wire scan232 ;
wire scan233 ;
wire scan234 ;
wire scan235 ;
wire scan236 ;
wire scan237 ;
wire scan238 ;
wire scan239 ;
wire scan240 ;
wire scan241 ;
wire scan242 ;
wire scan243 ;
wire scan244 ;
wire scan245 ;
wire scan246 ;
wire scan247 ;
wire scan248 ;
wire scan249 ;
wire scan250 ;
wire scan251 ;
wire scan252 ;
wire scan253 ;
wire scan254 ;
wire scan255 ;
wire scan256 ;
wire scan257 ;
wire scan258 ;
wire scan259 ;
wire scan260 ;
wire scan261 ;
wire scan262 ;
wire scan263 ;
wire scan264 ;
wire scan265 ;
wire scan266 ;
wire scan267 ;
wire scan268 ;
wire scan269 ;
wire scan270 ;
wire scan271 ;
wire scan272 ;
wire scan273 ;
wire scan274 ;
wire scan275 ;
wire scan276 ;
wire scan277 ;
wire scan278 ;
wire scan279 ;
wire scan280 ;
wire scan281 ;
wire scan282 ;
wire scan283 ;
wire scan284 ;
wire scan285 ;
wire scan286 ;
wire scan287 ;
wire scan288 ;
wire scan289 ;
wire scan290 ;
wire scan291 ;
wire scan292 ;
wire scan293 ;
wire scan294 ;
wire scan295 ;
wire scan296 ;
wire scan297 ;
wire scan298 ;
wire scan299 ;
wire scan300 ;
wire scan301 ;
wire scan302 ;
wire scan303 ;
wire scan304 ;
wire scan305 ;
wire scan306 ;
wire scan307 ;
wire scan308 ;
wire scan309 ;
wire scan310 ;
wire scan311 ;
jtint1_lssd bs1 (.DOUT(INTAL_ENB_TPAD), .MODE(mode_c), .TCKA(clockdra), .TCKB(cl
ockdrb), .UPDATE (updatedr), .SHIFT(shiftdr),
        .TDI(tdi), .DINP(INTAL_ENB_FCORE), .TDO(scan2), .ENB(enb), .SETN(set
n));
jtin1_lssd bs2 (.DOUT(RSTL_TCORE), .MODE(mode_i), .TCKA(clockdra), .TCKB(clockdr
b), .UPDATE (updatedr), .SHIFT(shiftdr),
        .TDI(scan2), .DINP(RSTL_FPAD), .TDO(scan3), .ENB(enb), .SETN(setn));
jtin1_lssd bs3 (.DOUT(PCICLK_TCORE), .MODE(mode_i), .TCKA(clockdra), .TCKB(clock
drb), .UPDATE (updatedr), .SHIFT(shiftdr),
        .TDI(scan3), .DINP(PCICLK_FPAD), .TDO(scan4), .ENB(enb), .SETN(setn)
);
jtin1_lssd bs4 (.DOUT(GNTL_TCORE), .MODE(mode_i), .TCKA(clockdra), .TCKB(clockdr
b), .UPDATE (updatedr), .SHIFT(shiftdr),
        .TDI(scan4), .DINP(GNTL_FPAD), .TDO(scan5), .ENB(enb), .SETN(setn));
jtint1_lssd bs5 (.DOUT(REQL_ENB_TPAD), .MODE(mode_c), .TCKA(clockdra), .TCKB(clo
ckdrb), .UPDATE (updatedr), .SHIFT(shiftdr),
        .TDI(scan5), .DINP(REQL_ENB_FCORE), .TDO(scan6), .ENB(enb), .SETN(se
tn));
jtout1_lssd bs6 (.DOUT(REQL_TPAD), .MODE(mode_o), .TCKA(clockdra), .TCKB(clockdr
b), .UPDATE (updatedr), .SHIFT(shiftdr),
        .TDI(scan6), .DINP(REQL_FCORE), .TDO(scan7) , .ENB(enb), .SETN(setn)
);
jtint1_lssd bs7 (.DOUT(AD31_ENB_TPAD), .MODE(mode_c), .TCKA(clockdra), .TCKB(clo
ckdrb), .UPDATE (updatedr), .SHIFT(shiftdr),
        .TDI(scan7), .DINP(AD31_ENB_FCORE), .TDO(scan8), .ENB(enb), .SETN(se
tn));
jtbi1_lssd bs8_9 (.DOUT0(AD31_TCORE0), .MODE0(mode_i), .TCKA(clockdra), .TCKB(cl
ockdrb), .UPDATE (updatedr), .SHIFT(shiftdr),
        .TDI0(scan8), .DINP0(AD31_FPAD0), .TDO0(scan9), .DINP1 (AD31_FCORE1)
, .TDI1(scan9),
        .TDO1(scan10), .ENB(enb), .MODE1(mode_o), .DOUT1(AD31_TPAD1));
jtbi1_lssd bs10_11 (.DOUT0(AD30_TCORE0), .MODE0(mode_i), .TCKA(clockdra), .TCKB(
clockdrb), .UPDATE (updatedr), .SHIFT(shiftdr),
        .TDI0(scan10), .DINP0(AD30_FPAD0), .TDO0(scan11), .DINP1 (AD30_FCORE
1), .TDI1(scan11),
        .TDO1(scan12), .ENB(enb), .MODE1(mode_o), .DOUT1(AD30_TPAD1));
jtbi1_lssd bs12_13 (.DOUT0(AD29_TCORE0), .MODE0(mode_i), .TCKA(clockdra), .TCKB(
```

B-33

```
clockdrb), .UPDATE (updatedr), .SHIFT(shiftdr),
        .TDI0(scan12), .DINP0(AD29_FPAD0), .TDO0(scan13), .DINP1 (AD29_FCORE
1), .TDI1(scan13),
        .TDO1(scan14), .ENB(enb), .MODE1(mode_o), .DOUT1(AD29_TPAD1));
jtbi1_lssd bs14_15 (.DOUT0(AD28_TCORE0), .MODE0(mode_i), .TCKA(clockdra), .TCKB(
clockdrb), .UPDATE (updatedr), .SHIFT(shiftdr),
        .TDI0(scan14), .DINP0(AD28_FPAD0), .TDO0(scan15), .DINP1 (AD28_FCORE
1), .TDI1(scan15),
        .TDO1(scan16), .ENB(enb), .MODE1(mode_o), .DOUT1(AD28_TPAD1));
jtbi1_lssd bs16_17 (.DOUT0(AD27_TCORE0), .MODE0(mode_i), .TCKA(clockdra), .TCKB(
clockdrb), .UPDATE (updatedr), .SHIFT(shiftdr),
        .TDI0(scan16), .DINP0(AD27_FPAD0), .TDO0(scan17), .DINP1 (AD27_FCORE
1), .TDI1(scan17),
        .TDO1(scan18), .ENB(enb), .MODE1(mode_o), .DOUT1(AD27_TPAD1));
jtbi1_lssd bs18_19 (.DOUT0(AD26_TCORE0), .MODE0(mode_i), .TCKA(clockdra), .TCKB(
clockdrb), .UPDATE (updatedr), .SHIFT(shiftdr),
        .TDI0(scan18), .DINP0(AD26_FPAD0), .TDO0(scan19), .DINP1 (AD26_FCORE
1), .TDI1(scan19),
        .TDO1(scan20), .ENB(enb), .MODE1(mode_o), .DOUT1(AD26_TPAD1));
jtint1_lssd bs20 (.DOUT(AD25_S09_ENB_TPAD), .MODE(mode_c), .TCKA(clockdra), .TCK
B(clockdrb), .UPDATE (updatedr), .SHIFT(shiftdr),
        .TDI(scan20), .DINP(AD25_S09_ENB_FCORE), .TDO(scan21), .ENB(enb), .S
ETN(setn));
jtbi1_lssd bs21_22 (.DOUT0(AD25_S09_TCORE0), .MODE0(mode_i), .TCKA(clockdra), .T
CKB(clockdrb), .UPDATE (updatedr), .SHIFT(shiftdr),
        .TDI0(scan21), .DINP0(AD25_S09_FPAD0), .TDO0(scan22), .DINP1 (AD25_S
09_FCORE1), .TDI1(scan22),
        .TDO1(scan23), .ENB(enb), .MODE1(mode_o), .DOUT1(AD25_S09_TPAD1));
jtbi1_lssd bs23_24 (.DOUT0(AD24_S08_TCORE0), .MODE0(mode_i), .TCKA(clockdra), .T
CKB(clockdrb), .UPDATE (updatedr), .SHIFT(shiftdr),
        .TDI0(scan23), .DINP0(AD24_S08_FPAD0), .TDO0(scan24), .DINP1 (AD24_S
08_FCORE1), .TDI1(scan24),
        .TDO1(scan25), .ENB(enb), .MODE1(mode_o), .DOUT1(AD24_S08_TPAD1));
jtint1_lssd bs25 (.DOUT(C_BE3L_ENB_TPAD), .MODE(mode_c), .TCKA(clockdra), .TCKB(
clockdrb), .UPDATE (updatedr), .SHIFT(shiftdr),
        .TDI(scan25), .DINP(C_BE3L_ENB_FCORE), .TDO(scan26), .ENB(enb), .SET
N(setn));
jtbi1_lssd bs26_27 (.DOUT0(C_BE3L_TCORE0), .MODE0(mode_i), .TCKA(clockdra), .TCK
B(clockdrb), .UPDATE (updatedr), .SHIFT(shiftdr),
        .TDI0(scan26), .DINP0(C_BE3L_FPAD0), .TDO0(scan27), .DINP1 (C_BE3L_F
CORE1), .TDI1(scan27),
        .TDO1(scan28), .ENB(enb), .MODE1(mode_o), .DOUT1(C_BE3L_TPAD1));
jtin1_lssd bs28 (.DOUT(IDSEL_TCORE), .MODE(mode_i), .TCKA(clockdra), .TCKB(clock
drb), .UPDATE (updatedr), .SHIFT(shiftdr),
        .TDI(scan28), .DINP(IDSEL_FPAD), .TDO(scan29), .ENB(enb), .SETN(setn
));
jtbi1_lssd bs29_30 (.DOUT0(AD23_S07_TCORE0), .MODE0(mode_i), .TCKA(clockdra), .T
CKB(clockdrb), .UPDATE (updatedr), .SHIFT(shiftdr),
        .TDI0(scan29), .DINP0(AD23_S07_FPAD0), .TDO0(scan30), .DINP1 (AD23_S
07_FCORE1), .TDI1(scan30),
        .TDO1(scan31), .ENB(enb), .MODE1(mode_o), .DOUT1(AD23_S07_TPAD1));
jtbi1_lssd bs31_32 (.DOUT0(AD22_S06_TCORE0), .MODE0(mode_i), .TCKA(clockdra), .T
CKB(clockdrb), .UPDATE (updatedr), .SHIFT(shiftdr),
        .TDI0(scan31), .DINP0(AD22_S06_FPAD0), .TDO0(scan32), .DINP1 (AD22_S
06_FCORE1), .TDI1(scan32),
        .TDO1(scan33), .ENB(enb), .MODE1(mode_o), .DOUT1(AD22_S06_TPAD1));
jtbi1_lssd bs33_34 (.DOUT0(AD21_S05_TCORE0), .MODE0(mode_i), .TCKA(clockdra), .T
CKB(clockdrb), .UPDATE (updatedr), .SHIFT(shiftdr),
        .TDI0(scan33), .DINP0(AD21_S05_FPAD0), .TDO0(scan34), .DINP1 (AD21_S
05_FCORE1), .TDI1(scan34),
        .TDO1(scan35), .ENB(enb), .MODE1(mode_o), .DOUT1(AD21_S05_TPAD1));
jtbi1_lssd bs35_36 (.DOUT0(AD20_S04_TCORE0), .MODE0(mode_i), .TCKA(clockdra), .T
CKB(clockdrb), .UPDATE (updatedr), .SHIFT(shiftdr),
        .TDI0(scan35), .DINP0(AD20_S04_FPAD0), .TDO0(scan36), .DINP1 (AD20_S
04_FCORE1), .TDI1(scan36),
        .TDO1(scan37), .ENB(enb), .MODE1(mode_o), .DOUT1(AD20_S04_TPAD1));
jtbi1_lssd bs37_38 (.DOUT0(AD19_S03_TCORE0), .MODE0(mode_i), .TCKA(clockdra), .T
CKB(clockdrb), .UPDATE (updatedr), .SHIFT(shiftdr),
        .TDI0(scan37), .DINP0(AD19_S03_FPAD0), .TDO0(scan38), .DINP1 (AD19_S
03_FCORE1), .TDI1(scan38),
        .TDO1(scan39), .ENB(enb), .MODE1(mode_o), .DOUT1(AD19_S03_TPAD1));
jtbi1_lssd bs39_40 (.DOUT0(AD18_S02_TCORE0), .MODE0(mode_i), .TCKA(clockdra), .T
CKB(clockdrb), .UPDATE (updatedr), .SHIFT(shiftdr),
        .TDI0(scan39), .DINP0(AD18_S02_FPAD0), .TDO0(scan40), .DINP1 (AD18_S
02_FCORE1), .TDI1(scan40),
        .TDO1(scan41), .ENB(enb), .MODE1(mode_o), .DOUT1(AD18_S02_TPAD1));
jtbi1_lssd bs41_42 (.DOUT0(AD17_S01_TCORE0), .MODE0(mode_i), .TCKA(clockdra), .T
CKB(clockdrb), .UPDATE (updatedr), .SHIFT(shiftdr),
        .TDI0(scan41), .DINP0(AD17_S01_FPAD0), .TDO0(scan42), .DINP1 (AD17_S
01_FCORE1), .TDI1(scan42),
        .TDO1(scan43), .ENB(enb), .MODE1(mode_o), .DOUT1(AD17_S01_TPAD1));
jtbi1_lssd bs43_44 (.DOUT0(AD16_S00_TCORE0), .MODE0(mode_i), .TCKA(clockdra), .T
CKB(clockdrb), .UPDATE (updatedr), .SHIFT(shiftdr),
        .TDI0(scan43), .DINP0(AD16_S00_FPAD0), .TDO0(scan44), .DINP1 (AD16_S
00_FCORE1), .TDI1(scan44),
        .TDO1(scan45), .ENB(enb), .MODE1(mode_o), .DOUT1(AD16_S00_TPAD1));
jtbi1_lssd bs45_46 (.DOUT0(C_BE2L_TCORE0), .MODE0(mode_i), .TCKA(clockdra), .TCK
B(clockdrb), .UPDATE (updatedr), .SHIFT(shiftdr),
        .TDI0(scan45), .DINP0(C_BE2L_FPAD0), .TDO0(scan46), .DINP1 (C_BE2L_F
CORE1), .TDI1(scan46),
        .TDO1(scan47), .ENB(enb), .MODE1(mode_o), .DOUT1(C_BE2L_TPAD1));
jtint1_lssd bs47 (.DOUT(FRAMEL_ENB_TPAD), .MODE(mode_c), .TCKA(clockdra), .TCKB(
clockdrb), .UPDATE (updatedr), .SHIFT(shiftdr),
        .TDI(scan47), .DINP(FRAMEL_ENB_FCORE), .TDO(scan48), .ENB(enb), .SET
N(setn));
jtbi1_lssd bs48_49 (.DOUT0(FRAMEL_TCORE0), .MODE0(mode_i), .TCKA(clockdra), .TCK
B(clockdrb), .UPDATE (updatedr), .SHIFT(shiftdr),
        .TDI0(scan48), .DINP0(FRAMEL_FPAD0), .TDO0(scan49), .DINP1 (FRAMEL_F
CORE1), .TDI1(scan49),
        .TDO1(scan50), .ENB(enb), .MODE1(mode_o), .DOUT1(FRAMEL_TPAD1));
jtint1_lssd bs50 (.DOUT(IRDYL_ENB_TPAD), .MODE(mode_c), .TCKA(clockdra), .TCKB(c
lockdrb), .UPDATE (updatedr), .SHIFT(shiftdr),
        .TDI(scan50), .DINP(IRDYL_ENB_FCORE), .TDO(scan51), .ENB(enb), .SETN
(setn));
jtbi1_lssd bs51_52 (.DOUT0(IRDYL_TCORE0), .MODE0(mode_i), .TCKA(clockdra), .TCKB
(clockdrb), .UPDATE (updatedr), .SHIFT(shiftdr),
        .TDI0(scan51), .DINP0(IRDYL_FPAD0), .TDO0(scan52), .DINP1 (IRDYL_FCO
RE1), .TDI1(scan52),
        .TDO1(scan53), .ENB(enb), .MODE1(mode_o), .DOUT1(IRDYL_TPAD1));
jtint1_lssd bs53 (.DOUT(TRDYL_ENB_TPAD), .MODE(mode_c), .TCKA(clockdra), .TCKB(c
lockdrb), .UPDATE (updatedr), .SHIFT(shiftdr),
        .TDI(scan53), .DINP(TRDYL_ENB_FCORE), .TDO(scan54), .ENB(enb), .SETN
(setn));
jtbi1_lssd bs54_55 (.DOUT0(TRDYL_TCORE0), .MODE0(mode_i), .TCKA(clockdra), .TCKB
(clockdrb), .UPDATE (updatedr), .SHIFT(shiftdr),
        .TDI0(scan54), .DINP0(TRDYL_FPAD0), .TDO0(scan55), .DINP1 (TRDYL_FCO
RE1), .TDI1(scan55),
        .TDO1(scan56), .ENB(enb), .MODE1(mode_o), .DOUT1(TRDYL_TPAD1));
jtint1_lssd bs56 (.DOUT(DVSELL_ENB_TPAD), .MODE(mode_c), .TCKA(clockdra), .TCKB(
clockdrb), .UPDATE (updatedr), .SHIFT(shiftdr),
        .TDI(scan56), .DINP(DVSELL_ENB_FCORE), .TDO(scan57), .ENB(enb), .SET
N(setn));
```

msp_1ex_bs.v

B-34

```
jtbil_lssd bs57_58 (.DOUT0(DVSELL_TCORE0), .MODE0(mode_i), .TCKA(clockdra), .TCK
B(clockdrb), .UPDATE (updatedr), .SHIFT(shiftdr),
            .TDI0(scan57), .DINP0(DVSELL_FPAD0), .TDO0(scan58), .DINP1 (DVSELL_F
CORE1), .TDI1(scan58),
            .TDO1(scan59), .ENB(enb), .MODE1(mode_o), .DOUT1(DVSELL_TPAD1));
jtintl_lssd bs59 (.DOUT(STOPL_ENB_TPAD), .MODE(mode_c), .TCKA(clockdra), .TCKB(c
lockdrb), .UPDATE (updatedr), .SHIFT(shiftdr),
            .TDI(scan59), .DINP(STOPL_ENB_FCORE), .TDO(scan60), .ENB(enb), .SETN
(setn));
jtbil_lssd bs60_61 (.DOUT0(STOPL_TCORE0), .MODE0(mode_i), .TCKA(clockdra), .TCKB
(clockdrb), .UPDATE (updatedr), .SHIFT(shiftdr),
            .TDI0(scan60), .DINP0(STOPL_FPAD0), .TDO0(scan61), .DINP1 (STOPL_FCO
RE1), .TDI1(scan61),
            .TDO1(scan62), .ENB(enb), .MODE1(mode_o), .DOUT1(STOPL_TPAD1));
jtintl_lssd bs62 (.DOUT(LOCKL_ENB_TPAD), .MODE(mode_c), .TCKA(clockdra), .TCKB(c
lockdrb), .UPDATE (updatedr), .SHIFT(shiftdr),
            .TDI(scan62), .DINP(LOCKL_ENB_FCORE), .TDO(scan63), .ENB(enb), .SETN
(setn));
jtbil_lssd bs63_64 (.DOUT0(LOCKL_TCORE0), .MODE0(mode_i), .TCKA(clockdra), .TCKB
(clockdrb), .UPDATE (updatedr), .SHIFT(shiftdr),
            .TDI0(scan63), .DINP0(LOCKL_FPAD0), .TDO0(scan64), .DINP1 (LOCKL_FCO
RE1), .TDI1(scan64),
            .TDO1(scan65), .ENB(enb), .MODE1(mode_o), .DOUT1(LOCKL_TPAD1));
jtintl_lssd bs65 (.DOUT(PERRL_ENB_TPAD), .MODE(mode_c), .TCKA(clockdra), .TCKB(c
lockdrb), .UPDATE (updatedr), .SHIFT(shiftdr),
            .TDI(scan65), .DINP(PERRL_ENB_FCORE), .TDO(scan66), .ENB(enb), .SETN
(setn));
jtbil_lssd bs66_67 (.DOUT0(PERRL_TCORE0), .MODE0(mode_i), .TCKA(clockdra), .TCKB
(clockdrb), .UPDATE (updatedr), .SHIFT(shiftdr),
            .TDI0(scan66), .DINP0(PERRL_FPAD0), .TDO0(scan67), .DINP1 (PERRL_FCO
RE1), .TDI1(scan67),
            .TDO1(scan68), .ENB(enb), .MODE1(mode_o), .DOUT1(PERRL_TPAD1));
jtintl_lssd bs68 (.DOUT(SERRL_ENB_TPAD), .MODE(mode_c), .TCKA(clockdra), .TCKB(c
lockdrb), .UPDATE (updatedr), .SHIFT(shiftdr),
            .TDI(scan68), .DINP(SERRL_ENB_FCORE), .TDO(scan69), .ENB(enb), .SETN
(setn));

jtinl_lssd bs69_70 (.DOUT(SERRL_TCORE), .MODE(mode_i), .TCKA(clockdra), .TCKB(cl
ockdrb), .UPDATE (updatedr), .SHIFT(shiftdr),
            .TDI(scan69), .DINP(SERRL_FPAD), .TDO(scan71), .ENB(enb), .SETN(setn
));

// @@@ As the Serr Pad is changing to open drain, this pad is changing to jtin
// @@@ jtbil_lssd bs69_70 (.DOUT0(SERRL_TCORE0), .MODE0(mode_i), .TCKA(clockdra)
, .TCKB(clockdrb), .UPDATE (updatedr), .SHIFT(shiftdr),
// @@@      .TDI0(scan69), .DINP0(SERRL_FPAD0), .TDO0(scan70), .DINP1 (SERRL_FCO
RE1), .TDI1(scan70),
// @@@      .TDO1(scan71), .ENB(enb), .MODE1(mode_o), .DOUT1(SERRL_TPAD1));

jtinl_lssd bs71 (.DOUT(TCA_TCORE), .MODE(mode_i), .TCKA(clockdra), .TCKB(clockdr
b), .UPDATE (updatedr), .SHIFT(shiftdr),
            .TDI(scan71), .DINP(TCA_FPAD), .TDO(scan72), .ENB(enb), .SETN(setn))
;
jtintl_lssd bs72 (.DOUT(PAR_ENB_TPAD), .MODE(mode_c), .TCKA(clockdra), .TCKB(clo
ckdrb), .UPDATE (updatedr), .SHIFT(shiftdr),
            .TDI(scan72), .DINP(PAR_ENB_FCORE), .TDO(scan73), .ENB(enb), .SETN(s
etn));
jtbil_lssd bs73_74 (.DOUT0(PAR_TCORE0), .MODE0(mode_i), .TCKA(clockdra), .TCKB(c
lockdrb), .UPDATE (updatedr), .SHIFT(shiftdr),
            .TDI0(scan73), .DINP0(PAR_FPAD0), .TDO0(scan74), .DINP1 (PAR_FCORE1)
, .TDI1(scan74),
            .TDO1(scan75), .ENB(enb), .MODE1(mode_o), .DOUT1(PAR_TPAD1));
jtbil_lssd bs75_76 (.DOUT0(C_BE1L_TCORE0), .MODE0(mode_i), .TCKA(clockdra), .TCK
B(clockdrb), .UPDATE (updatedr), .SHIFT(shiftdr),
            .TDI0(scan75), .DINP0(C_BE1L_FPAD0), .TDO0(scan76), .DINP1 (C_BE1L_F
CORE1), .TDI1(scan76),
            .TDO1(scan77), .ENB(enb), .MODE1(mode_o), .DOUT1(C_BE1L_TPAD1));
jtintl_lssd bs77 (.DOUT(AD15_SI9_ENB_TPAD), .MODE(mode_c), .TCKA(clockdra), .TCK
B(clockdrb), .UPDATE (updatedr), .SHIFT(shiftdr),
            .TDI(scan77), .DINP(AD15_SI9_ENB_FCORE), .TDO(scan78), .ENB(enb), .S
ETN(setn));
jtbil_lssd bs78_79 (.DOUT0(AD15_SI9_TCORE0), .MODE0(mode_i), .TCKA(clockdra), .T
CKB(clockdrb), .UPDATE (updatedr), .SHIFT(shiftdr),
            .TDI0(scan78), .DINP0(AD15_SI9_FPAD0), .TDO0(scan79), .DINP1 (AD15_S
I9_FCORE1), .TDI1(scan79),
            .TDO1(scan80), .ENB(enb), .MODE1(mode_o), .DOUT1(AD15_SI9_TPAD1));
jtbil_lssd bs80_81 (.DOUT0(AD14_SI8_TCORE0), .MODE0(mode_i), .TCKA(clockdra), .T
CKB(clockdrb), .UPDATE (updatedr), .SHIFT(shiftdr),
            .TDI0(scan80), .DINP0(AD14_SI8_FPAD0), .TDO0(scan81), .DINP1 (AD14_S
I8_FCORE1), .TDI1(scan81),
            .TDO1(scan82), .ENB(enb), .MODE1(mode_o), .DOUT1(AD14_SI8_TPAD1));
jtbil_lssd bs82_83 (.DOUT0(AD13_SI7_TCORE0), .MODE0(mode_i), .TCKA(clockdra), .T
CKB(clockdrb), .UPDATE (updatedr), .SHIFT(shiftdr),
            .TDI0(scan82), .DINP0(AD13_SI7_FPAD0), .TDO0(scan83), .DINP1 (AD13_S
I7_FCORE1), .TDI1(scan83),
            .TDO1(scan84), .ENB(enb), .MODE1(mode_o), .DOUT1(AD13_SI7_TPAD1));
jtbil_lssd bs84_85 (.DOUT0(AD12_SI6_TCORE0), .MODE0(mode_i), .TCKA(clockdra), .T
CKB(clockdrb), .UPDATE (updatedr), .SHIFT(shiftdr),
            .TDI0(scan84), .DINP0(AD12_SI6_FPAD0), .TDO0(scan85), .DINP1 (AD12_S
I6_FCORE1), .TDI1(scan85),
            .TDO1(scan86), .ENB(enb), .MODE1(mode_o), .DOUT1(AD12_SI6_TPAD1));
jtbil_lssd bs86_87 (.DOUT0(AD11_SI5_TCORE0), .MODE0(mode_i), .TCKA(clockdra), .T
CKB(clockdrb), .UPDATE (updatedr), .SHIFT(shiftdr),
            .TDI0(scan86), .DINP0(AD11_SI5_FPAD0), .TDO0(scan87), .DINP1 (AD11_S
I5_FCORE1), .TDI1(scan87),
            .TDO1(scan88), .ENB(enb), .MODE1(mode_o), .DOUT1(AD11_SI5_TPAD1));
jtbil_lssd bs88_89 (.DOUT0(AD10_SI4_TCORE0), .MODE0(mode_i), .TCKA(clockdra), .T
CKB(clockdrb), .UPDATE (updatedr), .SHIFT(shiftdr),
            .TDI0(scan88), .DINP0(AD10_SI4_FPAD0), .TDO0(scan89), .DINP1 (AD10_S
I4_FCORE1), .TDI1(scan89),
            .TDO1(scan90), .ENB(enb), .MODE1(mode_o), .DOUT1(AD10_SI4_TPAD1));
jtbil_lssd bs90_91 (.DOUT0(AD09_SI3_TCORE0), .MODE0(mode_i), .TCKA(clockdra), .T
CKB(clockdrb), .UPDATE (updatedr), .SHIFT(shiftdr),
            .TDI0(scan90), .DINP0(AD09_SI3_FPAD0), .TDO0(scan91), .DINP1 (AD09_S
I3_FCORE1), .TDI1(scan91),
            .TDO1(scan92), .ENB(enb), .MODE1(mode_o), .DOUT1(AD09_SI3_TPAD1));
jtbil_lssd bs92_93 (.DOUT0(AD08_SI2_TCORE0), .MODE0(mode_i), .TCKA(clockdra), .T
CKB(clockdrb), .UPDATE (updatedr), .SHIFT(shiftdr),
            .TDI0(scan92), .DINP0(AD08_SI2_FPAD0), .TDO0(scan93), .DINP1 (AD08_S
I2_FCORE1), .TDI1(scan93),
            .TDO1(scan94), .ENB(enb), .MODE1(mode_o), .DOUT1(AD08_SI2_TPAD1));
jtbil_lssd bs94_95 (.DOUT0(C_BE0L_TCORE0), .MODE0(mode_i), .TCKA(clockdra), .TCK
B(clockdrb), .UPDATE (updatedr), .SHIFT(shiftdr),
            .TDI0(scan94), .DINP0(C_BE0L_FPAD0), .TDO0(scan95), .DINP1 (C_BE0L_F
CORE1), .TDI1(scan95),
            .TDO1(scan96), .ENB(enb), .MODE1(mode_o), .DOUT1(C_BE0L_TPAD1));
jtinl_lssd bs96 (.DOUT(TCB_TCORE), .MODE(mode_i), .TCKA(clockdra), .TCKB(clockdr
b), .UPDATE (updatedr), .SHIFT(shiftdr),
            .TDI(scan96), .DINP(TCB_FPAD), .TDO(scan97), .ENB(enb), .SETN(setn))
;
jtinl_lssd bs97 (.DOUT(TM_TCORE), .MODE(mode_i), .TCKA(clockdra), .TCKB(clockdrb
), .UPDATE (updatedr), .SHIFT(shiftdr),
```

B-35

```
        .TDI(scan97), .DINP(TM_FPAD), .TDO(scan98), .ENB(enb), .SETN(setn));
jtbil_lssd bs98_99 (.DOUT0(AD07_SI1_TCORE0), .MODE0(mode_i), .TCKA(clockdra), .T
CKB(clockdrb), .UPDATE (updatedr), .SHIFT(shiftdr),
        .TDI0(scan98), .DINP0(AD07_SI1_FPAD0), .TDO0(scan99), .DINP1 (AD07_S
I1_FCORE1), .TDI1(scan99),
        .TDO1(scan100), .ENB(enb), .MODE1(mode_o), .DOUT1(AD07_SI1_TPAD1));
jtbil_lssd bs100_101 (.DOUT0(AD06_SI0_TCORE0), .MODE0(mode_i), .TCKA(clockdra),
.TCKB(clockdrb), .UPDATE (updatedr), .SHIFT(shiftdr),
        .TDI0(scan100), .DINP0(AD06_SI0_FPAD0), .TDO0(scan101), .DINP1 (AD06
_SI0_FCORE1), .TDI1(scan101),
        .TDO1(scan102), .ENB(enb), .MODE1(mode_o), .DOUT1(AD06_SI0_TPAD1));
jtintl_lssd bs102 (.DOUT(AD05_MT5_ENB_TPAD), .MODE(mode_c), .TCKA(clockdra), .TC
KB(clockdrb), .UPDATE (updatedr), .SHIFT(shiftdr),
        .TDI(scan102), .DINP(AD05_MT5_ENB_FCORE), .TDO(scan103), .ENB(enb),
.SETN(setn));
jtbil_lssd bs103_104 (.DOUT0(AD05_MT5_TCORE0), .MODE0(mode_i), .TCKA(clockdra),
.TCKB(clockdrb), .UPDATE (updatedr), .SHIFT(shiftdr),
        .TDI0(scan103), .DINP0(AD05_MT5_FPAD0), .TDO0(scan104), .DINP1 (AD05
_MT5_FCORE1), .TDI1(scan104),
        .TDO1(scan105), .ENB(enb), .MODE1(mode_o), .DOUT1(AD05_MT5_TPAD1));
jtbil_lssd bs105_106 (.DOUT0(AD04_MT4_TCORE0), .MODE0(mode_i), .TCKA(clockdra),
.TCKB(clockdrb), .UPDATE (updatedr), .SHIFT(shiftdr),
        .TDI0(scan105), .DINP0(AD04_MT4_FPAD0), .TDO0(scan106), .DINP1 (AD04
_MT4_FCORE1), .TDI1(scan106),
        .TDO1(scan107), .ENB(enb), .MODE1(mode_o), .DOUT1(AD04_MT4_TPAD1));
jtbil_lssd bs107_108 (.DOUT0(AD03_MT3_TCORE0), .MODE0(mode_i), .TCKA(clockdra),
.TCKB(clockdrb), .UPDATE (updatedr), .SHIFT(shiftdr),
        .TDI0(scan107), .DINP0(AD03_MT3_FPAD0), .TDO0(scan108), .DINP1 (AD03
_MT3_FCORE1), .TDI1(scan108),
        .TDO1(scan109), .ENB(enb), .MODE1(mode_o), .DOUT1(AD03_MT3_TPAD1));
jtintl_lssd bs109 (.DOUT(AD02_MT2_ENB_TPAD), .MODE(mode_c), .TCKA(clockdra), .TC
KB(clockdrb), .UPDATE (updatedr), .SHIFT(shiftdr),
        .TDI(scan109), .DINP(AD02_MT2_ENB_FCORE), .TDO(scan110), .ENB(enb),
.SETN(setn));
jtbil_lssd bs110_111 (.DOUT0(AD02_MT2_TCORE0), .MODE0(mode_i), .TCKA(clockdra),
.TCKB(clockdrb), .UPDATE (updatedr), .SHIFT(shiftdr),
        .TDI0(scan110), .DINP0(AD02_MT2_FPAD0), .TDO0(scan111), .DINP1 (AD02
_MT2_FCORE1), .TDI1(scan111),
        .TDO1(scan112), .ENB(enb), .MODE1(mode_o), .DOUT1(AD02_MT2_TPAD1));
jtbil_lssd bs112_113 (.DOUT0(AD01_MT1_TCORE0), .MODE0(mode_i), .TCKA(clockdra),
.TCKB(clockdrb), .UPDATE (updatedr), .SHIFT(shiftdr),
        .TDI0(scan112), .DINP0(AD01_MT1_FPAD0), .TDO0(scan113), .DINP1 (AD01
_MT1_FCORE1), .TDI1(scan113),
        .TDO1(scan114), .ENB(enb), .MODE1(mode_o), .DOUT1(AD01_MT1_TPAD1));
jtbil_lssd bs114_115 (.DOUT0(AD00_MT0_TCORE0), .MODE0(mode_i), .TCKA(clockdra),
.TCKB(clockdrb), .UPDATE (updatedr), .SHIFT(shiftdr),
        .TDI0(scan114), .DINP0(AD00_MT0_FPAD0), .TDO0(scan115), .DINP1 (AD00
_MT0_FCORE1), .TDI1(scan115),
        .TDO1(scan116), .ENB(enb), .MODE1(mode_o), .DOUT1(AD00_MT0_TPAD1));
jtoutl_lssd bs116 (.DOUT(MA11_TPAD), .MODE(mode_o), .TCKA(clockdra), .TCKB(clock
drb), .UPDATE (updatedr), .SHIFT(shiftdr),
        .TDI(w1_sdram), .DINP(MA11_FCORE), .TDO(scan117) , .ENB(dbsr_en), .S
ETN(setn));
jtoutl_lssd bs117 (.DOUT(MA10_TPAD), .MODE(mode_o), .TCKA(clockdra), .TCKB(clock
drb), .UPDATE (updatedr), .SHIFT(shiftdr),
        .TDI(scan117), .DINP(MA10_FCORE), .TDO(scan118) , .ENB(dbsr_en), .SE
TN(setn));
jtoutl_lssd bs118 (.DOUT(MA9_TPAD), .MODE(mode_o), .TCKA(clockdra), .TCKB(clockd
rb), .UPDATE (updatedr), .SHIFT(shiftdr),
        .TDI(scan118), .DINP(MA9_FCORE), .TDO(scan119) , .ENB(dbsr_en), .SET
N(setn));
jtoutl_lssd bs119 (.DOUT(MA8_TPAD), .MODE(mode_o), .TCKA(clockdra), .TCKB(clockd
rb), .UPDATE (updatedr), .SHIFT(shiftdr),
        .TDI(scan119), .DINP(MA8_FCORE), .TDO(scan120) , .ENB(dbsr_en), .SET
N(setn));
jtoutl_lssd bs120 (.DOUT(MA7_TPAD), .MODE(mode_o), .TCKA(clockdra), .TCKB(clockd
rb), .UPDATE (updatedr), .SHIFT(shiftdr),
        .TDI(scan120), .DINP(MA7_FCORE), .TDO(scan121) , .ENB(dbsr_en), .SET
N(setn));
jtoutl_lssd bs121 (.DOUT(MA6_TPAD), .MODE(mode_o), .TCKA(clockdra), .TCKB(clockd
rb), .UPDATE (updatedr), .SHIFT(shiftdr),
        .TDI(scan121), .DINP(MA6_FCORE), .TDO(scan122) , .ENB(dbsr_en), .SET
N(setn));
jtoutl_lssd bs122 (.DOUT(MA5_TPAD), .MODE(mode_o), .TCKA(clockdra), .TCKB(clockd
rb), .UPDATE (updatedr), .SHIFT(shiftdr),
        .TDI(scan122), .DINP(MA5_FCORE), .TDO(scan123) , .ENB(dbsr_en), .SET
N(setn));
jtoutl_lssd bs123 (.DOUT(MA4_TPAD), .MODE(mode_o), .TCKA(clockdra), .TCKB(clockd
rb), .UPDATE (updatedr), .SHIFT(shiftdr),
        .TDI(scan123), .DINP(MA4_FCORE), .TDO(scan124) , .ENB(dbsr_en), .SET
N(setn));
jtoutl_lssd bs124 (.DOUT(MA3_TPAD), .MODE(mode_o), .TCKA(clockdra), .TCKB(clockd
rb), .UPDATE (updatedr), .SHIFT(shiftdr),
        .TDI(scan124), .DINP(MA3_FCORE), .TDO(scan125) , .ENB(dbsr_en), .SET
N(setn));
jtoutl_lssd bs125 (.DOUT(MA2_TPAD), .MODE(mode_o), .TCKA(clockdra), .TCKB(clockd
rb), .UPDATE (updatedr), .SHIFT(shiftdr),
        .TDI(scan125), .DINP(MA2_FCORE), .TDO(scan126) , .ENB(dbsr_en), .SET
N(setn));
jtoutl_lssd bs126 (.DOUT(MA1_TPAD), .MODE(mode_o), .TCKA(clockdra), .TCKB(clockd
rb), .UPDATE (updatedr), .SHIFT(shiftdr),
        .TDI(scan126), .DINP(MA1_FCORE), .TDO(scan127) , .ENB(dbsr_en), .SET
N(setn));
jtoutl_lssd bs127 (.DOUT(MA0_TPAD), .MODE(mode_o), .TCKA(clockdra), .TCKB(clockd
rb), .UPDATE (updatedr), .SHIFT(shiftdr),
        .TDI(scan127), .DINP(MA0_FCORE), .TDO(scan128) , .ENB(dbsr_en), .SET
N(setn));
jtoutl_lssd bs128 (.DOUT(RAS1L_TPAD), .MODE(mode_o), .TCKA(clockdra), .TCKB(cloc
kdrb), .UPDATE (updatedr), .SHIFT(shiftdr),
        .TDI(scan128), .DINP(RAS1L_FCORE), .TDO(scan129) , .ENB(dbsr_en), .S
ETN(setn));
jtoutl_lssd bs129 (.DOUT(CAS1L_TPAD), .MODE(mode_o), .TCKA(clockdra), .TCKB(cloc
kdrb), .UPDATE (updatedr), .SHIFT(shiftdr),
        .TDI(scan129), .DINP(CAS1L_FCORE), .TDO(scan130) , .ENB(dbsr_en), .S
ETN(setn));
jtoutl_lssd bs130 (.DOUT(MWEL_TPAD), .MODE(mode_o), .TCKA(clockdra), .TCKB(clock
drb), .UPDATE (updatedr), .SHIFT(shiftdr),
        .TDI(scan130), .DINP(MWEL_FCORE), .TDO(scan131) , .ENB(dbsr_en), .SE
TN(setn));
jtoutl_lssd bs131 (.DOUT(DQM_TPAD), .MODE(mode_o), .TCKA(clockdra), .TCKB(clockd
rb), .UPDATE (updatedr), .SHIFT(shiftdr),
        .TDI(scan131), .DINP(DQM_FCORE), .TDO(scan132) , .ENB(dbsr_en), .SET
N(setn));
jtoutl_lssd bs132 (.DOUT(MCS0L_TPAD), .MODE(mode_o), .TCKA(clockdra), .TCKB(cloc
kdrb), .UPDATE (updatedr), .SHIFT(shiftdr),
        .TDI(scan132), .DINP(MCS0L_FCORE), .TDO(scan133) , .ENB(dbsr_en), .S
ETN(setn));
jtoutl_lssd bs133 (.DOUT(MCS1L_TPAD), .MODE(mode_o), .TCKA(clockdra), .TCKB(cloc
kdrb), .UPDATE (updatedr), .SHIFT(shiftdr),
        .TDI(scan133), .DINP(MCS1L_FCORE), .TDO(scan134) , .ENB(dbsr_en), .S
ETN(setn));
jtoutl_lssd bs134 (.DOUT(MCKE_TPAD), .MODE(mode_o), .TCKA(clockdra), .TCKB(clock
```

B-36

```
drb), .UPDATE (updatedr), .SHIFT(shiftdr),
            .TDI(scan134), .DINP(MCKE_FCORE), .TDO(scan135) , .ENB(dbsr_en), .SE
TN(setn));
jtinl_lssd bs135 (.DOUT(MRDYH_TCORE), .MODE(mode_i), .TCKA(clockdra), .TCKB(cloc
kdrb), .UPDATE (updatedr), .SHIFT(shiftdr),
            .TDI(scan135), .DINP(MRDYH_FPAD), .TDO(scan136), .ENB(dbsr_en), .SET
N(setn));
jtintl_lssd bs136 (.DOUT(MD0_ENB_TPAD), .MODE(mode_c), .TCKA(clockdra), .TCKB(cl
ockdrb), .UPDATE (updatedr), .SHIFT(shiftdr),
            .TDI(scan136), .DINP(MD0_ENB_FCORE), .TDO(scan137), .ENB(dbsr_en), .
SETN(setn));
jtbil_lssd bs137_138 (.DOUT0(MD0_TCORE0), .MODE0(mode_i), .TCKA(clockdra), .TCKB
(clockdrb), .UPDATE (updatedr), .SHIFT(shiftdr),
            .TDI0(scan137), .DINP0(MD0_FPAD0), .TDO0(scan138), .DINP1 (MD0_FCORE
1), .TDI1(scan138),
            .TDO1(scan139), .ENB(dbsr_en), .MODE1(mode_o), .DOUT1(MD0_TPAD1));
jtbil_lssd bs139_140 (.DOUT0(MD1_TCORE0), .MODE0(mode_i), .TCKA(clockdra), .TCKB
(clockdrb), .UPDATE (updatedr), .SHIFT(shiftdr),
            .TDI0(scan139), .DINP0(MD1_FPAD0), .TDO0(scan140), .DINP1 (MD1_FCORE
1), .TDI1(scan140),
            .TDO1(scan141), .ENB(dbsr_en), .MODE1(mode_o), .DOUT1(MD1_TPAD1));
jtbil_lssd bs141_142 (.DOUT0(MD2_TCORE0), .MODE0(mode_i), .TCKA(clockdra), .TCKB
(clockdrb), .UPDATE (updatedr), .SHIFT(shiftdr),
            .TDI0(scan141), .DINP0(MD2_FPAD0), .TDO0(scan142), .DINP1 (MD2_FCORE
1), .TDI1(scan142),
            .TDO1(scan143), .ENB(dbsr_en), .MODE1(mode_o), .DOUT1(MD2_TPAD1));
jtbil_lssd bs143_144 (.DOUT0(MD3_TCORE0), .MODE0(mode_i), .TCKA(clockdra), .TCKB
(clockdrb), .UPDATE (updatedr), .SHIFT(shiftdr),
            .TDI0(scan143), .DINP0(MD3_FPAD0), .TDO0(scan144), .DINP1 (MD3_FCORE
1), .TDI1(scan144),
            .TDO1(scan145), .ENB(dbsr_en), .MODE1(mode_o), .DOUT1(MD3_TPAD1));
jtbil_lssd bs145_146 (.DOUT0(MD4_TCORE0), .MODE0(mode_i), .TCKA(clockdra), .TCKB
(clockdrb), .UPDATE (updatedr), .SHIFT(shiftdr),
            .TDI0(scan145), .DINP0(MD4_FPAD0), .TDO0(scan146), .DINP1 (MD4_FCORE
1), .TDI1(scan146),
            .TDO1(scan147), .ENB(dbsr_en), .MODE1(mode_o), .DOUT1(MD4_TPAD1));
jtbil_lssd bs147_148 (.DOUT0(MD5_TCORE0), .MODE0(mode_i), .TCKA(clockdra), .TCKB
(clockdrb), .UPDATE (updatedr), .SHIFT(shiftdr),
            .TDI0(scan147), .DINP0(MD5_FPAD0), .TDO0(scan148), .DINP1 (MD5_FCORE
1), .TDI1(scan148),
            .TDO1(scan149), .ENB(dbsr_en), .MODE1(mode_o), .DOUT1(MD5_TPAD1));
jtbil_lssd bs149_150 (.DOUT0(MD6_TCORE0), .MODE0(mode_i), .TCKA(clockdra), .TCKB
(clockdrb), .UPDATE (updatedr), .SHIFT(shiftdr),
            .TDI0(scan149), .DINP0(MD6_FPAD0), .TDO0(scan150), .DINP1 (MD6_FCORE
1), .TDI1(scan150),
            .TDO1(scan151), .ENB(dbsr_en), .MODE1(mode_o), .DOUT1(MD6_TPAD1));
jtbil_lssd bs151_152 (.DOUT0(MD7_TCORE0), .MODE0(mode_i), .TCKA(clockdra), .TCKB
(clockdrb), .UPDATE (updatedr), .SHIFT(shiftdr),
            .TDI0(scan151), .DINP0(MD7_FPAD0), .TDO0(scan152), .DINP1 (MD7_FCORE
1), .TDI1(scan152),
            .TDO1(scan153), .ENB(dbsr_en), .MODE1(mode_o), .DOUT1(MD7_TPAD1));
jtbil_lssd bs153_154 (.DOUT0(MD8_TCORE0), .MODE0(mode_i), .TCKA(clockdra), .TCKB
(clockdrb), .UPDATE (updatedr), .SHIFT(shiftdr),
            .TDI0(scan153), .DINP0(MD8_FPAD0), .TDO0(scan154), .DINP1 (MD8_FCORE
1), .TDI1(scan154),
            .TDO1(scan155), .ENB(dbsr_en), .MODE1(mode_o), .DOUT1(MD8_TPAD1));
jtbil_lssd bs155_156 (.DOUT0(MD9_TCORE0), .MODE0(mode_i), .TCKA(clockdra), .TCKB
(clockdrb), .UPDATE (updatedr), .SHIFT(shiftdr),
            .TDI0(scan155), .DINP0(MD9_FPAD0), .TDO0(scan156), .DINP1 (MD9_FCORE
1), .TDI1(scan156),
            .TDO1(scan157), .ENB(dbsr_en), .MODE1(mode_o), .DOUT1(MD9_TPAD1));
jtbil_lssd bs157_158 (.DOUT0(MD10_TCORE0), .MODE0(mode_i), .TCKA(clockdra), .TCK
B(clockdrb), .UPDATE (updatedr), .SHIFT(shiftdr),
            .TDI0(scan157), .DINP0(MD10_FPAD0), .TDO0(scan158), .DINP1 (MD10_FCO
RE1), .TDI1(scan158),
            .TDO1(scan159), .ENB(dbsr_en), .MODE1(mode_o), .DOUT1(MD10_TPAD1));
jtbil_lssd bs159_160 (.DOUT0(MD11_TCORE0), .MODE0(mode_i), .TCKA(clockdra), .TCK
B(clockdrb), .UPDATE (updatedr), .SHIFT(shiftdr),
            .TDI0(scan159), .DINP0(MD11_FPAD0), .TDO0(scan160), .DINP1 (MD11_FCO
RE1), .TDI1(scan160),
            .TDO1(scan161), .ENB(dbsr_en), .MODE1(mode_o), .DOUT1(MD11_TPAD1));
jtbil_lssd bs161_162 (.DOUT0(MD12_TCORE0), .MODE0(mode_i), .TCKA(clockdra), .TCK
B(clockdrb), .UPDATE (updatedr), .SHIFT(shiftdr),
            .TDI0(scan161), .DINP0(MD12_FPAD0), .TDO0(scan162), .DINP1 (MD12_FCO
RE1), .TDI1(scan162),
            .TDO1(scan163), .ENB(dbsr_en), .MODE1(mode_o), .DOUT1(MD12_TPAD1));
jtbil_lssd bs163_164 (.DOUT0(MD13_TCORE0), .MODE0(mode_i), .TCKA(clockdra), .TCK
B(clockdrb), .UPDATE (updatedr), .SHIFT(shiftdr),
            .TDI0(scan163), .DINP0(MD13_FPAD0), .TDO0(scan164), .DINP1 (MD13_FCO
RE1), .TDI1(scan164),
            .TDO1(scan165), .ENB(dbsr_en), .MODE1(mode_o), .DOUT1(MD13_TPAD1));
jtbil_lssd bs165_166 (.DOUT0(MD14_TCORE0), .MODE0(mode_i), .TCKA(clockdra), .TCK
B(clockdrb), .UPDATE (updatedr), .SHIFT(shiftdr),
            .TDI0(scan165), .DINP0(MD14_FPAD0), .TDO0(scan166), .DINP1 (MD14_FCO
RE1), .TDI1(scan166),
            .TDO1(scan167), .ENB(dbsr_en), .MODE1(mode_o), .DOUT1(MD14_TPAD1));
jtbil_lssd bs167_168 (.DOUT0(MD15_TCORE0), .MODE0(mode_i), .TCKA(clockdra), .TCK
B(clockdrb), .UPDATE (updatedr), .SHIFT(shiftdr),
            .TDI0(scan167), .DINP0(MD15_FPAD0), .TDO0(scan168), .DINP1 (MD15_FCO
RE1), .TDI1(scan168),
            .TDO1(scan169), .ENB(dbsr_en), .MODE1(mode_o), .DOUT1(MD15_TPAD1));
jtbil_lssd bs169_170 (.DOUT0(MD16_TCORE0), .MODE0(mode_i), .TCKA(clockdra), .TCK
B(clockdrb), .UPDATE (updatedr), .SHIFT(shiftdr),
            .TDI0(scan169), .DINP0(MD16_FPAD0), .TDO0(scan170), .DINP1 (MD16_FCO
RE1), .TDI1(scan170),
            .TDO1(scan171), .ENB(dbsr_en), .MODE1(mode_o), .DOUT1(MD16_TPAD1));
jtbil_lssd bs171_172 (.DOUT0(MD17_TCORE0), .MODE0(mode_i), .TCKA(clockdra), .TCK
B(clockdrb), .UPDATE (updatedr), .SHIFT(shiftdr),
            .TDI0(scan171), .DINP0(MD17_FPAD0), .TDO0(scan172), .DINP1 (MD17_FCO
RE1), .TDI1(scan172),
            .TDO1(scan173), .ENB(dbsr_en), .MODE1(mode_o), .DOUT1(MD17_TPAD1));
jtbil_lssd bs173_174 (.DOUT0(MD18_TCORE0), .MODE0(mode_i), .TCKA(clockdra), .TCK
B(clockdrb), .UPDATE (updatedr), .SHIFT(shiftdr),
            .TDI0(scan173), .DINP0(MD18_FPAD0), .TDO0(scan174), .DINP1 (MD18_FCO
RE1), .TDI1(scan174),
            .TDO1(scan175), .ENB(dbsr_en), .MODE1(mode_o), .DOUT1(MD18_TPAD1));
jtbil_lssd bs175_176 (.DOUT0(MD19_TCORE0), .MODE0(mode_i), .TCKA(clockdra), .TCK
B(clockdrb), .UPDATE (updatedr), .SHIFT(shiftdr),
            .TDI0(scan175), .DINP0(MD19_FPAD0), .TDO0(scan176), .DINP1 (MD19_FCO
RE1), .TDI1(scan176),
            .TDO1(scan177), .ENB(dbsr_en), .MODE1(mode_o), .DOUT1(MD19_TPAD1));
jtbil_lssd bs177_178 (.DOUT0(MD20_TCORE0), .MODE0(mode_i), .TCKA(clockdra), .TCK
B(clockdrb), .UPDATE (updatedr), .SHIFT(shiftdr),
            .TDI0(scan177), .DINP0(MD20_FPAD0), .TDO0(scan178), .DINP1 (MD20_FCO
RE1), .TDI1(scan178),
            .TDO1(scan179), .ENB(dbsr_en), .MODE1(mode_o), .DOUT1(MD20_TPAD1));
jtbil_lssd bs179_180 (.DOUT0(MD21_TCORE0), .MODE0(mode_i), .TCKA(clockdra), .TCK
B(clockdrb), .UPDATE (updatedr), .SHIFT(shiftdr),
            .TDI0(scan179), .DINP0(MD21_FPAD0), .TDO0(scan180), .DINP1 (MD21_FCO
RE1), .TDI1(scan180),
            .TDO1(scan181), .ENB(dbsr_en), .MODE1(mode_o), .DOUT1(MD21_TPAD1));
jtbil_lssd bs181_182 (.DOUT0(MD22_TCORE0), .MODE0(mode_i), .TCKA(clockdra), .TCK
```

msp_1ex_bs.v

B-37

```
B(clockdrb), .UPDATE (updatedr), .SHIFT(shiftdr),
            .TDI0(scan181), .DINP0(MD22_FPAD0), .TDO0(scan182), .DINP1 (MD22_FCO
RE1), .TDI1(scan182),
            .TDO1(scan183), .ENB(dbsr_en), .MODE1(mode_o), .DOUT1(MD22_TPAD1));
jtbi1_lssd bs183_184 (.DOUT0(MD23_TCORE0), .MODE0(mode_i), .TCKA(clockdra), .TCK
B(clockdrb), .UPDATE (updatedr), .SHIFT(shiftdr),
            .TDI0(scan183), .DINP0(MD23_FPAD0), .TDO0(scan184), .DINP1 (MD23_FCO
RE1), .TDI1(scan184),
            .TDO1(scan185), .ENB(dbsr_en), .MODE1(mode_o), .DOUT1(MD23_TPAD1));
jtbi1_lssd bs185_186 (.DOUT0(MD24_TCORE0), .MODE0(mode_i), .TCKA(clockdra), .TCK
B(clockdrb), .UPDATE (updatedr), .SHIFT(shiftdr),
            .TDI0(scan185), .DINP0(MD24_FPAD0), .TDO0(scan186), .DINP1 (MD24_FCO
RE1), .TDI1(scan186),
            .TDO1(scan187), .ENB(dbsr_en), .MODE1(mode_o), .DOUT1(MD24_TPAD1));
jtbi1_lssd bs187_188 (.DOUT0(MD25_TCORE0), .MODE0(mode_i), .TCKA(clockdra), .TCK
B(clockdrb), .UPDATE (updatedr), .SHIFT(shiftdr),
            .TDI0(scan187), .DINP0(MD25_FPAD0), .TDO0(scan188), .DINP1 (MD25_FCO
RE1), .TDI1(scan188),
            .TDO1(scan189), .ENB(dbsr_en), .MODE1(mode_o), .DOUT1(MD25_TPAD1));
jtbi1_lssd bs189_190 (.DOUT0(MD26_TCORE0), .MODE0(mode_i), .TCKA(clockdra), .TCK
B(clockdrb), .UPDATE (updatedr), .SHIFT(shiftdr),
            .TDI0(scan189), .DINP0(MD26_FPAD0), .TDO0(scan190), .DINP1 (MD26_FCO
RE1), .TDI1(scan190),
            .TDO1(scan191), .ENB(dbsr_en), .MODE1(mode_o), .DOUT1(MD26_TPAD1));
jtbi1_lssd bs191_192 (.DOUT0(MD27_TCORE0), .MODE0(mode_i), .TCKA(clockdra), .TCK
B(clockdrb), .UPDATE (updatedr), .SHIFT(shiftdr),
            .TDI0(scan191), .DINP0(MD27_FPAD0), .TDO0(scan192), .DINP1 (MD27_FCO
RE1), .TDI1(scan192),
            .TDO1(scan193), .ENB(dbsr_en), .MODE1(mode_o), .DOUT1(MD27_TPAD1));
jtbi1_lssd bs193_194 (.DOUT0(MD28_TCORE0), .MODE0(mode_i), .TCKA(clockdra), .TCK
B(clockdrb), .UPDATE (updatedr), .SHIFT(shiftdr),
            .TDI0(scan193), .DINP0(MD28_FPAD0), .TDO0(scan194), .DINP1 (MD28_FCO
RE1), .TDI1(scan194),
            .TDO1(scan195), .ENB(dbsr_en), .MODE1(mode_o), .DOUT1(MD28_TPAD1));
jtbi1_lssd bs195_196 (.DOUT0(MD29_TCORE0), .MODE0(mode_i), .TCKA(clockdra), .TCK
B(clockdrb), .UPDATE (updatedr), .SHIFT(shiftdr),
            .TDI0(scan195), .DINP0(MD29_FPAD0), .TDO0(scan196), .DINP1 (MD29_FCO
RE1), .TDI1(scan196),
            .TDO1(scan197), .ENB(dbsr_en), .MODE1(mode_o), .DOUT1(MD29_TPAD1));
jtbi1_lssd bs197_198 (.DOUT0(MD30_TCORE0), .MODE0(mode_i), .TCKA(clockdra), .TCK
B(clockdrb), .UPDATE (updatedr), .SHIFT(shiftdr),
            .TDI0(scan197), .DINP0(MD30_FPAD0), .TDO0(scan198), .DINP1 (MD30_FCO
RE1), .TDI1(scan198),
            .TDO1(scan199), .ENB(dbsr_en), .MODE1(mode_o), .DOUT1(MD30_TPAD1));
jtbi1_lssd bs199_200 (.DOUT0(MD31_TCORE0), .MODE0(mode_i), .TCKA(clockdra), .TCK
B(clockdrb), .UPDATE (updatedr), .SHIFT(shiftdr),
            .TDI0(scan199), .DINP0(MD31_FPAD0), .TDO0(scan200), .DINP1 (MD31_FCO
RE1), .TDI1(scan200),
            .TDO1(scan201), .ENB(dbsr_en), .MODE1(mode_o), .DOUT1(MD31_TPAD1));
jtbi1_lssd bs201_202 (.DOUT0(MD32_TCORE0), .MODE0(mode_i), .TCKA(clockdra), .TCK
B(clockdrb), .UPDATE (updatedr), .SHIFT(shiftdr),
            .TDI0(scan201), .DINP0(MD32_FPAD0), .TDO0(scan202), .DINP1 (MD32_FCO
RE1), .TDI1(scan202),
            .TDO1(scan203), .ENB(dbsr_en), .MODE1(mode_o), .DOUT1(MD32_TPAD1));
jtbi1_lssd bs203_204 (.DOUT0(MD33_TCORE0), .MODE0(mode_i), .TCKA(clockdra), .TCK
B(clockdrb), .UPDATE (updatedr), .SHIFT(shiftdr),
            .TDI0(scan203), .DINP0(MD33_FPAD0), .TDO0(scan204), .DINP1 (MD33_FCO
RE1), .TDI1(scan204),
            .TDO1(scan205), .ENB(dbsr_en), .MODE1(mode_o), .DOUT1(MD33_TPAD1));
jtbi1_lssd bs205_206 (.DOUT0(MD34_TCORE0), .MODE0(mode_i), .TCKA(clockdra), .TCK
B(clockdrb), .UPDATE (updatedr), .SHIFT(shiftdr),
            .TDI0(scan205), .DINP0(MD34_FPAD0), .TDO0(scan206), .DINP1 (MD34_FCO
RE1), .TDI1(scan206),
            .TDO1(scan207), .ENB(dbsr_en), .MODE1(mode_o), .DOUT1(MD34_TPAD1));
jtbi1_lssd bs207_208 (.DOUT0(MD35_TCORE0), .MODE0(mode_i), .TCKA(clockdra), .TCK
B(clockdrb), .UPDATE (updatedr), .SHIFT(shiftdr),
            .TDI0(scan207), .DINP0(MD35_FPAD0), .TDO0(scan208), .DINP1 (MD35_FCO
RE1), .TDI1(scan208),
            .TDO1(scan209), .ENB(dbsr_en), .MODE1(mode_o), .DOUT1(MD35_TPAD1));
jtbi1_lssd bs209_210 (.DOUT0(MD36_TCORE0), .MODE0(mode_i), .TCKA(clockdra), .TCK
B(clockdrb), .UPDATE (updatedr), .SHIFT(shiftdr),
            .TDI0(scan209), .DINP0(MD36_FPAD0), .TDO0(scan210), .DINP1 (MD36_FCO
RE1), .TDI1(scan210),
            .TDO1(scan211), .ENB(dbsr_en), .MODE1(mode_o), .DOUT1(MD36_TPAD1));
jtbi1_lssd bs211_212 (.DOUT0(MD37_TCORE0), .MODE0(mode_i), .TCKA(clockdra), .TCK
B(clockdrb), .UPDATE (updatedr), .SHIFT(shiftdr),
            .TDI0(scan211), .DINP0(MD37_FPAD0), .TDO0(scan212), .DINP1 (MD37_FCO
RE1), .TDI1(scan212),
            .TDO1(scan213), .ENB(dbsr_en), .MODE1(mode_o), .DOUT1(MD37_TPAD1));
jtbi1_lssd bs213_214 (.DOUT0(MD38_TCORE0), .MODE0(mode_i), .TCKA(clockdra), .TCK
B(clockdrb), .UPDATE (updatedr), .SHIFT(shiftdr),
            .TDI0(scan213), .DINP0(MD38_FPAD0), .TDO0(scan214), .DINP1 (MD38_FCO
RE1), .TDI1(scan214),
            .TDO1(scan215), .ENB(dbsr_en), .MODE1(mode_o), .DOUT1(MD38_TPAD1));
jtbi1_lssd bs215_216 (.DOUT0(MD39_TCORE0), .MODE0(mode_i), .TCKA(clockdra), .TCK
B(clockdrb), .UPDATE (updatedr), .SHIFT(shiftdr),
            .TDI0(scan215), .DINP0(MD39_FPAD0), .TDO0(scan216), .DINP1 (MD39_FCO
RE1), .TDI1(scan216),
            .TDO1(scan217), .ENB(dbsr_en), .MODE1(mode_o), .DOUT1(MD39_TPAD1));
jtbi1_lssd bs217_218 (.DOUT0(MD40_TCORE0), .MODE0(mode_i), .TCKA(clockdra), .TCK
B(clockdrb), .UPDATE (updatedr), .SHIFT(shiftdr),
            .TDI0(scan217), .DINP0(MD40_FPAD0), .TDO0(scan218), .DINP1 (MD40_FCO
RE1), .TDI1(scan218),
            .TDO1(scan219), .ENB(dbsr_en), .MODE1(mode_o), .DOUT1(MD40_TPAD1));
jtbi1_lssd bs219_220 (.DOUT0(MD41_TCORE0), .MODE0(mode_i), .TCKA(clockdra), .TCK
B(clockdrb), .UPDATE (updatedr), .SHIFT(shiftdr),
            .TDI0(scan219), .DINP0(MD41_FPAD0), .TDO0(scan220), .DINP1 (MD41_FCO
RE1), .TDI1(scan220),
            .TDO1(scan221), .ENB(dbsr_en), .MODE1(mode_o), .DOUT1(MD41_TPAD1));
jtbi1_lssd bs221_222 (.DOUT0(MD42_TCORE0), .MODE0(mode_i), .TCKA(clockdra), .TCK
B(clockdrb), .UPDATE (updatedr), .SHIFT(shiftdr),
            .TDI0(scan221), .DINP0(MD42_FPAD0), .TDO0(scan222), .DINP1 (MD42_FCO
RE1), .TDI1(scan222),
            .TDO1(scan223), .ENB(dbsr_en), .MODE1(mode_o), .DOUT1(MD42_TPAD1));
jtck_lssd bs223 (.TCKA(clockdra), .TCKB(clockdrb), .SHIFT(shiftdr), .TDI(scan223
), .DINP(MSPCK_FPAD_TCORE), .TDO(scan224), .ENB(dbsr_en));
jtbi1_lssd bs224_225 (.DOUT0(MD43_TCORE0), .MODE0(mode_i), .TCKA(clockdra), .TCK
B(clockdrb), .UPDATE (updatedr), .SHIFT(shiftdr),
            .TDI0(scan224), .DINP0(MD43_FPAD0), .TDO0(scan225), .DINP1 (MD43_FCO
RE1), .TDI1(scan225),
            .TDO1(scan226), .ENB(dbsr_en), .MODE1(mode_o), .DOUT1(MD43_TPAD1));
jtbi1_lssd bs226_227 (.DOUT0(MD44_TCORE0), .MODE0(mode_i), .TCKA(clockdra), .TCK
B(clockdrb), .UPDATE (updatedr), .SHIFT(shiftdr),
            .TDI0(scan226), .DINP0(MD44_FPAD0), .TDO0(scan227), .DINP1 (MD44_FCO
RE1), .TDI1(scan227),
            .TDO1(scan228), .ENB(dbsr_en), .MODE1(mode_o), .DOUT1(MD44_TPAD1));
jtbi1_lssd bs228_229 (.DOUT0(MD45_TCORE0), .MODE0(mode_i), .TCKA(clockdra), .TCK
B(clockdrb), .UPDATE (updatedr), .SHIFT(shiftdr),
            .TDI0(scan228), .DINP0(MD45_FPAD0), .TDO0(scan229), .DINP1 (MD45_FCO
RE1), .TDI1(scan229),
            .TDO1(scan230), .ENB(dbsr_en), .MODE1(mode_o), .DOUT1(MD45_TPAD1));
jtbi1_lssd bs230_231 (.DOUT0(MD46_TCORE0), .MODE0(mode_i), .TCKA(clockdra), .TCK
```

B-38

```
B(clockdrb), .UPDATE (updatedr), .SHIFT(shiftdr),
                    .TDI0(scan230), .DINP0(MD46_FPAD0), .TDO0(scan231), .DINP1 (MD46_FCO
RE1), .TDI1(scan231),
                    .TDO1(scan232), .ENB(dbsr_en), .MODE1(mode_o), .DOUT1(MD46_TPAD1));
jtbi1_lssd bs232_233 (.DOUT0(MD47_TCORE0), .MODE0(mode_i), .TCKA(clockdra), .TCK
B(clockdrb), .UPDATE (updatedr), .SHIFT(shiftdr),
                    .TDI0(scan232), .DINP0(MD47_FPAD0), .TDO0(scan233), .DINP1 (MD47_FCO
RE1), .TDI1(scan233),
                    .TDO1(scan234), .ENB(dbsr_en), .MODE1(mode_o), .DOUT1(MD47_TPAD1));
jtbi1_lssd bs234_235 (.DOUT0(MD48_TCORE0), .MODE0(mode_i), .TCKA(clockdra), .TCK
B(clockdrb), .UPDATE (updatedr), .SHIFT(shiftdr),
                    .TDI0(scan234), .DINP0(MD48_FPAD0), .TDO0(scan235), .DINP1 (MD48_FCO
RE1), .TDI1(scan235),
                    .TDO1(scan236), .ENB(dbsr_en), .MODE1(mode_o), .DOUT1(MD48_TPAD1));
jtbi1_lssd bs236_237 (.DOUT0(MD49_TCORE0), .MODE0(mode_i), .TCKA(clockdra), .TCK
B(clockdrb), .UPDATE (updatedr), .SHIFT(shiftdr),
                    .TDI0(scan236), .DINP0(MD49_FPAD0), .TDO0(scan237), .DINP1 (MD49_FCO
RE1), .TDI1(scan237),
                    .TDO1(scan238), .ENB(dbsr_en), .MODE1(mode_o), .DOUT1(MD49_TPAD1));
jtbi1_lssd bs238_239 (.DOUT0(MD50_TCORE0), .MODE0(mode_i), .TCKA(clockdra), .TCK
B(clockdrb), .UPDATE (updatedr), .SHIFT(shiftdr),
                    .TDI0(scan238), .DINP0(MD50_FPAD0), .TDO0(scan239), .DINP1 (MD50_FCO
RE1), .TDI1(scan239),
                    .TDO1(scan240), .ENB(dbsr_en), .MODE1(mode_o), .DOUT1(MD50_TPAD1));
jtbi1_lssd bs240_241 (.DOUT0(MD51_TCORE0), .MODE0(mode_i), .TCKA(clockdra), .TCK
B(clockdrb), .UPDATE (updatedr), .SHIFT(shiftdr),
                    .TDI0(scan240), .DINP0(MD51_FPAD0), .TDO0(scan241), .DINP1 (MD51_FCO
RE1), .TDI1(scan241),
                    .TDO1(scan242), .ENB(dbsr_en), .MODE1(mode_o), .DOUT1(MD51_TPAD1));
jtbi1_lssd bs242_243 (.DOUT0(MD52_TCORE0), .MODE0(mode_i), .TCKA(clockdra), .TCK
B(clockdrb), .UPDATE (updatedr), .SHIFT(shiftdr),
                    .TDI0(scan242), .DINP0(MD52_FPAD0), .TDO0(scan243), .DINP1 (MD52_FCO
RE1), .TDI1(scan243),
                    .TDO1(scan244), .ENB(dbsr_en), .MODE1(mode_o), .DOUT1(MD52_TPAD1));
jtbi1_lssd bs244_245 (.DOUT0(MD53_TCORE0), .MODE0(mode_i), .TCKA(clockdra), .TCK
B(clockdrb), .UPDATE (updatedr), .SHIFT(shiftdr),
                    .TDI0(scan244), .DINP0(MD53_FPAD0), .TDO0(scan245), .DINP1 (MD53_FCO
RE1), .TDI1(scan245),
                    .TDO1(scan246), .ENB(dbsr_en), .MODE1(mode_o), .DOUT1(MD53_TPAD1));
jtbi1_lssd bs246_247 (.DOUT0(MD54_TCORE0), .MODE0(mode_i), .TCKA(clockdra), .TCK
B(clockdrb), .UPDATE (updatedr), .SHIFT(shiftdr),
                    .TDI0(scan246), .DINP0(MD54_FPAD0), .TDO0(scan247), .DINP1 (MD54_FCO
RE1), .TDI1(scan247),
                    .TDO1(scan248), .ENB(dbsr_en), .MODE1(mode_o), .DOUT1(MD54_TPAD1));
jtbi1_lssd bs248_249 (.DOUT0(MD55_TCORE0), .MODE0(mode_i), .TCKA(clockdra), .TCK
B(clockdrb), .UPDATE (updatedr), .SHIFT(shiftdr),
                    .TDI0(scan248), .DINP0(MD55_FPAD0), .TDO0(scan249), .DINP1 (MD55_FCO
RE1), .TDI1(scan249),
                    .TDO1(scan250), .ENB(dbsr_en), .MODE1(mode_o), .DOUT1(MD55_TPAD1));
jtbi1_lssd bs250_251 (.DOUT0(MD56_TCORE0), .MODE0(mode_i), .TCKA(clockdra), .TCK
B(clockdrb), .UPDATE (updatedr), .SHIFT(shiftdr),
                    .TDI0(scan250), .DINP0(MD56_FPAD0), .TDO0(scan251), .DINP1 (MD56_FCO
RE1), .TDI1(scan251),
                    .TDO1(scan252), .ENB(dbsr_en), .MODE1(mode_o), .DOUT1(MD56_TPAD1));
jtbi1_lssd bs252_253 (.DOUT0(MD57_TCORE0), .MODE0(mode_i), .TCKA(clockdra), .TCK
B(clockdrb), .UPDATE (updatedr), .SHIFT(shiftdr),
                    .TDI0(scan252), .DINP0(MD57_FPAD0), .TDO0(scan253), .DINP1 (MD57_FCO
RE1), .TDI1(scan253),
                    .TDO1(scan254), .ENB(dbsr_en), .MODE1(mode_o), .DOUT1(MD57_TPAD1));
jtbi1_lssd bs254_255 (.DOUT0(MD58_TCORE0), .MODE0(mode_i), .TCKA(clockdra), .TCK
B(clockdrb), .UPDATE (updatedr), .SHIFT(shiftdr),
```

```
                    .TDI0(scan254), .DINP0(MD58_FPAD0), .TDO0(scan255), .DINP1 (MD58_FCO
RE1), .TDI1(scan255),
                    .TDO1(scan256), .ENB(dbsr_en), .MODE1(mode_o), .DOUT1(MD58_TPAD1));
jtbi1_lssd bs256_257 (.DOUT0(MD59_TCORE0), .MODE0(mode_i), .TCKA(clockdra), .TCK
B(clockdrb), .UPDATE (updatedr), .SHIFT(shiftdr),
                    .TDI0(scan256), .DINP0(MD59_FPAD0), .TDO0(scan257), .DINP1 (MD59_FCO
RE1), .TDI1(scan257),
                    .TDO1(scan258), .ENB(dbsr_en), .MODE1(mode_o), .DOUT1(MD59_TPAD1));
jtbi1_lssd bs258_259 (.DOUT0(MD60_TCORE0), .MODE0(mode_i), .TCKA(clockdra), .TCK
B(clockdrb), .UPDATE (updatedr), .SHIFT(shiftdr),
                    .TDI0(scan258), .DINP0(MD60_FPAD0), .TDO0(scan259), .DINP1 (MD60_FCO
RE1), .TDI1(scan259),
                    .TDO1(scan260), .ENB(dbsr_en), .MODE1(mode_o), .DOUT1(MD60_TPAD1));
jtbi1_lssd bs260_261 (.DOUT0(MD61_TCORE0), .MODE0(mode_i), .TCKA(clockdra), .TCK
B(clockdrb), .UPDATE (updatedr), .SHIFT(shiftdr),
                    .TDI0(scan260), .DINP0(MD61_FPAD0), .TDO0(scan261), .DINP1 (MD61_FCO
RE1), .TDI1(scan261),
                    .TDO1(scan262), .ENB(dbsr_en), .MODE1(mode_o), .DOUT1(MD61_TPAD1));
jtbi1_lssd bs262_263 (.DOUT0(MD62_TCORE0), .MODE0(mode_i), .TCKA(clockdra), .TCK
B(clockdrb), .UPDATE (updatedr), .SHIFT(shiftdr),
                    .TDI0(scan262), .DINP0(MD62_FPAD0), .TDO0(scan263), .DINP1 (MD62_FCO
RE1), .TDI1(scan263),
                    .TDO1(scan264), .ENB(dbsr_en), .MODE1(mode_o), .DOUT1(MD62_TPAD1));
jtbi1_lssd bs264_265 (.DOUT0(MD63_TCORE0), .MODE0(mode_i), .TCKA(clockdra), .TCK
B(clockdrb), .UPDATE (updatedr), .SHIFT(shiftdr),
                    .TDI0(scan264), .DINP0(MD63_FPAD0), .TDO0(scan265), .DINP1 (MD63_FCO
RE1), .TDI1(scan265),
                    .TDO1(scan266), .ENB(dbsr_en), .MODE1(mode_o), .DOUT1(MD63_TPAD1));
jtout1_lssd bs266 (.DOUT(MA23_TPAD), .MODE(mode_o), .TCKA(clockdra), .TCKB(clock
drb), .UPDATE (updatedr), .SHIFT(shiftdr),
                    .TDI(scan266), .DINP(MA23_FCORE), .TDO(scan267) , .ENB(dbsr_en), .SE
TN(setn));
jtout1_lssd bs267 (.DOUT(MA24_TPAD), .MODE(mode_o), .TCKA(clockdra), .TCKB(clock
drb), .UPDATE (updatedr), .SHIFT(shiftdr),
                    .TDI(scan267), .DINP(MA24_FCORE), .TDO(scan268) , .ENB(dbsr_en), .SE
TN(setn));
jtout1_lssd bs268 (.DOUT(RESET0_TPAD), .MODE(mode_o), .TCKA(clockdra), .TCKB(clo
ckdrb), .UPDATE (updatedr), .SHIFT(shiftdr),
                    .TDI(scan268), .DINP(RESET0_FCORE), .TDO(scan269) , .ENB(enb), .SETN
(setn));
jtout1_lssd bs269 (.DOUT(TCS0L_TPAD), .MODE(mode_o), .TCKA(clockdra), .TCKB(cloc
kdrb), .UPDATE (updatedr), .SHIFT(shiftdr),
                    .TDI(scan269), .DINP(TCS0L_FCORE), .TDO(scan270) , .ENB(enb), .SETN(
setn));
jtout1_lssd bs270 (.DOUT(TCS1L_TPAD), .MODE(mode_o), .TCKA(clockdra), .TCKB(cloc
kdrb), .UPDATE (updatedr), .SHIFT(shiftdr),
                    .TDI(scan270), .DINP(TCS1L_FCORE), .TDO(scan271) , .ENB(enb), .SETN(
setn));
jtout1_lssd bs271 (.DOUT(PD15_PA15_TPAD), .MODE(mode_o), .TCKA(clockdra), .TCKB(
clockdrb), .UPDATE (updatedr), .SHIFT(shiftdr),
                    .TDI(scan271), .DINP(PD15_PA15_FCORE), .TDO(scan272) , .ENB(enb), .S
ETN(setn));
jtout1_lssd bs272 (.DOUT(PD14_PA14_TPAD), .MODE(mode_o), .TCKA(clockdra), .TCKB(
clockdrb), .UPDATE (updatedr), .SHIFT(shiftdr),
                    .TDI(scan272), .DINP(PD14_PA14_FCORE), .TDO(scan273) , .ENB(enb), .S
ETN(setn));
jtout1_lssd bs273 (.DOUT(PD13_PA13_TPAD), .MODE(mode_o), .TCKA(clockdra), .TCKB(
clockdrb), .UPDATE (updatedr), .SHIFT(shiftdr),
                    .TDI(scan273), .DINP(PD13_PA13_FCORE), .TDO(scan274) , .ENB(enb), .S
ETN(setn));
jtout1_lssd bs274 (.DOUT(PD12_PA12_TPAD), .MODE(mode_o), .TCKA(clockdra), .TCKB(
```

msp_1ex_bs.v

B-39

```
clockdrb), .UPDATE (updatedr), .SHIFT(shiftdr),
                .TDI(scan274), .DINP(PD12_PA12_FCORE), .TDO(scan275) , .ENB(enb), .S
ETN(setn));
jtoutl_lssd bs275 (.DOUT(PD11_PA11_TPAD), .MODE(mode_o), .TCKA(clockdra), .TCKB(
clockdrb), .UPDATE (updatedr), .SHIFT(shiftdr),
                .TDI(scan275), .DINP(PD11_PA11_FCORE), .TDO(scan276) , .ENB(enb), .S
ETN(setn));
jtoutl_lssd bs276 (.DOUT(PD10_PA10_TPAD), .MODE(mode_o), .TCKA(clockdra), .TCKB(
clockdrb), .UPDATE (updatedr), .SHIFT(shiftdr),
                .TDI(scan276), .DINP(PD10_PA10_FCORE), .TDO(scan277) , .ENB(enb), .S
ETN(setn));
jtoutl_lssd bs277 (.DOUT(PD9_PA9_TPAD), .MODE(mode_o), .TCKA(clockdra), .TCKB(cl
ockdrb), .UPDATE (updatedr), .SHIFT(shiftdr),
                .TDI(scan277), .DINP(PD9_PA9_FCORE), .TDO(scan278) , .ENB(enb), .SET
N(setn));
jtoutl_lssd bs278 (.DOUT(PD8_PA8_TPAD), .MODE(mode_o), .TCKA(clockdra), .TCKB(cl
ockdrb), .UPDATE (updatedr), .SHIFT(shiftdr),
                .TDI(scan278), .DINP(PD8_PA8_FCORE), .TDO(scan279) , .ENB(enb), .SET
N(setn));
jtoutl_lssd bs279 (.DOUT(PD7_PA7_TPAD), .MODE(mode_o), .TCKA(clockdra), .TCKB(cl
ockdrb), .UPDATE (updatedr), .SHIFT(shiftdr),
                .TDI(scan279), .DINP(PD7_PA7_FCORE), .TDO(scan280) , .ENB(enb), .SET
N(setn));
jtoutl_lssd bs280 (.DOUT(PD6_PA6_TPAD), .MODE(mode_o), .TCKA(clockdra), .TCKB(cl
ockdrb), .UPDATE (updatedr), .SHIFT(shiftdr),
                .TDI(scan280), .DINP(PD6_PA6_FCORE), .TDO(scan281) , .ENB(enb), .SET
N(setn));
jtoutl_lssd bs281 (.DOUT(PD5_PA5_TPAD), .MODE(mode_o), .TCKA(clockdra), .TCKB(cl
ockdrb), .UPDATE (updatedr), .SHIFT(shiftdr),
                .TDI(scan281), .DINP(PD5_PA5_FCORE), .TDO(scan282) , .ENB(enb), .SET
N(setn));
jtoutl_lssd bs282 (.DOUT(PD4_PA4_TPAD), .MODE(mode_o), .TCKA(clockdra), .TCKB(cl
ockdrb), .UPDATE (updatedr), .SHIFT(shiftdr),
                .TDI(scan282), .DINP(PD4_PA4_FCORE), .TDO(scan283) , .ENB(enb), .SET
N(setn));
jtoutl_lssd bs283 (.DOUT(PD3_PA3_TPAD), .MODE(mode_o), .TCKA(clockdra), .TCKB(cl
ockdrb), .UPDATE (updatedr), .SHIFT(shiftdr),
                .TDI(scan283), .DINP(PD3_PA3_FCORE), .TDO(scan284) , .ENB(enb), .SET
N(setn));
jtoutl_lssd bs284 (.DOUT(PD2_PA2_TPAD), .MODE(mode_o), .TCKA(clockdra), .TCKB(cl
ockdrb), .UPDATE (updatedr), .SHIFT(shiftdr),
                .TDI(scan284), .DINP(PD2_PA2_FCORE), .TDO(scan285) , .ENB(enb), .SET
N(setn));
jtoutl_lssd bs285 (.DOUT(PD1_PA1_TPAD), .MODE(mode_o), .TCKA(clockdra), .TCKB(cl
ockdrb), .UPDATE (updatedr), .SHIFT(shiftdr),
                .TDI(scan285), .DINP(PD1_PA1_FCORE), .TDO(scan286) , .ENB(enb), .SET
N(setn));
jtoutl_lssd bs286 (.DOUT(PD0_PA0_TPAD), .MODE(mode_o), .TCKA(clockdra), .TCKB(cl
ockdrb), .UPDATE (updatedr), .SHIFT(shiftdr),
                .TDI(scan286), .DINP(PD0_PA0_FCORE), .TDO(scan287) , .ENB(enb), .SET
N(setn));
jtinl_lssd bs287 (.DOUT(C7_TCORE), .MODE(mode_i), .TCKA(clockdra), .TCKB(clockdr
b), .UPDATE (updatedr), .SHIFT(shiftdr),
                .TDI(scan287), .DINP(C7_FPAD), .TDO(scan288), .ENB(enb), .SETN(setn)
);
jtinl_lssd bs288 (.DOUT(C6_TCORE), .MODE(mode_i), .TCKA(clockdra), .TCKB(clockdr
b), .UPDATE (updatedr), .SHIFT(shiftdr),
                .TDI(scan288), .DINP(C6_FPAD), .TDO(scan289), .ENB(enb), .SETN(setn)
);
jtinl_lssd bs289 (.DOUT(C5_TCORE), .MODE(mode_i), .TCKA(clockdra), .TCKB(clockdr
b), .UPDATE (updatedr), .SHIFT(shiftdr),
                .TDI(scan289), .DINP(C5_FPAD), .TDO(scan290), .ENB(enb), .SETN(setn)
);
jtinl_lssd bs290 (.DOUT(C4_TCORE), .MODE(mode_i), .TCKA(clockdra), .TCKB(clockdr
b), .UPDATE (updatedr), .SHIFT(shiftdr),
                .TDI(scan290), .DINP(C4_FPAD), .TDO(scan291), .ENB(enb), .SETN(setn)
);
jtinl_lssd bs291 (.DOUT(C3_TCORE), .MODE(mode_i), .TCKA(clockdra), .TCKB(clockdr
b), .UPDATE (updatedr), .SHIFT(shiftdr),
                .TDI(scan291), .DINP(C3_FPAD), .TDO(scan292), .ENB(enb), .SETN(setn)
);
jtinl_lssd bs292 (.DOUT(C2_TCORE), .MODE(mode_i), .TCKA(clockdra), .TCKB(clockdr
b), .UPDATE (updatedr), .SHIFT(shiftdr),
                .TDI(scan292), .DINP(C2_FPAD), .TDO(scan293), .ENB(enb), .SETN(setn)
);
jtinl_lssd bs293 (.DOUT(C1_TCORE), .MODE(mode_i), .TCKA(clockdra), .TCKB(clockdr
b), .UPDATE (updatedr), .SHIFT(shiftdr),
                .TDI(scan293), .DINP(C1_FPAD), .TDO(scan294), .ENB(enb), .SETN(setn)
);
jtinl_lssd bs294 (.DOUT(C0_TCORE), .MODE(mode_i), .TCKA(clockdra), .TCKB(clockdr
b), .UPDATE (updatedr), .SHIFT(shiftdr),
                .TDI(scan294), .DINP(C0_FPAD), .TDO(scan295), .ENB(enb), .SETN(setn)
);
jtoutl_lssd bs295 (.DOUT(PROMCSL_TPAD), .MODE(mode_o), .TCKA(clockdra), .TCKB(cl
ockdrb), .UPDATE (updatedr), .SHIFT(shiftdr),
                .TDI(scan295), .DINP(PROMCSL_FCORE), .TDO(scan296) , .ENB(enb), .SET
N(setn));
jtinl_lssd bs296 (.DOUT(BGVS_TCORE), .MODE(mode_i), .TCKA(clockdra), .TCKB(clock
drb), .UPDATE (updatedr), .SHIFT(shiftdr),
                .TDI(scan296), .DINP(BGVS_FPAD), .TDO(scan297), .ENB(enb), .SETN(set
n));
jtinl_lssd bs297 (.DOUT(BGHS_TCORE), .MODE(mode_i), .TCKA(clockdra), .TCKB(clock
drb), .UPDATE (updatedr), .SHIFT(shiftdr),
                .TDI(scan297), .DINP(BGHS_FPAD), .TDO(scan298), .ENB(enb), .SETN(set
n));
jtoutl_lssd bs298 (.DOUT(MSSEL_TPAD), .MODE(mode_o), .TCKA(clockdra), .TCKB(cloc
kdrb), .UPDATE (updatedr), .SHIFT(shiftdr),
                .TDI(scan298), .DINP(MSSEL_FCORE), .TDO(scan299) , .ENB(enb), .SETN(
setn));
jtinl_lssd bs299 (.DOUT(BGCLK_TCORE), .MODE(mode_i), .TCKA(clockdra), .TCKB(cloc
kdrb), .UPDATE (updatedr), .SHIFT(shiftdr),
                .TDI(scan299), .DINP(BGCLK_FPAD), .TDO(scan300), .ENB(enb), .SETN(se
tn));
jtoutl_lssd bs300 (.DOUT(SCLK_TPAD), .MODE(mode_o), .TCKA(clockdra), .TCKB(clock
drb), .UPDATE (updatedr), .SHIFT(shiftdr),
                .TDI(scan300), .DINP(SCLK_FCORE), .TDO(scan301) , .ENB(enb), .SETN(s
etn));
jtintl_lssd bs301 (.DOUT(SDAT_ENB_TPAD), .MODE(mode_c), .TCKA(clockdra), .TCKB(c
lockdrb), .UPDATE (updatedr), .SHIFT(shiftdr),
                .TDI(scan301), .DINP(SDAT_ENB_FCORE), .TDO(scan302), .ENB(enb), .SET
N(setn));
jtbil_lssd bs302_303 (.DOUT0(SDAT_TCORE0), .MODE0(mode_i), .TCKA(clockdra), .TCK
B(clockdrb), .UPDATE (updatedr), .SHIFT(shiftdr),
                .TDI0(scan302), .DINP0(SDAT_FPAD0), .TDO0(scan303), .DINP1 (SDAT_FCO
RE1), .TDI1(scan303),
                .TDO1(scan304), .ENB(enb), .MODE1(mode_o), .DOUT1(SDAT_TPAD1));
jtoutl_lssd bs304 (.DOUT(SFRS_TPAD), .MODE(mode_o), .TCKA(clockdra), .TCKB(clock
drb), .UPDATE (updatedr), .SHIFT(shiftdr),
                .TDI(scan304), .DINP(SFRS_FCORE), .TDO(scan305) , .ENB(enb), .SETN(s
etn));
jtinl_lssd bs305 (.DOUT(SERIAL_IN_TCORE), .MODE(mode_i), .TCKA(clockdra), .TCKB(
clockdrb), .UPDATE (updatedr), .SHIFT(shiftdr),
```

msp_1ex_bs.v

B-40

```
            .TDI(scan305), .DINP(SERIAL_IN_FPAD), .TDO(scan306), .ENB(enb), .SET
N(setn));
jtout1_lssd bs306 (.DOUT(SERIAL_OUT_TPAD), .MODE(mode_o), .TCKA(clockdra), .TCKB
(clockdrb), .UPDATE (updatedr), .SHIFT(shiftdr),
            .TDI(scan306), .DINP(SERIAL_OUT_FCORE), .TDO(scan307) , .ENB(enb), .
SETN(setn));
jtin1_lssd bs307 (.DOUT(A43SDFS_TCORE), .MODE(mode_i), .TCKA(clockdra), .TCKB(cl
ockdrb), .UPDATE (updatedr), .SHIFT(shiftdr),
            .TDI(scan307), .DINP(A43SDFS_FPAD), .TDO(scan308), .ENB(enb), .SETN(
setn));
jtin1_lssd bs308 (.DOUT(A43SCLK_TCORE), .MODE(mode_i), .TCKA(clockdra), .TCKB(cl
ockdrb), .UPDATE (updatedr), .SHIFT(shiftdr),
            .TDI(scan308), .DINP(A43SCLK_FPAD), .TDO(scan309), .ENB(enb), .SETN(
setn));
jtout1_lssd bs309 (.DOUT(A43SDI_TPAD), .MODE(mode_o), .TCKA(clockdra), .TCKB(clo
ckdrb), .UPDATE (updatedr), .SHIFT(shiftdr),
            .TDI(scan309), .DINP(A43SDI_FCORE), .TDO(scan310) , .ENB(enb), .SETN
(setn));
jtin1_lssd bs310 (.DOUT(A43SDO_TCORE), .MODE(mode_i), .TCKA(clockdra), .TCKB(clo
ckdrb), .UPDATE (updatedr), .SHIFT(shiftdr),
            .TDI(scan310), .DINP(A43SDO_FPAD), .TDO(tdo), .ENB(enb), .SETN(setn)
);
mx2 g1 (.D0(scan116), .D1(tdi), .S(dbsr_select), .Y(w1_sdram));
nid g2 (.A(scan268), .Y(dbsr_scan_out));

endmodule
```

msp_1ex_bs.v

B-41

```
//---------------------------------------------------------------
//Copyright (c) 1996 Samsung Semiconductor Inc.
//---------------------------------------------------------------
//Contact :
//        Sanghyeon Baeg,
//        Samsung Semiconductor Inc.
//        3655 N. 1st Street
//        San Jose, CA 95134
//        (415) 954-7005
//-----------------------------------------------------------------


 module msp_pad_bs_lex  (

 // MCU
                MD_pt,
                MA_pt,
                MA23_pt,
                MA24_pt,
                DQM_pt,
                MWE0_l_pt,
                CAS1_l_pt,
                RAS1_l_pt,
                MCS0_l_pt,
                MCS1_l_pt,
                MCKE_pt,
                TCS0_l_pt,
                TCS1_l_pt,
                SDdata_IN_bt,
                Mrdy_bt,

                MS_RDY_pt,
                MWRdata_tb,
                SDdata_woe_l_tb,
                maddr_tb,
                maddr23_tb,
                maddr24_tb,
                mc_RAS_l_tb,
                mc_CAS_l_tb,
                mc_WE0_l_tb,
                mc_CS0_l_tb,
                mc_CS1_l_tb,
                mc_CKE_tb,
                CS0_l_tb,
                CS1_l_tb,
                mc_DQM_tb,

// AD 1843
                ad43_sdo_bt,
                ad43_sdi_tb,
                A43_SDFS_bt,
                A43SCK_bt,
                A43SDO_pt,
                A43SDI_pt,
                A43SDFS_pt,
                A43SCLK_pt,

// KS119
                PD_PA_pt,
                PROMCSL_pt,
                SFRS_pt,
                SCLK_pt,
                MSSEL_pt,
                BGVS_pt,
                BGHS_pt,
                C_pt,
                BGCLK_pt,
                SDAT_pt,
                PD_PA_out_tb,
                PROMCS_out_tb,
                SDAT_out_tb,
                SFRS_out_tb,
                SCLK_in_tb,
                SDAT_en_tb,
                MSSEL_119_out_tb,
                BGVS_in_bt,
                BGHS_in_bt,
                SDAT_in_bt,
                BIOS_DATA_bt,
                BGCLK_CK_bt,

// PCI
                PciClk_pt,
                PciRstN_pt,
                PciGntN_pt,
                PciIdsel_pt,

                PciAd_pt,
                PciC_BeN_pt,
                PciPar_pt,
                PciFrameN_pt,
                PciIrdyN_pt,
                PciTrdyN_pt,
                PciStopN_pt,
                PciLockN_pt ,
                PciDevselN_pt ,
                PciPerrN_pt ,
                PciSerrN_pt ,

                PciReqN_pt ,
                PciIntAN_pt ,

                PCIM_Clk_bt,
                PCIM_RstN_bt,

                iPciIdsel_bt,
                iPciGntN_bt,
                iPciAd_bt,
                iPciCBeN_bt,
                iPciPar_bt,
                iPciFrameN_bt,
                iPciIrdyN_bt,
                iPciTrdyN_bt,
                iPciStopN_bt,
                iPciDevselN_bt,
                iPciLockN_bt,
                iPciPerrN_bt,
                iPciSerrN_bt,
```

msp_bs_pad_1ex.v

B-42

```
                oPciAd_tb,
                oPciCBeN_tb,
                oPciPar_tb,
                oPciReqN_tb,
                oPciFrameN_tb,
                oPciIrdyN_tb,
                oPciTrdyN_tb,
                oPciStopN_tb,
                oPciLockN_tb,
                oPciPerrN_tb,
                // @@@ oPciSerrN_tb,
                oPciIntAN_tb,

                Ad_enable_tb,
                Cbe_enable_tb,
                Par_enable_tb,
                Frame_enable_tb,
                Irdy_enable_tb,
                Trdy_enable_tb,
                Stop_enable_tb,
                Devsel_enable_tb,
                Lock_enable_tb,
                Perr_enable_tb,
                Serr_enable_tb,
                PCIM_Rst_tb,


                TCA_pt,
                TCB_pt,
                TM_pt,
                TRSTL_pt,
                TDI_pt,
                TCK_pt,
                TMS_pt,
                TDO_pt,

                TCA_tcore_bt,
                TCB_tcore_bt,
                TM_tcore_bt,
                TRSTL_tcore_pb,
                TDI_tcore_pb,
                TCK_tcore_pb,
                TMS_tcore_pb,
                TDO_fcore_bp,
                TDO_enb_fcore_bp,
// JTAG Ports
                multiple_scan_mode_tb,
                enb_tb,
                setn_tb,
                clockdra_tb,
                clockdrb_tb,
                updatedr_tb,
                shiftdr_tb,
                mode_c_tb,
                mode_i_tb,
                mode_o_tb,
                dbsr_select_tb,
                dbsr_scan_out_tb,
                sdram_bs_csn_tb,
                sdram_csn_sel_tb,
                bsr_tdo,

                mc_RAS_1_bp,

// System Ports
                MEMCLK_pt,
                sysclk_tocore_bt,
                MSPCK_pt,
                sdrm_ck_fcore_bp,

// IOB ports
                MIDIIN_pt,
                MIDIO_pt,
                Uart_sin_bt,
                Uart_sout_tb,

// MISC
                RESET_pt,
                reset_fcore_tb,


// Multiple scan outputs

                ad25_so9,
                ad24_so8,
                ad23_so7,
                ad22_so6,
                ad21_so5,
                ad20_so4,
                ad19_so3,
                ad18_so2,
                ad17_so1,
                ad16_so0

 );

input           ad25_so9;
input           ad24_so8;
input           ad23_so7;
input           ad22_so6;
input           ad21_so5;
input           ad20_so4;
input           ad19_so3;
input           ad18_so2;
input           ad17_so1;
input           ad16_so0;

output          RESET_pt;
input           reset_fcore_tb;

output  MEMCLK_pt;
output  sysclk_tocore_bt;
input   MSPCK_pt;
input   sdrm_ck_fcore_bp;

input   MIDIIN_pt;
input   Uart_sout_tb;
output  MIDIO_pt;
output  Uart_sin_bt;

inout   [63:0]  MD_pt;
```

B-43

```
input   [63:0]  MWRdata_tb;
input   [11:0]  maddr_tb;
input           maddr23_tb;
input           maddr24_tb;
input           SDdata_woe_l_tb;
input           mc_RAS_l_tb;
input           mc_CAS_l_tb;
input           mc_WE0_l_tb;
input           mc_CS0_l_tb;
input           mc_CS1_l_tb;
input           mc_CKE_tb;
input           CS0_l_tb;
input           CS1_l_tb;
input           mc_DQM_tb;
input           MS_RDY_pt;

output  [63:0]  SDdata_IN_bt;
output  [11:0]  MA_pt;
output          MA23_pt;
output          MA24_pt;
output          DQM_pt;
output          MCKE_pt;
output          MWE0_l_pt;
output          CAS1_l_pt;
output          RAS1_l_pt;
output          MCS0_l_pt;
output          MCS1_l_pt;
output          TCS0_l_pt;
output          TCS1_l_pt;
output          Mrdy_bt;

output          ad43_sdo_bt;
input           ad43_sdi_tb;
output          A43_SDFS_bt;
output          A43SCK_bt;
input           A43SDO_pt;
output          A43SDI_pt;
input           A43SDFS_pt;
input           A43SCLK_pt;

output  [15:0]  PD_PA_pt;
output          PROMCSL_pt;
output          SFRS_pt;
output          SCLK_pt;
output          MSSEL_pt;
input           BGVS_pt;
input           BGHS_pt;
input   [7:0]   C_pt;
input           BGCLK_pt;
input           SDAT_pt;
input   [15:0]  PD_PA_out_tb;
input           PROMCS_out_tb;
input           SDAT_out_tb;
input           SFRS_out_tb;
input           SCLK_in_tb;
input           SDAT_en_tb;
input           MSSEL_119_out_tb;
output          BGVS_in_bt;
output          BGHS_in_bt;
output          SDAT_in_bt;
output  [7:0]   BIOS_DATA_bt;

output          BGCLK_CK_bt;

input           PciClk_pt;
input           PciRstN_pt;
input           PciGntN_pt;
input           PciIdsel_pt;

inout   [31:0]  PciAd_pt;
inout   [3:0]   PciC_BeN_pt;
inout           PciPar_pt;
inout           PciFrameN_pt;
inout           PciIrdyN_pt;
inout           PciTrdyN_pt;
inout           PciStopN_pt;
inout           PciLockN_pt;
inout           PciDevselN_pt;
inout           PciPerrN_pt;

output          PciSerrN_pt;
output          PciReqN_pt;
output          PciIntAN_pt;
output          PCIM_Clk_bt;
output          PCIM_RstN_bt;
output          iPciIdsel_bt;
output          iPciGntN_bt;
output  [31:0]  iPciAd_bt;
output  [3:0]   iPciCBeN_bt;
output          iPciPar_bt;
output          iPciFrameN_bt;
output          iPciIrdyN_bt;
output          iPciTrdyN_bt;
output          iPciStopN_bt;
output          iPciDevselN_bt;
output          iPciLockN_bt;
output          iPciPerrN_bt;
output          iPciSerrN_bt;
input   [31:0]  oPciAd_tb;
input   [3:0]   oPciCBeN_tb;
input           oPciPar_tb;
input           oPciReqN_tb;
input           oPciFrameN_tb;
input           oPciIrdyN_tb;
input           oPciTrdyN_tb;
input           oPciStopN_tb;
input           oPciLockN_tb;
input           oPciPerrN_tb;
// @@@ input            oPciSerrN_tb;
input           oPciIntAN_tb;
input           Ad_enable_tb;
input           Cbe_enable_tb;
input           Par_enable_tb;
input           Frame_enable_tb;
input           Irdy_enable_tb;
input           Trdy_enable_tb;
input           Stop_enable_tb;
input           Devsel_enable_tb;
input           Lock_enable_tb;
input           Perr_enable_tb;
input           Serr_enable_tb;
input           PCIM_Rst_tb;
```

B-44

```
input          multiple_scan_mode_tb;
input          enb_tb;
input          setn_tb;
input          clockdra_tb;
input          clockdrb_tb;
input          updatedr_tb;
input          shiftdr_tb;
input          mode_c_tb;
input          mode_i_tb;
input          mode_o_tb;
input          dbsr_select_tb;
output         dbsr_scan_out_tb;
input          sdram_bs_csn_tb;
input          sdram_csn_sel_tb;
output         bsr_tdo;

input          TCA_pt;
input          TCB_pt;
input          TM_pt;
input          TRSTL_pt;
input          TDI_pt;
input          TCK_pt;
input          TMS_pt;
output         TDO_pt;

output         TCA_tcore_bt;
output         TCB_tcore_bt;
output         TM_tcore_bt;
output         TRSTL_tcore_pb;
output         TDI_tcore_pb;
output         TCK_tcore_pb;
output         TMS_tcore_pb;
input          TDO_fcore_bp;
input          TDO_enb_fcore_bp;

output         mc_RAS_1_bp;

wire [31:0] iPciAd_pb;
wire [31:0] oPciAd_bp;
wire [3:0]  iPciCBeN_pb;
wire [3:0]  oPciCBeN_bp;
wire [11:0] maddr_bp;
wire [15:0] PD_PA_out_bp;
wire [7:0] BIOS_DATA_pb;
wire ma23_bp;
wire ma24_bp;
wire [63:0] MWRdata_bp;
wire [63:0] SDdata_IN_pb;

wire [31:0] Ad_enable_bp;

// vssi VS_INS1 (oPciDevselN_tb);
supply0  oPciDevselN_tb;

// vddi VD_INS2 (XXX_VDD);
// supply1 XXX_VDD;
wire YYY_FLOAT;

// wire Ad_enable_bp_31;
// wire Ad_enable_bp_25;
// wire Ad_enable_bp_15;
// wire Ad_enable_bp_05;
// wire Ad_enable_bp_02;

// assign Ad_enable_bp[31] = Ad_enable_bp_31;
// assign Ad_enable_bp[30] = Ad_enable_bp_31;
// assign Ad_enable_bp[29] = Ad_enable_bp_31;
// assign Ad_enable_bp[28] = Ad_enable_bp_31;
// assign Ad_enable_bp[27] = Ad_enable_bp_31;
// assign Ad_enable_bp[26] = Ad_enable_bp_31;
// assign Ad_enable_bp[25] = Ad_enable_bp_25;
// assign Ad_enable_bp[24] = Ad_enable_bp_25;
// assign Ad_enable_bp[23] = Ad_enable_bp_25;
// assign Ad_enable_bp[22] = Ad_enable_bp_25;
// assign Ad_enable_bp[21] = Ad_enable_bp_25;
// assign Ad_enable_bp[20] = Ad_enable_bp_25;
// assign Ad_enable_bp[19] = Ad_enable_bp_25;
// assign Ad_enable_bp[18] = Ad_enable_bp_25;
// assign Ad_enable_bp[17] = Ad_enable_bp_25;
// assign Ad_enable_bp[16] = Ad_enable_bp_25;
// assign Ad_enable_bp[15] = Ad_enable_bp_15;
// assign Ad_enable_bp[14] = Ad_enable_bp_15;
// assign Ad_enable_bp[13] = Ad_enable_bp_15;
// assign Ad_enable_bp[12] = Ad_enable_bp_15;
// assign Ad_enable_bp[11] = Ad_enable_bp_15;
// assign Ad_enable_bp[10] = Ad_enable_bp_15;
// assign Ad_enable_bp[9]  = Ad_enable_bp_15;
// assign Ad_enable_bp[8]  = Ad_enable_bp_15;
// assign Ad_enable_bp[7]  = Ad_enable_bp_15;
// assign Ad_enable_bp[6]  = Ad_enable_bp_15;
// assign Ad_enable_bp[5]  = Ad_enable_bp_05;
// assign Ad_enable_bp[4]  = Ad_enable_bp_05;
// assign Ad_enable_bp[3]  = Ad_enable_bp_05;
// assign Ad_enable_bp[2]  = Ad_enable_bp_02;
// assign Ad_enable_bp[1]  = Ad_enable_bp_02;
// assign Ad_enable_bp[0]  = Ad_enable_bp_02;

msp_bs_top_1ex INS1 (
          .INTAL_ENB_TPAD(oPciIntAN_bp), // pin 1
          .INTAL_ENB_FCORE(oPciIntAN_tb), // pin 1
          .RSTL_TCORE(PCIM_RstN_bt),
          .RSTL_FPAD(PCIM_RstN_pb),
          .PCICLK_TCORE(PCIM_Clk_bt),
          .PCICLK_FPAD(PCIM_Clk_pb),
          .GNTL_TCORE(iPciGntN_bt),
          .GNTL_FPAD(iPciGntN_pb),
          .REQL_ENB_TPAD(PCIM_Rst_bp), // pin 207
          .REQL_ENB_FCORE(PCIM_Rst_tb), // pin 207
          .REQL_TPAD(oPciReqN_bp),
          .REQL_FCORE(oPciReqN_tb),

          .AD31_ENB_TPAD(Ad_enable_bp_31),
          // @@@ AD31_ENB_FCORE,
          .AD31_TCORE0(iPciAd_bt[31]),
          .AD31_FPAD0(iPciAd_pb[31]),
          .AD31_FCORE1(oPciAd_tb[31]),
          .AD31_TPAD1(oPciAd_bp[31]),
          .AD30_TCORE0(iPciAd_bt[30]),
          .AD30_FPAD0(iPciAd_pb[30]),
          .AD30_FCORE1(oPciAd_tb[30]),
          .AD30_TPAD1(oPciAd_bp[30]),
```

B-45

```
.AD29_TCORE0(iPciAd_bt[29]),
.AD29_FPAD0(iPciAd_pb[29]),
.AD29_FCORE1(oPciAd_tb[29]),
.AD29_TPAD1(oPciAd_bp[29]),
.AD28_TCORE0(iPciAd_bt[28]),
.AD28_FPAD0(iPciAd_pb[28]),
.AD28_FCORE1(oPciAd_tb[28]),
.AD28_TPAD1(oPciAd_bp[28]),
.AD27_TCORE0(iPciAd_bt[27]),
.AD27_FPAD0(iPciAd_pb[27]),
.AD27_FCORE1(oPciAd_tb[27]),
.AD27_TPAD1(oPciAd_bp[27]),
.AD26_TCORE0(iPciAd_bt[26]),
.AD26_FPAD0(iPciAd_pb[26]),
.AD26_FCORE1(oPciAd_tb[26]),
.AD26_TPAD1(oPciAd_bp[26]),
.AD25_S09_ENB_TPAD(Ad_enable_bp_25),
// @@@ AD25_S09_ENB_FCORE,
.AD25_S09_TCORE0(iPciAd_bt[25]),
.AD25_S09_FPAD0(iPciAd_pb[25]),
.AD25_S09_FCORE1(oPciAd_tb_25_so9),
.AD25_S09_TPAD1(oPciAd_bp[25]),
.AD24_S08_TCORE0(iPciAd_bt[24]),
.AD24_S08_FPAD0(iPciAd_pb[24]),
.AD24_S08_FCORE1(oPciAd_tb_24_so8),
.AD24_S08_TPAD1(oPciAd_bp[24]),
.C_BE3L_ENB_TPAD(Cbe_enable_bp),
.C_BE3L_ENB_FCORE(Cbe_enable_tb),
.C_BE3L_TCORE0(iPciCBeN_bt[3]),
.C_BE3L_FPAD0(iPciCBeN_pb[3]),
.C_BE3L_FCORE1(oPciCBeN_tb[3]),
.C_BE3L_TPAD1(oPciCBeN_bp[3]),
.IDSEL_TCORE(iPciIdsel_bt),
.IDSEL_FPAD(iPciIdsel_pb),
.AD23_S07_TCORE0(iPciAd_bt[23]),
.AD23_S07_FPAD0(iPciAd_pb[23]),
.AD23_S07_FCORE1(oPciAd_tb_23_so7),
.AD23_S07_TPAD1(oPciAd_bp[23]),
.AD22_S06_TCORE0(iPciAd_bt[22]),
.AD22_S06_FPAD0(iPciAd_pb[22]),
.AD22_S06_FCORE1(oPciAd_tb_22_so6),
.AD22_S06_TPAD1(oPciAd_bp[22]),
.AD21_S05_TCORE0(iPciAd_bt[21]),
.AD21_S05_FPAD0(iPciAd_pb[21]),
.AD21_S05_FCORE1(oPciAd_tb_21_so5),
.AD21_S05_TPAD1(oPciAd_bp[21]),
.AD20_S04_TCORE0(iPciAd_bt[20]),
.AD20_S04_FPAD0(iPciAd_pb[20]),
.AD20_S04_FCORE1(oPciAd_tb_20_so4),
.AD20_S04_TPAD1(oPciAd_bp[20]),
.AD19_S03_TCORE0(iPciAd_bt[19]),
.AD19_S03_FPAD0(iPciAd_pb[19]),
.AD19_S03_FCORE1(oPciAd_tb_19_so3),
.AD19_S03_TPAD1(oPciAd_bp[19]),
.AD18_S02_TCORE0(iPciAd_bt[18]),
.AD18_S02_FPAD0(iPciAd_pb[18]),
.AD18_S02_FCORE1(oPciAd_tb_18_so2),
.AD18_S02_TPAD1(oPciAd_bp[18]),
.AD17_S01_TCORE0(iPciAd_bt[17]),
.AD17_S01_FPAD0(iPciAd_pb[17]),
.AD17_S01_FCORE1(oPciAd_tb_17_so1),
.AD17_S01_TPAD1(oPciAd_bp[17]),
.AD16_S00_TCORE0(iPciAd_bt[16]),
.AD16_S00_FPAD0(iPciAd_pb[16]),
.AD16_S00_FCORE1(oPciAd_tb_16_so0),
.AD16_S00_TPAD1(oPciAd_bp[16]),
.C_BE2L_TCORE0(iPciCBeN_bt[2]),
.C_BE2L_FPAD0(iPciCBeN_pb[2]),
.C_BE2L_FCORE1(oPciCBeN_tb[2]),
.C_BE2L_TPAD1(oPciCBeN_bp[2]),
.FRAMEL_ENB_TPAD(Frame_enable_bp),
.FRAMEL_ENB_FCORE(Frame_enable_tb),
.FRAMEL_TCORE0(iPciFrameN_bt),
.FRAMEL_FPAD0(iPciFrameN_pb),
.FRAMEL_FCORE1(oPciFrameN_tb),
.FRAMEL_TPAD1(oPciFrameN_bp),
.IRDYL_ENB_TPAD(Irdy_enable_bp),
.IRDYL_ENB_FCORE(Irdy_enable_tb),
.IRDYL_TCORE0(iPciIrdyN_bt),
.IRDYL_FPAD0(iPciIrdyN_pb),
.IRDYL_FCORE1(oPciIrdyN_tb),
.IRDYL_TPAD1(oPciIrdyN_bp),
.TRDYL_ENB_TPAD(Trdy_enable_bp),
.TRDYL_ENB_FCORE(Trdy_enable_tb),
.TRDYL_TCORE0(iPciTrdyN_bt),
.TRDYL_FPAD0(iPciTrdyN_pb),
.TRDYL_FCORE1(oPciTrdyN_tb),
.TRDYL_TPAD1(oPciTrdyN_bp),
.DVSELL_ENB_TPAD(Devsel_enable_bp),
.DVSELL_ENB_FCORE(Devsel_enable_tb),
.DVSELL_TCORE0(iPciDevselN_bt),
.DVSELL_FPAD0(iPciDevselN_pb),
// @@@ .DVSELL_FCORE1(oPciDevselN_tb),
.DVSELL_FCORE1(1'b0),
.DVSELL_TPAD1(YYY_FLOAT),
.STOPL_ENB_TPAD(Stop_enable_bp),
.STOPL_ENB_FCORE(Stop_enable_tb),
.STOPL_TCORE0(iPciStopN_bt),
.STOPL_FPAD0(iPciStopN_pb),
.STOPL_FCORE1(oPciStopN_tb),
.STOPL_TPAD1(oPciStopN_bp),
.LOCKL_ENB_TPAD(Lock_enable_bp),
.LOCKL_ENB_FCORE(Lock_enable_tb),
.LOCKL_TCORE0(iPciLockN_bt),
.LOCKL_FPAD0(iPciLockN_pb),
.LOCKL_FCORE1(oPciLockN_tb),
.LOCKL_TPAD1(oPciLockN_bp),
.PERRL_ENB_TPAD(Perr_enable_bp),
.PERRL_ENB_FCORE(Perr_enable_tb),
.PERRL_TCORE0(iPciPerrN_bt),
.PERRL_FPAD0(iPciPerrN_pb),
.PERRL_FCORE1(oPciPerrN_tb),
.PERRL_TPAD1(oPciPerrN_bp),
.SERRL_ENB_TPAD(Serr_enable_bp),
.SERRL_ENB_FCORE(Serr_enable_tb),
// @@@ .SERRL_TCORE0(iPciSerrN_bt),
// @@@ .SERRL_FPAD0(iPciSerrN_pb),
.SERRL_TCORE(iPciSerrN_bt),
.SERRL_FPAD(iPciSerrN_pb),
// @@@ .SERRL_FCORE1(oPciSerrN_tb),
// @@@ .SERRL_TPAD1(oPciSerrN_bp),
.TCA_TCORE(TCA_tcore_bt),
```

msp_bs_pad_1ex.v

B-46

```
.TCA_FPAD(TCA_tcore_pb),
.PAR_ENB_TPAD(Par_enable_bp),
.PAR_ENB_FCORE(Par_enable_tb),
.PAR_TCORE0(iPciPar_bt),
.PAR_FPAD0(iPciPar_pb),
.PAR_FCORE1(oPciPar_tb),
.PAR_TPAD1(oPciPar_bp),
.C_BE1L_TCORE0(iPciCBeN_bt[1]),
.C_BE1L_FPAD0(iPciCBeN_pb[1]),
.C_BE1L_FCORE1(oPciCBeN_tb[1]),
.C_BE1L_TPAD1(oPciCBeN_bp[1]),
.AD15_SI9_ENB_TPAD(Ad_enable_bp_15),
// @@@ AD15_SI9_ENB_FCORE, // pin 37
.AD15_SI9_TCORE0(iPciAd_bt[15]),
.AD15_SI9_FPAD0(iPciAd_pb[15]),
.AD15_SI9_FCORE1(oPciAd_tb[15]),
.AD15_SI9_TPAD1(oPciAd_bp[15]),
.AD14_SI8_TCORE0(iPciAd_bt[14]),
.AD14_SI8_FPAD0(iPciAd_pb[14]),
.AD14_SI8_FCORE1(oPciAd_tb[14]),
.AD14_SI8_TPAD1(oPciAd_bp[14]),
.AD13_SI7_TCORE0(iPciAd_bt[13]),
.AD13_SI7_FPAD0(iPciAd_pb[13]),
.AD13_SI7_FCORE1(oPciAd_tb[13]),
.AD13_SI7_TPAD1(oPciAd_bp[13]),
.AD12_SI6_TCORE0(iPciAd_bt[12]),
.AD12_SI6_FPAD0(iPciAd_pb[12]),
.AD12_SI6_FCORE1(oPciAd_tb[12]),
.AD12_SI6_TPAD1(oPciAd_bp[12]),
.AD11_SI5_TCORE0(iPciAd_bt[11]),
.AD11_SI5_FPAD0(iPciAd_pb[11]),
.AD11_SI5_FCORE1(oPciAd_tb[11]),
.AD11_SI5_TPAD1(oPciAd_bp[11]),
.AD10_SI4_TCORE0(iPciAd_bt[10]),
.AD10_SI4_FPAD0(iPciAd_pb[10]),
.AD10_SI4_FCORE1(oPciAd_tb[10]),
.AD10_SI4_TPAD1(oPciAd_bp[10]),
.AD09_SI3_TCORE0(iPciAd_bt[9]),
.AD09_SI3_FPAD0(iPciAd_pb[9]),
.AD09_SI3_FCORE1(oPciAd_tb[9]),
.AD09_SI3_TPAD1(oPciAd_bp[9]),
.AD08_SI2_TCORE0(iPciAd_bt[8]),
.AD08_SI2_FPAD0(iPciAd_pb[8]),
.AD08_SI2_FCORE1(oPciAd_tb[8]),
.AD08_SI2_TPAD1(oPciAd_bp[8]),
.C_BE0L_TCORE0(iPciCBeN_bt[0]),
.C_BE0L_FPAD0(iPciCBeN_pb[0]),
.C_BE0L_FCORE1(oPciCBeN_tb[0]),
.C_BE0L_TPAD1(oPciCBeN_bp[0]),
.TCB_TCORE(TCB_tcore_bt),
.TCB_FPAD(TCB_tcore_pb),
.TM_TCORE(TM_tcore_bt),
.TM_FPAD(TM_tcore_pb),
.AD07_SI1_TCORE0(iPciAd_bt[7]),
.AD07_SI1_FPAD0(iPciAd_pb[7]),
.AD07_SI1_FCORE1(oPciAd_tb[7]),
.AD07_SI1_TPAD1(oPciAd_bp[7]),
.AD06_SI0_TCORE0(iPciAd_bt[6]),
.AD06_SI0_FPAD0(iPciAd_pb[6]),
.AD06_SI0_FCORE1(oPciAd_tb[6]),
.AD06_SI0_TPAD1(oPciAd_bp[6]),
.AD05_MT5_ENB_TPAD(Ad_enable_bp_05),
// @@@ AD05_MT5_ENB_FCORE,
.AD05_MT5_TCORE0(iPciAd_bt[5]),
.AD05_MT5_FPAD0(iPciAd_pb[5]),
.AD05_MT5_FCORE1(oPciAd_tb[5]),
.AD05_MT5_TPAD1(oPciAd_bp[5]),
.AD04_MT4_TCORE0(iPciAd_bt[4]),
.AD04_MT4_FPAD0(iPciAd_pb[4]),
.AD04_MT4_FCORE1(oPciAd_tb[4]),
.AD04_MT4_TPAD1(oPciAd_bp[4]),
.AD03_MT3_TCORE0(iPciAd_bt[3]),
.AD03_MT3_FPAD0(iPciAd_pb[3]),
.AD03_MT3_FCORE1(oPciAd_tb[3]),
.AD03_MT3_TPAD1(oPciAd_bp[3]),
.AD02_MT2_ENB_TPAD(Ad_enable_bp_02),
// @@@ AD02_MT2_ENB_FCORE,
.AD02_MT2_TCORE0(iPciAd_bt[2]),
.AD02_MT2_FPAD0(iPciAd_pb[2]),
.AD02_MT2_FCORE1(oPciAd_tb[2]),
.AD02_MT2_TPAD1(oPciAd_bp[2]),
.AD01_MT1_TCORE0(iPciAd_bt[1]),
.AD01_MT1_FPAD0(iPciAd_pb[1]),
.AD01_MT1_FCORE1(oPciAd_tb[1]),
.AD01_MT1_TPAD1(oPciAd_bp[1]),
.AD00_MT0_TCORE0(iPciAd_bt[0]),
.AD00_MT0_FPAD0(iPciAd_pb[0]),
.AD00_MT0_FCORE1(oPciAd_tb[0]),
.AD00_MT0_TPAD1(oPciAd_bp[0]),
.MA11_TPAD(maddr_bp[11]),
.MA11_FCORE(maddr_tb[11]),
.MA10_TPAD(maddr_bp[10]),
.MA10_FCORE(maddr_tb[10]),
.MA9_TPAD(maddr_bp[9]),
.MA9_FCORE(maddr_tb[9]),
.MA8_TPAD(maddr_bp[8]),
.MA8_FCORE(maddr_tb[8]),
.MA7_TPAD(maddr_bp[7]),
.MA7_FCORE(maddr_tb[7]),
.MA6_TPAD(maddr_bp[6]),
.MA6_FCORE(maddr_tb[6]),
.MA5_TPAD(maddr_bp[5]),
.MA5_FCORE(maddr_tb[5]),
.MA4_TPAD(maddr_bp[4]),
.MA4_FCORE(maddr_tb[4]),
.MA3_TPAD(maddr_bp[3]),
.MA3_FCORE(maddr_tb[3]),
.MA2_TPAD(maddr_bp[2]),
.MA2_FCORE(maddr_tb[2]),
.MA1_TPAD(maddr_bp[1]),
.MA1_FCORE(maddr_tb[1]),
.MA0_TPAD(maddr_bp[0]),
.MA0_FCORE(maddr_tb[0]),
.RAS1L_TPAD(mc_RAS_1_bp),
.RAS1L_FCORE(mc_RAS_1_tb),
.CAS1L_TPAD(mc_CAS_1_bp),
.CAS1L_FCORE(mc_CAS_1_tb),
.MWEL_TPAD(mc_WE0_1_bp),
.MWEL_FCORE(mc_WE0_1_tb),
.DQM_TPAD(mc_DQM_bp),
.DQM_FCORE(mc_DQM_tb),
.MCS0L_TPAD(mc_CS0_1_bp),
```

msp_bs_pad_1ex.v

B-47

```
.MCS0L_FCORE(mc_CS0_l_tb),
.MCS1L_TPAD(mc_CS1_l_bp),
.MCS1L_FCORE(mc_CS1_l_tb),
.MCKE_TPAD(mc_MCKE_bp),
.MCKE_FCORE(mc_CKE_tb_dc),
.MRDYH_TCORE(Mrdy_bt),
.MRDYH_FPAD(Mrdy_pb),
.MD0_ENB_TPAD(SDdata_woe_l_bp),
.MD0_ENB_FCORE(SDdata_woe_l_tb),
.MD0_TCORE0(SDdata_IN_bt[0]),
.MD0_FPAD0(SDdata_IN_pb[0]),
.MD0_FCORE1(MWRdata_tb[0]),
.MD0_TPAD1(MWRdata_bp[0]),
.MD1_TCORE0(SDdata_IN_bt[1]),
.MD1_FPAD0(SDdata_IN_pb[1]),
.MD1_FCORE1(MWRdata_tb[1]),
.MD1_TPAD1(MWRdata_bp[1]),
.MD2_TCORE0(SDdata_IN_bt[2]),
.MD2_FPAD0(SDdata_IN_pb[2]),
.MD2_FCORE1(MWRdata_tb[2]),
.MD2_TPAD1(MWRdata_bp[2]),
.MD3_TCORE0(SDdata_IN_bt[3]),
.MD3_FPAD0(SDdata_IN_pb[3]),
.MD3_FCORE1(MWRdata_tb[3]),
.MD3_TPAD1(MWRdata_bp[3]),
.MD4_TCORE0(SDdata_IN_bt[4]),
.MD4_FPAD0(SDdata_IN_pb[4]),
.MD4_FCORE1(MWRdata_tb[4]),
.MD4_TPAD1(MWRdata_bp[4]),
.MD5_TCORE0(SDdata_IN_bt[5]),
.MD5_FPAD0(SDdata_IN_pb[5]),
.MD5_FCORE1(MWRdata_tb[5]),
.MD5_TPAD1(MWRdata_bp[5]),
.MD6_TCORE0(SDdata_IN_bt[6]),
.MD6_FPAD0(SDdata_IN_pb[6]),
.MD6_FCORE1(MWRdata_tb[6]),
.MD6_TPAD1(MWRdata_bp[6]),
.MD7_TCORE0(SDdata_IN_bt[7]),
.MD7_FPAD0(SDdata_IN_pb[7]),
.MD7_FCORE1(MWRdata_tb[7]),
.MD7_TPAD1(MWRdata_bp[7]),
.MD8_TCORE0(SDdata_IN_bt[8]),
.MD8_FPAD0(SDdata_IN_pb[8]),
.MD8_FCORE1(MWRdata_tb[8]),
.MD8_TPAD1(MWRdata_bp[8]),
.MD9_TCORE0(SDdata_IN_bt[9]),
.MD9_FPAD0(SDdata_IN_pb[9]),
.MD9_FCORE1(MWRdata_tb[9]),
.MD9_TPAD1(MWRdata_bp[9]),
.MD10_TCORE0(SDdata_IN_bt[10]),
.MD10_FPAD0(SDdata_IN_pb[10]),
.MD10_FCORE1(MWRdata_tb[10]),
.MD10_TPAD1(MWRdata_bp[10]),
.MD11_TCORE0(SDdata_IN_bt[11]),
.MD11_FPAD0(SDdata_IN_pb[11]),
.MD11_FCORE1(MWRdata_tb[11]),
.MD11_TPAD1(MWRdata_bp[11]),
.MD12_TCORE0(SDdata_IN_bt[12]),
.MD12_FPAD0(SDdata_IN_pb[12]),
.MD12_FCORE1(MWRdata_tb[12]),
.MD12_TPAD1(MWRdata_bp[12]),
.MD13_TCORE0(SDdata_IN_bt[13]),
.MD13_FPAD0(SDdata_IN_pb[13]),
.MD13_FCORE1(MWRdata_tb[13]),
.MD13_TPAD1(MWRdata_bp[13]),
.MD14_TCORE0(SDdata_IN_bt[14]),
.MD14_FPAD0(SDdata_IN_pb[14]),
.MD14_FCORE1(MWRdata_tb[14]),
.MD14_TPAD1(MWRdata_bp[14]),
.MD15_TCORE0(SDdata_IN_bt[15]),
.MD15_FPAD0(SDdata_IN_pb[15]),
.MD15_FCORE1(MWRdata_tb[15]),
.MD15_TPAD1(MWRdata_bp[15]),
.MD16_TCORE0(SDdata_IN_bt[16]),
.MD16_FPAD0(SDdata_IN_pb[16]),
.MD16_FCORE1(MWRdata_tb[16]),
.MD16_TPAD1(MWRdata_bp[16]),
.MD17_TCORE0(SDdata_IN_bt[17]),
.MD17_FPAD0(SDdata_IN_pb[17]),
.MD17_FCORE1(MWRdata_tb[17]),
.MD17_TPAD1(MWRdata_bp[17]),
.MD18_TCORE0(SDdata_IN_bt[18]),
.MD18_FPAD0(SDdata_IN_pb[18]),
.MD18_FCORE1(MWRdata_tb[18]),
.MD18_TPAD1(MWRdata_bp[18]),
.MD19_TCORE0(SDdata_IN_bt[19]),
.MD19_FPAD0(SDdata_IN_pb[19]),
.MD19_FCORE1(MWRdata_tb[19]),
.MD19_TPAD1(MWRdata_bp[19]),
.MD20_TCORE0(SDdata_IN_bt[20]),
.MD20_FPAD0(SDdata_IN_pb[20]),
.MD20_FCORE1(MWRdata_tb[20]),
.MD20_TPAD1(MWRdata_bp[20]),
.MD21_TCORE0(SDdata_IN_bt[21]),
.MD21_FPAD0(SDdata_IN_pb[21]),
.MD21_FCORE1(MWRdata_tb[21]),
.MD21_TPAD1(MWRdata_bp[21]),
.MD22_TCORE0(SDdata_IN_bt[22]),
.MD22_FPAD0(SDdata_IN_pb[22]),
.MD22_FCORE1(MWRdata_tb[22]),
.MD22_TPAD1(MWRdata_bp[22]),
.MD23_TCORE0(SDdata_IN_bt[23]),
.MD23_FPAD0(SDdata_IN_pb[23]),
.MD23_FCORE1(MWRdata_tb[23]),
.MD23_TPAD1(MWRdata_bp[23]),
.MD24_TCORE0(SDdata_IN_bt[24]),
.MD24_FPAD0(SDdata_IN_pb[24]),
.MD24_FCORE1(MWRdata_tb[24]),
.MD24_TPAD1(MWRdata_bp[24]),
.MD25_TCORE0(SDdata_IN_bt[25]),
.MD25_FPAD0(SDdata_IN_pb[25]),
.MD25_FCORE1(MWRdata_tb[25]),
.MD25_TPAD1(MWRdata_bp[25]),
.MD26_TCORE0(SDdata_IN_bt[26]),
.MD26_FPAD0(SDdata_IN_pb[26]),
.MD26_FCORE1(MWRdata_tb[26]),
.MD26_TPAD1(MWRdata_bp[26]),
.MD27_TCORE0(SDdata_IN_bt[27]),
.MD27_FPAD0(SDdata_IN_pb[27]),
.MD27_FCORE1(MWRdata_tb[27]),
.MD27_TPAD1(MWRdata_bp[27]),
.MD28_TCORE0(SDdata_IN_bt[28]),
```

B-48

```
.MD28_FPAD0(SDdata_IN_pb[28]),
.MD28_FCORE1(MWRdata_tb[28]),
.MD28_TPAD1(MWRdata_bp[28]),
.MD29_TCORE0(SDdata_IN_bt[29]),
.MD29_FPAD0(SDdata_IN_pb[29]),
.MD29_FCORE1(MWRdata_tb[29]),
.MD29_TPAD1(MWRdata_bp[29]),
.MD30_TCORE0(SDdata_IN_bt[30]),
.MD30_FPAD0(SDdata_IN_pb[30]),
.MD30_FCORE1(MWRdata_tb[30]),
.MD30_TPAD1(MWRdata_bp[30]),
.MD31_TCORE0(SDdata_IN_bt[31]),
.MD31_FPAD0(SDdata_IN_pb[31]),
.MD31_FCORE1(MWRdata_tb[31]),
.MD31_TPAD1(MWRdata_bp[31]),
.MD32_TCORE0(SDdata_IN_bt[32]),
.MD32_FPAD0(SDdata_IN_pb[32]),
.MD32_FCORE1(MWRdata_tb[32]),
.MD32_TPAD1(MWRdata_bp[32]),
.MD33_TCORE0(SDdata_IN_bt[33]),
.MD33_FPAD0(SDdata_IN_pb[33]),
.MD33_FCORE1(MWRdata_tb[33]),
.MD33_TPAD1(MWRdata_bp[33]),
.MD34_TCORE0(SDdata_IN_bt[34]),
.MD34_FPAD0(SDdata_IN_pb[34]),
.MD34_FCORE1(MWRdata_tb[34]),
.MD34_TPAD1(MWRdata_bp[34]),
.MD35_TCORE0(SDdata_IN_bt[35]),
.MD35_FPAD0(SDdata_IN_pb[35]),
.MD35_FCORE1(MWRdata_tb[35]),
.MD35_TPAD1(MWRdata_bp[35]),
.MD36_TCORE0(SDdata_IN_bt[36]),
.MD36_FPAD0(SDdata_IN_pb[36]),
.MD36_FCORE1(MWRdata_tb[36]),
.MD36_TPAD1(MWRdata_bp[36]),
.MD37_TCORE0(SDdata_IN_bt[37]),
.MD37_FPAD0(SDdata_IN_pb[37]),
.MD37_FCORE1(MWRdata_tb[37]),
.MD37_TPAD1(MWRdata_bp[37]),
.MD38_TCORE0(SDdata_IN_bt[38]),
.MD38_FPAD0(SDdata_IN_pb[38]),
.MD38_FCORE1(MWRdata_tb[38]),
.MD38_TPAD1(MWRdata_bp[38]),
.MD39_TCORE0(SDdata_IN_bt[39]),
.MD39_FPAD0(SDdata_IN_pb[39]),
.MD39_FCORE1(MWRdata_tb[39]),
.MD39_TPAD1(MWRdata_bp[39]),
.MD40_TCORE0(SDdata_IN_bt[40]),
.MD40_FPAD0(SDdata_IN_pb[40]),
.MD40_FCORE1(MWRdata_tb[40]),
.MD40_TPAD1(MWRdata_bp[40]),
.MD41_TCORE0(SDdata_IN_bt[41]),
.MD41_FPAD0(SDdata_IN_pb[41]),
.MD41_FCORE1(MWRdata_tb[41]),
.MD41_TPAD1(MWRdata_bp[41]),
.MD42_TCORE0(SDdata_IN_bt[42]),
.MD42_FPAD0(SDdata_IN_pb[42]),
.MD42_FCORE1(MWRdata_tb[42]),
.MD42_TPAD1(MWRdata_bp[42]),
.MSPCK_FPAD_TCORE(sysclk_tocore_bt),
.MD43_TCORE0(SDdata_IN_bt[43]),
.MD43_FPAD0(SDdata_IN_pb[43]),
.MD43_FCORE1(MWRdata_tb[43]),
.MD43_TPAD1(MWRdata_bp[43]),
.MD44_TCORE0(SDdata_IN_bt[44]),
.MD44_FPAD0(SDdata_IN_pb[44]),
.MD44_FCORE1(MWRdata_tb[44]),
.MD44_TPAD1(MWRdata_bp[44]),
.MD45_TCORE0(SDdata_IN_bt[45]),
.MD45_FPAD0(SDdata_IN_pb[45]),
.MD45_FCORE1(MWRdata_tb[45]),
.MD45_TPAD1(MWRdata_bp[45]),
.MD46_TCORE0(SDdata_IN_bt[46]),
.MD46_FPAD0(SDdata_IN_pb[46]),
.MD46_FCORE1(MWRdata_tb[46]),
.MD46_TPAD1(MWRdata_bp[46]),
.MD47_TCORE0(SDdata_IN_bt[47]),
.MD47_FPAD0(SDdata_IN_pb[47]),
.MD47_FCORE1(MWRdata_tb[47]),
.MD47_TPAD1(MWRdata_bp[47]),
.MD48_TCORE0(SDdata_IN_bt[48]),
.MD48_FPAD0(SDdata_IN_pb[48]),
.MD48_FCORE1(MWRdata_tb[48]),
.MD48_TPAD1(MWRdata_bp[48]),
.MD49_TCORE0(SDdata_IN_bt[49]),
.MD49_FPAD0(SDdata_IN_pb[49]),
.MD49_FCORE1(MWRdata_tb[49]),
.MD49_TPAD1(MWRdata_bp[49]),
.MD50_TCORE0(SDdata_IN_bt[50]),
.MD50_FPAD0(SDdata_IN_pb[50]),
.MD50_FCORE1(MWRdata_tb[50]),
.MD50_TPAD1(MWRdata_bp[50]),
.MD51_TCORE0(SDdata_IN_bt[51]),
.MD51_FPAD0(SDdata_IN_pb[51]),
.MD51_FCORE1(MWRdata_tb[51]),
.MD51_TPAD1(MWRdata_bp[51]),
.MD52_TCORE0(SDdata_IN_bt[52]),
.MD52_FPAD0(SDdata_IN_pb[52]),
.MD52_FCORE1(MWRdata_tb[52]),
.MD52_TPAD1(MWRdata_bp[52]),
.MD53_TCORE0(SDdata_IN_bt[53]),
.MD53_FPAD0(SDdata_IN_pb[53]),
.MD53_FCORE1(MWRdata_tb[53]),
.MD53_TPAD1(MWRdata_bp[53]),
.MD54_TCORE0(SDdata_IN_bt[54]),
.MD54_FPAD0(SDdata_IN_pb[54]),
.MD54_FCORE1(MWRdata_tb[54]),
.MD54_TPAD1(MWRdata_bp[54]),
.MD55_TCORE0(SDdata_IN_bt[55]),
.MD55_FPAD0(SDdata_IN_pb[55]),
.MD55_FCORE1(MWRdata_tb[55]),
.MD55_TPAD1(MWRdata_bp[55]),
.MD56_TCORE0(SDdata_IN_bt[56]),
.MD56_FPAD0(SDdata_IN_pb[56]),
.MD56_FCORE1(MWRdata_tb[56]),
.MD56_TPAD1(MWRdata_bp[56]),
.MD57_TCORE0(SDdata_IN_bt[57]),
.MD57_FPAD0(SDdata_IN_pb[57]),
.MD57_FCORE1(MWRdata_tb[57]),
.MD57_TPAD1(MWRdata_bp[57]),
.MD58_TCORE0(SDdata_IN_bt[58]),
.MD58_FPAD0(SDdata_IN_pb[58]),
```

msp_bs_pad_1ex.v

B-49

```
.MD58_FCORE1(MWRdata_tb[58]),
.MD58_TPAD1(MWRdata_bp[58]),
.MD59_TCORE0(SDdata_IN_bt[59]),
.MD59_FPAD0(SDdata_IN_pb[59]),
.MD59_FCORE1(MWRdata_tb[59]),
.MD59_TPAD1(MWRdata_bp[59]),
.MD60_TCORE0(SDdata_IN_bt[60]),
.MD60_FPAD0(SDdata_IN_pb[60]),
.MD60_FCORE1(MWRdata_tb[60]),
.MD60_TPAD1(MWRdata_bp[60]),
.MD61_TCORE0(SDdata_IN_bt[61]),
.MD61_FPAD0(SDdata_IN_pb[61]),
.MD61_FCORE1(MWRdata_tb[61]),
.MD61_TPAD1(MWRdata_bp[61]),
.MD62_TCORE0(SDdata_IN_bt[62]),
.MD62_FPAD0(SDdata_IN_pb[62]),
.MD62_FCORE1(MWRdata_tb[62]),
.MD62_TPAD1(MWRdata_bp[62]),
.MD63_TCORE0(SDdata_IN_bt[63]),
.MD63_FPAD0(SDdata_IN_pb[63]),
.MD63_FCORE1(MWRdata_tb[63]),
.MD63_TPAD1(MWRdata_bp[63]),
.MA23_TPAD(maddr23_bp),
.MA23_FCORE(maddr23_tb),
.MA24_TPAD(maddr24_bp),
.MA24_FCORE(maddr24_tb),
.RESET0_TPAD(reset_fcore_bp),
.RESET0_FCORE(reset_fcore_tb),
.TCS0L_TPAD(CS0_l_bp),
.TCS0L_FCORE(CS0_l_tb),
.TCS1L_TPAD(CS1_l_bp),
.TCS1L_FCORE(CS1_l_tb),
.PD15_PA15_TPAD(PD_PA_out_bp[15]),
.PD15_PA15_FCORE(PD_PA_out_tb[15]),
.PD14_PA14_TPAD(PD_PA_out_bp[14]),
.PD14_PA14_FCORE(PD_PA_out_tb[14]),
.PD13_PA13_TPAD(PD_PA_out_bp[13]),
.PD13_PA13_FCORE(PD_PA_out_tb[13]),
.PD12_PA12_TPAD(PD_PA_out_bp[12]),
.PD12_PA12_FCORE(PD_PA_out_tb[12]),
.PD11_PA11_TPAD(PD_PA_out_bp[11]),
.PD11_PA11_FCORE(PD_PA_out_tb[11]),
.PD10_PA10_TPAD(PD_PA_out_bp[10]),
.PD10_PA10_FCORE(PD_PA_out_tb[10]),
.PD9_PA9_TPAD(PD_PA_out_bp[9]),
.PD9_PA9_FCORE(PD_PA_out_tb[9]),
.PD8_PA8_TPAD(PD_PA_out_bp[8]),
.PD8_PA8_FCORE(PD_PA_out_tb[8]),
.PD7_PA7_TPAD(PD_PA_out_bp[7]),
.PD7_PA7_FCORE(PD_PA_out_tb[7]),
.PD6_PA6_TPAD(PD_PA_out_bp[6]),
.PD6_PA6_FCORE(PD_PA_out_tb[6]),
.PD5_PA5_TPAD(PD_PA_out_bp[5]),
.PD5_PA5_FCORE(PD_PA_out_tb[5]),
.PD4_PA4_TPAD(PD_PA_out_bp[4]),
.PD4_PA4_FCORE(PD_PA_out_tb[4]),
.PD3_PA3_TPAD(PD_PA_out_bp[3]),
.PD3_PA3_FCORE(PD_PA_out_tb[3]),
.PD2_PA2_TPAD(PD_PA_out_bp[2]),
.PD2_PA2_FCORE(PD_PA_out_tb[2]),
.PD1_PA1_TPAD(PD_PA_out_bp[1]),
.PD1_PA1_FCORE(PD_PA_out_tb[1]),
.PD0_PA0_TPAD(PD_PA_out_bp[0]),
.PD0_PA0_FCORE(PD_PA_out_tb[0]),
.C7_TCORE(BIOS_DATA_bt[7]),
.C7_FPAD(BIOS_DATA_pb[7]),
.C6_TCORE(BIOS_DATA_bt[6]),
.C6_FPAD(BIOS_DATA_pb[6]),
.C5_TCORE(BIOS_DATA_bt[5]),
.C5_FPAD(BIOS_DATA_pb[5]),
.C4_TCORE(BIOS_DATA_bt[4]),
.C4_FPAD(BIOS_DATA_pb[4]),
.C3_TCORE(BIOS_DATA_bt[3]),
.C3_FPAD(BIOS_DATA_pb[3]),
.C2_TCORE(BIOS_DATA_bt[2]),
.C2_FPAD(BIOS_DATA_pb[2]),
.C1_TCORE(BIOS_DATA_bt[1]),
.C1_FPAD(BIOS_DATA_pb[1]),
.C0_TCORE(BIOS_DATA_bt[0]),
.C0_FPAD(BIOS_DATA_pb[0]),
.PROMCSL_TPAD(PROMCS_out_bp),
.PROMCSL_FCORE(PROMCS_out_tb),
.BGVS_TCORE(BGVS_in_bt),
.BGVS_FPAD(BGVS_in_pb),
.BGHS_TCORE(BGHS_in_bt),
.BGHS_FPAD(BGHS_in_pb),
.MSSEL_TPAD(MSSEL_119_out_bp),
.MSSEL_FCORE(MSSEL_119_out_tb),
.BGCLK_TCORE(BGCLK_CK_bt),
.BGCLK_FPAD(BGCLK_CK_pb),
.SCLK_TPAD(SCLK_in_bp),
.SCLK_FCORE(SCLK_in_tb),
.SDAT_ENB_TPAD(SDAT_en_bp),
.SDAT_ENB_FCORE(SDAT_en_tb),
.SDAT_TCORE0(SDAT_in_bt),
.SDAT_FPAD0(SDAT_in_pb),
.SDAT_FCORE1(SDAT_out_tb),
.SDAT_TPAD1(SDAT_out_bp),
.SFRS_TPAD(SFRS_out_bp),
.SFRS_FCORE(SFRS_out_tb),
.SERIAL_IN_TCORE(Uart_sin_bt),
.SERIAL_IN_FPAD(Uart_sin_pb),
.SERIAL_OUT_TPAD(Uart_sout_bp),
.SERIAL_OUT_FCORE(Uart_sout_tb),
.A43SDFS_TCORE(A43_SDFS_bt),
.A43SDFS_FPAD(A43_SDFS_pb),
.A43SCLK_TCORE(A43SCK_bt),
.A43SCLK_FPAD(A43SCK_pb),
.A43SDI_TPAD(ad43_sdi_bp),
.A43SDI_FCORE(ad43_sdi_tb_ac),
.A43SDO_TCORE(ad43_sdo_bt),
.A43SDO_FPAD(ad43_sdo_pb),
.tdi(TDI_tcore_pb),
.tdo(bsr_tdo),
.enb(enb_tb),
.setn(setn_tb),
.clockdra(clockdra_tb),
.clockdrb(clockdrb_tb),
.updatedr(updatedr_tb),
.shiftdr(shiftdr_tb),
.mode_c(mode_c_tb),
.mode_i(mode_i_tb),
```

msp_bs_pad_1ex.v

B-50

```
        .mode_o(mode_o_tb),
        .multiple_scan_mode(multiple_scan_mode_tb),
        .ad_enb_fcore(Ad_enable_tb),
        .dbsr_select(dbsr_select_tb),
        .dbsr_scan_out(dbsr_scan_out_tb),
        .sdram_bs_csn(sdram_bs_csn_tb),
        .sdram_csn_sel(sdram_csn_sel_tb)
);

mcu_pad  INS2 ( .MD(MD_pt),              //SDRAM DATA BIDI
                .MA(MA_pt),              //Address out to SDRAM
                .MA23(MA23_pt),
                .MA24(MA24_pt),
                .DQM(DQM_pt),             //DQM signal to SDRAM
                .MWE0_l(MWE0_l_pt),          //Write enable signal
                .MCKE(MCKE_pt),           //CLock Enable signal
                .CAS1_l(CAS1_l_pt),         //CAS strobe signal to SDRAM
                .RAS1_l(RAS1_l_pt),         //RAS strobe signal to SDRAM
                .MCS0_l(MCS0_l_pt),         //CS signal to SDRAM
                .MCS1_l(MCS1_l_pt),         //CS signal to SDRAM
                .TCS0_l(TCS0_l_pt),         //CS signal to TILER
                .TCS1_l(TCS1_l_pt),         //CS signal to TILER
                .SDdata_IN(SDdata_IN_pb),       //Read data from SDRAM through PA
D
                .Mrdy(Mrdy_pb),           //ready signal from tiler

                .MS_RDY(MS_RDY_pt),         //Ready signal from Tiler
                .MWRdata(MWRdata_bp),        //Write data to SDRAM
                .SDdata_woe_l(SDdata_woe_l_bp),   //Tri-state buffer enable sign
al
                .maddr(maddr_bp),           //Internal address to PAD
                .maddr23(maddr23_bp),         //Internal address to PAD
                .maddr24(maddr24_bp),         //Internal address to PAD
                .mc_CKE(mc_MCKE_bp),
                .mc_RAS_l(mc_RAS_l_bp),         //Internal RAS strobe to PAD
                .mc_CAS_l(mc_CAS_l_bp),         //Internal CAS strobe to PAD
                .mc_WE0_l(mc_WE0_l_bp),         //Internal WE signal to PAD
                .mc_CS0_l(mc_CS0_l_bp),         //INternal CS signal to PAD
                .mc_CS1_l(mc_CS1_l_bp),         //INternal CS signal to PAD
                .CS0_l(CS0_l_bp),           //INternal CS signal to PAD and Tiler
                .CS1_l(CS1_l_bp),           //INternal CS signal to PAD and Tiler
                .mc_DQM(mc_DQM_bp),           //Internal DQM signal to PAD
                                                                        locks.
                .Net_PI1(fnet_2),
                .Net_PO1(fnet_3),
                .Net_PI2(fnet_4),
                .Net_PO2(fnet_5),
                .Net_TN(TM_tcore_pb)

                );

iob_pads INS9  ( .MIDIIN(MIDIIN_pt),
                 .MIDIO(MIDIO_pt),
                 .Uart_sin(Uart_sin_pb),
                 .Uart_sout(Uart_sout_bp),
                 .Net_PI1(fnet_7),
                 .Net_PO1(fnet_8)
               );

PCIIO INS3  ( .PciClk(PciClk_pt),             // Inputs from PCI
              .PciRstN(PciRstN_pt),
              .PciGntN(PciGntN_pt),
              .PciIdsel(PciIdsel_pt),

              .PciAd(PciAd_pt),              // Inouts from PCI
              .PciC_BeN(PciC_BeN_pt),
              .PciPar(PciPar_pt),
              .PciFrameN(PciFrameN_pt),
              .PciIrdyN(PciIrdyN_pt),
              .PciTrdyN(PciTrdyN_pt),
              .PciStopN(PciStopN_pt),
              .PciLockN(PciLockN_pt) ,
              .PciDevselN(PciDevselN_pt) ,
              .PciPerrN(PciPerrN_pt) ,
              .PciSerrN(PciSerrN_pt) ,

              .PciReqN(PciReqN_pt) ,           // Outputs to PCI
              .PciIntAN(PciIntAN_pt) ,

              .PCIM_Clk(PCIM_Clk_pb),          // Ouputs to Fbus and Sub Blocks
              .PCIM_RstN(PCIM_RstN_pb),

              .iPciIdsel(iPciIdsel_pb),         // Outputs to PCI Sub Blocks
              .iPciGntN(iPciGntN_pb),

              .iPciAd(iPciAd_pb),
              .iPciCBeN(iPciCBeN_pb),
              .iPciPar(iPciPar_pb),
              .iPciFrameN(iPciFrameN_pb),
              .iPciIrdyN(iPciIrdyN_pb),
              .iPciTrdyN(iPciTrdyN_pb),
              .iPciStopN(iPciStopN_pb),
              .iPciDevselN(iPciDevselN_pb),
              .iPciLockN(iPciLockN_pb),
              .iPciPerrN(iPciPerrN_pb),
              .iPciSerrN(iPciSerrN_pb),

              .oPciAd(oPciAd_bp),            // Ouputs to Pci Bus from PCISubB

              .oPciCBeN(oPciCBeN_bp),
              .oPciPar(oPciPar_bp),
              .oPciReqN(oPciReqN_bp),
              .oPciFrameN(oPciFrameN_bp),
              .oPciIrdyN(oPciIrdyN_bp),
              .oPciTrdyN(oPciTrdyN_bp),
              .oPciStopN(oPciStopN_bp),
              .oPciLockN(oPciLockN_bp),
              .oPciPerrN(oPciPerrN_bp),
              // @@@ .oPciSerrN(oPciSerrN_bp),
              .oPciIntAN(oPciIntAN_bp),

              //.Ad_enable(Ad_enable_bp),         // Enable Signals for PCIIO

              .Ad_enable( { Ad_enable_bp_31,
                            Ad_enable_bp_31,
                            Ad_enable_bp_31,
                            Ad_enable_bp_31,
                            Ad_enable_bp_31,
                            Ad_enable_bp_31,
                            Ad_enable_bp_25,
                            Ad_enable_bp_25,
                            Ad_enable_bp_25,
```

msp_bs_pad_1ex.v

B-51

```
                         Ad_enable_bp_25,
                         Ad_enable_bp_25,
                         Ad_enable_bp_25,
                         Ad_enable_bp_25,
                         Ad_enable_bp_25,
                         Ad_enable_bp_25,
                         Ad_enable_bp_25,
                         Ad_enable_bp_15,
                         Ad_enable_bp_15,
                         Ad_enable_bp_15,
                         Ad_enable_bp_15,
                         Ad_enable_bp_15,
                         Ad_enable_bp_15,
                         Ad_enable_bp_15,
                         Ad_enable_bp_15,
                         Ad_enable_bp_15,
                         Ad_enable_bp_15,
                         Ad_enable_bp_05,
                         Ad_enable_bp_05,
                         Ad_enable_bp_05,
                         Ad_enable_bp_02,
                         Ad_enable_bp_02,
                         Ad_enable_bp_02 } ),

                .Cbe_enable(Cbe_enable_bp),
                .Par_enable(Par_enable_bp),
                .Frame_enable(Frame_enable_bp),
                .Irdy_enable(Irdy_enable_bp),
                .Trdy_enable(Trdy_enable_bp),
                .Stop_enable(Stop_enable_bp),
                .Devsel_enable(Devsel_enable_bp),
                .Lock_enable(Lock_enable_bp),
                .Perr_enable(Perr_enable_bp),
                .Serr_enable(Serr_enable_bp),
                .PCIM_Rst(PCIM_Rst_bp),

                .Net_TN(TM_tcore_pb),
                .Net_PI1(fnet_1),
                .Net_PO1(fnet_2),
                .Net_PI2(fnet_10),
                .Net_PO2(fnet_11),
                .Net_PI3(fnet_12),
                .Net_PO3(fnet_13)

              );
ad43_pad INS4 (
         .ad43_sdo(ad43_sdo_pb),       //internal Serial data input from 1843
         .ad43_sdi(ad43_sdi_bp),       //internal Serial data output to 1843
         .A43_SDFS(A43_SDFS_pb),      //interna 1843 frame sync
         .A43SCK(A43SCK_pb),      //internal 1843 serial clock
         .A43SDO(A43SDO_pt),         // #131 serial data input from 1843
         .A43SDI(A43SDI_pt),         // #130 serial data output to 1843
         .A43SDFS(A43SDFS_pt),        // #126 1843 frame sync
         .A43SCLK(A43SCLK_pt),         // #127 1843 serial clock

         .Net_PI1(fnet_8),
         .Net_PO1(fnet_9)
         );

ks119_rom_pad INS5 (
                  .PD_PA(PD_PA_pt),
                  .PROMCSL(PROMCSL_pt),
                  .SFRS(SFRS_pt),
                  .SCLK(SCLK_pt),
                  .MSSEL(MSSEL_pt),
                  .BGVS(BGVS_pt),
                  .BGHS(BGHS_pt),
                  .C(C_pt),
                  .BGCLK(BGCLK_pt),
                  .SDAT(SDAT_pt),
                  .PD_PA_out(PD_PA_out_bp),
                  .PROMCS_out(PROMCS_out_bp),
                  .SDAT_out(SDAT_out_bp),
                  .SFRS_out(SFRS_out_bp),
                  .SCLK_in(SCLK_in_bp),
                  .SDAT_en(SDAT_en_bp),
                  .MSSEL_119_out(MSSEL_119_out_bp),
                  .BGVS_in(BGVS_in_pb),
                  .BGHS_in(BGHS_in_pb),
                  .SDAT_in(SDAT_in_pb),
                  .BIOS_DATA(BIOS_DATA_pb),
                  .BGCLK_CK(BGCLK_CK_pb),
                  .Net_TN(TM_tcore_pb),
                  .Net_PI1(fnet_5),
                  .Net_PO1(fnet_6),
                  .Net_PI2(fnet_6),
                  .Net_PO2(fnet_7)
                  );

TESTIO INS6 (
                .TCA(TCA_pt),
                .TCB(TCB_pt),
                .TM(TM_pt),
                .TRSTL(TRSTL_pt),
                .TDI(TDI_pt),
                .TCK(TCK_pt),
                .TMS(TMS_pt),
                .TDO(TDO_pt),

                .TCA_tcore(TCA_tcore_pb),
                .TCB_tcore(TCB_tcore_pb),
                .TM_tcore(TM_tcore_pb),
                .TRSTL_tcore(TRSTL_tcore_pb),
                .TDI_tcore(TDI_tcore_pb),
                .TCK_tcore(TCK_tcore_pb),
                .TMS_tcore(TMS_tcore_pb),
                .TDO_fcore(TDO_fcore_bp),
                .TDO_enb_fcore(TDO_enb_fcore_bp),

                .Net_PO(fnet_1),
                .Net_PI1(fnet_9),
                .Net_PO1(fnet_10),
                .Net_PI2(fnet_11),
                .Net_PO2(fnet_12),
                .Net_PI3(fnet_13),
                .Net_PO3(net_dc)
              );
```

msp_bs_pad_1ex.v

B-52

```
clk_pad INS7 (
                .MEMCLK(MEMCLK_pt),
                .sysclk_tocore(sysclk_tocore_bt),
                .MSPCK(MSPCK_pt),
                .sdrm_ck_fcore(sdrm_ck_fcore_bp),
                .RESETO(RESET_pt),
                .reset_fcore(reset_fcore_bp),
                .Net_PI1(fnet_3),
                .Net_PO1(fnet_4)
            );

power_pad POWER_PAD ();

nand_tree_mux NAND_TREE (
                .Net_TN(TM_tcore_pb),
                .Net_DC(net_dc),
                .D1_AC(ad43_sdi_tb),
                .Y1_AC(ad43_sdi_tb_ac),
                .D1_DC(mc_CKE_tb),
                .Y1_DC(mc_CKE_tb_dc)
            );

test_muxes TEST_MUXES (
                .AD25_D0(oPciAd_tb[25]),
                .AD25_D1(ad25_so9),
                .AD25_Y(oPciAd_tb_25_so9),
                .AD24_D0(oPciAd_tb[24]),
                .AD24_D1(ad24_so8),
                .AD24_Y(oPciAd_tb_24_so8),
                .AD23_D0(oPciAd_tb[23]),
                .AD23_D1(ad23_so7),
                .AD23_Y(oPciAd_tb_23_so7),
                .AD22_D0(oPciAd_tb[22]),
                .AD22_D1(ad22_so6),
                .AD22_Y(oPciAd_tb_22_so6),
                .AD21_D0(oPciAd_tb[21]),
                .AD21_D1(ad21_so5),
                .AD21_Y(oPciAd_tb_21_so5),
                .AD20_D0(oPciAd_tb[20]),
                .AD20_D1(ad20_so4),
                .AD20_Y(oPciAd_tb_20_so4),
                .AD19_D0(oPciAd_tb[19]),
                .AD19_D1(ad19_so3),
                .AD19_Y(oPciAd_tb_19_so3),
                .AD18_D0(oPciAd_tb[18]),
                .AD18_D1(ad18_so2),
                .AD18_Y(oPciAd_tb_18_so2),
                .AD17_D0(oPciAd_tb[17]),
                .AD17_D1(ad17_so1),
                .AD17_Y(oPciAd_tb_17_so1),
                .AD16_D0(oPciAd_tb[16]),
                .AD16_D1(ad16_so0),
                .AD16_Y(oPciAd_tb_16_so0),
                .MF_MODE(multiple_scan_mode_tb) );
endmodule
```

B-53

```
//-----------------------------------------------------------------
//Copyright (c) 1996 Samsung Semiconductor Inc.
//-----------------------------------------------------------------
//Contact :
//        Sanghyeon Baeg,
//        Samsung Semiconductor Inc.
//        3655 N. 1st Street
//        San Jose, CA 95134
//        (415) 954-7005
//-------------------------------------------------------------------


module msp_bs_top_1ex (
        INTAL_ENB_TPAD, // pin 1
        INTAL_ENB_FCORE, // pin 1
        RSTL_TCORE, // pin 1
        RSTL_FPAD, // pin 1
        PCICLK_TCORE, // pin 1
        PCICLK_FPAD, // pin 1
        GNTL_TCORE, // pin 1
        GNTL_FPAD, // pin 1
        REQL_ENB_TPAD, // pin 1
        REQL_ENB_FCORE, // pin 1
        REQL_TPAD, // pin 1
        REQL_FCORE, // pin 1
        AD31_ENB_TPAD, // pin 1
        // AD31_ENB_FCORE, // pin 1
        AD31_TCORE0, // pin 1
        AD31_FPAD0, // pin 1
        AD31_FCORE1, // pin 1
        AD31_TPAD1, // pin 1
        AD30_TCORE0, // pin 1
        AD30_FPAD0, // pin 1
        AD30_FCORE1, // pin 1
        AD30_TPAD1, // pin 1
        AD29_TCORE0, // pin 1
        AD29_FPAD0, // pin 1
        AD29_FCORE1, // pin 1
        AD29_TPAD1, // pin 1
        AD28_TCORE0, // pin 1
        AD28_FPAD0, // pin 1
        AD28_FCORE1, // pin 1
        AD28_TPAD1, // pin 1
        AD27_TCORE0, // pin 1
        AD27_FPAD0, // pin 1
        AD27_FCORE1, // pin 1
        AD27_TPAD1, // pin 1
        AD26_TCORE0, // pin 1
        AD26_FPAD0, // pin 1
        AD26_FCORE1, // pin 1
        AD26_TPAD1, // pin 1
        AD25_S09_ENB_TPAD, // pin 1
        // AD25_S09_ENB_FCORE, // pin 1
        AD25_S09_TCORE0, // pin 1
        AD25_S09_FPAD0, // pin 1
        AD25_S09_FCORE1, // pin 1
        AD25_S09_TPAD1, // pin 1
        AD24_S08_TCORE0, // pin 1
        AD24_S08_FPAD0, // pin 1
        AD24_S08_FCORE1, // pin 1
        AD24_S08_TPAD1, // pin 1
        C_BE3L_ENB_TPAD, // pin 1
        C_BE3L_ENB_FCORE, // pin 1
        C_BE3L_TCORE0, // pin 1
        C_BE3L_FPAD0, // pin 1
        C_BE3L_FCORE1, // pin 1
        C_BE3L_TPAD1, // pin 1
        IDSEL_TCORE, // pin 1
        IDSEL_FPAD, // pin 1
        AD23_S07_TCORE0, // pin 1
        AD23_S07_FPAD0, // pin 1
        AD23_S07_FCORE1, // pin 1
        AD23_S07_TPAD1, // pin 1
        AD22_S06_TCORE0, // pin 1
        AD22_S06_FPAD0, // pin 1
        AD22_S06_FCORE1, // pin 1
        AD22_S06_TPAD1, // pin 1
        AD21_S05_TCORE0, // pin 1
        AD21_S05_FPAD0, // pin 1
        AD21_S05_FCORE1, // pin 1
        AD21_S05_TPAD1, // pin 1
        AD20_S04_TCORE0, // pin 1
        AD20_S04_FPAD0, // pin 1
        AD20_S04_FCORE1, // pin 1
        AD20_S04_TPAD1, // pin 1
        AD19_S03_TCORE0, // pin 1
        AD19_S03_FPAD0, // pin 1
        AD19_S03_FCORE1, // pin 1
        AD19_S03_TPAD1, // pin 1
        AD18_S02_TCORE0, // pin 1
        AD18_S02_FPAD0, // pin 1
        AD18_S02_FCORE1, // pin 1
        AD18_S02_TPAD1, // pin 1
        AD17_S01_TCORE0, // pin 1
        AD17_S01_FPAD0, // pin 1
        AD17_S01_FCORE1, // pin 1
        AD17_S01_TPAD1, // pin 1
        AD16_S00_TCORE0, // pin 1
        AD16_S00_FPAD0, // pin 1
        AD16_S00_FCORE1, // pin 1
        AD16_S00_TPAD1, // pin 1
        C_BE2L_TCORE0, // pin 1
        C_BE2L_FPAD0, // pin 1
        C_BE2L_FCORE1, // pin 1
        C_BE2L_TPAD1, // pin 1
        FRAMEL_ENB_TPAD, // pin 1
        FRAMEL_ENB_FCORE, // pin 1
        FRAMEL_TCORE0, // pin 1
        FRAMEL_FPAD0, // pin 1
        FRAMEL_FCORE1, // pin 1
        FRAMEL_TPAD1, // pin 1
        IRDYL_ENB_TPAD, // pin 1
        IRDYL_ENB_FCORE, // pin 1
        IRDYL_TCORE0, // pin 1
        IRDYL_FPAD0, // pin 1
        IRDYL_FCORE1, // pin 1
        IRDYL_TPAD1, // pin 1
        TRDYL_ENB_TPAD, // pin 1
        TRDYL_ENB_FCORE, // pin 1
        TRDYL_TCORE0, // pin 1
        TRDYL_FPAD0, // pin 1
```

B-54

```
TRDYL_FCORE1, // pin 1
TRDYL_TPAD1, // pin 1
DVSELL_ENB_TPAD, // pin 1
DVSELL_ENB_FCORE, // pin 1
DVSELL_TCORE0, // pin 1
DVSELL_FPAD0, // pin 1
DVSELL_FCORE1, // pin 1
DVSELL_TPAD1, // pin 1
STOPL_ENB_TPAD, // pin 1
STOPL_ENB_FCORE, // pin 1
STOPL_TCORE0, // pin 1
STOPL_FPAD0, // pin 1
STOPL_FCORE1, // pin 1
STOPL_TPAD1, // pin 1
LOCKL_ENB_TPAD, // pin 1
LOCKL_ENB_FCORE, // pin 1
LOCKL_TCORE0, // pin 1
LOCKL_FPAD0, // pin 1
LOCKL_FCORE1, // pin 1
LOCKL_TPAD1, // pin 1
PERRL_ENB_TPAD, // pin 1
PERRL_ENB_FCORE, // pin 1
PERRL_TCORE0, // pin 1
PERRL_FPAD0, // pin 1
PERRL_FCORE1, // pin 1
PERRL_TPAD1, // pin 1
SERRL_ENB_TPAD, // pin 1
SERRL_ENB_FCORE, // pin 1
// @@@ SERRL_TCORE0, // pin 1
// @@@ SERRL_FPAD0, // pin 1
SERRL_TCORE, // pin 1
SERRL_FPAD, // pin 1
// @@@ SERRL_FCORE1, // pin 1
// @@@ SERRL_TPAD1, // pin 1
TCA_TCORE, // pin 1
TCA_FPAD, // pin 1
PAR_ENB_TPAD, // pin 1
PAR_ENB_FCORE, // pin 1
PAR_TCORE0, // pin 1
PAR_FPAD0, // pin 1
PAR_FCORE1, // pin 1
PAR_TPAD1, // pin 1
C_BE1L_TCORE0, // pin 1
C_BE1L_FPAD0, // pin 1
C_BE1L_FCORE1, // pin 1
C_BE1L_TPAD1, // pin 1
AD15_SI9_ENB_TPAD, // pin 1
// AD15_SI9_ENB_FCORE, // pin 1
AD15_SI9_TCORE0, // pin 1
AD15_SI9_FPAD0, // pin 1
AD15_SI9_FCORE1, // pin 1
AD15_SI9_TPAD1, // pin 1
AD14_SI8_TCORE0, // pin 1
AD14_SI8_FPAD0, // pin 1
AD14_SI8_FCORE1, // pin 1
AD14_SI8_TPAD1, // pin 1
AD13_SI7_TCORE0, // pin 1
AD13_SI7_FPAD0, // pin 1
AD13_SI7_FCORE1, // pin 1
AD13_SI7_TPAD1, // pin 1
AD12_SI6_TCORE0, // pin 1
AD12_SI6_FPAD0, // pin 1
AD12_SI6_FCORE1, // pin 1
AD12_SI6_TPAD1, // pin 1
AD11_SI5_TCORE0, // pin 1
AD11_SI5_FPAD0, // pin 1
AD11_SI5_FCORE1, // pin 1
AD11_SI5_TPAD1, // pin 1
AD10_SI4_TCORE0, // pin 1
AD10_SI4_FPAD0, // pin 1
AD10_SI4_FCORE1, // pin 1
AD10_SI4_TPAD1, // pin 1
AD09_SI3_TCORE0, // pin 1
AD09_SI3_FPAD0, // pin 1
AD09_SI3_FCORE1, // pin 1
AD09_SI3_TPAD1, // pin 1
AD08_SI2_TCORE0, // pin 1
AD08_SI2_FPAD0, // pin 1
AD08_SI2_FCORE1, // pin 1
AD08_SI2_TPAD1, // pin 1
C_BE0L_TCORE0, // pin 1
C_BE0L_FPAD0, // pin 1
C_BE0L_FCORE1, // pin 1
C_BE0L_TPAD1, // pin 1
TCB_TCORE, // pin 1
TCB_FPAD, // pin 1
TM_TCORE, // pin 1
TM_FPAD, // pin 1
AD07_SI1_TCORE0, // pin 1
AD07_SI1_FPAD0, // pin 1
AD07_SI1_FCORE1, // pin 1
AD07_SI1_TPAD1, // pin 1
AD06_SI0_TCORE0, // pin 1
AD06_SI0_FPAD0, // pin 1
AD06_SI0_FCORE1, // pin 1
AD06_SI0_TPAD1, // pin 1
AD05_MT5_ENB_TPAD, // pin 1
// AD05_MT5_ENB_FCORE, // pin 1
AD05_MT5_TCORE0, // pin 1
AD05_MT5_FPAD0, // pin 1
AD05_MT5_FCORE1, // pin 1
AD05_MT5_TPAD1, // pin 1
AD04_MT4_TCORE0, // pin 1
AD04_MT4_FPAD0, // pin 1
AD04_MT4_FCORE1, // pin 1
AD04_MT4_TPAD1, // pin 1
AD03_MT3_TCORE0, // pin 1
AD03_MT3_FPAD0, // pin 1
AD03_MT3_FCORE1, // pin 1
AD03_MT3_TPAD1, // pin 1
AD02_MT2_ENB_TPAD, // pin 1
// AD02_MT2_ENB_FCORE, // pin 1
AD02_MT2_TCORE0, // pin 1
AD02_MT2_FPAD0, // pin 1
AD02_MT2_FCORE1, // pin 1
AD02_MT2_TPAD1, // pin 1
AD01_MT1_TCORE0, // pin 1
AD01_MT1_FPAD0, // pin 1
AD01_MT1_FCORE1, // pin 1
AD01_MT1_TPAD1, // pin 1
AD00_MT0_TCORE0, // pin 1
AD00_MT0_FPAD0, // pin 1
```

msp_bs_top_1ex.v

B-55

```
AD00_MT0_FCORE1, // pin 1
AD00_MT0_TPAD1, // pin 1
MA11_TPAD, // pin 1
MA11_FCORE, // pin 1
MA10_TPAD, // pin 1
MA10_FCORE, // pin 1
MA9_TPAD, // pin 1
MA9_FCORE, // pin 1
MA8_TPAD, // pin 1
MA8_FCORE, // pin 1
MA7_TPAD, // pin 1
MA7_FCORE, // pin 1
MA6_TPAD, // pin 1
MA6_FCORE, // pin 1
MA5_TPAD, // pin 1
MA5_FCORE, // pin 1
MA4_TPAD, // pin 1
MA4_FCORE, // pin 1
MA3_TPAD, // pin 1
MA3_FCORE, // pin 1
MA2_TPAD, // pin 1
MA2_FCORE, // pin 1
MA1_TPAD, // pin 1
MA1_FCORE, // pin 1
MA0_TPAD, // pin 1
MA0_FCORE, // pin 1
RAS1L_TPAD, // pin 1
RAS1L_FCORE, // pin 1
CAS1L_TPAD, // pin 1
CAS1L_FCORE, // pin 1
MWEL_TPAD, // pin 1
MWEL_FCORE, // pin 1
DQM_TPAD, // pin 1
DQM_FCORE, // pin 1
MCS0L_TPAD, // pin 1
MCS0L_FCORE, // pin 1
MCS1L_TPAD, // pin 1
MCS1L_FCORE, // pin 1
MCKE_TPAD, // pin 1
MCKE_FCORE, // pin 1
MRDYH_TCORE, // pin 1
MRDYH_FPAD, // pin 1
MD0_ENB_TPAD, // pin 1
MD0_ENB_FCORE, // pin 1
MD0_TCORE0, // pin 1
MD0_FPAD0, // pin 1
MD0_FCORE1, // pin 1
MD0_TPAD1, // pin 1
MD1_TCORE0, // pin 1
MD1_FPAD0, // pin 1
MD1_FCORE1, // pin 1
MD1_TPAD1, // pin 1
MD2_TCORE0, // pin 1
MD2_FPAD0, // pin 1
MD2_FCORE1, // pin 1
MD2_TPAD1, // pin 1
MD3_TCORE0, // pin 1
MD3_FPAD0, // pin 1
MD3_FCORE1, // pin 1
MD3_TPAD1, // pin 1
MD4_TCORE0, // pin 1
MD4_FPAD0, // pin 1
MD4_FCORE1, // pin 1
MD4_TPAD1, // pin 1
MD5_TCORE0, // pin 1
MD5_FPAD0, // pin 1
MD5_FCORE1, // pin 1
MD5_TPAD1, // pin 1
MD6_TCORE0, // pin 1
MD6_FPAD0, // pin 1
MD6_FCORE1, // pin 1
MD6_TPAD1, // pin 1
MD7_TCORE0, // pin 1
MD7_FPAD0, // pin 1
MD7_FCORE1, // pin 1
MD7_TPAD1, // pin 1
MD8_TCORE0, // pin 1
MD8_FPAD0, // pin 1
MD8_FCORE1, // pin 1
MD8_TPAD1, // pin 1
MD9_TCORE0, // pin 1
MD9_FPAD0, // pin 1
MD9_FCORE1, // pin 1
MD9_TPAD1, // pin 1
MD10_TCORE0, // pin 1
MD10_FPAD0, // pin 1
MD10_FCORE1, // pin 1
MD10_TPAD1, // pin 1
MD11_TCORE0, // pin 1
MD11_FPAD0, // pin 1
MD11_FCORE1, // pin 1
MD11_TPAD1, // pin 1
MD12_TCORE0, // pin 1
MD12_FPAD0, // pin 1
MD12_FCORE1, // pin 1
MD12_TPAD1, // pin 1
MD13_TCORE0, // pin 1
MD13_FPAD0, // pin 1
MD13_FCORE1, // pin 1
MD13_TPAD1, // pin 1
MD14_TCORE0, // pin 1
MD14_FPAD0, // pin 1
MD14_FCORE1, // pin 1
MD14_TPAD1, // pin 1
MD15_TCORE0, // pin 1
MD15_FPAD0, // pin 1
MD15_FCORE1, // pin 1
MD15_TPAD1, // pin 1
MD16_TCORE0, // pin 1
MD16_FPAD0, // pin 1
MD16_FCORE1, // pin 1
MD16_TPAD1, // pin 1
MD17_TCORE0, // pin 1
MD17_FPAD0, // pin 1
MD17_FCORE1, // pin 1
MD17_TPAD1, // pin 1
MD18_TCORE0, // pin 1
MD18_FPAD0, // pin 1
MD18_FCORE1, // pin 1
MD18_TPAD1, // pin 1
MD19_TCORE0, // pin 1
MD19_FPAD0, // pin 1
```

B-56

```
MD19_FCORE1, // pin 1
MD19_TPAD1, // pin 1
MD20_TCORE0, // pin 1
MD20_FPAD0, // pin 1
MD20_FCORE1, // pin 1
MD20_TPAD1, // pin 1
MD21_TCORE0, // pin 1
MD21_FPAD0, // pin 1
MD21_FCORE1, // pin 1
MD21_TPAD1, // pin 1
MD22_TCORE0, // pin 1
MD22_FPAD0, // pin 1
MD22_FCORE1, // pin 1
MD22_TPAD1, // pin 1
MD23_TCORE0, // pin 1
MD23_FPAD0, // pin 1
MD23_FCORE1, // pin 1
MD23_TPAD1, // pin 1
MD24_TCORE0, // pin 1
MD24_FPAD0, // pin 1
MD24_FCORE1, // pin 1
MD24_TPAD1, // pin 1
MD25_TCORE0, // pin 1
MD25_FPAD0, // pin 1
MD25_FCORE1, // pin 1
MD25_TPAD1, // pin 1
MD26_TCORE0, // pin 1
MD26_FPAD0, // pin 1
MD26_FCORE1, // pin 1
MD26_TPAD1, // pin 1
MD27_TCORE0, // pin 1
MD27_FPAD0, // pin 1
MD27_FCORE1, // pin 1
MD27_TPAD1, // pin 1
MD28_TCORE0, // pin 1
MD28_FPAD0, // pin 1
MD28_FCORE1, // pin 1
MD28_TPAD1, // pin 1
MD29_TCORE0, // pin 1
MD29_FPAD0, // pin 1
MD29_FCORE1, // pin 1
MD29_TPAD1, // pin 1
MD30_TCORE0, // pin 1
MD30_FPAD0, // pin 1
MD30_FCORE1, // pin 1
MD30_TPAD1, // pin 1
MD31_TCORE0, // pin 1
MD31_FPAD0, // pin 1
MD31_FCORE1, // pin 1
MD31_TPAD1, // pin 1
MD32_TCORE0, // pin 1
MD32_FPAD0, // pin 1
MD32_FCORE1, // pin 1
MD32_TPAD1, // pin 1
MD33_TCORE0, // pin 1
MD33_FPAD0, // pin 1
MD33_FCORE1, // pin 1
MD33_TPAD1, // pin 1
MD34_TCORE0, // pin 1
MD34_FPAD0, // pin 1
MD34_FCORE1, // pin 1
MD34_TPAD1, // pin 1
MD35_TCORE0, // pin 1
MD35_FPAD0, // pin 1
MD35_FCORE1, // pin 1
MD35_TPAD1, // pin 1
MD36_TCORE0, // pin 1
MD36_FPAD0, // pin 1
MD36_FCORE1, // pin 1
MD36_TPAD1, // pin 1
MD37_TCORE0, // pin 1
MD37_FPAD0, // pin 1
MD37_FCORE1, // pin 1
MD37_TPAD1, // pin 1
MD38_TCORE0, // pin 1
MD38_FPAD0, // pin 1
MD38_FCORE1, // pin 1
MD38_TPAD1, // pin 1
MD39_TCORE0, // pin 1
MD39_FPAD0, // pin 1
MD39_FCORE1, // pin 1
MD39_TPAD1, // pin 1
MD40_TCORE0, // pin 1
MD40_FPAD0, // pin 1
MD40_FCORE1, // pin 1
MD40_TPAD1, // pin 1
MD41_TCORE0, // pin 1
MD41_FPAD0, // pin 1
MD41_FCORE1, // pin 1
MD41_TPAD1, // pin 1
MD42_TCORE0, // pin 1
MD42_FPAD0, // pin 1
MD42_FCORE1, // pin 1
MD42_TPAD1, // pin 1
MSPCK_FPAD_TCORE, // pin 1
MD43_TCORE0, // pin 1
MD43_FPAD0, // pin 1
MD43_FCORE1, // pin 1
MD43_TPAD1, // pin 1
MD44_TCORE0, // pin 1
MD44_FPAD0, // pin 1
MD44_FCORE1, // pin 1
MD44_TPAD1, // pin 1
MD45_TCORE0, // pin 1
MD45_FPAD0, // pin 1
MD45_FCORE1, // pin 1
MD45_TPAD1, // pin 1
MD46_TCORE0, // pin 1
MD46_FPAD0, // pin 1
MD46_FCORE1, // pin 1
MD46_TPAD1, // pin 1
MD47_TCORE0, // pin 1
MD47_FPAD0, // pin 1
MD47_FCORE1, // pin 1
MD47_TPAD1, // pin 1
MD48_TCORE0, // pin 1
MD48_FPAD0, // pin 1
MD48_FCORE1, // pin 1
MD48_TPAD1, // pin 1
MD49_TCORE0, // pin 1
MD49_FPAD0, // pin 1
MD49_FCORE1, // pin 1
```

msp_bs_top_1ex.v

B-57

```
MD49_TPAD1, // pin 1
MD50_TCORE0, // pin 1
MD50_FPAD0, // pin 1
MD50_FCORE1, // pin 1
MD50_TPAD1, // pin 1
MD51_TCORE0, // pin 1
MD51_FPAD0, // pin 1
MD51_FCORE1, // pin 1
MD51_TPAD1, // pin 1
MD52_TCORE0, // pin 1
MD52_FPAD0, // pin 1
MD52_FCORE1, // pin 1
MD52_TPAD1, // pin 1
MD53_TCORE0, // pin 1
MD53_FPAD0, // pin 1
MD53_FCORE1, // pin 1
MD53_TPAD1, // pin 1
MD54_TCORE0, // pin 1
MD54_FPAD0, // pin 1
MD54_FCORE1, // pin 1
MD54_TPAD1, // pin 1
MD55_TCORE0, // pin 1
MD55_FPAD0, // pin 1
MD55_FCORE1, // pin 1
MD55_TPAD1, // pin 1
MD56_TCORE0, // pin 1
MD56_FPAD0, // pin 1
MD56_FCORE1, // pin 1
MD56_TPAD1, // pin 1
MD57_TCORE0, // pin 1
MD57_FPAD0, // pin 1
MD57_FCORE1, // pin 1
MD57_TPAD1, // pin 1
MD58_TCORE0, // pin 1
MD58_FPAD0, // pin 1
MD58_FCORE1, // pin 1
MD58_TPAD1, // pin 1
MD59_TCORE0, // pin 1
MD59_FPAD0, // pin 1
MD59_FCORE1, // pin 1
MD59_TPAD1, // pin 1
MD60_TCORE0, // pin 1
MD60_FPAD0, // pin 1
MD60_FCORE1, // pin 1
MD60_TPAD1, // pin 1
MD61_TCORE0, // pin 1
MD61_FPAD0, // pin 1
MD61_FCORE1, // pin 1
MD61_TPAD1, // pin 1
MD62_TCORE0, // pin 1
MD62_FPAD0, // pin 1
MD62_FCORE1, // pin 1
MD62_TPAD1, // pin 1
MD63_TCORE0, // pin 1
MD63_FPAD0, // pin 1
MD63_FCORE1, // pin 1
MD63_TPAD1, // pin 1
MA23_TPAD, // pin 1
MA23_FCORE, // pin 1
MA24_TPAD, // pin 1
MA24_FCORE, // pin 1
```

```
RESET0_TPAD, // pin 1
RESET0_FCORE, // pin 1
TCS0L_TPAD, // pin 1
TCS0L_FCORE, // pin 1
TCS1L_TPAD, // pin 1
TCS1L_FCORE, // pin 1
PD15_PA15_TPAD, // pin 1
PD15_PA15_FCORE, // pin 1
PD14_PA14_TPAD, // pin 1
PD14_PA14_FCORE, // pin 1
PD13_PA13_TPAD, // pin 1
PD13_PA13_FCORE, // pin 1
PD12_PA12_TPAD, // pin 1
PD12_PA12_FCORE, // pin 1
PD11_PA11_TPAD, // pin 1
PD11_PA11_FCORE, // pin 1
PD10_PA10_TPAD, // pin 1
PD10_PA10_FCORE, // pin 1
PD9_PA9_TPAD, // pin 1
PD9_PA9_FCORE, // pin 1
PD8_PA8_TPAD, // pin 1
PD8_PA8_FCORE, // pin 1
PD7_PA7_TPAD, // pin 1
PD7_PA7_FCORE, // pin 1
PD6_PA6_TPAD, // pin 1
PD6_PA6_FCORE, // pin 1
PD5_PA5_TPAD, // pin 1
PD5_PA5_FCORE, // pin 1
PD4_PA4_TPAD, // pin 1
PD4_PA4_FCORE, // pin 1
PD3_PA3_TPAD, // pin 1
PD3_PA3_FCORE, // pin 1
PD2_PA2_TPAD, // pin 1
PD2_PA2_FCORE, // pin 1
PD1_PA1_TPAD, // pin 1
PD1_PA1_FCORE, // pin 1
PD0_PA0_TPAD, // pin 1
PD0_PA0_FCORE, // pin 1
C7_TCORE, // pin 1
C7_FPAD, // pin 1
C6_TCORE, // pin 1
C6_FPAD, // pin 1
C5_TCORE, // pin 1
C5_FPAD, // pin 1
C4_TCORE, // pin 1
C4_FPAD, // pin 1
C3_TCORE, // pin 1
C3_FPAD, // pin 1
C2_TCORE, // pin 1
C2_FPAD, // pin 1
C1_TCORE, // pin 1
C1_FPAD, // pin 1
C0_TCORE, // pin 1
C0_FPAD, // pin 1
PROMCSL_TPAD, // pin 1
PROMCSL_FCORE, // pin 1
BGVS_TCORE, // pin 1
BGVS_FPAD, // pin 1
BGHS_TCORE, // pin 1
BGHS_FPAD, // pin 1
MSSEL_TPAD, // pin 1
```

B-58

```
        MSSEL_FCORE, // pin 1
        BGCLK_TCORE, // pin 1
        BGCLK_FPAD, // pin 1
        SCLK_TPAD, // pin 1
        SCLK_FCORE, // pin 1
        SDAT_ENB_TPAD, // pin 1
        SDAT_ENB_FCORE, // pin 1
        SDAT_TCORE0, // pin 1
        SDAT_FPAD0, // pin 1
        SDAT_FCORE1, // pin 1
        SDAT_TPAD1, // pin 1
        SFRS_TPAD, // pin 1
        SFRS_FCORE, // pin 1
        SERIAL_IN_TCORE, // pin 1
        SERIAL_IN_FPAD, // pin 1
        SERIAL_OUT_TPAD, // pin 1
        SERIAL_OUT_FCORE, // pin 1
        A43SDFS_TCORE, // pin 1
        A43SDFS_FPAD, // pin 1
        A43SCLK_TCORE, // pin 1
        A43SCLK_FPAD, // pin 1
        A43SDI_TPAD, // pin 1
        A43SDI_FCORE, // pin 1
        A43SDO_TCORE, // pin 1
        A43SDO_FPAD, // pin 1
        tdi,
        tdo,
        enb,
        setn,
        clockdra,
        clockdrb,
        updatedr,
        shiftdr,
        mode_c,
        mode_i,
        mode_o,

        multiple_scan_mode, // @@@ multiple scan test mode, active high
        ad_enb_fcore,       // @@@ AD ports I/O direction control signal from c
ore
        dbsr_select,
        dbsr_scan_out,
        sdram_bs_csn,
        sdram_csn_sel
);

        input  multiple_scan_mode; // @@@ multiple scan test mode, active high
        input  ad_enb_fcore;       // @@@ AD ports I/O direction control signal
 from core
        input  dbsr_select;
        output dbsr_scan_out;
        input sdram_bs_csn;
        input sdram_csn_sel;

        output INTAL_ENB_TPAD; // pin 1
        input  INTAL_ENB_FCORE; // pin 1
        output RSTL_TCORE; // pin 1
        input  RSTL_FPAD; // pin 1
        output PCICLK_TCORE; // pin 1
        input  PCICLK_FPAD; // pin 1
        output GNTL_TCORE; // pin 1
        input  GNTL_FPAD; // pin 1
        output REQL_ENB_TPAD; // pin 1
        input  REQL_ENB_FCORE; // pin 1
        output REQL_TPAD; // pin 1
        input  REQL_FCORE; // pin 1
        output AD31_ENB_TPAD; // pin 1
        // input  AD31_ENB_FCORE; // pin 1
        output AD31_TCORE0; // pin 1
        input  AD31_FPAD0; // pin 1
        input  AD31_FCORE1; // pin 1
        output AD31_TPAD1; // pin 1
        output AD30_TCORE0; // pin 1
        input  AD30_FPAD0; // pin 1
        input  AD30_FCORE1; // pin 1
        output AD30_TPAD1; // pin 1
        output AD29_TCORE0; // pin 1
        input  AD29_FPAD0; // pin 1
        input  AD29_FCORE1; // pin 1
        output AD29_TPAD1; // pin 1
        output AD28_TCORE0; // pin 1
        input  AD28_FPAD0; // pin 1
        input  AD28_FCORE1; // pin 1
        output AD28_TPAD1; // pin 1
        output AD27_TCORE0; // pin 1
        input  AD27_FPAD0; // pin 1
        input  AD27_FCORE1; // pin 1
        output AD27_TPAD1; // pin 1
        output AD26_TCORE0; // pin 1
        input  AD26_FPAD0; // pin 1
        input  AD26_FCORE1; // pin 1
        output AD26_TPAD1; // pin 1
        output AD25_SO9_ENB_TPAD; // pin 1
        // input  AD25_SO9_ENB_FCORE; // pin 1
        output AD25_SO9_TCORE0; // pin 1
        input  AD25_SO9_FPAD0; // pin 1
        input  AD25_SO9_FCORE1; // pin 1
        output AD25_SO9_TPAD1; // pin 1
        output AD24_SO8_TCORE0; // pin 1
        input  AD24_SO8_FPAD0; // pin 1
        input  AD24_SO8_FCORE1; // pin 1
        output AD24_SO8_TPAD1; // pin 1
        output C_BE3L_ENB_TPAD; // pin 1
        input  C_BE3L_ENB_FCORE; // pin 1
        output C_BE3L_TCORE0; // pin 1
        input  C_BE3L_FPAD0; // pin 1
        input  C_BE3L_FCORE1; // pin 1
        output C_BE3L_TPAD1; // pin 1
        output IDSEL_TCORE; // pin 1
        input  IDSEL_FPAD; // pin 1
        output AD23_SO7_TCORE0; // pin 1
        input  AD23_SO7_FPAD0; // pin 1
        input  AD23_SO7_FCORE1; // pin 1
        output AD23_SO7_TPAD1; // pin 1
        output AD22_SO6_TCORE0; // pin 1
        input  AD22_SO6_FPAD0; // pin 1
        input  AD22_SO6_FCORE1; // pin 1
        output AD22_SO6_TPAD1; // pin 1
        output AD21_SO5_TCORE0; // pin 1
        input  AD21_SO5_FPAD0; // pin 1
        input  AD21_SO5_FCORE1; // pin 1
```

B-59

```
output AD21_S05_TPAD1; // pin 1
output AD20_S04_TCORE0; // pin 1
input  AD20_S04_FPAD0; // pin 1
input  AD20_S04_FCORE1; // pin 1
output AD20_S04_TPAD1; // pin 1
output AD19_S03_TCORE0; // pin 1
input  AD19_S03_FPAD0; // pin 1
input  AD19_S03_FCORE1; // pin 1
output AD19_S03_TPAD1; // pin 1
output AD18_S02_TCORE0; // pin 1
input  AD18_S02_FPAD0; // pin 1
input  AD18_S02_FCORE1; // pin 1
output AD18_S02_TPAD1; // pin 1
output AD17_S01_TCORE0; // pin 1
input  AD17_S01_FPAD0; // pin 1
input  AD17_S01_FCORE1; // pin 1
output AD17_S01_TPAD1; // pin 1
output AD16_S00_TCORE0; // pin 1
input  AD16_S00_FPAD0; // pin 1
input  AD16_S00_FCORE1; // pin 1
output AD16_S00_TPAD1; // pin 1
output C_BE2L_TCORE0; // pin 1
input  C_BE2L_FPAD0; // pin 1
input  C_BE2L_FCORE1; // pin 1
output C_BE2L_TPAD1; // pin 1
output FRAMEL_ENB_TPAD; // pin 1
input  FRAMEL_ENB_FCORE; // pin 1
output FRAMEL_TCORE0; // pin 1
input  FRAMEL_FPAD0; // pin 1
input  FRAMEL_FCORE1; // pin 1
output FRAMEL_TPAD1; // pin 1
output IRDYL_ENB_TPAD; // pin 1
input  IRDYL_ENB_FCORE; // pin 1
output IRDYL_TCORE0; // pin 1
input  IRDYL_FPAD0; // pin 1
input  IRDYL_FCORE1; // pin 1
output IRDYL_TPAD1; // pin 1
output TRDYL_ENB_TPAD; // pin 1
input  TRDYL_ENB_FCORE; // pin 1
output TRDYL_TCORE0; // pin 1
input  TRDYL_FPAD0; // pin 1
input  TRDYL_FCORE1; // pin 1
output TRDYL_TPAD1; // pin 1
output DVSELL_ENB_TPAD; // pin 1
input  DVSELL_ENB_FCORE; // pin 1
output DVSELL_TCORE0; // pin 1
input  DVSELL_FPAD0; // pin 1
input  DVSELL_FCORE1; // pin 1
output DVSELL_TPAD1; // pin 1
output STOPL_ENB_TPAD; // pin 1
input  STOPL_ENB_FCORE; // pin 1
output STOPL_TCORE0; // pin 1
input  STOPL_FPAD0; // pin 1
input  STOPL_FCORE1; // pin 1
output STOPL_TPAD1; // pin 1
output LOCKL_ENB_TPAD; // pin 1
input  LOCKL_ENB_FCORE; // pin 1
output LOCKL_TCORE0; // pin 1
input  LOCKL_FPAD0; // pin 1
input  LOCKL_FCORE1; // pin 1
output LOCKL_TPAD1; // pin 1
output PERRL_ENB_TPAD; // pin 1
input  PERRL_ENB_FCORE; // pin 1
output PERRL_TCORE0; // pin 1
input  PERRL_FPAD0; // pin 1
input  PERRL_FCORE1; // pin 1
output PERRL_TPAD1; // pin 1
output SERRL_ENB_TPAD; // pin 1
input  SERRL_ENB_FCORE; // pin 1
// @@@ output SERRL_TCORE0; // pin 1
// @@@ input  SERRL_FPAD0; // pin 1
output SERRL_TCORE; // pin 1
input  SERRL_FPAD; // pin 1
// @@@ input  SERRL_FCORE1; // pin 1
// @@@ output SERRL_TPAD1; // pin 1
output TCA_TCORE; // pin 1
input  TCA_FPAD; // pin 1
output PAR_ENB_TPAD; // pin 1
input  PAR_ENB_FCORE; // pin 1
output PAR_TCORE0; // pin 1
input  PAR_FPAD0; // pin 1
input  PAR_FCORE1; // pin 1
output PAR_TPAD1; // pin 1
output C_BE1L_TCORE0; // pin 1
input  C_BE1L_FPAD0; // pin 1
input  C_BE1L_FCORE1; // pin 1
output C_BE1L_TPAD1; // pin 1
output AD15_SI9_ENB_TPAD; // pin 1
// input  AD15_SI9_ENB_FCORE; // pin 1
output AD15_SI9_TCORE0; // pin 1
input  AD15_SI9_FPAD0; // pin 1
input  AD15_SI9_FCORE1; // pin 1
output AD15_SI9_TPAD1; // pin 1
output AD14_SI8_TCORE0; // pin 1
input  AD14_SI8_FPAD0; // pin 1
input  AD14_SI8_FCORE1; // pin 1
output AD14_SI8_TPAD1; // pin 1
output AD13_SI7_TCORE0; // pin 1
input  AD13_SI7_FPAD0; // pin 1
input  AD13_SI7_FCORE1; // pin 1
output AD13_SI7_TPAD1; // pin 1
output AD12_SI6_TCORE0; // pin 1
input  AD12_SI6_FPAD0; // pin 1
input  AD12_SI6_FCORE1; // pin 1
output AD12_SI6_TPAD1; // pin 1
output AD11_SI5_TCORE0; // pin 1
input  AD11_SI5_FPAD0; // pin 1
input  AD11_SI5_FCORE1; // pin 1
output AD11_SI5_TPAD1; // pin 1
output AD10_SI4_TCORE0; // pin 1
input  AD10_SI4_FPAD0; // pin 1
input  AD10_SI4_FCORE1; // pin 1
output AD10_SI4_TPAD1; // pin 1
output AD09_SI3_TCORE0; // pin 1
input  AD09_SI3_FPAD0; // pin 1
input  AD09_SI3_FCORE1; // pin 1
output AD09_SI3_TPAD1; // pin 1
output AD08_SI2_TCORE0; // pin 1
input  AD08_SI2_FPAD0; // pin 1
input  AD08_SI2_FCORE1; // pin 1
output AD08_SI2_TPAD1; // pin 1
output C_BE0L_TCORE0; // pin 1
```

msp_bs_top_1ex.v

B-60

```
input  C_BEOL_FPAD0; // pin 1
input  C_BEOL_FCORE1; // pin 1
output C_BEOL_TPAD1; // pin 1
output TCB_TCORE; // pin 1
input  TCB_FPAD; // pin 1
output TM_TCORE; // pin 1
input  TM_FPAD; // pin 1
output AD07_SI1_TCORE0; // pin 1
input  AD07_SI1_FPAD0; // pin 1
input  AD07_SI1_FCORE1; // pin 1
output AD07_SI1_TPAD1; // pin 1
output AD06_SI0_TCORE0; // pin 1
input  AD06_SI0_FPAD0; // pin 1
input  AD06_SI0_FCORE1; // pin 1
output AD06_SI0_TPAD1; // pin 1
output AD05_MT5_ENB_TPAD; // pin 1
// input  AD05_MT5_ENB_FCORE; // pin 1
output AD05_MT5_TCORE0; // pin 1
input  AD05_MT5_FPAD0; // pin 1
input  AD05_MT5_FCORE1; // pin 1
output AD05_MT5_TPAD1; // pin 1
output AD04_MT4_TCORE0; // pin 1
input  AD04_MT4_FPAD0; // pin 1
input  AD04_MT4_FCORE1; // pin 1
output AD04_MT4_TPAD1; // pin 1
output AD03_MT3_TCORE0; // pin 1
input  AD03_MT3_FPAD0; // pin 1
input  AD03_MT3_FCORE1; // pin 1
output AD03_MT3_TPAD1; // pin 1
output AD02_MT2_ENB_TPAD; // pin 1
// input  AD02_MT2_ENB_FCORE; // pin 1
output AD02_MT2_TCORE0; // pin 1
input  AD02_MT2_FPAD0; // pin 1
input  AD02_MT2_FCORE1; // pin 1
output AD02_MT2_TPAD1; // pin 1
output AD01_MT1_TCORE0; // pin 1
input  AD01_MT1_FPAD0; // pin 1
input  AD01_MT1_FCORE1; // pin 1
output AD01_MT1_TPAD1; // pin 1
output AD00_MT0_TCORE0; // pin 1
input  AD00_MT0_FPAD0; // pin 1
input  AD00_MT0_FCORE1; // pin 1
output AD00_MT0_TPAD1; // pin 1
output MA11_TPAD; // pin 1
input  MA11_FCORE; // pin 1
output MA10_TPAD; // pin 1
input  MA10_FCORE; // pin 1
output MA9_TPAD; // pin 1
input  MA9_FCORE; // pin 1
output MA8_TPAD; // pin 1
input  MA8_FCORE; // pin 1
output MA7_TPAD; // pin 1
input  MA7_FCORE; // pin 1
output MA6_TPAD; // pin 1
input  MA6_FCORE; // pin 1
output MA5_TPAD; // pin 1
input  MA5_FCORE; // pin 1
output MA4_TPAD; // pin 1
input  MA4_FCORE; // pin 1
output MA3_TPAD; // pin 1
input  MA3_FCORE; // pin 1
output MA2_TPAD; // pin 1
input  MA2_FCORE; // pin 1
output MA1_TPAD; // pin 1
input  MA1_FCORE; // pin 1
output MA0_TPAD; // pin 1
input  MA0_FCORE; // pin 1
output RAS1L_TPAD; // pin 1
input  RAS1L_FCORE; // pin 1
output CAS1L_TPAD; // pin 1
input  CAS1L_FCORE; // pin 1
output MWEL_TPAD; // pin 1
input  MWEL_FCORE; // pin 1
output DQM_TPAD; // pin 1
input  DQM_FCORE; // pin 1
output MCS0L_TPAD; // pin 1
input  MCS0L_FCORE; // pin 1
output MCS1L_TPAD; // pin 1
input  MCS1L_FCORE; // pin 1
output MCKE_TPAD; // pin 1
input  MCKE_FCORE; // pin 1
output MRDYH_TCORE; // pin 1
input  MRDYH_FPAD; // pin 1
output MD0_ENB_TPAD; // pin 1
input  MD0_ENB_FCORE; // pin 1
output MD0_TCORE0; // pin 1
input  MD0_FPAD0; // pin 1
input  MD0_FCORE1; // pin 1
output MD0_TPAD1; // pin 1
output MD1_TCORE0; // pin 1
input  MD1_FPAD0; // pin 1
input  MD1_FCORE1; // pin 1
output MD1_TPAD1; // pin 1
output MD2_TCORE0; // pin 1
input  MD2_FPAD0; // pin 1
input  MD2_FCORE1; // pin 1
output MD2_TPAD1; // pin 1
output MD3_TCORE0; // pin 1
input  MD3_FPAD0; // pin 1
input  MD3_FCORE1; // pin 1
output MD3_TPAD1; // pin 1
output MD4_TCORE0; // pin 1
input  MD4_FPAD0; // pin 1
input  MD4_FCORE1; // pin 1
output MD4_TPAD1; // pin 1
output MD5_TCORE0; // pin 1
input  MD5_FPAD0; // pin 1
input  MD5_FCORE1; // pin 1
output MD5_TPAD1; // pin 1
output MD6_TCORE0; // pin 1
input  MD6_FPAD0; // pin 1
input  MD6_FCORE1; // pin 1
output MD6_TPAD1; // pin 1
output MD7_TCORE0; // pin 1
input  MD7_FPAD0; // pin 1
input  MD7_FCORE1; // pin 1
output MD7_TPAD1; // pin 1
output MD8_TCORE0; // pin 1
input  MD8_FPAD0; // pin 1
input  MD8_FCORE1; // pin 1
output MD8_TPAD1; // pin 1
output MD9_TCORE0; // pin 1
```

msp_bs_top_1ex.v

B-61

```
input  MD9_FPAD0; // pin 1
input  MD9_FCORE1; // pin 1
output MD9_TPAD1; // pin 1
output MD10_TCORE0; // pin 1
input  MD10_FPAD0; // pin 1
input  MD10_FCORE1; // pin 1
output MD10_TPAD1; // pin 1
output MD11_TCORE0; // pin 1
input  MD11_FPAD0; // pin 1
input  MD11_FCORE1; // pin 1
output MD11_TPAD1; // pin 1
output MD12_TCORE0; // pin 1
input  MD12_FPAD0; // pin 1
input  MD12_FCORE1; // pin 1
output MD12_TPAD1; // pin 1
output MD13_TCORE0; // pin 1
input  MD13_FPAD0; // pin 1
input  MD13_FCORE1; // pin 1
output MD13_TPAD1; // pin 1
output MD14_TCORE0; // pin 1
input  MD14_FPAD0; // pin 1
input  MD14_FCORE1; // pin 1
output MD14_TPAD1; // pin 1
output MD15_TCORE0; // pin 1
input  MD15_FPAD0; // pin 1
input  MD15_FCORE1; // pin 1
output MD15_TPAD1; // pin 1
output MD16_TCORE0; // pin 1
input  MD16_FPAD0; // pin 1
input  MD16_FCORE1; // pin 1
output MD16_TPAD1; // pin 1
output MD17_TCORE0; // pin 1
input  MD17_FPAD0; // pin 1
input  MD17_FCORE1; // pin 1
output MD17_TPAD1; // pin 1
output MD18_TCORE0; // pin 1
input  MD18_FPAD0; // pin 1
input  MD18_FCORE1; // pin 1
output MD18_TPAD1; // pin 1
output MD19_TCORE0; // pin 1
input  MD19_FPAD0; // pin 1
input  MD19_FCORE1; // pin 1
output MD19_TPAD1; // pin 1
output MD20_TCORE0; // pin 1
input  MD20_FPAD0; // pin 1
input  MD20_FCORE1; // pin 1
output MD20_TPAD1; // pin 1
output MD21_TCORE0; // pin 1
input  MD21_FPAD0; // pin 1
input  MD21_FCORE1; // pin 1
output MD21_TPAD1; // pin 1
output MD22_TCORE0; // pin 1
input  MD22_FPAD0; // pin 1
input  MD22_FCORE1; // pin 1
output MD22_TPAD1; // pin 1
output MD23_TCORE0; // pin 1
input  MD23_FPAD0; // pin 1
input  MD23_FCORE1; // pin 1
output MD23_TPAD1; // pin 1
output MD24_TCORE0; // pin 1
input  MD24_FPAD0; // pin 1
input  MD24_FCORE1; // pin 1
output MD24_TPAD1; // pin 1
output MD25_TCORE0; // pin 1
input  MD25_FPAD0; // pin 1
input  MD25_FCORE1; // pin 1
output MD25_TPAD1; // pin 1
output MD26_TCORE0; // pin 1
input  MD26_FPAD0; // pin 1
input  MD26_FCORE1; // pin 1
output MD26_TPAD1; // pin 1
output MD27_TCORE0; // pin 1
input  MD27_FPAD0; // pin 1
input  MD27_FCORE1; // pin 1
output MD27_TPAD1; // pin 1
output MD28_TCORE0; // pin 1
input  MD28_FPAD0; // pin 1
input  MD28_FCORE1; // pin 1
output MD28_TPAD1; // pin 1
output MD29_TCORE0; // pin 1
input  MD29_FPAD0; // pin 1
input  MD29_FCORE1; // pin 1
output MD29_TPAD1; // pin 1
output MD30_TCORE0; // pin 1
input  MD30_FPAD0; // pin 1
input  MD30_FCORE1; // pin 1
output MD30_TPAD1; // pin 1
output MD31_TCORE0; // pin 1
input  MD31_FPAD0; // pin 1
input  MD31_FCORE1; // pin 1
output MD31_TPAD1; // pin 1
output MD32_TCORE0; // pin 1
input  MD32_FPAD0; // pin 1
input  MD32_FCORE1; // pin 1
output MD32_TPAD1; // pin 1
output MD33_TCORE0; // pin 1
input  MD33_FPAD0; // pin 1
input  MD33_FCORE1; // pin 1
output MD33_TPAD1; // pin 1
output MD34_TCORE0; // pin 1
input  MD34_FPAD0; // pin 1
input  MD34_FCORE1; // pin 1
output MD34_TPAD1; // pin 1
output MD35_TCORE0; // pin 1
input  MD35_FPAD0; // pin 1
input  MD35_FCORE1; // pin 1
output MD35_TPAD1; // pin 1
output MD36_TCORE0; // pin 1
input  MD36_FPAD0; // pin 1
input  MD36_FCORE1; // pin 1
output MD36_TPAD1; // pin 1
output MD37_TCORE0; // pin 1
input  MD37_FPAD0; // pin 1
input  MD37_FCORE1; // pin 1
output MD37_TPAD1; // pin 1
output MD38_TCORE0; // pin 1
input  MD38_FPAD0; // pin 1
input  MD38_FCORE1; // pin 1
output MD38_TPAD1; // pin 1
output MD39_TCORE0; // pin 1
input  MD39_FPAD0; // pin 1
input  MD39_FCORE1; // pin 1
```

msp_bs_top_1ex.v

B-62

```
output MD39_TPAD1; // pin 1
output MD40_TCORE0; // pin 1
input  MD40_FPAD0; // pin 1
input  MD40_FCORE1; // pin 1
output MD40_TPAD1; // pin 1
output MD41_TCORE0; // pin 1
input  MD41_FPAD0; // pin 1
input  MD41_FCORE1; // pin 1
output MD41_TPAD1; // pin 1
output MD42_TCORE0; // pin 1
input  MD42_FPAD0; // pin 1
input  MD42_FCORE1; // pin 1
output MD42_TPAD1; // pin 1
input  MSPCK_FPAD_TCORE; // pin 1
output MD43_TCORE0; // pin 1
input  MD43_FPAD0; // pin 1
input  MD43_FCORE1; // pin 1
output MD43_TPAD1; // pin 1
output MD44_TCORE0; // pin 1
input  MD44_FPAD0; // pin 1
input  MD44_FCORE1; // pin 1
output MD44_TPAD1; // pin 1
output MD45_TCORE0; // pin 1
input  MD45_FPAD0; // pin 1
input  MD45_FCORE1; // pin 1
output MD45_TPAD1; // pin 1
output MD46_TCORE0; // pin 1
input  MD46_FPAD0; // pin 1
input  MD46_FCORE1; // pin 1
output MD46_TPAD1; // pin 1
output MD47_TCORE0; // pin 1
input  MD47_FPAD0; // pin 1
input  MD47_FCORE1; // pin 1
output MD47_TPAD1; // pin 1
output MD48_TCORE0; // pin 1
input  MD48_FPAD0; // pin 1
input  MD48_FCORE1; // pin 1
output MD48_TPAD1; // pin 1
output MD49_TCORE0; // pin 1
input  MD49_FPAD0; // pin 1
input  MD49_FCORE1; // pin 1
output MD49_TPAD1; // pin 1
output MD50_TCORE0; // pin 1
input  MD50_FPAD0; // pin 1
input  MD50_FCORE1; // pin 1
output MD50_TPAD1; // pin 1
output MD51_TCORE0; // pin 1
input  MD51_FPAD0; // pin 1
input  MD51_FCORE1; // pin 1
output MD51_TPAD1; // pin 1
output MD52_TCORE0; // pin 1
input  MD52_FPAD0; // pin 1
input  MD52_FCORE1; // pin 1
output MD52_TPAD1; // pin 1
output MD53_TCORE0; // pin 1
input  MD53_FPAD0; // pin 1
input  MD53_FCORE1; // pin 1
output MD53_TPAD1; // pin 1
output MD54_TCORE0; // pin 1
input  MD54_FPAD0; // pin 1
input  MD54_FCORE1; // pin 1
output MD54_TPAD1; // pin 1
output MD55_TCORE0; // pin 1
input  MD55_FPAD0; // pin 1
input  MD55_FCORE1; // pin 1
output MD55_TPAD1; // pin 1
output MD56_TCORE0; // pin 1
input  MD56_FPAD0; // pin 1
input  MD56_FCORE1; // pin 1
output MD56_TPAD1; // pin 1
output MD57_TCORE0; // pin 1
input  MD57_FPAD0; // pin 1
input  MD57_FCORE1; // pin 1
output MD57_TPAD1; // pin 1
output MD58_TCORE0; // pin 1
input  MD58_FPAD0; // pin 1
input  MD58_FCORE1; // pin 1
output MD58_TPAD1; // pin 1
output MD59_TCORE0; // pin 1
input  MD59_FPAD0; // pin 1
input  MD59_FCORE1; // pin 1
output MD59_TPAD1; // pin 1
output MD60_TCORE0; // pin 1
input  MD60_FPAD0; // pin 1
input  MD60_FCORE1; // pin 1
output MD60_TPAD1; // pin 1
output MD61_TCORE0; // pin 1
input  MD61_FPAD0; // pin 1
input  MD61_FCORE1; // pin 1
output MD61_TPAD1; // pin 1
output MD62_TCORE0; // pin 1
input  MD62_FPAD0; // pin 1
input  MD62_FCORE1; // pin 1
output MD62_TPAD1; // pin 1
output MD63_TCORE0; // pin 1
input  MD63_FPAD0; // pin 1
input  MD63_FCORE1; // pin 1
output MD63_TPAD1; // pin 1
output MA23_TPAD; // pin 1
input  MA23_FCORE; // pin 1
output MA24_TPAD; // pin 1
input  MA24_FCORE; // pin 1
output RESET0_TPAD; // pin 1
input  RESET0_FCORE; // pin 1
output TCS0L_TPAD; // pin 1
input  TCS0L_FCORE; // pin 1
output TCS1L_TPAD; // pin 1
input  TCS1L_FCORE; // pin 1
output PD15_PA15_TPAD; // pin 1
input  PD15_PA15_FCORE; // pin 1
output PD14_PA14_TPAD; // pin 1
input  PD14_PA14_FCORE; // pin 1
output PD13_PA13_TPAD; // pin 1
input  PD13_PA13_FCORE; // pin 1
output PD12_PA12_TPAD; // pin 1
input  PD12_PA12_FCORE; // pin 1
output PD11_PA11_TPAD; // pin 1
input  PD11_PA11_FCORE; // pin 1
output PD10_PA10_TPAD; // pin 1
input  PD10_PA10_FCORE; // pin 1
output PD9_PA9_TPAD; // pin 1
input  PD9_PA9_FCORE; // pin 1
```

B-63

```
output PD8_PA8_TPAD; // pin 1
input  PD8_PA8_FCORE; // pin 1
output PD7_PA7_TPAD; // pin 1
input  PD7_PA7_FCORE; // pin 1
output PD6_PA6_TPAD; // pin 1
input  PD6_PA6_FCORE; // pin 1
output PD5_PA5_TPAD; // pin 1
input  PD5_PA5_FCORE; // pin 1
output PD4_PA4_TPAD; // pin 1
input  PD4_PA4_FCORE; // pin 1
output PD3_PA3_TPAD; // pin 1
input  PD3_PA3_FCORE; // pin 1
output PD2_PA2_TPAD; // pin 1
input  PD2_PA2_FCORE; // pin 1
output PD1_PA1_TPAD; // pin 1
input  PD1_PA1_FCORE; // pin 1
output PD0_PA0_TPAD; // pin 1
input  PD0_PA0_FCORE; // pin 1
output C7_TCORE; // pin 1
input  C7_FPAD; // pin 1
output C6_TCORE; // pin 1
input  C6_FPAD; // pin 1
output C5_TCORE; // pin 1
input  C5_FPAD; // pin 1
output C4_TCORE; // pin 1
input  C4_FPAD; // pin 1
output C3_TCORE; // pin 1
input  C3_FPAD; // pin 1
output C2_TCORE; // pin 1
input  C2_FPAD; // pin 1
output C1_TCORE; // pin 1
input  C1_FPAD; // pin 1
output C0_TCORE; // pin 1
input  C0_FPAD; // pin 1
output PROMCSL_TPAD; // pin 1
input  PROMCSL_FCORE; // pin 1
output BGVS_TCORE; // pin 1
input  BGVS_FPAD; // pin 1
output BGHS_TCORE; // pin 1
input  BGHS_FPAD; // pin 1
output MSSEL_TPAD; // pin 1
input  MSSEL_FCORE; // pin 1
output BGCLK_TCORE; // pin 1
input  BGCLK_FPAD; // pin 1
output SCLK_TPAD; // pin 1
input  SCLK_FCORE; // pin 1
output SDAT_ENB_TPAD; // pin 1
input  SDAT_ENB_FCORE; // pin 1
output SDAT_TCORE0; // pin 1
input  SDAT_FPAD0; // pin 1
input  SDAT_FCORE1; // pin 1
output SDAT_TPAD1; // pin 1
output SFRS_TPAD; // pin 1
input  SFRS_FCORE; // pin 1
output SERIAL_IN_TCORE; // pin 1
input  SERIAL_IN_FPAD; // pin 1
output SERIAL_OUT_TPAD; // pin 1
input  SERIAL_OUT_FCORE; // pin 1
output A43SDFS_TCORE; // pin 1
input  A43SDFS_FPAD; // pin 1
output A43SCLK_TCORE; // pin 1
       input  A43SCLK_FPAD; // pin 1
       output A43SDI_TPAD; // pin 1
       input  A43SDI_FCORE; // pin 1
       output A43SDO_TCORE; // pin 1
       input  A43SDO_FPAD; // pin 1
//     input TDI ;     // pin 1
//     input TCK ;     // pin 1
//     output TDO ;    // pin 1
       input  tdi;
       output tdo;
       input  enb;
       input  setn;
       input  clockdra;
       input  clockdrb;
       input  updatedr;
       input  shiftdr;
       input  mode_c;
       input  mode_i;
       input  mode_o;

msp_bs_1ex MSP_BS_1EX (
       .INTAL_ENB_TPAD(INTAL_ENB_TPAD),
       .INTAL_ENB_FCORE(INTAL_ENB_FCORE),
       .RSTL_TCORE(RSTL_TCORE),
       .RSTL_FPAD(RSTL_FPAD),
       .PCICLK_TCORE(PCICLK_TCORE),
       .PCICLK_FPAD(PCICLK_FPAD),
       .GNTL_TCORE(GNTL_TCORE),
       .GNTL_FPAD(GNTL_FPAD),
       .REQL_ENB_TPAD(REQL_ENB_TPAD),
       .REQL_ENB_FCORE(REQL_ENB_FCORE),
       .REQL_TPAD(REQL_TPAD),
       .REQL_FCORE(REQL_FCORE),
       .AD31_ENB_TPAD(AD31_ENB_TPAD_net),
       .AD31_ENB_FCORE(AD31_ENB_FCORE),
       .AD31_TCORE0(AD31_TCORE0),
       .AD31_FPAD0(AD31_FPAD0),
       .AD31_FCORE1(AD31_FCORE1),
       .AD31_TPAD1(AD31_TPAD1),
       .AD30_TCORE0(AD30_TCORE0),
       .AD30_FPAD0(AD30_FPAD0),
       .AD30_FCORE1(AD30_FCORE1),
       .AD30_TPAD1(AD30_TPAD1),
       .AD29_TCORE0(AD29_TCORE0),
       .AD29_FPAD0(AD29_FPAD0),
       .AD29_FCORE1(AD29_FCORE1),
       .AD29_TPAD1(AD29_TPAD1),
       .AD28_TCORE0(AD28_TCORE0),
       .AD28_FPAD0(AD28_FPAD0),
       .AD28_FCORE1(AD28_FCORE1),
       .AD28_TPAD1(AD28_TPAD1),
       .AD27_TCORE0(AD27_TCORE0),
       .AD27_FPAD0(AD27_FPAD0),
       .AD27_FCORE1(AD27_FCORE1),
       .AD27_TPAD1(AD27_TPAD1),
       .AD26_TCORE0(AD26_TCORE0),
       .AD26_FPAD0(AD26_FPAD0),
       .AD26_FCORE1(AD26_FCORE1),
       .AD26_TPAD1(AD26_TPAD1),
       .AD25_S09_ENB_TPAD(AD25_S09_ENB_TPAD_net),
       .AD25_S09_ENB_FCORE(AD25_S09_ENB_FCORE),
```

msp_bs_top_1ex.v

B-64

```
.AD25_SO9_TCORE0(AD25_SO9_TCORE0),
.AD25_SO9_FPAD0(AD25_SO9_FPAD0),
.AD25_SO9_FCORE1(AD25_SO9_FCORE1),
.AD25_SO9_TPAD1(AD25_SO9_TPAD1),
.AD24_SO8_TCORE0(AD24_SO8_TCORE0),
.AD24_SO8_FPAD0(AD24_SO8_FPAD0),
.AD24_SO8_FCORE1(AD24_SO8_FCORE1),
.AD24_SO8_TPAD1(AD24_SO8_TPAD1),
.C_BE3L_ENB_TPAD(C_BE3L_ENB_TPAD),
.C_BE3L_ENB_FCORE(C_BE3L_ENB_FCORE),
.C_BE3L_TCORE0(C_BE3L_TCORE0),
.C_BE3L_FPAD0(C_BE3L_FPAD0),
.C_BE3L_FCORE1(C_BE3L_FCORE1),
.C_BE3L_TPAD1(C_BE3L_TPAD1),
.IDSEL_TCORE(IDSEL_TCORE),
.IDSEL_FPAD(IDSEL_FPAD),
.AD23_SO7_TCORE0(AD23_SO7_TCORE0),
.AD23_SO7_FPAD0(AD23_SO7_FPAD0),
.AD23_SO7_FCORE1(AD23_SO7_FCORE1),
.AD23_SO7_TPAD1(AD23_SO7_TPAD1),
.AD22_SO6_TCORE0(AD22_SO6_TCORE0),
.AD22_SO6_FPAD0(AD22_SO6_FPAD0),
.AD22_SO6_FCORE1(AD22_SO6_FCORE1),
.AD22_SO6_TPAD1(AD22_SO6_TPAD1),
.AD21_SO5_TCORE0(AD21_SO5_TCORE0),
.AD21_SO5_FPAD0(AD21_SO5_FPAD0),
.AD21_SO5_FCORE1(AD21_SO5_FCORE1),
.AD21_SO5_TPAD1(AD21_SO5_TPAD1),
.AD20_SO4_TCORE0(AD20_SO4_TCORE0),
.AD20_SO4_FPAD0(AD20_SO4_FPAD0),
.AD20_SO4_FCORE1(AD20_SO4_FCORE1),
.AD20_SO4_TPAD1(AD20_SO4_TPAD1),
.AD19_SO3_TCORE0(AD19_SO3_TCORE0),
.AD19_SO3_FPAD0(AD19_SO3_FPAD0),
.AD19_SO3_FCORE1(AD19_SO3_FCORE1),
.AD19_SO3_TPAD1(AD19_SO3_TPAD1),
.AD18_SO2_TCORE0(AD18_SO2_TCORE0),
.AD18_SO2_FPAD0(AD18_SO2_FPAD0),
.AD18_SO2_FCORE1(AD18_SO2_FCORE1),
.AD18_SO2_TPAD1(AD18_SO2_TPAD1),
.AD17_SO1_TCORE0(AD17_SO1_TCORE0),
.AD17_SO1_FPAD0(AD17_SO1_FPAD0),
.AD17_SO1_FCORE1(AD17_SO1_FCORE1),
.AD17_SO1_TPAD1(AD17_SO1_TPAD1),
.AD16_SO0_TCORE0(AD16_SO0_TCORE0),
.AD16_SO0_FPAD0(AD16_SO0_FPAD0),
.AD16_SO0_FCORE1(AD16_SO0_FCORE1),
.AD16_SO0_TPAD1(AD16_SO0_TPAD1),
.C_BE2L_TCORE0(C_BE2L_TCORE0),
.C_BE2L_FPAD0(C_BE2L_FPAD0),
.C_BE2L_FCORE1(C_BE2L_FCORE1),
.C_BE2L_TPAD1(C_BE2L_TPAD1),
.FRAMEL_ENB_TPAD(FRAMEL_ENB_TPAD),
.FRAMEL_ENB_FCORE(FRAMEL_ENB_FCORE),
.FRAMEL_TCORE0(FRAMEL_TCORE0),
.FRAMEL_FPAD0(FRAMEL_FPAD0),
.FRAMEL_FCORE1(FRAMEL_FCORE1),
.FRAMEL_TPAD1(FRAMEL_TPAD1),
.IRDYL_ENB_TPAD(IRDYL_ENB_TPAD),
.IRDYL_ENB_FCORE(IRDYL_ENB_FCORE),
.IRDYL_TCORE0(IRDYL_TCORE0),
.IRDYL_FPAD0(IRDYL_FPAD0),
.IRDYL_FCORE1(IRDYL_FCORE1),
.IRDYL_TPAD1(IRDYL_TPAD1),
.TRDYL_ENB_TPAD(TRDYL_ENB_TPAD),
.TRDYL_ENB_FCORE(TRDYL_ENB_FCORE),
.TRDYL_TCORE0(TRDYL_TCORE0),
.TRDYL_FPAD0(TRDYL_FPAD0),
.TRDYL_FCORE1(TRDYL_FCORE1),
.TRDYL_TPAD1(TRDYL_TPAD1),
.DVSELL_ENB_TPAD(DVSELL_ENB_TPAD),
.DVSELL_ENB_FCORE(DVSELL_ENB_FCORE),
.DVSELL_TCORE0(DVSELL_TCORE0),
.DVSELL_FPAD0(DVSELL_FPAD0),
.DVSELL_FCORE1(DVSELL_FCORE1),
.DVSELL_TPAD1(DVSELL_TPAD1),
.STOPL_ENB_TPAD(STOPL_ENB_TPAD),
.STOPL_ENB_FCORE(STOPL_ENB_FCORE),
.STOPL_TCORE0(STOPL_TCORE0),
.STOPL_FPAD0(STOPL_FPAD0),
.STOPL_FCORE1(STOPL_FCORE1),
.STOPL_TPAD1(STOPL_TPAD1),
.LOCKL_ENB_TPAD(LOCKL_ENB_TPAD),
.LOCKL_ENB_FCORE(LOCKL_ENB_FCORE),
.LOCKL_TCORE0(LOCKL_TCORE0),
.LOCKL_FPAD0(LOCKL_FPAD0),
.LOCKL_FCORE1(LOCKL_FCORE1),
.LOCKL_TPAD1(LOCKL_TPAD1),
.PERRL_ENB_TPAD(PERRL_ENB_TPAD),
.PERRL_ENB_FCORE(PERRL_ENB_FCORE),
.PERRL_TCORE0(PERRL_TCORE0),
.PERRL_FPAD0(PERRL_FPAD0),
.PERRL_FCORE1(PERRL_FCORE1),
.PERRL_TPAD1(PERRL_TPAD1),
.SERRL_ENB_TPAD(SERRL_ENB_TPAD),
.SERRL_ENB_FCORE(SERRL_ENB_FCORE),
// @@@ .SERRL_TCORE0(SERRL_TCORE0),
// @@@ .SERRL_FPAD0(SERRL_FPAD0),
.SERRL_TCORE(SERRL_TCORE),
.SERRL_FPAD(SERRL_FPAD),
// @@@ .SERRL_FCORE1(SERRL_FCORE1),
// @@@ .SERRL_TPAD1(SERRL_TPAD1),
.TCA_TCORE(TCA_TCORE),
.TCA_FPAD(TCA_FPAD),
.PAR_ENB_TPAD(PAR_ENB_TPAD),
.PAR_ENB_FCORE(PAR_ENB_FCORE),
.PAR_TCORE0(PAR_TCORE0),
.PAR_FPAD0(PAR_FPAD0),
.PAR_FCORE1(PAR_FCORE1),
.PAR_TPAD1(PAR_TPAD1),
.C_BE1L_TCORE0(C_BE1L_TCORE0),
.C_BE1L_FPAD0(C_BE1L_FPAD0),
.C_BE1L_FCORE1(C_BE1L_FCORE1),
.C_BE1L_TPAD1(C_BE1L_TPAD1),
.AD15_SI9_ENB_TPAD(AD15_SI9_ENB_TPAD_net),
.AD15_SI9_ENB_FCORE(AD15_SI9_ENB_FCORE),
.AD15_SI9_TCORE0(AD15_SI9_TCORE0),
.AD15_SI9_FPAD0(AD15_SI9_FPAD0),
.AD15_SI9_FCORE1(AD15_SI9_FCORE1),
.AD15_SI9_TPAD1(AD15_SI9_TPAD1),
.AD14_SI8_TCORE0(AD14_SI8_TCORE0),
.AD14_SI8_FPAD0(AD14_SI8_FPAD0),
```

msp_bs_top_1ex.v

B-65

```
.AD14_SI8_FCORE1(AD14_SI8_FCORE1),
.AD14_SI8_TPAD1(AD14_SI8_TPAD1),
.AD13_SI7_TCORE0(AD13_SI7_TCORE0),
.AD13_SI7_FPAD0(AD13_SI7_FPAD0),
.AD13_SI7_FCORE1(AD13_SI7_FCORE1),
.AD13_SI7_TPAD1(AD13_SI7_TPAD1),
.AD12_SI6_TCORE0(AD12_SI6_TCORE0),
.AD12_SI6_FPAD0(AD12_SI6_FPAD0),
.AD12_SI6_FCORE1(AD12_SI6_FCORE1),
.AD12_SI6_TPAD1(AD12_SI6_TPAD1),
.AD11_SI5_TCORE0(AD11_SI5_TCORE0),
.AD11_SI5_FPAD0(AD11_SI5_FPAD0),
.AD11_SI5_FCORE1(AD11_SI5_FCORE1),
.AD11_SI5_TPAD1(AD11_SI5_TPAD1),
.AD10_SI4_TCORE0(AD10_SI4_TCORE0),
.AD10_SI4_FPAD0(AD10_SI4_FPAD0),
.AD10_SI4_FCORE1(AD10_SI4_FCORE1),
.AD10_SI4_TPAD1(AD10_SI4_TPAD1),
.AD09_SI3_TCORE0(AD09_SI3_TCORE0),
.AD09_SI3_FPAD0(AD09_SI3_FPAD0),
.AD09_SI3_FCORE1(AD09_SI3_FCORE1),
.AD09_SI3_TPAD1(AD09_SI3_TPAD1),
.AD08_SI2_TCORE0(AD08_SI2_TCORE0),
.AD08_SI2_FPAD0(AD08_SI2_FPAD0),
.AD08_SI2_FCORE1(AD08_SI2_FCORE1),
.AD08_SI2_TPAD1(AD08_SI2_TPAD1),
.C_BEOL_TCORE0(C_BEOL_TCORE0),
.C_BEOL_FPAD0(C_BEOL_FPAD0),
.C_BEOL_FCORE1(C_BEOL_FCORE1),
.C_BEOL_TPAD1(C_BEOL_TPAD1),
.TCB_TCORE(TCB_TCORE),
.TCB_FPAD(TCB_FPAD),
.TM_TCORE(TM_TCORE),
.TM_FPAD(TM_FPAD),
.AD07_SI1_TCORE0(AD07_SI1_TCORE0),
.AD07_SI1_FPAD0(AD07_SI1_FPAD0),
.AD07_SI1_FCORE1(AD07_SI1_FCORE1),
.AD07_SI1_TPAD1(AD07_SI1_TPAD1),
.AD06_SI0_TCORE0(AD06_SI0_TCORE0),
.AD06_SI0_FPAD0(AD06_SI0_FPAD0),
.AD06_SI0_FCORE1(AD06_SI0_FCORE1),
.AD06_SI0_TPAD1(AD06_SI0_TPAD1),
.AD05_MT5_ENB_TPAD(AD05_MT5_ENB_TPAD_net),
.AD05_MT5_ENB_FCORE(AD05_MT5_ENB_FCORE),
.AD05_MT5_TCORE0(AD05_MT5_TCORE0),
.AD05_MT5_FPAD0(AD05_MT5_FPAD0),
.AD05_MT5_FCORE1(AD05_MT5_FCORE1),
.AD05_MT5_TPAD1(AD05_MT5_TPAD1),
.AD04_MT4_TCORE0(AD04_MT4_TCORE0),
.AD04_MT4_FPAD0(AD04_MT4_FPAD0),
.AD04_MT4_FCORE1(AD04_MT4_FCORE1),
.AD04_MT4_TPAD1(AD04_MT4_TPAD1),
.AD03_MT3_TCORE0(AD03_MT3_TCORE0),
.AD03_MT3_FPAD0(AD03_MT3_FPAD0),
.AD03_MT3_FCORE1(AD03_MT3_FCORE1),
.AD03_MT3_TPAD1(AD03_MT3_TPAD1),
.AD02_MT2_ENB_TPAD(AD02_MT2_ENB_TPAD_net),
.AD02_MT2_ENB_FCORE(AD02_MT2_ENB_FCORE),
.AD02_MT2_TCORE0(AD02_MT2_TCORE0),
.AD02_MT2_FPAD0(AD02_MT2_FPAD0),
.AD02_MT2_FCORE1(AD02_MT2_FCORE1),
.AD02_MT2_TPAD1(AD02_MT2_TPAD1),
.AD01_MT1_TCORE0(AD01_MT1_TCORE0),
.AD01_MT1_FPAD0(AD01_MT1_FPAD0),
.AD01_MT1_FCORE1(AD01_MT1_FCORE1),
.AD01_MT1_TPAD1(AD01_MT1_TPAD1),
.AD00_MT0_TCORE0(AD00_MT0_TCORE0),
.AD00_MT0_FPAD0(AD00_MT0_FPAD0),
.AD00_MT0_FCORE1(AD00_MT0_FCORE1),
.AD00_MT0_TPAD1(AD00_MT0_TPAD1),
.MA11_TPAD(MA11_TPAD),
.MA11_FCORE(MA11_FCORE),
.MA10_TPAD(MA10_TPAD),
.MA10_FCORE(MA10_FCORE),
.MA9_TPAD(MA9_TPAD),
.MA9_FCORE(MA9_FCORE),
.MA8_TPAD(MA8_TPAD),
.MA8_FCORE(MA8_FCORE),
.MA7_TPAD(MA7_TPAD),
.MA7_FCORE(MA7_FCORE),
.MA6_TPAD(MA6_TPAD),
.MA6_FCORE(MA6_FCORE),
.MA5_TPAD(MA5_TPAD),
.MA5_FCORE(MA5_FCORE),
.MA4_TPAD(MA4_TPAD),
.MA4_FCORE(MA4_FCORE),
.MA3_TPAD(MA3_TPAD),
.MA3_FCORE(MA3_FCORE),
.MA2_TPAD(MA2_TPAD),
.MA2_FCORE(MA2_FCORE),
.MA1_TPAD(MA1_TPAD),
.MA1_FCORE(MA1_FCORE),
.MA0_TPAD(MA0_TPAD),
.MA0_FCORE(MA0_FCORE),
.RAS1L_TPAD(RAS1L_TPAD),
.RAS1L_FCORE(RAS1L_FCORE),
.CAS1L_TPAD(CAS1L_TPAD),
.CAS1L_FCORE(CAS1L_FCORE),
.MWEL_TPAD(MWEL_TPAD),
.MWEL_FCORE(MWEL_FCORE),
.DQM_TPAD(DQM_TPAD),
.DQM_FCORE(DQM_FCORE),
// .MCS0L_TPAD(MCS0L_TPAD),
.MCS0L_TPAD(norm_csn0),
.MCS0L_FCORE(MCS0L_FCORE),
// .MCS1L_TPAD(MCS1L_TPAD),
.MCS1L_TPAD(norm_csn1),
.MCS1L_FCORE(MCS1L_FCORE),
.MCKE_TPAD(MCKE_TPAD),
.MCKE_FCORE(MCKE_FCORE),
.MRDYH_TCORE(MRDYH_TCORE),
.MRDYH_FPAD(MRDYH_FPAD),
.MD0_ENB_TPAD(MD0_ENB_TPAD),
.MD0_ENB_FCORE(MD0_ENB_FCORE),
.MD0_TCORE0(MD0_TCORE0),
.MD0_FPAD0(MD0_FPAD0),
.MD0_FCORE1(MD0_FCORE1),
.MD0_TPAD1(MD0_TPAD1),
.MD1_TCORE0(MD1_TCORE0),
.MD1_FPAD0(MD1_FPAD0),
.MD1_FCORE1(MD1_FCORE1),
.MD1_TPAD1(MD1_TPAD1),
```

msp_bs_top_1ex.v

B-66

```
.MD2_TCORE0(MD2_TCORE0),
.MD2_FPAD0(MD2_FPAD0),
.MD2_FCORE1(MD2_FCORE1),
.MD2_TPAD1(MD2_TPAD1),
.MD3_TCORE0(MD3_TCORE0),
.MD3_FPAD0(MD3_FPAD0),
.MD3_FCORE1(MD3_FCORE1),
.MD3_TPAD1(MD3_TPAD1),
.MD4_TCORE0(MD4_TCORE0),
.MD4_FPAD0(MD4_FPAD0),
.MD4_FCORE1(MD4_FCORE1),
.MD4_TPAD1(MD4_TPAD1),
.MD5_TCORE0(MD5_TCORE0),
.MD5_FPAD0(MD5_FPAD0),
.MD5_FCORE1(MD5_FCORE1),
.MD5_TPAD1(MD5_TPAD1),
.MD6_TCORE0(MD6_TCORE0),
.MD6_FPAD0(MD6_FPAD0),
.MD6_FCORE1(MD6_FCORE1),
.MD6_TPAD1(MD6_TPAD1),
.MD7_TCORE0(MD7_TCORE0),
.MD7_FPAD0(MD7_FPAD0),
.MD7_FCORE1(MD7_FCORE1),
.MD7_TPAD1(MD7_TPAD1),
.MD8_TCORE0(MD8_TCORE0),
.MD8_FPAD0(MD8_FPAD0),
.MD8_FCORE1(MD8_FCORE1),
.MD8_TPAD1(MD8_TPAD1),
.MD9_TCORE0(MD9_TCORE0),
.MD9_FPAD0(MD9_FPAD0),
.MD9_FCORE1(MD9_FCORE1),
.MD9_TPAD1(MD9_TPAD1),
.MD10_TCORE0(MD10_TCORE0),
.MD10_FPAD0(MD10_FPAD0),
.MD10_FCORE1(MD10_FCORE1),
.MD10_TPAD1(MD10_TPAD1),
.MD11_TCORE0(MD11_TCORE0),
.MD11_FPAD0(MD11_FPAD0),
.MD11_FCORE1(MD11_FCORE1),
.MD11_TPAD1(MD11_TPAD1),
.MD12_TCORE0(MD12_TCORE0),
.MD12_FPAD0(MD12_FPAD0),
.MD12_FCORE1(MD12_FCORE1),
.MD12_TPAD1(MD12_TPAD1),
.MD13_TCORE0(MD13_TCORE0),
.MD13_FPAD0(MD13_FPAD0),
.MD13_FCORE1(MD13_FCORE1),
.MD13_TPAD1(MD13_TPAD1),
.MD14_TCORE0(MD14_TCORE0),
.MD14_FPAD0(MD14_FPAD0),
.MD14_FCORE1(MD14_FCORE1),
.MD14_TPAD1(MD14_TPAD1),
.MD15_TCORE0(MD15_TCORE0),
.MD15_FPAD0(MD15_FPAD0),
.MD15_FCORE1(MD15_FCORE1),
.MD15_TPAD1(MD15_TPAD1),
.MD16_TCORE0(MD16_TCORE0),
.MD16_FPAD0(MD16_FPAD0),
.MD16_FCORE1(MD16_FCORE1),
.MD16_TPAD1(MD16_TPAD1),
.MD17_TCORE0(MD17_TCORE0),
.MD17_FPAD0(MD17_FPAD0),
.MD17_FCORE1(MD17_FCORE1),
.MD17_TPAD1(MD17_TPAD1),
.MD18_TCORE0(MD18_TCORE0),
.MD18_FPAD0(MD18_FPAD0),
.MD18_FCORE1(MD18_FCORE1),
.MD18_TPAD1(MD18_TPAD1),
.MD19_TCORE0(MD19_TCORE0),
.MD19_FPAD0(MD19_FPAD0),
.MD19_FCORE1(MD19_FCORE1),
.MD19_TPAD1(MD19_TPAD1),
.MD20_TCORE0(MD20_TCORE0),
.MD20_FPAD0(MD20_FPAD0),
.MD20_FCORE1(MD20_FCORE1),
.MD20_TPAD1(MD20_TPAD1),
.MD21_TCORE0(MD21_TCORE0),
.MD21_FPAD0(MD21_FPAD0),
.MD21_FCORE1(MD21_FCORE1),
.MD21_TPAD1(MD21_TPAD1),
.MD22_TCORE0(MD22_TCORE0),
.MD22_FPAD0(MD22_FPAD0),
.MD22_FCORE1(MD22_FCORE1),
.MD22_TPAD1(MD22_TPAD1),
.MD23_TCORE0(MD23_TCORE0),
.MD23_FPAD0(MD23_FPAD0),
.MD23_FCORE1(MD23_FCORE1),
.MD23_TPAD1(MD23_TPAD1),
.MD24_TCORE0(MD24_TCORE0),
.MD24_FPAD0(MD24_FPAD0),
.MD24_FCORE1(MD24_FCORE1),
.MD24_TPAD1(MD24_TPAD1),
.MD25_TCORE0(MD25_TCORE0),
.MD25_FPAD0(MD25_FPAD0),
.MD25_FCORE1(MD25_FCORE1),
.MD25_TPAD1(MD25_TPAD1),
.MD26_TCORE0(MD26_TCORE0),
.MD26_FPAD0(MD26_FPAD0),
.MD26_FCORE1(MD26_FCORE1),
.MD26_TPAD1(MD26_TPAD1),
.MD27_TCORE0(MD27_TCORE0),
.MD27_FPAD0(MD27_FPAD0),
.MD27_FCORE1(MD27_FCORE1),
.MD27_TPAD1(MD27_TPAD1),
.MD28_TCORE0(MD28_TCORE0),
.MD28_FPAD0(MD28_FPAD0),
.MD28_FCORE1(MD28_FCORE1),
.MD28_TPAD1(MD28_TPAD1),
.MD29_TCORE0(MD29_TCORE0),
.MD29_FPAD0(MD29_FPAD0),
.MD29_FCORE1(MD29_FCORE1),
.MD29_TPAD1(MD29_TPAD1),
.MD30_TCORE0(MD30_TCORE0),
.MD30_FPAD0(MD30_FPAD0),
.MD30_FCORE1(MD30_FCORE1),
.MD30_TPAD1(MD30_TPAD1),
.MD31_TCORE0(MD31_TCORE0),
.MD31_FPAD0(MD31_FPAD0),
.MD31_FCORE1(MD31_FCORE1),
.MD31_TPAD1(MD31_TPAD1),
.MD32_TCORE0(MD32_TCORE0),
.MD32_FPAD0(MD32_FPAD0),
```

msp_bs_top_1ex.v

B-67

```
.MD32_FCORE1(MD32_FCORE1),
.MD32_TPAD1(MD32_TPAD1),
.MD33_TCORE0(MD33_TCORE0),
.MD33_FPAD0(MD33_FPAD0),
.MD33_FCORE1(MD33_FCORE1),
.MD33_TPAD1(MD33_TPAD1),
.MD34_TCORE0(MD34_TCORE0),
.MD34_FPAD0(MD34_FPAD0),
.MD34_FCORE1(MD34_FCORE1),
.MD34_TPAD1(MD34_TPAD1),
.MD35_TCORE0(MD35_TCORE0),
.MD35_FPAD0(MD35_FPAD0),
.MD35_FCORE1(MD35_FCORE1),
.MD35_TPAD1(MD35_TPAD1),
.MD36_TCORE0(MD36_TCORE0),
.MD36_FPAD0(MD36_FPAD0),
.MD36_FCORE1(MD36_FCORE1),
.MD36_TPAD1(MD36_TPAD1),
.MD37_TCORE0(MD37_TCORE0),
.MD37_FPAD0(MD37_FPAD0),
.MD37_FCORE1(MD37_FCORE1),
.MD37_TPAD1(MD37_TPAD1),
.MD38_TCORE0(MD38_TCORE0),
.MD38_FPAD0(MD38_FPAD0),
.MD38_FCORE1(MD38_FCORE1),
.MD38_TPAD1(MD38_TPAD1),
.MD39_TCORE0(MD39_TCORE0),
.MD39_FPAD0(MD39_FPAD0),
.MD39_FCORE1(MD39_FCORE1),
.MD39_TPAD1(MD39_TPAD1),
.MD40_TCORE0(MD40_TCORE0),
.MD40_FPAD0(MD40_FPAD0),
.MD40_FCORE1(MD40_FCORE1),
.MD40_TPAD1(MD40_TPAD1),
.MD41_TCORE0(MD41_TCORE0),
.MD41_FPAD0(MD41_FPAD0),
.MD41_FCORE1(MD41_FCORE1),
.MD41_TPAD1(MD41_TPAD1),
.MD42_TCORE0(MD42_TCORE0),
.MD42_FPAD0(MD42_FPAD0),
.MD42_FCORE1(MD42_FCORE1),
.MD42_TPAD1(MD42_TPAD1),
.MSPCK_FPAD_TCORE(MSPCK_FPAD_TCORE),
.MD43_TCORE0(MD43_TCORE0),
.MD43_FPAD0(MD43_FPAD0),
.MD43_FCORE1(MD43_FCORE1),
.MD43_TPAD1(MD43_TPAD1),
.MD44_TCORE0(MD44_TCORE0),
.MD44_FPAD0(MD44_FPAD0),
.MD44_FCORE1(MD44_FCORE1),
.MD44_TPAD1(MD44_TPAD1),
.MD45_TCORE0(MD45_TCORE0),
.MD45_FPAD0(MD45_FPAD0),
.MD45_FCORE1(MD45_FCORE1),
.MD45_TPAD1(MD45_TPAD1),
.MD46_TCORE0(MD46_TCORE0),
.MD46_FPAD0(MD46_FPAD0),
.MD46_FCORE1(MD46_FCORE1),
.MD46_TPAD1(MD46_TPAD1),
.MD47_TCORE0(MD47_TCORE0),
.MD47_FPAD0(MD47_FPAD0),
.MD47_FCORE1(MD47_FCORE1),
.MD47_TPAD1(MD47_TPAD1),
.MD48_TCORE0(MD48_TCORE0),
.MD48_FPAD0(MD48_FPAD0),
.MD48_FCORE1(MD48_FCORE1),
.MD48_TPAD1(MD48_TPAD1),
.MD49_TCORE0(MD49_TCORE0),
.MD49_FPAD0(MD49_FPAD0),
.MD49_FCORE1(MD49_FCORE1),
.MD49_TPAD1(MD49_TPAD1),
.MD50_TCORE0(MD50_TCORE0),
.MD50_FPAD0(MD50_FPAD0),
.MD50_FCORE1(MD50_FCORE1),
.MD50_TPAD1(MD50_TPAD1),
.MD51_TCORE0(MD51_TCORE0),
.MD51_FPAD0(MD51_FPAD0),
.MD51_FCORE1(MD51_FCORE1),
.MD51_TPAD1(MD51_TPAD1),
.MD52_TCORE0(MD52_TCORE0),
.MD52_FPAD0(MD52_FPAD0),
.MD52_FCORE1(MD52_FCORE1),
.MD52_TPAD1(MD52_TPAD1),
.MD53_TCORE0(MD53_TCORE0),
.MD53_FPAD0(MD53_FPAD0),
.MD53_FCORE1(MD53_FCORE1),
.MD53_TPAD1(MD53_TPAD1),
.MD54_TCORE0(MD54_TCORE0),
.MD54_FPAD0(MD54_FPAD0),
.MD54_FCORE1(MD54_FCORE1),
.MD54_TPAD1(MD54_TPAD1),
.MD55_TCORE0(MD55_TCORE0),
.MD55_FPAD0(MD55_FPAD0),
.MD55_FCORE1(MD55_FCORE1),
.MD55_TPAD1(MD55_TPAD1),
.MD56_TCORE0(MD56_TCORE0),
.MD56_FPAD0(MD56_FPAD0),
.MD56_FCORE1(MD56_FCORE1),
.MD56_TPAD1(MD56_TPAD1),
.MD57_TCORE0(MD57_TCORE0),
.MD57_FPAD0(MD57_FPAD0),
.MD57_FCORE1(MD57_FCORE1),
.MD57_TPAD1(MD57_TPAD1),
.MD58_TCORE0(MD58_TCORE0),
.MD58_FPAD0(MD58_FPAD0),
.MD58_FCORE1(MD58_FCORE1),
.MD58_TPAD1(MD58_TPAD1),
.MD59_TCORE0(MD59_TCORE0),
.MD59_FPAD0(MD59_FPAD0),
.MD59_FCORE1(MD59_FCORE1),
.MD59_TPAD1(MD59_TPAD1),
.MD60_TCORE0(MD60_TCORE0),
.MD60_FPAD0(MD60_FPAD0),
.MD60_FCORE1(MD60_FCORE1),
.MD60_TPAD1(MD60_TPAD1),
.MD61_TCORE0(MD61_TCORE0),
.MD61_FPAD0(MD61_FPAD0),
.MD61_FCORE1(MD61_FCORE1),
.MD61_TPAD1(MD61_TPAD1),
.MD62_TCORE0(MD62_TCORE0),
.MD62_FPAD0(MD62_FPAD0),
.MD62_FCORE1(MD62_FCORE1),
```

msp_bs_top_1ex.v

B-68

```
.MD62_TPAD1(MD62_TPAD1),
.MD63_TCORE0(MD63_TCORE0),
.MD63_FPAD0(MD63_FPAD0),
.MD63_FCORE1(MD63_FCORE1),
.MD63_TPAD1(MD63_TPAD1),
.MA23_TPAD(MA23_TPAD),
.MA23_FCORE(MA23_FCORE),
.MA24_TPAD(MA24_TPAD),
.MA24_FCORE(MA24_FCORE),
.RESET0_TPAD(RESET0_TPAD),
.RESET0_FCORE(RESET0_FCORE),
.TCS0L_TPAD(TCS0L_TPAD),
.TCS0L_FCORE(TCS0L_FCORE),
.TCS1L_TPAD(TCS1L_TPAD),
.TCS1L_FCORE(TCS1L_FCORE),
.PD15_PA15_TPAD(PD15_PA15_TPAD),
.PD15_PA15_FCORE(PD15_PA15_FCORE),
.PD14_PA14_TPAD(PD14_PA14_TPAD),
.PD14_PA14_FCORE(PD14_PA14_FCORE),
.PD13_PA13_TPAD(PD13_PA13_TPAD),
.PD13_PA13_FCORE(PD13_PA13_FCORE),
.PD12_PA12_TPAD(PD12_PA12_TPAD),
.PD12_PA12_FCORE(PD12_PA12_FCORE),
.PD11_PA11_TPAD(PD11_PA11_TPAD),
.PD11_PA11_FCORE(PD11_PA11_FCORE),
.PD10_PA10_TPAD(PD10_PA10_TPAD),
.PD10_PA10_FCORE(PD10_PA10_FCORE),
.PD9_PA9_TPAD(PD9_PA9_TPAD),
.PD9_PA9_FCORE(PD9_PA9_FCORE),
.PD8_PA8_TPAD(PD8_PA8_TPAD),
.PD8_PA8_FCORE(PD8_PA8_FCORE),
.PD7_PA7_TPAD(PD7_PA7_TPAD),
.PD7_PA7_FCORE(PD7_PA7_FCORE),
.PD6_PA6_TPAD(PD6_PA6_TPAD),
.PD6_PA6_FCORE(PD6_PA6_FCORE),
.PD5_PA5_TPAD(PD5_PA5_TPAD),
.PD5_PA5_FCORE(PD5_PA5_FCORE),
.PD4_PA4_TPAD(PD4_PA4_TPAD),
.PD4_PA4_FCORE(PD4_PA4_FCORE),
.PD3_PA3_TPAD(PD3_PA3_TPAD),
.PD3_PA3_FCORE(PD3_PA3_FCORE),
.PD2_PA2_TPAD(PD2_PA2_TPAD),
.PD2_PA2_FCORE(PD2_PA2_FCORE),
.PD1_PA1_TPAD(PD1_PA1_TPAD),
.PD1_PA1_FCORE(PD1_PA1_FCORE),
.PD0_PA0_TPAD(PD0_PA0_TPAD),
.PD0_PA0_FCORE(PD0_PA0_FCORE),
.C7_TCORE(C7_TCORE),
.C7_FPAD(C7_FPAD),
.C6_TCORE(C6_TCORE),
.C6_FPAD(C6_FPAD),
.C5_TCORE(C5_TCORE),
.C5_FPAD(C5_FPAD),
.C4_TCORE(C4_TCORE),
.C4_FPAD(C4_FPAD),
.C3_TCORE(C3_TCORE),
.C3_FPAD(C3_FPAD),
.C2_TCORE(C2_TCORE),
.C2_FPAD(C2_FPAD),
.C1_TCORE(C1_TCORE),
.C1_FPAD(C1_FPAD),
.C0_TCORE(C0_TCORE),
.C0_FPAD(C0_FPAD),
.PROMCSL_TPAD(PROMCSL_TPAD),
.PROMCSL_FCORE(PROMCSL_FCORE),
.BGVS_TCORE(BGVS_TCORE),
.BGVS_FPAD(BGVS_FPAD),
.BGHS_TCORE(BGHS_TCORE),
.BGHS_FPAD(BGHS_FPAD),
.MSSEL_TPAD(MSSEL_TPAD),
.MSSEL_FCORE(MSSEL_FCORE),
.BGCLK_TCORE(BGCLK_TCORE),
.BGCLK_FPAD(BGCLK_FPAD),
.SCLK_TPAD(SCLK_TPAD),
.SCLK_FCORE(SCLK_FCORE),
.SDAT_ENB_TPAD(SDAT_ENB_TPAD),
.SDAT_ENB_FCORE(SDAT_ENB_FCORE),
.SDAT_TCORE0(SDAT_TCORE0),
.SDAT_FPAD0(SDAT_FPAD0),
.SDAT_FCORE1(SDAT_FCORE1),
.SDAT_TPAD1(SDAT_TPAD1),
.SFRS_TPAD(SFRS_TPAD),
.SFRS_FCORE(SFRS_FCORE),
.SERIAL_IN_TCORE(SERIAL_IN_TCORE),
.SERIAL_IN_FPAD(SERIAL_IN_FPAD),
.SERIAL_OUT_TPAD(SERIAL_OUT_TPAD),
.SERIAL_OUT_FCORE(SERIAL_OUT_FCORE),
.A43SDFS_TCORE(A43SDFS_TCORE),
.A43SDFS_FPAD(A43SDFS_FPAD),
.A43SCLK_TCORE(A43SCLK_TCORE),
.A43SCLK_FPAD(A43SCLK_FPAD),
.A43SDI_TPAD(A43SDI_TPAD),
.A43SDI_FCORE(A43SDI_FCORE),
.A43SDO_TCORE(A43SDO_TCORE),
.A43SDO_FPAD(A43SDO_FPAD),
.tdi(tdi),
.tdo(tdo),
.enb(enb),
.setn(setn),
.clockdra(clockdra),
.clockdrb(clockdrb),
.updatedr(updatedr),
.shiftdr(shiftdr),
.mode_c(mode_c),
.mode_i(mode_i),
.mode_o(mode_o),
.dbsr_select(dbsr_select),
.dbsr_scan_out(dbsr_scan_out),
.dbsr_en(dbsr_en)
);

 // @@@  Configure the scan in and scan out pins in multiple scan mode
 nid2  INS2 (.Y(AD31_ENB_FCORE), .A(ad_enb_fcore));
 nid2  INS7 (.Y(AD02_MT2_ENB_FCORE), .A(ad_enb_fcore));

 // @@@ ad2d2 INS3 (.Y(AD25_SO9_ENB_FCORE), .A(net1), .B(ad_enb_fcore));
 // @@@ iv    INS4 (.Y(net1), .A(multiple_scan_mode));
 // @@@ or2   INS5 (.Y(AD15_SI9_ENB_FCORE), .A(ad_enb_fcore), .B(multiple_scan_m
ode));
 // @@@ or2   INS6 (.Y(AD05_MT5_ENB_FCORE), .A(ad_enb_fcore), .B(multiple_scan_m
ode));
```

msp_bs_top_1ex.v

B-69

```
or2     INS3 (.Y(AD25_SO9_ENB_FCORE), .A(multiple_scan_mode), .B(ad_enb_fcore))
;
iv      INS4 (.Y(net1), .A(multiple_scan_mode));
ad2d2   INS5 (.Y(AD15_SI9_ENB_FCORE), .A(ad_enb_fcore), .B(net1));
ad2d2   INS6 (.Y(AD05_MT5_ENB_FCORE), .A(ad_enb_fcore), .B(net1));

or2 gDbsrEn(.A(enb), .B(dbsr_select), .Y(dbsr_en));
mx2 gCsn0(.D0(norm_csn0), .D1(sdram_bs_csn), .S(sdram_csn_sel), .Y(MCS0L_TPAD))
;
mx2 gCsn1(.D0(norm_csn1), .D1(sdram_bs_csn), .S(sdram_csn_sel), .Y(MCS1L_TPAD))
;

// @@@ Adding buffer to the driver to PCI enable signal
nid2  add_buf1 (.Y(AD31_ENB_TPAD),      .A(AD31_ENB_TPAD_net) );
nid2  add_buf2 (.Y(AD25_SO9_ENB_TPAD), .A(AD25_SO9_ENB_TPAD_net) );
nid2  add_buf3 (.Y(AD15_SI9_ENB_TPAD), .A(AD15_SI9_ENB_TPAD_net) );
nid2  add_buf4 (.Y(AD05_MT5_ENB_TPAD), .A(AD05_MT5_ENB_TPAD_net) );
nid2  add_buf5 (.Y(AD02_MT2_ENB_TPAD), .A(AD02_MT2_ENB_TPAD_net) );

endmodule
```

msp_bs_top_1ex.v 13-70

```
//--------------------------------------------------------------
//Copyright (c) 1996 Samsung Semiconductor Inc.
//--------------------------------------------------------------
//Contact :
//        Sanghyeon Baeg,
//        Samsung Semiconductor Inc.
//        3655 N. 1st Street
//        San Jose, CA 95134
//        (415) 954-7005
//--------------------------------------------------------------

module msp_jtag (
  // Outputs
   tdo_data, tdo_enb, rti, ud,
   rf_sclka, idc_sclka, iec_sclka, lae_sclka,
   pda_sclka, mf_sclka, bci_sclka, iof_sclka,
   falu_sclka, exu_dp_sclka, mul_sclka, ifdm_dp_sclka,
   lsu_dp_sclka, ccu_dp_sclka, mcueh_dp_sclka, pcibp_dp_sclka,
   codec_dp_sclka,
   rf_sclkb, idc_sclkb, iec_sclkb, lae_sclkb,
   pda_sclkb, mf_sclkb, bci_sclkb, iof_sclkb,
   falu_sclkb, exu_dp_sclkb, mul_sclkb, ifdm_dp_sclkb,
   lsu_dp_sclkb, ccu_dp_sclkb, mcueh_dp_sclkb, pcibp_dp_sclkb,
   codec_dp_sclkb,
   scan_test_mode,
   rf_scan_in, idc_scan_in, iec_scan_in, lae_scan_in,
   pda_scan_in, mf_scan_in, bci_scan_in, iof_scan_in,
   falu_scan_in, exu_dp_scan_in, mul_scan_in, ifdm_dp_scan_in,
   lsu_dp_scan_in, ccu_dp_scan_in, mcueh_dp_scan_in, pcibp_dp_scan_in,
   codec_dp_scan_in,
   bist_mb1_clk1o, bist_mb1_clk2o, bist_mb2_clk1o, bist_mb2_clk2o,
   bist_mb3_clk1o, bist_mb3_clk2o, bist_mb4_clk1o, bist_mb4_clk2o,
   arm7_scan_in, bist_arm7_clk1o, bist_arm7_clk2o,
   clockdr, clkdr_sca, clkdr_scb, updatedr, shiftdr,
   msp_mode_i, msp_mode_o, msp_mode_c,
   arm7_mode_i, arm7_mode_o, arm7_bs_disable, set_n, msp_bs_disable,
   mcrn, ins,

  // Inputs
   trst_n, tdi, tck, tms, tca, tcb, sysclk, sysreset_n,
   mult_in_1, mult_in_2, mult_in_3, mult_in_4, mult_in_5,
   mult_in_6, mult_in_7, mult_in_8, mult_in_9, mult_in_10,
   mult_in_11, mult_in_12, mult_in_13, mult_in_14, mult_in_15,
   mult_in_16, mult_in_17,
   rf_scan_out, idc_scan_out, iec_scan_out, lae_scan_out,
   pda_scan_out, mf_scan_out, bci_scan_out, iof_scan_out,
   falu_scan_out, exu_dp_scan_out, mul_scan_out, ifdm_dp_scan_out,
   lsu_dp_scan_out, ccu_dp_scan_out, mcueh_dp_scan_out, pcibp_dp_scan_out,
   codec_dp_scan_out, bsr_scan_out, arm7_scan_out, dbsr_scan_out,
   ocr_in, mult_scan_mode, por_n
);

  // Outputs
  output tdo_data, tdo_enb, rti, ud;
  output rf_sclka, idc_sclka, iec_sclka, lae_sclka,
   pda_sclka, mf_sclka, bci_sclka, iof_sclka,
   falu_sclka, exu_dp_sclka, mul_sclka, ifdm_dp_sclka,
   lsu_dp_sclka, ccu_dp_sclka, mcueh_dp_sclka, pcibp_dp_sclka,
   codec_dp_sclka;
  output rf_sclkb, idc_sclkb, iec_sclkb, lae_sclkb,
   pda_sclkb, mf_sclkb, bci_sclkb, iof_sclkb,
   falu_sclkb, exu_dp_sclkb, mul_sclkb, ifdm_dp_sclkb,
   lsu_dp_sclkb, ccu_dp_sclkb, mcueh_dp_sclkb, pcibp_dp_sclkb,
   codec_dp_sclkb;
  output scan_test_mode;
  output rf_scan_in, idc_scan_in, iec_scan_in, lae_scan_in,
   pda_scan_in, mf_scan_in, bci_scan_in, iof_scan_in,
   falu_scan_in, exu_dp_scan_in, mul_scan_in, ifdm_dp_scan_in,
   lsu_dp_scan_in, ccu_dp_scan_in, mcueh_dp_scan_in, pcibp_dp_scan_in,
   codec_dp_scan_in;
  output bist_mb1_clk1o, bist_mb1_clk2o, bist_mb2_clk1o, bist_mb2_clk2o,
    bist_mb3_clk1o, bist_mb3_clk2o, bist_mb4_clk1o, bist_mb4_clk2o;
  output arm7_scan_in, bist_arm7_clk1o, bist_arm7_clk2o;
  output clockdr, clkdr_sca, clkdr_scb, updatedr, shiftdr;
  output msp_mode_i, msp_mode_o, msp_mode_c, arm7_mode_i, arm7_mode_o;
  output arm7_bs_disable, set_n, msp_bs_disable;
  output [39:0] mcrn;
  output [31:0] ins;

  // Inputs
  input trst_n, tdi, tck, tms, tca, tcb, sysclk, sysreset_n;
  input mult_in_1, mult_in_2, mult_in_3, mult_in_4, mult_in_5,
        mult_in_6, mult_in_7, mult_in_8, mult_in_9, mult_in_10,
        mult_in_11, mult_in_12, mult_in_13, mult_in_14, mult_in_15,
        mult_in_16, mult_in_17;
  input rf_scan_out, idc_scan_out, iec_scan_out, lae_scan_out,
        pda_scan_out, mf_scan_out, bci_scan_out, iof_scan_out,
        falu_scan_out, exu_dp_scan_out, mul_scan_out, ifdm_dp_scan_out,
        lsu_dp_scan_out, ccu_dp_scan_out, mcueh_dp_scan_out, pcibp_dp_scan_out,
        codec_dp_scan_out;
  input bsr_scan_out, arm7_scan_out, dbsr_scan_out;
  input [69:0] ocr_in;
  input mult_scan_mode, por_n;

        // Unused outputs
  wire sys_clk_bypass, any_bist, tlr, sca13, scb13;
  wire [39:0] mcrp;
  wire [69:0] ocr_out, ocrinst;

        // unused inputs, stuck to ground
  // wire psi13;                // refer to my notebook
  // wire [39:0] mcr_in;        // data_in to mcr register

  // Logics to generate scan_test_mode
scan_async_dis scan_async_dis (
  .scan_mode(scan_test_mode), .mf_tms(mult_scan_mode), .mf_ins(ins[20]),
  .ins0(ins[0]), .ins5(ins[5]), .ins6(ins[6]), .ins7(ins[7]), .ins8(ins[8]),
  .ins9(ins[9]), .ins10(ins[10]), .ins11(ins[11]), .ins12(ins[12]),
  .ins13(ins[13]), .ins14(ins[14]), .ins15(ins[15]), .ins16(ins[16]),
  .ins17(ins[17]), .ins19(ins[19]), .ins21(ins[21]), .ins23(ins[23])
);

  // Logics to invert mcrp and generate mcrn
  wire [39:0] mcr_out;

iv mcrn_g0(.Y(mcrn[0]), .A(mcr_out[0]));
iv mcrn_g1(.Y(mcrn[1]), .A(mcr_out[1]));
iv mcrn_g2(.Y(mcrn[2]), .A(mcr_out[2]));
iv mcrn_g3(.Y(mcrn[3]), .A(mcr_out[3]));
iv mcrn_g4(.Y(mcrn[4]), .A(mcr_out[4]));
```

msp_jtag_gate.v

B-71

```
iv mcrn_g5(.Y(mcrn[5]), .A(mcr_out[5]));
iv mcrn_g6(.Y(mcrn[6]), .A(mcr_out[6]));
iv mcrn_g7(.Y(mcrn[7]), .A(mcr_out[7]));
iv mcrn_g8(.Y(mcrn[8]), .A(mcr_out[8]));
iv mcrn_g9(.Y(mcrn[9]), .A(mcr_out[9]));
iv mcrn_g10(.Y(mcrn[10]), .A(mcr_out[10]));
iv mcrn_g11(.Y(mcrn[11]), .A(mcr_out[11]));
iv mcrn_g12(.Y(mcrn[12]), .A(mcr_out[12]));
iv mcrn_g13(.Y(mcrn[13]), .A(mcr_out[13]));
iv mcrn_g14(.Y(mcrn[14]), .A(mcr_out[14]));
iv mcrn_g15(.Y(mcrn[15]), .A(mcr_out[15]));
iv mcrn_g16(.Y(mcrn[16]), .A(mcr_out[16]));
iv mcrn_g17(.Y(mcrn[17]), .A(mcr_out[17]));
iv mcrn_g18(.Y(mcrn[18]), .A(mcr_out[18]));
iv mcrn_g19(.Y(mcrn[19]), .A(mcr_out[19]));
iv mcrn_g20(.Y(mcrn[20]), .A(mcr_out[20]));
iv mcrn_g21(.Y(mcrn[21]), .A(mcr_out[21]));
iv mcrn_g22(.Y(mcrn[22]), .A(mcr_out[22]));
iv mcrn_g23(.Y(mcrn[23]), .A(mcr_out[23]));
iv mcrn_g24(.Y(mcrn[24]), .A(mcr_out[24]));
iv mcrn_g25(.Y(mcrn[25]), .A(mcr_out[25]));
iv mcrn_g26(.Y(mcrn[26]), .A(mcr_out[26]));
iv mcrn_g27(.Y(mcrn[27]), .A(mcr_out[27]));
iv mcrn_g28(.Y(mcrn[28]), .A(mcr_out[28]));
iv mcrn_g29(.Y(mcrn[29]), .A(mcr_out[29]));
iv mcrn_g30(.Y(mcrn[30]), .A(mcr_out[30]));
iv mcrn_g31(.Y(mcrn[31]), .A(mcr_out[31]));
iv mcrn_g32(.Y(mcrn[32]), .A(mcr_out[32]));
iv mcrn_g33(.Y(mcrn[33]), .A(mcr_out[33]));
iv mcrn_g34(.Y(mcrn[34]), .A(mcr_out[34]));
iv mcrn_g35(.Y(mcrn[35]), .A(mcr_out[35]));
iv mcrn_g36(.Y(mcrn[36]), .A(mcr_out[36]));
iv mcrn_g37(.Y(mcrn[37]), .A(mcr_out[37]));
iv mcrn_g38(.Y(mcrn[38]), .A(mcr_out[38]));
iv mcrn_g39(.Y(mcrn[39]), .A(mcr_out[39]));

  // to invoke JTAG core
mspn_top mspn_top (.sys_clk(sys_clk_bypass), .msp(msp_bs_disable),
  .ins0(ins[0]), .ins1(ins[1]), .ins2(ins[2]), .ins3(ins[3]), .ins4(ins[4]),
  .ins5(ins[5]), .ins6(ins[6]), .ins7(ins[7]), .ins8(ins[8]), .ins9(ins[9]),
  .ins10(ins[10]), .ins11(ins[11]), .ins12(ins[12]), .ins13(ins[13]),
  .ins14(ins[14]), .ins15(ins[15]), .ins16(ins[16]), .ins17(ins[17]),
  .ins18(ins[18]), .ins19(ins[19]), .ins20(ins[20]), .ins21(ins[21]),
  .ins22(ins[22]), .ins23(ins[23]), .ins24(ins[24]), .ins25(ins[25]),
  .ins26(ins[26]), .ins27(ins[27]), .ins28(ins[28]), .ins29(ins[29]),
  .ins30(ins[30]), .ins31(ins[31]),
  .si_cdr(idc_scan_in), .scb_cdr(idc_sclkb), .sca_cdr(idc_sclka),
  :psi_cdr(mult_in_2), .mclk(sysclk), .clockdr(clockdr),
  .clkdr_sca(clkdr_sca), .clkdr_scb(clkdr_scb),
  .mcrp0(mcrp[0]), .mcrp1(mcrp[1]), .mcrp2(mcrp[2]),
  .mcrp3(mcrp[3]), .mcrp4(mcrp[4]), .mcrp5(mcrp[5]),
  .mcrp6(mcrp[6]), .mcrp7(mcrp[7]), .mcrp8(mcrp[8]),
  .mcrp9(mcrp[9]),
  .mcrp10(mcrp[10]), .mcrp11(mcrp[11]), .mcrp12(mcrp[12]),
  .mcrp13(mcrp[13]), .mcrp14(mcrp[14]), .mcrp15(mcrp[15]),
  .mcrp16(mcrp[16]), .mcrp17(mcrp[17]), .mcrp18(mcrp[18]),
  .mcrp19(mcrp[19]),
  .mcrp20(mcrp[20]), .mcrp21(mcrp[21]), .mcrp22(mcrp[22]),
  .mcrp23(mcrp[23]), .mcrp24(mcrp[24]), .mcrp25(mcrp[25]),
  .mcrp26(mcrp[26]), .mcrp27(mcrp[27]), .mcrp28(mcrp[28]),
  .mcrp29(mcrp[29]),
  mcrp30(mcrp[30]), .mcrp31(mcrp[31]), .mcrp32(mcrp[32]),
  .mcrp33(mcrp[33]), .mcrp34(mcrp[34]), .mcrp35(mcrp[35]),
  .mcrp36(mcrp[36]), .mcrp37(mcrp[37]), .mcrp38(mcrp[38]),
  .mcrp39(mcrp[39]),
  .mcr_out0(mcr_out[0]), .mcr_out1(mcr_out[1]), .mcr_out2(mcr_out[2]),
  .mcr_out3(mcr_out[3]), .mcr_out4(mcr_out[4]), .mcr_out5(mcr_out[5]),
  .mcr_out6(mcr_out[6]), .mcr_out7(mcr_out[7]), .mcr_out8(mcr_out[8]),
  .mcr_out9(mcr_out[9]),
  .mcr_out10(mcr_out[10]), .mcr_out11(mcr_out[11]), .mcr_out12(mcr_out[12]),
  .mcr_out13(mcr_out[13]), .mcr_out14(mcr_out[14]), .mcr_out15(mcr_out[15]),
  .mcr_out16(mcr_out[16]), .mcr_out17(mcr_out[17]), .mcr_out18(mcr_out[18]),
  .mcr_out19(mcr_out[19]),
  .mcr_out20(mcr_out[20]), .mcr_out21(mcr_out[21]), .mcr_out22(mcr_out[22]),
  .mcr_out23(mcr_out[23]), .mcr_out24(mcr_out[24]), .mcr_out25(mcr_out[25]),
  .mcr_out26(mcr_out[26]), .mcr_out27(mcr_out[27]), .mcr_out28(mcr_out[28]),
  .mcr_out29(mcr_out[29]),
  .mcr_out30(mcr_out[30]), .mcr_out31(mcr_out[31]), .mcr_out32(mcr_out[32]),
  .mcr_out33(mcr_out[33]), .mcr_out34(mcr_out[34]), .mcr_out35(mcr_out[35]),
  .mcr_out36(mcr_out[36]), .mcr_out37(mcr_out[37]), .mcr_out38(mcr_out[38]),
  .mcr_out39(mcr_out[39]),
  .any_bist(any_bist),
  .scb0(falu_sclkb), .scb1(mul_sclkb), .scb2(iec_sclkb), .scb3(lae_sclkb),
  .scb4(mf_sclkb), .scb5(pda_sclkb), .scb6(ifdm_dp_sclkb), .scb7(lsu_dp_sclkb),
  .scb8(ccu_dp_sclkb), .scb9(mcueh_dp_sclkb), .scb10(pcibp_dp_sclkb),
  .scb11(bci_sclkb), .scb12(codec_dp_sclkb), .scb13(scb13),
  .scb14(exu_dp_sclkb), .scb15(iof_sclkb), .scb16(rf_sclkb),
  .dr_tdo0(falu_scan_out), .dr_tdo1(mul_scan_out), .dr_tdo2(iec_scan_out),
  .dr_tdo3(lae_scan_out), .dr_tdo4(mf_scan_out), .dr_tdo5(pda_scan_out),
  .dr_tdo6(ifdm_dp_scan_out), .dr_tdo7(lsu_dp_scan_out),
  .dr_tdo8(ccu_dp_scan_out), .dr_tdo9(mcueh_dp_scan_out),
  .dr_tdo10(pcibp_dp_scan_out), .dr_tdo11(bci_scan_out),
  .dr_tdo12(codec_dp_scan_out), .dr_tdo13(dbsr_scan_out),
  .dr_tdo14(exu_dp_scan_out), .dr_tdo15(iof_scan_out), .dr_tdo16(rf_scan_out),
  .dr_tdo17(arm7_scan_out),
  .si0(falu_scan_in), .si1(mul_scan_in), .si2(iec_scan_in), .si3(lae_scan_in),
  .si4(mf_scan_in), .si5(pda_scan_in), .si6(ifdm_dp_scan_in),
  .si7(lsu_dp_scan_in), .si8(ccu_dp_scan_in), .si9(mcueh_dp_scan_in),
  .si10(pcibp_dp_scan_in), .si11(bci_scan_in), .si12(codec_dp_scan_in),
  .si13(arm7_scan_in), .si14(exu_dp_scan_in), .si15(iof_scan_in),
  .si16(rf_scan_in),
  .psi0(mult_in_9), .psi1(mult_in_11), .psi2(mult_in_3), .psi3(mult_in_4),
  .psi4(mult_in_6), .psi5(mult_in_5), .psi6(mult_in_12), .psi7(mult_in_13),
  .psi8(mult_in_14), .psi9(mult_in_15), .psi10(mult_in_16), .psi11(mult_in_7),
  .psi12(mult_in_17), .psi13(1'b0), .psi14(mult_in_10),
  .psi15(mult_in_8), .psi16(mult_in_1),
  .psca(tca), .pscb(tcb), .tms(tms), .tdi(tdi), .tclk(tck), .trst_n(trst_n),
  .updatedr(updatedr), .tdo_data(tdo_data), .tdo_enb(tdo_enb),
  .clklo(bist_mbl_clklo), .mspmode_o(msp_mode_o),
  .mcr_in0(1'b0), .mcr_in1(1'b0), .mcr_in2(1'b0),
  .mcr_in3(1'b0), .mcr_in4(1'b0), .mcr_in5(1'b0),
  .mcr_in6(1'b0), .mcr_in7(1'b0), .mcr_in8(1'b0),
  .mcr_in9(1'b0), .mcr_in10(1'b0), .mcr_in11(1'b0),
  .mcr_in12(1'b0), .mcr_in13(1'b0), .mcr_in14(1'b0),
  .mcr_in15(1'b0), .mcr_in16(1'b0), .mcr_in17(1'b0),
  .mcr_in18(1'b0), .mcr_in19(1'b0), .mcr_in20(1'b0),
  .mcr_in21(1'b0), .mcr_in22(1'b0), .mcr_in23(1'b0),
  .mcr_in24(1'b0), .mcr_in25(1'b0), .mcr_in26(1'b0),
  .mcr_in27(1'b0), .mcr_in28(1'b0), .mcr_in29(1'b0),
  .mcr_in30(1'b0), .mcr_in31(1'b0), .mcr_in32(1'b0),
  .mcr_in33(1'b0), .mcr_in34(1'b0), .mcr_in35(1'b0),
  .mcr_in36(1'b0), .mcr_in37(1'b0), .mcr_in38(1'b0),
```

B-72

```
.mcr_in39(1'b0),
.mrst_n(sysreset_n), .shiftdr(shiftdr), .tlr(tlr), .rti(rti), .ud(ud),
.reset_n(set_n),
.sca0(falu_sclka), .sca1(mul_sclka), .sca2(iec_sclka), .sca3(lae_sclka),
.sca4(mf_sclka), .sca5(pda_sclka), .sca6(ifdm_dp_sclka), .sca7(lsu_dp_sclka),
.sca8(ccu_dp_sclka), .sca9(mcueh_dp_sclka), .sca10(pcibp_dp_sclka),
.sca11(bci_sclka), .sca12(codec_dp_sclka), .sca13(sca13),
.sca14(exu_dp_sclka), .sca15(iof_sclka), .sca16(rf_sclka),
.bsr_tdo(bsr_scan_out), .cdr_tdo(idc_scan_out), .arm7mode_i(arm7_mode_i),
.arm7mode_o(arm7_mode_o), .arm7(arm7_bs_disable), .por(por_n),
.mspmode_c(msp_mode_c), .arm7_clk1o(bist_arm7_clk1o),
.arm7_clk2o(bist_arm7_clk2o), .clk2o(bist_mb1_clk2o),
.mspmode_i(msp_mode_i), .mb2_clk1o(bist_mb2_clk1o),
.mb2_clk2o(bist_mb2_clk2o), .mb4_clk1o(bist_mb4_clk1o),
.mb3_clk1o(bist_mb3_clk1o), .mb3_clk2o(bist_mb3_clk2o),
.mb4_clk2o(bist_mb4_clk2o),
.ocr_out0(ocr_out[0]), .ocr_out1(ocr_out[1]), .ocr_out2(ocr_out[2]),
.ocr_out3(ocr_out[3]), .ocr_out4(ocr_out[4]), .ocr_out5(ocr_out[5]),
.ocr_out6(ocr_out[6]), .ocr_out7(ocr_out[7]), .ocr_out8(ocr_out[8]),
.ocr_out9(ocr_out[9]),
.ocr_out10(ocr_out[10]), .ocr_out11(ocr_out[11]), .ocr_out12(ocr_out[12]),
.ocr_out13(ocr_out[13]), .ocr_out14(ocr_out[14]), .ocr_out15(ocr_out[15]),
.ocr_out16(ocr_out[16]), .ocr_out17(ocr_out[17]), .ocr_out18(ocr_out[18]),
.ocr_out19(ocr_out[19]),
.ocr_out20(ocr_out[20]), .ocr_out21(ocr_out[21]), .ocr_out22(ocr_out[22]),
.ocr_out23(ocr_out[23]), .ocr_out24(ocr_out[24]), .ocr_out25(ocr_out[25]),
.ocr_out26(ocr_out[26]), .ocr_out27(ocr_out[27]), .ocr_out28(ocr_out[28]),
.ocr_out29(ocr_out[29]),
.ocr_out30(ocr_out[30]), .ocr_out31(ocr_out[31]), .ocr_out32(ocr_out[32]),
.ocr_out33(ocr_out[33]), .ocr_out34(ocr_out[34]), .ocr_out35(ocr_out[35]),
.ocr_out36(ocr_out[36]), .ocr_out37(ocr_out[37]), .ocr_out38(ocr_out[38]),
.ocr_out39(ocr_out[39]),
.ocr_out40(ocr_out[40]), .ocr_out41(ocr_out[41]), .ocr_out42(ocr_out[42]),
.ocr_out43(ocr_out[43]), .ocr_out44(ocr_out[44]), .ocr_out45(ocr_out[45]),
.ocr_out46(ocr_out[46]), .ocr_out47(ocr_out[47]), .ocr_out48(ocr_out[48]),
.ocr_out49(ocr_out[49]),
.ocr_out50(ocr_out[50]), .ocr_out51(ocr_out[51]), .ocr_out52(ocr_out[52]),
.ocr_out53(ocr_out[53]), .ocr_out54(ocr_out[54]), .ocr_out55(ocr_out[55]),
.ocr_out56(ocr_out[56]), .ocr_out57(ocr_out[57]), .ocr_out58(ocr_out[58]),
.ocr_out59(ocr_out[59]),
.ocr_out60(ocr_out[60]), .ocr_out61(ocr_out[61]), .ocr_out62(ocr_out[62]),
.ocr_out63(ocr_out[63]), .ocr_out64(ocr_out[64]), .ocr_out65(ocr_out[65]),
.ocr_out66(ocr_out[66]), .ocr_out67(ocr_out[67]), .ocr_out68(ocr_out[68]),
.ocr_out69(ocr_out[69]),
.ocrinst0(ocrinst[0]), .ocrinst1(ocrinst[1]), .ocrinst2(ocrinst[2]),
.ocrinst3(ocrinst[3]), .ocrinst4(ocrinst[4]), .ocrinst5(ocrinst[5]),
.ocrinst6(ocrinst[6]), .ocrinst7(ocrinst[7]), .ocrinst8(ocrinst[8]),
.ocrinst9(ocrinst[9]),
.ocrinst10(ocrinst[10]), .ocrinst11(ocrinst[11]), .ocrinst12(ocrinst[12]),
.ocrinst13(ocrinst[13]), .ocrinst14(ocrinst[14]), .ocrinst15(ocrinst[15]),
.ocrinst16(ocrinst[16]), .ocrinst17(ocrinst[17]), .ocrinst18(ocrinst[18]),
.ocrinst19(ocrinst[19]),
.ocrinst20(ocrinst[20]), .ocrinst21(ocrinst[21]), .ocrinst22(ocrinst[22]),
.ocrinst23(ocrinst[23]), .ocrinst24(ocrinst[24]), .ocrinst25(ocrinst[25]),
.ocrinst26(ocrinst[26]), .ocrinst27(ocrinst[27]), .ocrinst28(ocrinst[28]),
.ocrinst29(ocrinst[29]),
.ocrinst30(ocrinst[30]), .ocrinst31(ocrinst[31]), .ocrinst32(ocrinst[32]),
.ocrinst33(ocrinst[33]), .ocrinst34(ocrinst[34]), .ocrinst35(ocrinst[35]),
.ocrinst36(ocrinst[36]), .ocrinst37(ocrinst[37]), .ocrinst38(ocrinst[38]),
.ocrinst39(ocrinst[39]),
.ocrinst40(ocrinst[40]), .ocrinst41(ocrinst[41]), .ocrinst42(ocrinst[42]),
.ocrinst43(ocrinst[43]), .ocrinst44(ocrinst[44]), .ocrinst45(ocrinst[45]),
.ocrinst46(ocrinst[46]), .ocrinst47(ocrinst[47]), .ocrinst48(ocrinst[48]),
.ocrinst49(ocrinst[49]),
.ocrinst50(ocrinst[50]), .ocrinst51(ocrinst[51]), .ocrinst52(ocrinst[52]),
.ocrinst53(ocrinst[53]), .ocrinst54(ocrinst[54]), .ocrinst55(ocrinst[55]),
.ocrinst56(ocrinst[56]), .ocrinst57(ocrinst[57]), .ocrinst58(ocrinst[58]),
.ocrinst59(ocrinst[59]),
.ocrinst60(ocrinst[60]), .ocrinst61(ocrinst[61]), .ocrinst62(ocrinst[62]),
.ocrinst63(ocrinst[63]), .ocrinst64(ocrinst[64]), .ocrinst65(ocrinst[65]),
.ocrinst66(ocrinst[66]), .ocrinst67(ocrinst[67]), .ocrinst68(ocrinst[68]),
.ocrinst69(ocrinst[69]),
.in_sl0(ocr_in[0]), .in_sl1(ocr_in[1]), .in_sl2(ocr_in[2]),
.in_sl3(ocr_in[3]), .in_sl4(ocr_in[4]), .in_sl5(ocr_in[5]),
.in_sl6(ocr_in[6]), .in_sl7(ocr_in[7]), .in_sl8(ocr_in[8]),
.in_sl9(ocr_in[9]),
.in_sl10(ocr_in[10]), .in_sl11(ocr_in[11]), .in_sl12(ocr_in[12]),
.in_sl13(ocr_in[13]), .in_sl14(ocr_in[14]), .in_sl15(ocr_in[15]),
.in_sl16(ocr_in[16]), .in_sl17(ocr_in[17]), .in_sl18(ocr_in[18]),
.in_sl19(ocr_in[19]),
.in_sl20(ocr_in[20]), .in_sl21(ocr_in[21]), .in_sl22(ocr_in[22]),
.in_sl23(ocr_in[23]), .in_sl24(ocr_in[24]), .in_sl25(ocr_in[25]),
.in_sl26(ocr_in[26]), .in_sl27(ocr_in[27]), .in_sl28(ocr_in[28]),
.in_sl29(ocr_in[29]),
.in_sl30(ocr_in[30]), .in_sl31(ocr_in[31]), .in_sl32(ocr_in[32]),
.in_sl33(ocr_in[33]), .in_sl34(ocr_in[34]), .in_sl35(ocr_in[35]),
.in_sl36(ocr_in[36]), .in_sl37(ocr_in[37]), .in_sl38(ocr_in[38]),
.in_sl39(ocr_in[39]),
.in_sl40(ocr_in[40]), .in_sl41(ocr_in[41]), .in_sl42(ocr_in[42]),
.in_sl43(ocr_in[43]), .in_sl44(ocr_in[44]), .in_sl45(ocr_in[45]),
.in_sl46(ocr_in[46]), .in_sl47(ocr_in[47]), .in_sl48(ocr_in[48]),
.in_sl49(ocr_in[49]),
.in_sl50(ocr_in[50]), .in_sl51(ocr_in[51]), .in_sl52(ocr_in[52]),
.in_sl53(ocr_in[53]), .in_sl54(ocr_in[54]), .in_sl55(ocr_in[55]),
.in_sl56(ocr_in[56]), .in_sl57(ocr_in[57]), .in_sl58(ocr_in[58]),
.in_sl59(ocr_in[59]),
.in_sl60(ocr_in[60]), .in_sl61(ocr_in[61]), .in_sl62(ocr_in[62]),
.in_sl63(ocr_in[63]), .in_sl64(ocr_in[64]), .in_sl65(ocr_in[65]),
.in_sl66(ocr_in[66]), .in_sl67(ocr_in[67]), .in_sl68(ocr_in[68]),
.in_sl69(ocr_in[69])
);

endmodule
```

B-73

```
//-----------------------------------------------------------------
//Copyright (c) 1996 Samsung Semiconductor Inc.
//-----------------------------------------------------------------
//Contact :
//       Sanghyeon Baeg,
//       Samsung Semiconductor Inc.
//       3655 N. 1st Street
//       San Jose, CA 95134
//       (415) 954-7005
//-------------------------------------------------------------------

module msp_jtag_total (
  // Outputs
   jtag_rf_we, jtag_rf_capclk,
   sdram_bs_csn,
   tdo_data, tdo_enb, rti,
   rf_sclka, idc_sclka, iec_sclka, lae_sclka,
   pda_sclka, mf_sclka, bci_sclka, iof_sclka,
   falu_sclka, exu_dp_sclka, mul_sclka, ifdm_dp_sclka,
   lsu_dp_sclka, ccu_dp_sclka, mcueh_dp_sclka, pcibp_dp_sclka,
   codec_dp_sclka,
   rf_sclkb, idc_sclkb, iec_sclkb, lae_sclkb,
   pda_sclkb, mf_sclkb, bci_sclkb, iof_sclkb,
   falu_sclkb, exu_dp_sclkb, mul_sclkb, ifdm_dp_sclkb,
   lsu_dp_sclkb, ccu_dp_sclkb, mcueh_dp_sclkb, pcibp_dp_sclkb,
   codec_dp_sclkb,
   scan_test_mode,
   rf_scan_in, idc_scan_in, iec_scan_in, lae_scan_in,
   pda_scan_in, mf_scan_in, bci_scan_in, iof_scan_in,
   falu_scan_in, exu_dp_scan_in, mul_scan_in, ifdm_dp_scan_in,
   lsu_dp_scan_in, ccu_dp_scan_in, mcueh_dp_scan_in, pcibp_dp_scan_in,
   codec_dp_scan_in,
   bist_mb1_clk1o, bist_mb1_clk2o, bist_mb2_clk1o, bist_mb2_clk2o,
   bist_mb3_clk1o, bist_mb3_clk2o, bist_mb4_clk1o, bist_mb4_clk2o,
   arm7_scan_in, bist_arm7_clk1o, bist_arm7_clk2o,
   clockdr, clkdr_sca, clkdr_scb, updatedr, shiftdr,
   mcr_mspmode_i, mcr_mspmode_o, mcr_mspmode_c,
   mcr_arm7mode_i, mcr_arm7mode_o, arm7_bs_disable, set_n, msp_bs_disable,
   mcrn, ins,

  // Inputs
   frun_clk1, frun_clk2,
   sdram_clk, rasb, sdram_data,
   trst_n, tdi, tck, tms, tca, tcb, sysclk, sysreset_n,
   mult_in_1, mult_in_2, mult_in_3, mult_in_4, mult_in_5,
   mult_in_6, mult_in_7, mult_in_8, mult_in_9, mult_in_10,
   mult_in_11, mult_in_12, mult_in_13, mult_in_14, mult_in_15,
   mult_in_16, mult_in_17,
   rf_scan_out, idc_scan_out, iec_scan_out, lae_scan_out,
   pda_scan_out, mf_scan_out, bci_scan_out, iof_scan_out,
   falu_scan_out, exu_dp_scan_out, mul_scan_out, ifdm_dp_scan_out,
   lsu_dp_scan_out, ccu_dp_scan_out, mcueh_dp_scan_out, pcibp_dp_scan_out,
   codec_dp_scan_out, bsr_scan_out, arm7_scan_out, dbsr_scan_out,
   ocr_in69,ocr_in68,ocr_in67,ocr_in66,ocr_in1,ocr_in0,
   mult_scan_mode, por_n
);

  // Outputs
  output jtag_rf_we, jtag_rf_capclk;
  output sdram_bs_csn;
  output tdo_data, tdo_enb, rti;
  output rf_sclka, idc_sclka, iec_sclka, lae_sclka,
   pda_sclka, mf_sclka, bci_sclka, iof_sclka,
   falu_sclka, exu_dp_sclka, mul_sclka, ifdm_dp_sclka,
   lsu_dp_sclka, ccu_dp_sclka, mcueh_dp_sclka, pcibp_dp_sclka,
   codec_dp_sclka;
  output rf_sclkb, idc_sclkb, iec_sclkb, lae_sclkb,
   pda_sclkb, mf_sclkb, bci_sclkb, iof_sclkb,
   falu_sclkb, exu_dp_sclkb, mul_sclkb, ifdm_dp_sclkb,
   lsu_dp_sclkb, ccu_dp_sclkb, mcueh_dp_sclkb, pcibp_dp_sclkb,
   codec_dp_sclkb;
  output scan_test_mode;
  output rf_scan_in, idc_scan_in, iec_scan_in, lae_scan_in,
   pda_scan_in, mf_scan_in, bci_scan_in, iof_scan_in,
   falu_scan_in, exu_dp_scan_in, mul_scan_in, ifdm_dp_scan_in,
   lsu_dp_scan_in, ccu_dp_scan_in, mcueh_dp_scan_in, pcibp_dp_scan_in,
   codec_dp_scan_in;
  output bist_mb1_clk1o, bist_mb1_clk2o, bist_mb2_clk1o, bist_mb2_clk2o,
    bist_mb3_clk1o, bist_mb3_clk2o, bist_mb4_clk1o, bist_mb4_clk2o;
  output arm7_scan_in, bist_arm7_clk1o, bist_arm7_clk2o;
  output clockdr, clkdr_sca, clkdr_scb, updatedr, shiftdr;
  output mcr_mspmode_i, mcr_mspmode_o, mcr_mspmode_c, mcr_arm7mode_i,
         mcr_arm7mode_o;
  output arm7_bs_disable, set_n, msp_bs_disable;
  output [39:0] mcrn;
  output [31:0] ins;

  // Inputs
  input frun_clk1, frun_clk2;
  input sdram_clk, rasb;
  input [63:0] sdram_data;      // From SDRAM
  input trst_n, tdi, tck, tms, tca, tcb, sysclk, sysreset_n;
  input mult_in_1, mult_in_2, mult_in_3, mult_in_4, mult_in_5,
        mult_in_6, mult_in_7, mult_in_8, mult_in_9, mult_in_10,
        mult_in_11, mult_in_12, mult_in_13, mult_in_14, mult_in_15,
        mult_in_16, mult_in_17;
  input rf_scan_out, idc_scan_out, iec_scan_out, lae_scan_out,
        pda_scan_out, mf_scan_out, bci_scan_out, iof_scan_out,
        falu_scan_out, exu_dp_scan_out, mul_scan_out, ifdm_dp_scan_out,
        lsu_dp_scan_out, ccu_dp_scan_out, mcueh_dp_scan_out, pcibp_dp_scan_out,
        codec_dp_scan_out;
  input bsr_scan_out, arm7_scan_out, dbsr_scan_out;
  input ocr_in69,ocr_in68,ocr_in67,ocr_in66,ocr_in1,ocr_in0;
  input mult_scan_mode, por_n;

  wire [63:0] sdram_ocr_in;

nid2 Gtckbuf (.Y(tck_buf), .A(tck));

jtag_rf_interface jtag_rf_interface(
 .mcr_rf_we(mcrn[18]),
 .mcr_rf_capen(mcrn[17]),
 .frun_clk1(frun_clk1),
 .frun_clk2(frun_clk2),
 .jtag_rf_we(jtag_rf_we),
 .jtag_rf_capclk(jtag_rf_capclk)
);

msp_sdram_jtag msp_sdram_jtag(
 .reset_n(set_n),
```

msp_jtag_total.v

B-74

```
    .ud(ud),
    .sdram_clk(sdram_clk),
    .tck(tck_buf),
    .sdram_bs_en(ins[22]),
    .sdram_access(mcrn[15]),
    .sr_exit(mcrn[16]),
    .burst_refresh(mcrn[17]),
    .rasb(rasb),
    .sdram_data(sdram_data),
    .ocr_data(sdram_ocr_in),
    .sdram_bs_csn(w_sdram_bs_csn)
);

mcr_add_log mcr_add_log (
    .mcr(mcrn),
    .msp_mode_i(msp_mode_i),
    .msp_mode_o(msp_mode_o),
    .msp_mode_c(msp_mode_c),
    .arm7_mode_i(arm7_mode_i),
    .arm7_mode_o(arm7_mode_o),
    .mcr_mspmode_i(w_mcr_mspmode_i),
    .mcr_mspmode_o(w_mcr_mspmode_o),
    .mcr_mspmode_c(w_mcr_mspmode_c),
    .mcr_arm7mode_i(w_mcr_arm7mode_i),
    .mcr_arm7mode_o(w_mcr_arm7mode_o)
);

// @@@ v1.1 Included the clock drivers
clks_drivers clk_drivers (
    .rf_sclka               (w_rf_sclka),
    .idc_sclka              (w_idc_sclka),
    .iec_sclka              (w_iec_sclka),
    .lae_sclka              (w_lae_sclka),
    .pda_sclka              (w_pda_sclka),
    .mf_sclka               (w_mf_sclka),
    .bci_sclka              (w_bci_sclka),
    .iof_sclka              (w_iof_sclka),
    .falu_sclka             (w_falu_sclka),
    .exu_dp_sclka           (w_exu_dp_sclka),
    .mul_sclka              (w_mul_sclka),
    .ifdm_dp_sclka          (w_ifdm_dp_sclka),
    .lsu_dp_sclka           (w_lsu_dp_sclka),
    .ccu_dp_sclka           (w_ccu_dp_sclka),
    .mcueh_dp_sclka         (w_mcueh_dp_sclka),
    .pcibp_dp_sclka         (w_pcibp_dp_sclka),
    .codec_dp_sclka         (w_codec_dp_sclka),
    .rf_sclkb               (w_rf_sclkb),
    .idc_sclkb              (w_idc_sclkb),
    .iec_sclkb              (w_iec_sclkb),
    .lae_sclkb              (w_lae_sclkb),
    .pda_sclkb              (w_pda_sclkb),
    .mf_sclkb               (w_mf_sclkb),
    .bci_sclkb              (w_bci_sclkb),
    .iof_sclkb              (w_iof_sclkb),
    .falu_sclkb             (w_falu_sclkb),
    .exu_dp_sclkb           (w_exu_dp_sclkb),
    .mul_sclkb              (w_mul_sclkb),
    .ifdm_dp_sclkb          (w_ifdm_dp_sclkb),
    .lsu_dp_sclkb           (w_lsu_dp_sclkb),
    .ccu_dp_sclkb           (w_ccu_dp_sclkb),
    .mcueh_dp_sclkb         (w_mcueh_dp_sclkb),
    .pcibp_dp_sclkb         (w_pcibp_dp_sclkb),
    .codec_dp_sclkb         (w_codec_dp_sclkb),
    .scan_test_mode         (w_scan_test_mode),
    .sdram_bs_csn           (w_sdram_bs_csn),
    .bist_mb1_clk1o         (w_bist_mb1_clk1o),
    .bist_mb1_clk2o         (w_bist_mb1_clk2o),
    .bist_mb2_clk1o         (w_bist_mb2_clk1o),
    .bist_mb2_clk2o         (w_bist_mb2_clk2o),
    .bist_mb3_clk1o         (w_bist_mb3_clk1o),
    .bist_mb3_clk2o         (w_bist_mb3_clk2o),
    .bist_mb4_clk1o         (w_bist_mb4_clk1o),
    .bist_mb4_clk2o         (w_bist_mb4_clk2o),
    .arm7_scan_in           (w_arm7_scan_in),
    .bist_arm7_clk1o        (w_bist_arm7_clk1o),
    .bist_arm7_clk2o        (w_bist_arm7_clk2o),
    .clockdr                (w_clockdr),
    .updatedr               (w_updatedr),
    .shiftdr                (w_shiftdr),
    .mcr_mspmode_i          (w_mcr_mspmode_i),
    .mcr_mspmode_o          (w_mcr_mspmode_o),
    .mcr_mspmode_c          (w_mcr_mspmode_c),
    .mcr_arm7mode_i         (w_mcr_arm7mode_i),
    .mcr_arm7mode_o         (w_mcr_arm7mode_o),
    .arm7_bs_disable        (w_arm7_bs_disable),
    .set_n                  (w_set_n),
    .msp_bs_disable         (w_msp_bs_disable),

    .orf_sclka              (rf_sclka),
    .oidc_sclka             (idc_sclka),
    .oiec_sclka             (iec_sclka),
    .olae_sclka             (lae_sclka),
    .opda_sclka             (pda_sclka),
    .omf_sclka              (mf_sclka),
    .obci_sclka             (bci_sclka),
    .oiof_sclka             (iof_sclka),
    .ofalu_sclka            (falu_sclka),
    .oexu_dp_sclka          (exu_dp_sclka),
    .omul_sclka             (mul_sclka),
    .oifdm_dp_sclka         (ifdm_dp_sclka),
    .olsu_dp_sclka          (lsu_dp_sclka),
    .occu_dp_sclka          (ccu_dp_sclka),
    .omcueh_dp_sclka        (mcueh_dp_sclka),
    .opcibp_dp_sclka        (pcibp_dp_sclka),
    .ocodec_dp_sclka        (codec_dp_sclka),
    .orf_sclkb              (rf_sclkb),
    .oidc_sclkb             (idc_sclkb),
    .oiec_sclkb             (iec_sclkb),
    .olae_sclkb             (lae_sclkb),
    .opda_sclkb             (pda_sclkb),
    .omf_sclkb              (mf_sclkb),
    .obci_sclkb             (bci_sclkb),
    .oiof_sclkb             (iof_sclkb),
    .ofalu_sclkb            (falu_sclkb),
    .oexu_dp_sclkb          (exu_dp_sclkb),
    .omul_sclkb             (mul_sclkb),
    .oifdm_dp_sclkb         (ifdm_dp_sclkb),
    .olsu_dp_sclkb          (lsu_dp_sclkb),
    .occu_dp_sclkb          (ccu_dp_sclkb),
    .omcueh_dp_sclkb        (mcueh_dp_sclkb),
    .opcibp_dp_sclkb        (pcibp_dp_sclkb),
    .ocodec_dp_sclkb        (codec_dp_sclkb),
```

msp_jtag_total.v

B-75

```
.oscan_test_mode          (scan_test_mode),
.osdram_bs_csn            (sdram_bs_csn),
.obist_mb1_clk1o          (bist_mb1_clk1o),
.obist_mb1_clk2o          (bist_mb1_clk2o),
.obist_mb2_clk1o          (bist_mb2_clk1o),
.obist_mb2_clk2o          (bist_mb2_clk2o),
.obist_mb3_clk1o          (bist_mb3_clk1o),
.obist_mb3_clk2o          (bist_mb3_clk2o),
.obist_mb4_clk1o          (bist_mb4_clk1o),
.obist_mb4_clk2o          (bist_mb4_clk2o),
.oarm7_scan_in            (arm7_scan_in),
.obist_arm7_clk1o         (bist_arm7_clk1o),
.obist_arm7_clk2o         (bist_arm7_clk2o),
.oclockdr                 (clockdr),
.oupdatedr                (updatedr),
.oshiftdr                 (shiftdr),
.omcr_mspmode_i           (mcr_mspmode_i),
.omcr_mspmode_o           (mcr_mspmode_o),
.omcr_mspmode_c           (mcr_mspmode_c),
.omcr_arm7mode_i          (mcr_arm7mode_i),
.omcr_arm7mode_o          (mcr_arm7mode_o),
.oarm7_bs_disable         (arm7_bs_disable),
.oset_n                   (set_n),
.omsp_bs_disable          (msp_bs_disable ) );

msp_jtag msp_jtag(
  // Outputs

// @@@ v1.1   .tdo(tdo), .rti(rti), .ud(ud),
// @@@ v1.1   .rf_sclka(rf_sclka), .idc_sclka(idc_sclka), .iec_sclka(iec_sclka),
// @@@ v1.1   .lae_sclka(lae_sclka), .pda_sclka(pda_sclka), .mf_sclka(mf_sclka),
// @@@ v1.1   .bci_sclka(bci_sclka), .iof_sclka(iof_sclka), .falu_sclka(falu_scl
ka),
// @@@ v1.1   .exu_dp_sclka(exu_dp_sclka), .mul_sclka(mul_sclka),
// @@@ v1.1   .ifdm_dp_sclka(ifdm_dp_sclka), .lsu_dp_sclka(lsu_dp_sclka),
// @@@ v1.1   .ccu_dp_sclka(ccu_dp_sclka), .mcueh_dp_sclka(mcueh_dp_sclka),
// @@@ v1.1   .pcibp_dp_sclka(pcibp_dp_sclka), .codec_dp_sclka(codec_dp_sclka),
// @@@ v1.1   .rf_sclkb(rf_sclkb), .idc_sclkb(idc_sclkb), .iec_sclkb(iec_sclkb),
// @@@ v1.1   .lae_sclkb(lae_sclkb), .pda_sclkb(pda_sclkb), .mf_sclkb(mf_sclkb),
// @@@ v1.1   .bci_sclkb(bci_sclkb), .iof_sclkb(iof_sclkb), .falu_sclkb(falu_scl
kb),
// @@@ v1.1   .exu_dp_sclkb(exu_dp_sclkb), .mul_sclkb(mul_sclkb),
// @@@ v1.1   .ifdm_dp_sclkb(ifdm_dp_sclkb), .lsu_dp_sclkb(lsu_dp_sclkb),
// @@@ v1.1   .ccu_dp_sclkb(ccu_dp_sclkb), .mcueh_dp_sclkb(mcueh_dp_sclkb),
// @@@ v1.1   .pcibp_dp_sclkb(pcibp_dp_sclkb), .codec_dp_sclkb(codec_dp_sclkb),
// @@@ v1.1   .scan_test_mode(scan_test_mode),
// @@@ v1.1   .rf_scan_in(rf_scan_in), .idc_scan_in(idc_scan_in),
// @@@ v1.1   .iec_scan_in(iec_scan_in), .lae_scan_in(lae_scan_in),
// @@@ v1.1   .pda_scan_in(pda_scan_in), .mf_scan_in(mf_scan_in),
// @@@ v1.1   .bci_scan_in(bci_scan_in), .iof_scan_in(iof_scan_in),
// @@@ v1.1   .falu_scan_in(falu_scan_in), .exu_dp_scan_in(exu_dp_scan_in),
// @@@ v1.1   .mul_scan_in(mul_scan_in), .ifdm_dp_scan_in(ifdm_dp_scan_in),
// @@@ v1.1   .lsu_dp_scan_in(lsu_dp_scan_in), .ccu_dp_scan_in(ccu_dp_scan_in),
// @@@ v1.1   .mcueh_dp_scan_in(mcueh_dp_scan_in), .pcibp_dp_scan_in(pcibp_dp_sc
an_in),
// @@@ v1.1   .codec_dp_scan_in(codec_dp_scan_in),
// @@@ v1.1   .bist_mb1_clk1o(bist_mb1_clk1o), .bist_mb1_clk2o(bist_mb1_clk2o),
// @@@ v1.1   .bist_mb2_clk1o(bist_mb2_clk1o), .bist_mb2_clk2o(bist_mb2_clk2o),
// @@@ v1.1   .bist_mb3_clk1o(bist_mb3_clk1o), .bist_mb3_clk2o(bist_mb3_clk2o),
// @@@ v1.1   .bist_mb4_clk1o(bist_mb4_clk1o), .bist_mb4_clk2o(bist_mb4_clk2o),
// @@@ v1.1   .arm7_scan_in(arm7_scan_in), .bist_arm7_clk1o(bist_arm7_clk1o),
// @@@ v1.1   .bist_arm7_clk2o(bist_arm7_clk2o),
// @@@ v1.1   .clockdr(clockdr), .updatedr(updatedr), .shiftdr(shiftdr),
// @@@ v1.1   .msp_mode_i(msp_mode_i), .msp_mode_o(msp_mode_o), .msp_mode_c(msp_
mode_c),
// @@@ v1.1   .arm7_mode_i(arm7_mode_i), .arm7_mode_o(arm7_mode_o),
// @@@ v1.1   .arm7_bs_disable(arm7_bs_disable), .set_n(set_n),
// @@@ v1.1   .msp_bs_disable(msp_bs_disable), .mcrn(mcrn), .ins(ins),

   .tdo_data(tdo_data), .tdo_enb(tdo_enb), .rti(rti), .ud(ud),
   .rf_sclka(w_rf_sclka), .idc_sclka(w_idc_sclka), .iec_sclka(w_iec_sclka),
   .lae_sclka(w_lae_sclka), .pda_sclka(w_pda_sclka), .mf_sclka(w_mf_sclka),
   .bci_sclka(w_bci_sclka), .iof_sclka(w_iof_sclka), .falu_sclka(w_falu_sclka),
   .exu_dp_sclka(w_exu_dp_sclka), .mul_sclka(w_mul_sclka),
   .ifdm_dp_sclka(w_ifdm_dp_sclka), .lsu_dp_sclka(w_lsu_dp_sclka),
   .ccu_dp_sclka(w_ccu_dp_sclka), .mcueh_dp_sclka(w_mcueh_dp_sclka),
   .pcibp_dp_sclka(w_pcibp_dp_sclka), .codec_dp_sclka(w_codec_dp_sclka),
   .rf_sclkb(w_rf_sclkb), .idc_sclkb(w_idc_sclkb), .iec_sclkb(w_iec_sclkb),
   .lae_sclkb(w_lae_sclkb), .pda_sclkb(w_pda_sclkb), .mf_sclkb(w_mf_sclkb),
   .bci_sclkb(w_bci_sclkb), .iof_sclkb(w_iof_sclkb), .falu_sclkb(w_falu_sclkb),
   .exu_dp_sclkb(w_exu_dp_sclkb), .mul_sclkb(w_mul_sclkb),
   .ifdm_dp_sclkb(w_ifdm_dp_sclkb), .lsu_dp_sclkb(w_lsu_dp_sclkb),
   .ccu_dp_sclkb(w_ccu_dp_sclkb), .mcueh_dp_sclkb(w_mcueh_dp_sclkb),
   .pcibp_dp_sclkb(w_pcibp_dp_sclkb), .codec_dp_sclkb(w_codec_dp_sclkb),
   .scan_test_mode(w_scan_test_mode),
   .rf_scan_in(rf_scan_in), .idc_scan_in(idc_scan_in),
   .iec_scan_in(iec_scan_in), .lae_scan_in(lae_scan_in),
   .pda_scan_in(pda_scan_in), .mf_scan_in(mf_scan_in),
   .bci_scan_in(bci_scan_in), .iof_scan_in(iof_scan_in),
   .falu_scan_in(falu_scan_in), .exu_dp_scan_in(exu_dp_scan_in),
   .mul_scan_in(mul_scan_in), .ifdm_dp_scan_in(ifdm_dp_scan_in),
   .lsu_dp_scan_in(lsu_dp_scan_in), .ccu_dp_scan_in(ccu_dp_scan_in),
   .mcueh_dp_scan_in(mcueh_dp_scan_in), .pcibp_dp_scan_in(pcibp_dp_scan_in),
   .codec_dp_scan_in(codec_dp_scan_in),
   .bist_mb1_clk1o(w_bist_mb1_clk1o), .bist_mb1_clk2o(w_bist_mb1_clk2o),
   .bist_mb2_clk1o(w_bist_mb2_clk1o), .bist_mb2_clk2o(w_bist_mb2_clk2o),
   .bist_mb3_clk1o(w_bist_mb3_clk1o), .bist_mb3_clk2o(w_bist_mb3_clk2o),
   .bist_mb4_clk1o(w_bist_mb4_clk1o), .bist_mb4_clk2o(w_bist_mb4_clk2o),
   .arm7_scan_in(w_arm7_scan_in), .bist_arm7_clk1o(w_bist_arm7_clk1o),
   .bist_arm7_clk2o(w_bist_arm7_clk2o),
   .clockdr(w_clockdr), .clkdr_sca(clkdr_sca), .clkdr_scb(clkdr_scb),
   .updatedr(w_updatedr), .shiftdr(w_shiftdr),
   .msp_mode_i(msp_mode_i), .msp_mode_o(msp_mode_o), .msp_mode_c(msp_mode_c),
   .arm7_mode_i(arm7_mode_i), .arm7_mode_o(arm7_mode_o),
   .arm7_bs_disable(w_arm7_bs_disable), .set_n(w_set_n),
   .msp_bs_disable(w_msp_bs_disable), .mcrn(mcrn), .ins(ins),

  // Inputs
   .trst_n(trst_n), .tdi(tdi), .tck(tck_buf), .tms(tms), .tca(tca), .tcb(tcb),
   .sysclk(sysclk), .sysreset_n(1'b1),  // Useless signal, fixed to VDD
   .mult_in_1(mult_in_1), .mult_in_2(mult_in_2), .mult_in_3(mult_in_3),
   .mult_in_4(mult_in_4), .mult_in_5(mult_in_5), .mult_in_6(mult_in_6),
   .mult_in_7(mult_in_7), .mult_in_8(mult_in_8), .mult_in_9(mult_in_9),
   .mult_in_10(mult_in_10), .mult_in_11(mult_in_11), .mult_in_12(mult_in_12),
   .mult_in_13(mult_in_13), .mult_in_14(mult_in_14), .mult_in_15(mult_in_15),
   .mult_in_16(mult_in_16), .mult_in_17(mult_in_17),
   .rf_scan_out(rf_scan_out), .idc_scan_out(idc_scan_out),
   .iec_scan_out(iec_scan_out), .lae_scan_out(lae_scan_out),
   .pda_scan_out(pda_scan_out), .mf_scan_out(mf_scan_out),
   .bci_scan_out(bci_scan_out), .iof_scan_out(iof_scan_out),
   .falu_scan_out(falu_scan_out), .exu_dp_scan_out(exu_dp_scan_out),
   .mul_scan_out(mul_scan_out), .ifdm_dp_scan_out(ifdm_dp_scan_out),
```

msp_jtag_total.v

B-76

```
   .lsu_dp_scan_out(lsu_dp_scan_out), .ccu_dp_scan_out(ccu_dp_scan_out),
   .mcueh_dp_scan_out(mcueh_dp_scan_out), .pcibp_dp_scan_out(pcibp_dp_scan_out),
   .codec_dp_scan_out(codec_dp_scan_out), .bsr_scan_out(bsr_scan_out),
   .arm7_scan_out(arm7_scan_out), .dbsr_scan_out(dbsr_scan_out),
   .ocr_in({ocr_in69,ocr_in68,ocr_in67,ocr_in66,sdram_ocr_in,ocr_in1,ocr_in0}),
   .mult_scan_mode(mult_scan_mode), .por_n(por_n)
);

endmodule
```

I claim:

1. An integrated circuit comprising:

a plurality of function blocks; and a configurable scan chain circuitry for testing said plurality of function blocks such that:

in a first test mode, said configurable scan chain circuitry provides a plurality of scan chains, wherein each scan chain is for scanning data in and/or out of corresponding one or more of said plurality of function blocks, such that in a testing operation any of said scan chains is operable to be selected and scanned without any other one of said scan chains being scanned and said integrated circuit is operable to be tested without any other one of said scan chains being scanned;

in a second test mode, said configurable scan chain circuitry provides a plurality of scan chains, wherein each scan chain is for scanning data in and/or out of corresponding one or more of said plurality of function blocks such that in a testing operation all of said scan chains for all of said function blocks are scanned in parallel.

2. The integrated circuit of claim 1 wherein said configurable scan chain circuitry comprises a JTAG controller, and each of said first and second test modes is initiated by supplying a separate JTAG private instruction to said JTAG controller.

3. The integrated circuit of claim 1 wherein each of said scan chains comprises a shift register built of level sensitive scan design latches.

4. The integrated circuit of claim 1 further comprising a plurality of input and/or output ports for non-test operation, wherein a subset of said plurality of ports is reconfigured by said configurable scan chain circuitry to act as inputs for said scan chains during said second test mode.

5. The integrated circuit of claim 1 further comprising a plurality of input and/or output ports for non-test operation, wherein a subset of said plurality of ports is reconfigured by said configurable scan chain circuitry to act as outputs for said scan chains during said second test mode.

6. The integrated circuit of claim 2 wherein in the first mode, data is scanned into said selected scan chain using a JTAG TDI serial data input.

7. The integrated circuit of claim 2 wherein in the first mode, data is scanned out of said selected scan chain using a JTAG TDO serial data output.

8. The integrated circuit of claim 1 wherein in the first test mode, all of said plurality of scan chains share one test data input and one test data output for scanning test data.

9. The integrated circuit of claim 1 wherein in the second test mode, each of said plurality of scan chains has a data input and a data output for test data scanning, separate from any of the other of said plurality of scan chains.

10. The integrated circuit of claim 1 wherein in the second test mode, at least one scan chain is obtained by combining at least two scan chains of the first test mode to reduce the number of scan chain inputs and outputs used for parallel scanning in the second test mode.

11. A method for testing an integrated circuit comprising a plurality of function blocks and a configurable scan chain circuitry, the method comprising:

configuring said scan chain circuitry to perform testing in a first test mode or a second test mode, wherein:

in the first test mode, said configurable scan chain circuitry provides a plurality of scan chains, wherein each scan chain is for scanning data in and/or out of corresponding one or more of said plurality of function blocks, such that in a testing operation any of said scan chains is operable to be selected and scanned without any other one of said scan chains being scanned and said integrated circuit is operable to be tested without any other one of said scan chains being scanned;

in the second test mode, said configurable scan chain circuitry provides a plurality of scan chains, wherein each scan chain is for scanning data in and/or out of corresponding one or more of said plurality of function blocks such that in a testing operation all of said scan chains for all of said function blocks are scanned in parallel; and testing the integrated circuit in the mode provided by the configurable scan chain circuitry.

12. The method of claim 11 wherein said configurable scan chain circuitry comprises a JTAG controller, and each of said first and second test modes is initiated by supplying a separate JTAG private instruction to said JTAG controller.

13. The method of claim 11 wherein each of said scan chains comprises a shift register built of level sensitive scan design latches.

14. The method of claim 11 further comprising a plurality of input and/or output ports for non-test operation, wherein a subset of said plurality of ports is reconfigured by said configurable scan chain circuitry to act as inputs for said scan chains during said second test mode.

15. The method of claim 11 further comprising a plurality of input and/or output ports for non-test operation, wherein a subset of said plurality of ports is reconfigured by said configurable scan chain circuitry to act as outputs for said scan chains during said second test mode.

16. The method of claim 12 wherein in the first mode, data is scanned into said selected scan chain using a JTAG TDI serial data input.

17. The method of claim 12 wherein in the first mode, data is scanned out of said selected scan chain using a JTAG TDO Serial data output.

18. The method of claim 11 wherein in the first test mode, all of said plurality of scan chains share one test data input and one test data output for scanning test data.

19. The method of claim 11 wherein in the second test mode, each of said plurality of scan chains has a data input and a data output for test data scanning, separate from any of the other of said plurality of scan chains.

20. The method of claim 11 wherein in the second test mode, at least one scan chain is obtained by combining at least two scan chains of the first test mode to reduce the number of scan chain inputs and outputs used for parallel scanning in the second test mode.

21. The integrated circuit of claim 1 wherein the scan chains are to receive test vectors which are to be applied to the function blocks.

22. The method of claim 11 wherein the scan chains receive test vectors which are applied to the function blocks.

23. A method for testing integrated circuits each of which comprises a structure of claim 1, the method comprising:

when at least one of the integrated circuits is being debugged, testing the integrated circuit in the first test mode; and when at least one of the integrated circuits undergoes manufacturing testing, testing the integrated circuit in the second test mode.

* * * * *